(12) United States Patent
KnicKrehm et al.

(10) Patent No.: US 10,275,726 B2
(45) Date of Patent: Apr. 30, 2019

(54) RE-CREATING THE SOUND OF AN AUDIENCE LOCATION AREA FROM A MEASURED PERFORMANCE SPACE IN A LIVE REHEARSAL SPACE

(71) Applicant: Constellation Productions, Inc., Cambridge, MA (US)

(72) Inventors: Glenn KnicKrehm, Cambridge, MA (US); Alban Bassuet, New York, NY (US); Andrew Neill Woodger, London (GB)

(73) Assignee: Constellation Productions, Inc., Cambridge, MA (US)

( * ) Notice: Subject to any disclaimer, the term of this patent is extended or adjusted under 35 U.S.C. 154(b) by 0 days.

(21) Appl. No.: 15/713,740

(22) Filed: Sep. 25, 2017

(65) Prior Publication Data
US 2018/0025297 A1   Jan. 25, 2018

Related U.S. Application Data

(63) Continuation of application No. 14/742,920, filed on Jun. 18, 2015, now Pat. No. 9,773,215, which is a
(Continued)

(51) Int. Cl.
*A63J 1/02* (2006.01)
*G01H 7/00* (2006.01)
(Continued)

(52) U.S. Cl.
CPC ............... *G06Q 10/02* (2013.01); *A63J 1/02* (2013.01); *E04B 1/994* (2013.01); *G01H 7/00* (2013.01);
(Continued)

(58) Field of Classification Search
CPC .......... G01H 7/00; G06Q 10/02; H04R 29/00; A63J 1/02; E04B 1/994; G06F 17/5004;
(Continued)

(56) References Cited

U.S. PATENT DOCUMENTS 5,452,360 A * 9/1995 Yamashita ........... G10H 1/0091
381/63
5,797,126 A   8/1998 Helbling et al.
(Continued)

FOREIGN PATENT DOCUMENTS

CA   2729744 C   1/2017
EP   1647909 A2   4/2006
(Continued)

OTHER PUBLICATIONS

EP09774333.0, "European Application Serial No. EP09774333.0, Extended European Search Report Received dated Sep. 18, 2017", Constellation Productions, Inc., 6 Pages.

*Primary Examiner* — Paul Kim
*Assistant Examiner* — Friedrich Fahnert
(74) *Attorney, Agent, or Firm* — GTC Law Group PC & Affiliates

(57) ABSTRACT

In embodiments of the present invention improved capabilities are described for a computer-based method for reproducing a performance sound quality in a rehearsal space, the method comprising accessing a computer stored multi-dimensional sound signature for an audience location in a performance space, receiving sound data from a sound input device in the rehearsal space, modifying the sound data to match a sound characteristic of the multi-dimensional sound signature, and transmitting the modified sound data through a sound output device in the rehearsal space.

20 Claims, 124 Drawing Sheets

Related U.S. Application Data continuation of application No. 13/745,463, filed on Jan. 18, 2013, now Pat. No. 9,094,765, which is a continuation of application No. 12/495,019, filed on Jun. 30, 2009, now Pat. No. 8,396,226.

(60) Provisional application No. 61/185,837, filed on Jun. 10, 2009, provisional application No. 61/176,426, filed on May 7, 2009, provisional application No. 61/076,859, filed on Jun. 30, 2008.

(51) Int. Cl.

| | |
|---|---|
| G06Q 10/02 | (2012.01) |
| G09B 23/14 | (2006.01) |
| G10K 15/00 | (2006.01) |
| H04R 29/00 | (2006.01) |
| E04B 1/99 | (2006.01) |
| G06F 17/50 | (2006.01) |
| G10K 11/00 | (2006.01) |

(52) U.S. Cl.
CPC ...... *G06F 17/5004* (2013.01); *G06F 17/5009* (2013.01); *G09B 23/14* (2013.01); *G10K 11/002* (2013.01); *G10K 15/00* (2013.01); *H04R 29/00* (2013.01)

(58) Field of Classification Search
CPC ... G06F 17/5009; G09B 23/14; G10K 11/002; G10K 15/00
USPC ...... 381/1, 17, 56, 61, 63, 83, 310, 18, 303, 381/306, 307; 310/322
See application file for complete search history.

(56) References Cited

U.S. PATENT DOCUMENTS

| | | | |
|---|---|---|---|
| 6,782,105 B1* | 8/2004 | Sahara | G10K 15/12 381/61 |
| 8,396,226 B2 | 3/2013 | Knickrehm et al. | |
| 8,724,821 B2 | 5/2014 | Ohashi | |
| 9,094,765 B2 | 7/2015 | Knickrehm et al. | |
| 9,773,215 B2 | 9/2017 | Knickrehm et al. | |
| 2001/0012367 A1* | 8/2001 | Sotome | H04S 3/00 381/1 |
| 2002/0138405 A1 | 9/2002 | Sakai et al. | |
| 2003/0007648 A1 | 1/2003 | Currell | |
| 2003/0093706 A1 | 5/2003 | Cronin et al. | |
| 2005/0131659 A1 | 6/2005 | Mei et al. | |
| 2005/0163322 A1* | 7/2005 | Kang | H04S 1/002 381/17 |
| 2005/0248233 A1* | 11/2005 | Pompei | G10K 15/02 310/322 |
| 2006/0198531 A1 | 9/2006 | Berson et al. | |
| 2008/0243211 A1* | 10/2008 | Cartwright | G10K 11/175 607/63 |
| 2008/0267416 A1 | 10/2008 | Goldstein et al. | |
| 2008/0298614 A1 | 12/2008 | Cronin et al. | |
| 2009/0052680 A1 | 2/2009 | Wang et al. | |
| 2009/0067635 A1* | 3/2009 | Fletcher | H04R 1/347 381/17 |
| 2009/0164635 A1 | 6/2009 | Denker et al. | |
| 2009/0319306 A1 | 12/2009 | Chanick et al. | |
| 2013/0208904 A1 | 8/2013 | Knickrehm et al. | |
| 2015/0286966 A1 | 10/2015 | Knickrehm et al. | |
| 2015/0289071 A1 | 10/2015 | Knickrehm et al. | |

FOREIGN PATENT DOCUMENTS

| | | |
|---|---|---|
| EP | 1647909 A3 | 11/2006 |
| EP | 2294573 A2 | 3/2011 |
| FR | 2895542 A1 | 6/2007 |
| JP | 03194599 A | 8/1991 |
| JP | 03239296 A | 10/1991 |
| JP | 2000013900 A * | 1/2000 |
| WO | 2010002882 A2 | 1/2010 |

* cited by examiner

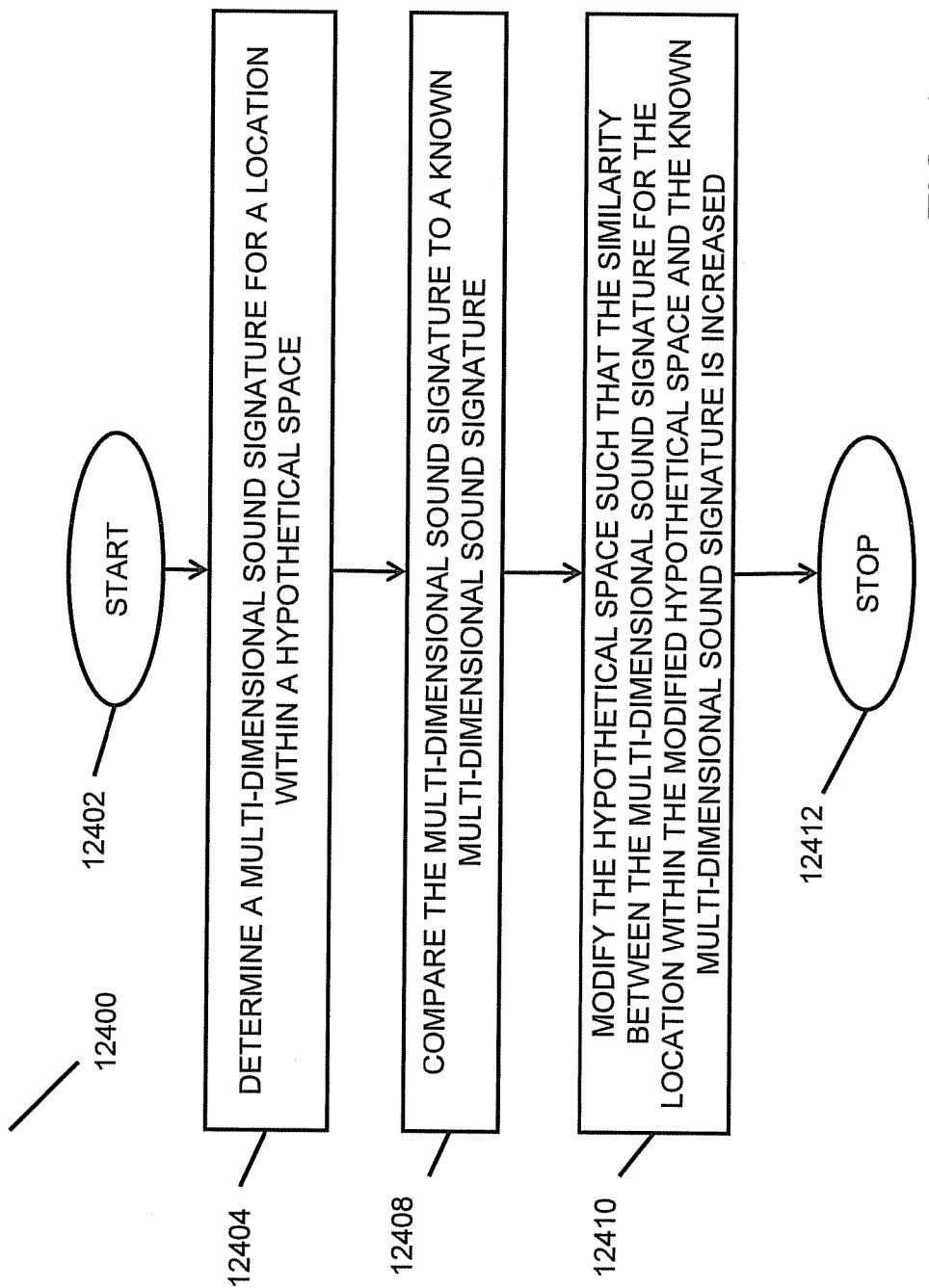

RE-CREATING THE SOUND OF AN AUDIENCE LOCATION AREA FROM A MEASURED PERFORMANCE SPACE IN A LIVE REHEARSAL SPACE

CROSS-REFERENCE TO RELATED APPLICATIONS

This application is a continuation of U.S. patent Ser. No. 14/742,920, filed Jun. 18, 2015 which is a continuation of U.S. patent Ser. No. 13/745,463, filed Jan. 18, 2013, now U.S. Pat. No. 9,094,765, which is a continuation of U.S. patent application Ser. No. 12/495,019, filed Jun. 30, 2009, now U.S. Pat. No. 8,396,226, issued Mar. 12, 2013. U.S. patent application Ser. No. 12/495,019 claims the benefit of the following provisional applications: U.S. Provisional Application Nos. 61/076,859, filed Jun. 30, 2008; 61/176,426, filed May 7, 2009; and 61/185,837, filed Jun. 10, 2009.

Each of the above applications is hereby incorporated by reference in their entirety.

BACKGROUND OF THE INVENTION

Field of the Invention

The invention described herein generally refers to acoustics, and more specifically to the production of improved acoustics in performance centers and electronically simulated performance experiences. Aspects of the invention also relate to stage machinery systems.

Description of Related Art

Designing performance centers and audio or audiovisual reproduction equipment is presently governed by the application of acoustic and physical measurements, parameters, and ratios. However, these methods have only been partially effective in creating a satisfactory subjective experience in many modern performance centers. This is because the parameters and measurements currently used do not distinguish certain significant features of a performance venue that contribute to effective performances and yield a satisfying audience experience. This has led to the creation of many modern concert halls that meet the accepted standards, but whose acoustics fail to produce highly satisfactory audience or performer experiences. Therefore there exists a need for improved methods used in the design, modification, and simulation of acoustic spaces.

Further, the design of performance centers also uses stage machinery, the complexity and expense of which has increased dramatically over time. Stage changes for live theatre often require substantial expensive equipment, as well as significant manpower, often requiring a team of people to engage in highly coordinated tasks, sometimes aided by machines, in order to effect a scene change. Such stage change systems are often beyond the reach of small theatres, both in cost and manpower. Even in larger, better financed performance venues, modern techniques for providing scenery and scenery changes are often deployed in fly spaces above the stage, resulting in degraded acoustic characteristics. Therefore a need exists for improved methods for effecting rapid, complex scene changes, at lower cost and with less manpower. A need also exists to provide scenery and scenery changing methods that contribute to improved acoustics in performance centers.

SUMMARY OF THE INVENTION

Methods and systems disclosed herein include improved methods and systems for design, modification, optimization, re-creation, simulation, and the like, of venues having highly desirable qualities for listeners, including concert halls and theatres, as well as smaller venues such as practice rooms.

Methods and systems disclosed herein include commercial applications including re-creation of acoustics environments in a rehearsal space, performance space, entertainment space, simulated space, hypothetical space, and the like; in a media content, during media use, and the like; in venue ticketing, venue sound sampling in venue ticketing, and the like; in software interfaces associated with the viewing, analyzing, modifying, modeled acoustic spaces; and the like.

Methods and systems disclosed herein include methods and systems for enabling rapid, automatic scene changes, optionally using electromechanical systems and optionally operating under computer control.

In embodiments, methods and systems for storing the multi-dimensional sound signature in accordance with an embodiment of the present invention may be provided. The methods and systems may include determining a multi-dimensional sound signature for a location within a space by measuring the multi-dimensional sound signature and storing the multi-dimensional sound signature using a storage medium. The measuring of the multi-dimensional signature may include initiating a sound at a first location in the space and measuring more than one dimension of the resulting sound at a second location in the space to form the multi-dimensional sound signature for such second location.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like. In embodiments, the sound may be characterized by a single frequency.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron, as well as a subwoofer, a dodecahedral speaker, a dodecahedral speaker and a subwoofer, a microphone, a directional microphone, and the like.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the multi-dimensional sound signature in accordance with another embodiment of the present invention may be provided. The methods and systems may include determining a multi-dimensional sound signature for a location within a space, and storing the multi-dimensional sound signature using a storage medium. The multi-dimensional signature may define a preferential order for reception of sound from a plurality of incidence directions, by measuring the multi-dimensional sound signature. The measuring of the multi-dimensional sound signature may include initiating a sound at a first location in the space and measuring more than one dimension of the resulting sound at a second location in the space to form the multi-dimensional sound signature for such second location.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like. In embodiments, the sound may be characterized by a single frequency.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron, as well as a subwoofer, a dodecahedral speaker, a dodecahedral speaker and a subwoofer, a microphone, a directional microphone, and the like.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like. In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the measurement to form a multi-dimensional sound signature may be provided. The methods and systems may include initiating a sound at a first location in a space, measuring more than one dimension of the resulting sound at a second location in the space, and storing the measurements in a storage medium to form a multi-dimensional sound signature for the second location in the space.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like. In embodiments, the sound may be characterized by a single frequency.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron, as well as a subwoofer, a dodecahedral speaker, a dodecahedral speaker and a subwoofer, a microphone, a directional microphone, and the like.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the measurements to form a multi-dimensional sound signature may be provided. The methods and systems may include initiating a sound at a first location in a space, measuring more than one dimension of the resulting sound at a second location in the space, and storing the measurements in a storage medium to form a multi-dimensional sound signature for the second location in the space. The multi-dimensional sound signature may define a preferential order for reception of sound from a plurality of incidence directions.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like. In embodiments, the sound may be characterized by a single frequency.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron, as well as a subwoofer, a dodecahedral speaker, a dodecahedral speaker and a subwoofer, a microphone, a directional microphone, and the like.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the multi-dimensional sound signatures for each of the plurality of locations in accordance with various embodiments of the present invention may be provided. The methods and systems may include creating a multi-dimensional sound signature composite for a space by determining a multi-dimensional sound signature for each of a plurality of locations in the space, and storing the multi-dimensional sound signatures for each of the plurality of locations using a storage medium to form the multi-dimensional sound signature composite for the space. Each multi-dimensional sound signature may be determined by initiating a sound at a constant location in the space and measuring more than one dimension of the resulting sound at each of the plurality of locations in the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, attenuation, frequency, frequency distribution, pitch, time, time lag, delay, loudness at a frequency, clarity, timbre, arrival time, azimuth, elevation, path length, amplitude, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the multi-dimensional sound signatures for each of the plurality of locations in accordance with various embodiments of the present invention may be provided. The methods and systems may include creating a multi-dimensional sound signature composite for a space by determining a multi-dimensional sound signature for each of a plurality of locations in the space, and storing the multi-dimensional sound signatures for each of the plurality of locations using a storage medium to form the multi-dimensional sound signature composite for the space. The multi-dimensional sound signature composite may define a preferential order for reception of sound from a plurality of incidence directions. Each multi-dimensional sound signature may be determined by initiating a sound at a constant location in the space and measuring more than one dimension of the resulting sound at each of the plurality of locations in the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location. In embodiments, the space may be a great hall, a jewel box, and the like.

In embodiments, methods and systems for storing the multi-dimensional sound signatures for a plurality of locations within the space in respect of sound initiated at a source location within the space may be provided. The multi-dimensional sound signatures may be stored in a multi-dimensional sound signature composite for a space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the multi-dimensional sound signatures for a plurality of locations within the space in respect of sound initiated at a source location within the space may be provided. The multi-dimensional sound signatures may be stored in a multi-dimensional sound signature composite for a space. The multi-dimensional sound signature composite may define a preferential order for reception of sound from a plurality of incidence directions.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the measurements for each other location to form a multi-dimensional sound signature composite for the space may be provided. The methods and systems may include initiating a sound at a first location in a space, measuring more than one dimension of the resulting sound at a plurality of other locations in the space, and storing the measurements for each other location in a storage medium to form a multi-dimensional sound signature composite for the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience. In embodiments, the space may be a great hall, a jewel box, and the like.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, methods and systems for storing the measurements for each other location to form a multi-dimensional sound signature composite for the space may be provided. The methods and systems may include initiating a sound at a first location in a space, measuring more than one dimension of the resulting sound at a plurality of other locations in the space, and storing the measurements for each other location in a storage medium to form a multi-dimensional sound signature composite for the space. The multi-dimensional sound signature composite may define a preferential order for reception of sound from a plurality of incidence directions. In embodiments, the space may be a great hall, a jewel box, and the like.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures in accordance with various embodiments of the present invention may be provided. The methods and systems may include creating a multi-dimensional sound signature composite for a space by determining a plurality of multi-dimensional sound signatures for a location in the space, and storing the multi-dimensional sound signatures using a storage medium to form the multi-dimensional sound signature composite for the space. Each multi-dimensional sound signature may be determined by initiating a sound at one of a plurality of other locations in the space and measuring more than one dimension of the resulting sound at the location in the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience. In embodiments, the space may be a great hall, a jewel box, and the like.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures to form the multi-dimensional sound signature composite for the space may be provided. The methods and systems may include creating a multi-dimensional sound signature composite for a space, and storing the multi-dimensional sound signatures using a storage medium to form the multi-dimensional sound signature composite for the space. The multi-dimensional sound signature composite may define a preferential order for reception of sound from a plurality of incidence directions, by determining a plurality of multi-dimensional sound signatures for a location in the space. Each multi-dimensional sound signature may be determined by initiating a sound at one of a plurality of other locations in the space and measuring more than one dimension of the resulting sound at the location in the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience. In embodiments, the space may be a great hall, a jewel box, and the like.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a location within the space in respect of sound initiated at a plurality of source locations within the space may be provided. The multi-dimensional sound signatures may be stored in a multi-dimensional sound signature composite for a space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience. In embodiments, the space may be a great hall, a jewel box, and the like.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a location within the space in respect of sound initiated at a plurality of source locations within the space may be provided. The multi-dimensional sound signatures may be stored in a multi-dimensional sound signature composite for a space. The multi-dimensional sound signatures may define a preferential order for reception of sound from a plurality of incidence directions.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience. In embodiments, the space may be a great hall, a jewel box, and the like.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature composite for the space may be provided. The methods and systems may include measuring more than one dimension of the sound at a location in a space resulting from sound initiated at a plurality of other locations in the space, and storing the measurements in a storage medium to form a multi-dimensional sound signature composite for the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience. In embodiments, the space may be a great hall, a jewel box, and the like.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature composite for the space may be provided. The methods and systems may include measuring more than one dimension of the sound at a location in a space resulting from sound initiated at a plurality of other locations in the space and storing the measurements in a storage medium to form a multi-dimensional sound signature composite for the space. The multi-dimensional sound signature composite may define a preferential order for reception of sound from a plurality of incidence directions.

In embodiments, methods and systems for storing the multi-dimensional sound signatures to form the multi-dimensional sound signature composite for the space may be provided. The methods and systems may include creating a multi-dimensional sound signature composite for a space and storing the multi-dimensional sound signatures using a storage medium to form the multi-dimensional sound signature composite for the space. The multi-dimensional sound signature composite for a space may be created by determining a plurality of multi-dimensional sound signatures for a location in the space, and determining a multi-dimensional sound signature for each of a plurality of locations in the space. Each multi-dimensional sound signature may be determined by initiating a sound at one of a plurality of other locations in the space and measuring more than one dimension of the resulting sound at the location in the space. Each multi-dimensional sound signature may be determined by initiating a sound at a constant location in the space and measuring more than one dimension of the resulting sound at each of the plurality of locations in the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures to form the multi-dimensional sound signature composite for the space may be provided. The methods and systems may include creating a multi-dimensional sound signature composite for a space and storing the multi-dimensional sound signatures using a storage medium to form the multi-dimensional sound signature composite for the space. The multi-dimensional sound signature composite may define a preferential order for reception of sound from a plurality of incidence directions. The multi-dimensional sound signature composite may be created by determining a plurality of multi-dimensional sound signatures for a location in the space and determining a multi-dimensional sound signature for each of a plurality of locations in the space. Each multi-dimensional sound signature may be determined by initiating a sound at one of a plurality of other locations in the space and measuring more than one dimension of the resulting sound at the location in the space. Each multi-dimensional sound signature may be determined by initiating a sound at a constant location in the space and measuring more than one dimension of the resulting sound at each of the plurality of locations in the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing multi-dimensional sound signatures for a location within the space in respect of sound initiated at a plurality of source locations within the space may be provided. The multi-dimensional sound signatures for the location may be stored in the multi-dimensional sound signature composite. In embodiments, methods and systems for storing multi-dimensional sound signatures for a plurality of locations within the space in respect of sound initiated at a source location within the space may be provided. The multi-dimensional sound signatures for the plurality of locations may be stored in the multi-dimensional sound signature composite.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a location within the space in respect of sound initiated at a plurality of source locations within the space may be provided. The multi-dimensional sound signatures may be stored in a multi-dimensional sound signature composite for a space. The multi-dimensional sound signature composite may define a preferential order for reception of sound from a plurality of incidence directions. In embodiments, methods and system for storing the multi-dimensional sound signatures for a plurality of locations within the space in respect of sound initiated at a source location within the space may be provided.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature composite for the space may be provided. The methods and systems may include measuring more than one dimension of the sound at a location in a space resulting from sound initiated at a plurality of other locations in the space, initiating a sound at a first location in a space and measuring more than one dimension of the resulting sound at a plurality of other locations in the space, and storing the measurements in a storage medium to form a multi-dimensional sound signature composite for the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature composite for the space. The methods and systems may include measuring more than one dimension of the sound at a location in a space resulting from sound initiated at a plurality of other locations in the space, initiating a sound at a first location in a space and measuring more than one dimension of the resulting sound at a plurality of other locations in the space, and storing the measurements in a storage medium to form a multi-dimensional sound signature composite for the space. The multi-dimensional sound signature composite may define a preferential order for reception of sound from a plurality of incidence directions.

In embodiments, methods and systems for storing the multi-dimensional sound signature in accordance with various embodiments of the present invention may be provided. The methods and systems may include determining a multi-dimensional sound signature for a location within a hypothetical space by computing and storing the multi-dimensional sound signature in a storage medium. The computing of the multi-dimensional sound signature may include simulating the initiation of a sound at a first location in the space and measuring more than one dimension of the resulting sound at a second location in the hypothetical space. Such simulation may be performed using a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions.

In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature may be provided. The methods and systems may include simulating the initiation of a sound at a first location in a hypothetical space, simulating the measurement of more than one dimension of the resulting sound at a second location in the hypothetical space, and storing the measurements in a storage medium to form a multi-dimensional sound signature for the second location in the hypothetical space. In embodiments, the simulation may be performed by a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for each of the plurality of locations to form the multi-dimensional sound signature composite may be provided. The methods and systems may include creating a multi-dimensional sound signature composite for a hypothetical space by determining a multi-dimensional sound signature for each of a plurality of locations in the hypothetical space and storing the multi-dimensional sound signatures for each of the plurality of locations using a storage medium to form the multi-dimensional sound signature composite for the hypothetical space. Each multi-dimensional sound signature may be determined by simulating the initiation of a sound at a constant location in the space and measuring more than one dimension of the resulting sound at each of the plurality of locations in the hypothetical space. Simulation may be performed using a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a plurality of locations within the space in respect of sound initiated at a source location within the space may be provided. The multi-dimensional sound signatures may be stored in a multi-dimensional sound signature composite for a hypothetical space. The multi-dimensional sound signatures may be generated using a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space.

In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements for each other location to form a multi-dimensional sound signature composite for the hypothetical space may be provided. The methods and systems may include simulating the initiation of a sound at a first location in a hypothetical space, simulating the measurement of more than one dimension of the resulting sound at a plurality of other locations in the hypothetical space, and storing the measurements for each other location in a storage medium to form a multi-dimensional sound signature composite for the hypothetical space. The simulation may be performed using a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures to form the multi-dimensional sound signature composite for the hypothetical space may be provided. The methods and systems may include creating a multi-dimensional sound signature composite for a hypothetical space by determining a plurality of multi-dimensional sound signatures for a location in the hypothetical space and storing the multi-dimensional sound signatures using a storage medium to form the multi-dimensional sound signature composite for the hypothetical space. Each multi-dimensional sound signature determined by simulating the initiation of a sound at one of a plurality of other locations in the hypothetical space and measuring of more than one dimension of the resulting sound at the location in the hypothetical space. The simulation may be performed using a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a location within the hypothetical space in respect of sound initiated at a plurality of source locations within the hypothetical space may be provided. The multi-dimensional sound signatures may be stored in a multi-dimensional sound signature composite for a hypothetical space. The multi-dimensional sound signatures may be generated using a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature composite for the hypothetical space may be provided. The methods and systems may include measuring more than one dimension of the sound at a location in a hypothetical space resulting from sound initiated at a plurality of other locations in the hypothetical space and storing the measurements in a storage medium to form a multi-dimensional sound signature composite for the hypothetical space. The measurement and initiation may be simulated through the use of a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures to form the multi-dimensional sound signature composite for the space. The methods and systems may include creating a multi-dimensional sound signature composite for a hypothetical space and storing the multi-dimensional sound signatures using a storage medium to form the multi-dimensional sound signature composite for the space. The creating a multi-dimensional sound signature composite may be created by determining a plurality of multi-dimensional sound signatures for a location in the hypothetical space and determining a multi-dimensional sound signature for each of a plurality of locations in the hypothetical space. Each multi-dimensional sound signature may be determined by initiating a sound at one of a plurality of other locations in the hypothetical space and measuring more than one dimension of the resulting sound at the location in the hypothetical space. Such measurement and initiation may be simulated through the use of a computer processor. Each multi-dimensional sound signature may be determined by initiating a sound at a constant location in the hypothetical space and measuring more than one dimension of the resulting sound at each of the plurality of locations in the hypothetical space. Such measurement and initiation may be simulated through the use of a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a location within the hypothetical space in respect of sound initiated at a plurality of source locations within the hypothetical space may be provided. The multi-dimensional sound signatures may be stored in a multi-dimensional sound signature composite for a space. In embodiments, methods and systems for storing the multi-dimensional sound signatures for a plurality of locations within the hypothetical space in respect of sound initiated at a source location within the hypothetical space may be provided.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature composite for the hypothetical space may be provided. The methods and systems may include simulating the measurement of more than one dimension of the sound at a location in a hypothetical space resulting from sound initiated at a plurality of other locations in the hypothetical space, simulating the initiation of a sound at a first location in a hypothetical space, simulating the measurement of more than one dimension of the resulting sound at a plurality of other locations in the hypothetical space, and storing the measurements in a storage medium to form a multi-dimensional sound signature composite for the hypothetical space. The stated simulation may be done using a computer processor.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency. In embodiments, the sound may not be initiated but may be a sound source inherent to the space. In embodiments, the sound may not be initiated but may be generated by at least one sound source inherent to the space. In embodiments, the sound may be initiated by at least one sound source inherent to the space.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signature in accordance with various embodiments of the present invention may be provided. The methods and systems may include determining a multi-dimensional sound signature for a location within a space by measuring the multi-dimensional sound signature and storing the multi-dimensional sound signature using a storage medium. The measurement of multi-dimensional sound signature and may include measuring more than one dimension of the sound at a location in the space resulting from the inherent ambient sound of the space to form for such location the multi-dimensional sound signature.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early decay time, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature for the location in the space may be provided. The methods and systems may include preserving the inherent ambient sound of a space, measuring more than one dimension of the sound at a location in the space, and storing the measurements in a storage medium to form a multi-dimensional sound signature for the location in the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for each of the plurality of locations to form the multi-dimensional sound signature composite for the space may be provided. The methods and systems may include creating a multi-dimensional sound signature composite for a space by determining a multi-dimensional sound signature for each of a plurality of locations in the space and storing the multi-dimensional sound signatures for each of the plurality of locations using a storage medium to form the multi-dimensional sound signature composite for the space. Each multi-dimensional sound signature may be determined by measuring more than one dimension of the sound at each of the plurality of locations in the space resulting from the inherent ambient sound of the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a plurality of locations within the space in respect of the inherent ambient sound of the space may be provided. The methods and systems may include preserving the inherent ambient sound of a space, measuring more than one dimension of the resulting sound at a plurality of locations in the space, and storing the measurements for each location in a storage medium to form a multi-dimensional sound signature composite for the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures to form the multi-dimensional sound signature composite for the space may be provided. The methods and systems may include creating a multi-dimensional sound signature composite for a space by determining a plurality of multi-dimensional sound signatures for a location in the space and storing the multi-dimensional sound signatures using a storage medium to form the multi-dimensional sound signature composite for the space. Each multi-dimensional sound signature may be determined measuring more than one dimension of the sound at the location in the space resulting from the inherent ambient sound of the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the multi-dimensional sound signatures for a location within the space in respect of the inherent ambient sound of the space. The multi-dimensional sound signatures may be stored in a multi-dimensional sound signature composite for a space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions. In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for storing the measurements to form a multi-dimensional sound signature composite for the space may be provided. The methods and systems may include measuring more than one dimension of the sound at a location in a space resulting from the inherent ambient sound of the space and storing the measurements in a storage medium to form a multi-dimensional sound signature composite for the space.

In embodiments, methods and systems for storing the multi-dimensional sound signatures to form the multi-dimensional sound signature composite for the space may be provided. The methods and systems may include creating a multi-dimensional sound signature composite for a space and storing the multi-dimensional sound signatures using a storage medium to form the multi-dimensional sound signature composite for the space. The multi-dimensional sound signature composite may be created by determining a plurality of multi-dimensional sound signatures for a location in the space and determining a multi-dimensional sound signature for each of a plurality of locations in the space. Each multi-dimensional sound signature may be determined by measuring more than one dimension of the sound at the location in the space resulting from the inherent ambient sound of the space. Each multi-dimensional sound signature may be determined by measuring more than one dimension of the sound at each of the plurality of locations in the space resulting from the inherent ambient sound of the space.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

In embodiments, the multi-dimensional sound signature may consist of multiple sound vectors. Each sound vector may represent the incidence of sound at the second location from a direction defined by three spatial dimensions. Each sound vector may include the time lag and loudness at a frequency from the direction. In embodiments, the multi-dimensional sound signature may consist of multiple sound vectors. Each sound vector may represent the incidence of sound at the second location from a direction defined by three spatial dimensions. Each sound vector may include the time lag and loudness from the direction. In embodiments, more than one dimension may include direction defined by three spatial dimensions, time lag and amplitude. In embodiments, more than one dimension may include loudness amplitude and time-lag defined by three spatial dimensions.

In embodiments, the dimension may be the difference in the timing of arrival of sound at the second location from different directions. In embodiments, the dimension may be the difference between the timing of arrival of reflected sound versus sound traveling directly from the first location to the second location. In embodiments, the dimension may be the difference in the amplitude of the sound arriving at the second location from different directions. In embodiments, the dimension may be the difference between the amplitude of reflected sound versus sound traveling directly from the first location to the second location. In embodiments, the multi-dimensional sound signature may associate a timing range for each incidence direction following reflection relative to sound reaching each location without reflection. In embodiments, the multi-dimensional sound signature may associate a timing range for each incidence direction following reflection relative to a time in which the sound was created. In embodiments, the multi-dimensional sound signature may define a preferential timing for reception of sound from a plurality of incidence directions. In embodiments, the multi-dimensional sound signature may define a preferential order for reception of sound from a plurality of incidence directions.

In embodiments, the dimension may be a direction, intensity, amplitude, attenuation, frequency, frequency distribution, pitch, time, time lag, delay, loudness at a frequency, clarity, timbre, arrival time, azimuth, elevation, path length, reverberation time (RT), early decay time (EDT), early to late sound index, early lateral energy fraction (LF), total relative sound level (G), integrated energy, sound pressure, early to late arriving sound energy ratio, definition, early to total sound energy ratio, and the like. In embodiments, the dimension may be a direction defined by three spatial dimensions.

In embodiments, the sound may be audible, inaudible, a multi-frequency sound, and the like.

In embodiments, the sound may be characterized by a single frequency.

In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the above stated methods may be repeated at 15 degree increments. In embodiments, the above stated methods may be repeated at increments of 15 degrees approximately. In embodiments, the angular separation granulation for vector representation may be 15 degrees.

In embodiments, methods and systems for combining multi-dimensional sound signature composites into a single multi-dimensional sound signature composite may be provided. The methods and systems may include creating a creating a multi-dimensional sound signature composite for a first space, creating a multi-dimensional sound signature composite for a second space, and combining multi-dimensional sound signature composites for a the first and second space into a single multi-dimensional sound signature composite. The range of values for each dimension may include values of such dimensions derived from each of the first and second space.

In embodiments, the first space multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the second space multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like. In embodiments, the first and second spaces may share similar acoustic properties and may be used for the performance of the same genre of music. In embodiments, the sounds initiated in the first and second spaces may be similar.

In embodiments, the range of values for each dimension may include the values for each of the first and second space. In embodiments, the acoustic properties represented by the single combined multi-dimensional sound signature composite may be superior to those of any of the individual spaces. In embodiments, for a given purpose, the acoustic properties represented by the single combined multi-dimensional sound signature composite may be superior to those of any of the individual spaces. In embodiments, the first and second spaces may share similar geometric properties.

In embodiments, methods and systems for combining multi-dimensional sound signature composites into a single multi-dimensional sound signature composite may be provided. The methods and systems may include creating multi-dimensional sound signature composites for a plurality of spaces and combining the multi-dimensional sound signature composites into a single multi-dimensional sound signature composite representing the range of values for each dimension included in the multi-dimensional sound signature composites for the plurality of spaces.

In embodiments, the first space multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the second space multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like. In embodiments, the first and second spaces may share similar acoustic properties and may be used for the performance of the same genre of music. In embodiments, the sounds initiated in the first and second spaces may be similar.

In embodiments, the range of values for each dimension may include the values for each of the first and second space. In embodiments, the acoustic properties represented by the single combined multi-dimensional sound signature composite may be superior to those of any of the individual spaces. In embodiments, for a given purpose, the acoustic properties represented by the single combined multi-dimensional sound signature composite may be superior to those of any of the individual spaces. In embodiments, the first and second spaces may share similar geometric properties.

In embodiments, methods and systems for decomposing the multi-dimensional sound signature composites may be provided. The methods and systems may include creating a multi-dimensional sound signature composite containing multi-dimensional sound data corresponding to a plurality of locations and decomposing the multi-dimensional sound signature composite into two or more multi-dimensional sound signature sub-composites. Each sub-composite corresponding to at least one selected location in the plurality of locations.

In embodiments, the multi-dimensional sound signature composite may be a space; a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, each sub-composite may correspond to at least one selected location in the number of locations. In embodiments, the at least one selected location may correspond to a space, a physical space, a zone of a space, a region of a space, a range of seats in a space, a stage contained in a space, an auditorium contained in a space, and the like.

In embodiments, methods and systems for modifying the space may be provided. The methods and systems may include determining a multi-dimensional sound signature for a location within a space, comparing the multi-dimensional sound signature to a known multi-dimensional sound signature, and modifying the space such that the similarity between the multi-dimensional sound signature for the location within the modified space and the known multi-dimensional sound signature may be increased.

In embodiments, the similarity may be increased for one dimension of the multi-dimensional sound signature, at least one dimension of the multi-dimensional sound signature, and the like. In embodiments, the space may be modified by the construction of fixtures designed to create reflections of sound within a defined range of time, amplitude and direction. In embodiments, the space may be modified by adding fixtures designed to create reflections of sound within a defined range of time, amplitude and direction. In embodiments, the space may be modified by removing fixtures designed to create reflections of sound within a defined range of time, amplitude and direction. In embodiments, the space may be modified by moving fixtures designed to create reflections of sound within a defined range of time, amplitude and direction. In embodiments, the range may be defined based on a preferred, multi-dimensional sound signature. In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like.

In embodiments, the known multi-dimensional sound signature may be an actual multi-dimensional sound signature for a location in another space, an idealized multi-dimensional sound signature, and the like In embodiments, the known multi-dimensional sound signature may result from manipulation of at least one other multi-dimensional sound signature. In embodiments, the known multi-dimensional sound signature may be for a location in a hypothetical space.

In embodiments, methods and systems for modifying the space may be provided. The methods and systems may include determining a multi-dimensional sound signature composite for a space, comparing the multi-dimensional sound signature composite to a known multi-dimensional sound signature composite, and modifying the space such that the similarity between the multi-dimensional sound signature composite for the modified space and the known multi-dimensional sound signature may be increased.

In embodiments, the space may correspond to the Great Hall and the known multi-dimensional sound signature composite may correspond to the Great Hall multi-dimensional sound signature composite. In embodiments, the space may correspond to the Jewel Box and the known multi-dimensional sound signature composite may correspond to the Jewel Box multi-dimensional sound signature composite. In embodiments, the similarity may be increased for one dimension of the multi-dimensional sound signature composite. In embodiments, the similarity may be increased for one or more dimensions of the multi-dimensional sound signature composite. In embodiments, the similarity may be increased for one location in the space. In embodiments, the similarity may be increased for at least one location in the space. In embodiments, the space may be modified by the construction of fixtures designed to create reflections of sound within a defined range of time, amplitude and direction. In embodiments, the space may be modified by adding fixtures designed to create reflections of sound within a defined range of time, amplitude and direction. In embodiments, the space may be modified by removing fixtures designed to create reflections of sound within a defined range of time, amplitude and direction. In embodiments, the space may be modified by moving fixtures designed to create reflections of sound within a defined range of time, amplitude and direction. In embodiments, the range may be defined based on a preferred, multi-dimensional sound signature. In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like.

In embodiments, the known multi-dimensional sound signature composite may be an actual multi-dimensional sound signature composite for another space. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for modifying the hypothetical space may be provided. The methods and systems may include determining a multi-dimensional sound signature for a location within a hypothetical space, comparing the multi-dimensional sound signature to a known multi-dimensional sound signature, and modifying the hypothetical space such that the similarity between the multi-dimensional sound signature for the location within the modified hypothetical space and the known multi-dimensional sound signature is increased.

In embodiments, the similarity may be increased for one dimension of the multi-dimensional sound signature. In embodiments, the similarity may be increased for at least one dimension of the multi-dimensional sound signature. In embodiments, the modification may include altering the design of the hypothetical space. In embodiments, the hypothetical space may be modified by the construction of fixtures designed to create reflections of sound within a defined range of time, amplitude and direction. In embodiments, the hypothetical space may be modified by adding fixtures designed to create reflections of sound within a defined range of time, amplitude and direction. In embodiments, the hypothetical space may be modified by removing fixtures designed to create reflections of sound within a defined range of time, amplitude and direction. In embodiments, the hypothetical space may be modified by moving fixtures designed to create reflections of sound within a defined range of time, amplitude and direction. In embodiments, the range may be defined based on a preferred, multi-dimensional sound signature. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like.

In embodiments, the known multi-dimensional sound signature may be an actual multi-dimensional sound signature for a location in another space. In embodiments, the known multi-dimensional sound signature may result from manipulation of at least one other multi-dimensional sound signature. In embodiments, the known multi-dimensional sound signature may be an idealized multi-dimensional sound signature. In embodiments, the known multi-dimensional sound signature may be a multi-dimensional sound signature for a location in a hypothetical space.

In embodiments, methods and systems for modifying the hypothetical space may be provided. The methods and systems may include determining a multi-dimensional sound signature composite for a hypothetical space, comparing the multi-dimensional sound signature composite to a known multi-dimensional sound signature composite, and modifying the hypothetical space such that the similarity between the multi-dimensional sound signature composite for the modified hypothetical space and the known multi-dimensional sound signature is increased.

In embodiments, the similarity may be increased for one dimension of the multi-dimensional sound signature composite. In embodiments, the similarity may be increased for at least one dimension of the multi-dimensional sound signature composite. In embodiments, the similarity may be increased for one location in the hypothetical space. In embodiments, the similarity may be increased for at least one location in the hypothetical space. In embodiments, the modification may include altering the design of the hypothetical space. In embodiments, the hypothetical space may be modified by the construction of fixtures designed to create reflections of sound within a defined range of time, amplitude and direction. In embodiments, the hypothetical space may be modified by adding fixtures designed to create reflections of sound within a defined range of time, amplitude and direction. In embodiments, the hypothetical space may be modified by removing fixtures designed to create reflections of sound within a defined range of time, amplitude and direction. In embodiments, the hypothetical space may be modified by moving fixtures designed to create reflections of sound within a defined range of time, amplitude and direction. In embodiments, the range may be defined based on a preferred, multi-dimensional sound signature. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like.

In embodiments, the known multi-dimensional sound signature composite may be an actual multi-dimensional sound signature composite for another space. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for modifying the space to increase the number of locations within the space may be provided. The methods and systems may include determining a multi-dimensional sound signature composite for a space, comparing the multi-dimensional sound signature composite to a known multi-dimensional sound signature composite, and modifying the space to increase the number of locations within the space that fall within the known multi-dimensional sound signature composite.

In embodiments, the number of locations falling within the known multi-dimensional sound signature may be increased for a dimension. In embodiments, the number of locations falling within the known multi-dimensional sound signature may be increased for more than one dimension. In embodiments, the space may be modified by the construction of fixtures designed to create reflections of sound within a defined range of time, amplitude and direction. In embodiments, the space may be modified by adding fixtures designed to create reflections of sound within a defined range of time, amplitude and direction. In embodiments, the space may be modified by removing fixtures designed to create reflections of sound within a defined range of time, amplitude and direction. In embodiments, the space may be modified by moving fixtures designed to create reflections of sound within a defined range of time, amplitude and direction. In embodiments, the range may be defined based on a preferred, multi-dimensional sound signature.

In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like. In embodiments, the known multi-dimensional sound signature composite may be an actual multi-dimensional sound signature composite for another space. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for modifying the space to increase the number of locations within the space may be provided. The methods and systems may include determining a multi-dimensional sound signature composite for a space, comparing the multi-dimensional sound signature composite to a known multi-dimensional sound signature composite, and modifying the space such that the number of locations within the space that fall within the known multi-dimensional sound signature composite may be maximized.

In embodiments, the number of locations falling within the known multi-dimensional sound signature may be increased for a dimension. In embodiments, the number of locations falling within the known multi-dimensional sound signature may be increased for more than one dimension. In embodiments, the space may be modified by the construction of fixtures designed to create reflections of sound within a defined range of time, amplitude and direction. In embodiments, the space may be modified by adding fixtures designed to create reflections of sound within a defined range of time, amplitude and direction. In embodiments, the space may be modified by removing fixtures designed to create reflections of sound within a defined range of time, amplitude and direction. In embodiments, the space may be modified by moving fixtures designed to create reflections of sound within a defined range of time, amplitude and direction. In embodiments, the range may be defined based on a preferred, multi-dimensional sound signature.

In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like. In embodiments, the known multi-dimensional sound signature composite may be an actual multi-dimensional sound signature composite for another space. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for modifying the space may be provided. The methods and systems may include determining a multi-dimensional sound signature composite for a space, comparing the multi-dimensional sound signature composite to a known multi-dimensional sound signature composite, computing the quotient of the number of locations within the space that fall within the known multi-dimensional sound signature composite divided by the number of locations common to both the space and the known multi-dimensional sound signature composite, and modifying the space such that the quotient may be increased.

In embodiments, the number of locations falling within the known multi-dimensional sound signature may be increased for a dimension. In embodiments, the number of locations falling within the known multi-dimensional sound signature may be increased for more than one dimension. In embodiments, the space may be modified by the construction of fixtures designed to create reflections of sound within a defined range of time, amplitude and direction. In embodiments, the space may be modified by adding fixtures designed to create reflections of sound within a defined range of time, amplitude and direction. In embodiments, the space may be modified by removing fixtures designed to create reflections of sound within a defined range of time, amplitude and direction. In embodiments, the space may be modified by moving fixtures designed to create reflections of sound within a defined range of time, amplitude and direction. In embodiments, the range may be defined based on a preferred, multi-dimensional sound signature.

In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like. In embodiments, the known multi-dimensional sound signature composite may be an actual multi-dimensional sound signature composite for another space. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for modifying the hypothetical space may be provided. The methods and systems may include determining a multi-dimensional sound signature composite for a hypothetical space, comparing the multi-dimensional sound signature composite to a known multi-dimensional sound signature composite, and modifying the hypothetical space to increase the number of locations within the hypothetical space that fall within the known multi-dimensional sound signature composite.

In embodiments, the number of locations falling within the known multi-dimensional sound signature may be increased for a dimension. In embodiments, the number of locations falling within the known multi-dimensional sound signature may be increased for more than one dimension. In embodiments, the modification may include altering the design of the hypothetical space. In embodiments, the hypothetical space may be modified by the construction of fixtures designed to create reflections of sound within a defined range of time, amplitude and direction. In embodiments, the hypothetical space may be modified by adding fixtures designed to create reflections of sound within a defined range of time, amplitude and direction. In embodiments, the hypothetical space may be modified by removing fixtures designed to create reflections of sound within a defined range of time, amplitude and direction. In embodiments, the hypothetical space may be modified by moving fixtures designed to create reflections of sound within a defined range of time, amplitude and direction.

In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like. In embodiments, the known multi-dimensional sound signature composite may be an actual multi-dimensional sound signature composite for another space. In embodiments, the known multi-dimensional sound signature composite results from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for modifying the hypothetical space may be provided. The methods and systems may include determining a multi-dimensional sound signature composite for a hypothetical space, comparing the multi-dimensional sound signature composite to a known multi-dimensional sound signature composite, and modifying the hypothetical space such that the number of locations within the hypothetical space that fall within the known multi-dimensional sound signature composite may be maximized.

In embodiments, the number of locations falling within the known multi-dimensional sound signature may be increased for a dimension. In embodiments, the number of locations falling within the known multi-dimensional sound signature may be increased for more than one dimension. In embodiments, the modification may include altering the design of the hypothetical space. In embodiments, the hypothetical space may be modified by the construction of fixtures designed to create reflections of sound within a defined range of time, amplitude and direction. In embodiments, the hypothetical space may be modified by adding fixtures designed to create reflections of sound within a defined range of time, amplitude and direction. In embodiments, the hypothetical space may be modified by removing fixtures designed to create reflections of sound within a defined range of time, amplitude and direction. In embodiments, the hypothetical space may be modified by moving fixtures designed to create reflections of sound within a defined range of time, amplitude and direction.

In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like. In embodiments, the known multi-dimensional sound signature composite may be an actual multi-dimensional sound signature composite for another space. In embodiments, the known multi-dimensional sound signature composite results from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for modifying the hypothetical space may be provided. The methods and space may include determining a multi-dimensional sound signature composite for a hypothetical space, comparing the multi-dimensional sound signature composite to a known multi-dimensional sound signature composite, computing the quotient of the number of locations within the hypothetical space that fall within the known multi-dimensional sound signature composite divided by the number of locations common to both the hypothetical space and the known multi-dimensional sound signature composite, and modifying the hypothetical space such that the quotient may be increased.

In embodiments, the number of locations falling within the known multi-dimensional sound signature may be increased for a dimension. In embodiments, the number of locations falling within the known multi-dimensional sound signature may be increased for more than one dimension. In embodiments, the modification may include altering the design of the hypothetical space. In embodiments, the hypothetical space may be modified by the construction of fixtures designed to create reflections of sound within a defined range of time, amplitude and direction. In embodiments, the hypothetical space may be modified by adding fixtures designed to create reflections of sound within a defined range of time, amplitude and direction. In embodiments, the hypothetical space may be modified by removing fixtures designed to create reflections of sound within a defined range of time, amplitude and direction. In embodiments, the hypothetical space may be modified by moving fixtures designed to create reflections of sound within a defined range of time, amplitude and direction.

In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, and the like. In embodiments, the known multi-dimensional sound signature composite may be an actual multi-dimensional sound signature composite for another space. In embodiments, the known multi-dimensional sound signature composite results from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the determined multi-dimensional sound signature composite may be a single source multi-dimensional sound signature composite. In embodiments, the determined multi-dimensional sound signature composite may be a multiple source multi-dimensional sound signature composite. In embodiments, the determined multi-dimensional sound signature composite may be a multiple source, multiple location, multi-dimensional sound signature composite. In embodiments, the determined multi-dimensional sound signature composite may be a hypothetical multi-dimensional sound signature composite. In embodiments, the determined multi-dimensional sound signature composite may be an ambient multi-dimensional sound signature composite. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for re-creating a known acoustic environment in a rehearsal space may be provided. The methods and systems may include determining the acoustic characteristics of the known environment, storing a multi-dimensional sound signature, determining the acoustic environment of the rehearsal space, comparing the determined acoustic environment of the rehearsal space with the stored multi-dimensional sound signature of the known space, and modifying the sound characteristics of the rehearsal space such as to reduce the differences between the acoustic environment of the rehearsal space and the multi-dimensional sound signature of the known space when a sound may be produced in the rehearsal space. The multi-dimensional sound signature may include a combination of a plurality of different sound dimensions selected from the group consisting of timing, direction, amplitude and frequency of sound reflections of the known acoustic environment.

In embodiments, the determination of the acoustic environment may include making a multi-dimensional sound measurement. In embodiments, determining the acoustic environment may include specifying a multi-dimensional sound signature. In embodiments, determining of the acoustic environment of the rehearsal space may include the creation of a multi-dimensional sound signature for the rehearsal space. In embodiments, the above stated comparing may include the comparison of the multi-dimensional sound signature of the rehearsal space with the multi-dimensional sound signature of the known space.

In embodiments, modifying the sound characteristics may include modifying a reflective characteristic of the rehearsal space. In embodiments, modifying the sound characteristics may include modifying an absorption characteristic of the rehearsal space. In embodiments, modifying the sound characteristics may include adjusting a sound system of the rehearsal space.

In embodiments, adjusting a sound system may include adjusting at least one of timing, location, direction and volume of at least one speaker in the space. In embodiments, adjusting a sound system may include adjusting a parameter of a sound mixing system. In embodiments, the parameter may include adjusting at least one of the timing, frequency, and volume of sound that will be played by at least one speaker. In embodiments, modifying the sound characteristics may include modifying at least one reflection to mimic at least one of a secondary and a tertiary reflection in the space. In embodiments, the sound dimensions of the sound signature composite may be selected from the group consisting of timing, direction, amplitude and frequency of reflections of sound associated with the known acoustic environment. In embodiments, reflections may include primary and secondary reflections from similar directions. In embodiments, reflections may include primary, secondary and tertiary reflections from similar directions. In embodiments, the determination of the acoustic environment of the rehearsal space may include the creation of a multi-dimensional sound signature for the rehearsal space. In embodiments, the above stated comparing may include the comparison of the multi-dimensional sound signature of the rehearsal space with the multi-dimensional sound signature of the known space.

In embodiments, the plurality of locations may be a plurality of sound initiation locations, a plurality of sound measurement locations, and the like. In embodiments, the plurality of locations may be a plurality of sound initiation locations and a plurality of sound measurement locations.

In embodiments, the space may be a substantially anechoic room, an anechoic room, a practice room, a rehearsal location, a virtual reality environment, a simulation environment, a computer gaming environment, a sound recording studio, and the like. In embodiments, the sound recording studio may include a sound mixing facility and a sound recording facility. In embodiments, the at least one speaker may be headphones, a surround sound system, a subwoofer, an array of speakers arranged to produce multi-dimensional sound in the space, a monitor, a monitor located on a stage.

In embodiments, the at least one microphone may include a direct input. In embodiments, the at least one microphone may include a direct input from a musical instrument. In embodiments, the reproduction may be in real-time. In embodiments, the reproduction may be substantially in real-time. In embodiments, the reproduction may be of live sound originating in the space. In embodiments, the reproduction may create the effect that a listener may be at a location of the known multi-dimensional sound signature. In embodiments, the reproduction may create the effect that a listener may be at a location of the known multi-dimensional sound signature and the listener may generate, at least in part, the sound contemporaneously originating in the space. In embodiments, the reproduction may create the effect that a listener may be at the location of the known multi-dimensional sound signature and the listener may generate, at least in part, the sound contemporaneously originating in the space, such that the reproduced version of the sound generated by the listener may be substantially as it would sound had the sound been generated at the location. In embodiments, the reproduction may create the effect that a listener may be at the location of the known multi-dimensional sound signature and the listener may generate, at least in part, the sound contemporaneously originating in the space, such that the reproduced version of the sound generated by the listener may be more similar to sound generated at the location.

In embodiments, the application of the known multi-dimensional sound signature may be performed with a computer processor. In embodiments, the modification may be performed with a computer processor, a sound mixing facility, a sound recording and playback facility, a sound processing facility. In embodiments, the sound processing facility may include a plurality of channels configured to adjust timing of sounds played from specified locations in the space.

In embodiments, the reproduction may be in real-time. In embodiments, the reproduction may be substantially in real-time. In embodiments, the reproduction may create the effect at each location in the space that a listener may be at a corresponding location of the space of the known multi-dimensional sound signature composite. In embodiments, the reproduction may create the effect at each location in the space that a listener may be at a corresponding location of the space of the known multi-dimensional sound signature composite and the listener may generate, at least in part, the sound contemporaneously originating in the space.

In embodiments, the reproduction may create the effect at each location in the space that a listener may be at a corresponding location of the space of the known multi-dimensional sound signature composite. The listener may generate, at least in part, the sound contemporaneously originating in the space, such that the reproduced version of the sound generated by the listener may be substantially as it would sound had the sound been generated in the space of the space of the known multi-dimensional sound signature composite.

In embodiments, the reproduction may create the effect that a listener may be at the location of the known multi-dimensional sound signature composite. The listener may generates, at least in part, the sound contemporaneously originating in the space, such that the reproduced version of the sound generated by the listener may be more similar to sound generated at the location.

In embodiments, the application of the known multi-dimensional sound signature may be performed with a computer processor.

In embodiments, the modification may be performed with a computer processor, a sound mixing facility, a sound recording and playback facility, a sound processing facility, and the like. The sound processing facility may include a plurality of channels configured to adjust timing of sounds played from specified locations in the space.

In embodiments, the known multi-dimensional sound signature may be for a location in an actual space, a hypothetical space, a location in the audience area of a space, a location in the stage area of a space, and the like.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for handling sound in a space equipped with a microphone and at least one speaker adapted to play sound from the microphone may be provided. The methods and systems may include determining a multi-dimensional sound signature for a location within the space, comparing the multi-dimensional sound signature to a known multi-dimensional sound signature, and modifying the sound emitted by the speaker such that the similarity between the multi-dimensional sound signature for the location within the space and the known multi-dimensional sound signature may be increased.

In embodiments, the space may be a substantially anechoic room, an anechoic room, a practice room, a rehearsal location, a virtual reality environment, a simulation environment, a computer gaming environment, a sound recording studio, and the like. In embodiments, the sound recording studio may include a sound mixing facility and a sound recording facility. In embodiments, the at least one speaker may be headphones, a surround sound system, a subwoofer, an array of speakers arranged to produce multi-dimensional sound in the space, a monitor, a monitor located on a stage.

In embodiments, the at least one microphone may include a direct input. In embodiments, the at least one microphone may include a direct input from a musical instrument. In embodiments, the reproduction may be in real-time. In embodiments, the reproduction may be substantially in real-time. In embodiments, the reproduction may be of live sound originating in the space. In embodiments, the reproduction may create the effect that a listener may be at a location of the known multi-dimensional sound signature. In embodiments, the reproduction may create the effect that a listener may be at a location of the known multi-dimensional sound signature and the listener may generate, at least in part, the sound contemporaneously originating in the space. In embodiments, the reproduction may create the effect that a listener may be at the location of the known multi-dimensional sound signature and the listener may generate, at least in part, the sound contemporaneously originating in the space, such that the reproduced version of the sound generated by the listener may be substantially as it would sound had the sound been generated at the location. In embodiments, the reproduction may create the effect that a listener may be at the location of the known multi-dimensional sound signature and the listener may generate, at least in part, the sound contemporaneously originating in the space, such that the reproduced version of the sound generated by the listener may be more similar to sound generated at the location.

In embodiments, the application of the known multi-dimensional sound signature may be performed with a computer processor. In embodiments, the modification may be performed with a computer processor, a sound mixing facility, a sound recording and playback facility, a sound processing facility. In embodiments, the sound processing facility may include a plurality of channels configured to adjust timing of sounds played from specified locations in the space.

In embodiments, the reproduction may be in real-time. In embodiments, the reproduction may be substantially in real-time. In embodiments, the reproduction may create the effect at each location in the space that a listener may be at a corresponding location of the space of the known multi-dimensional sound signature composite. In embodiments, the reproduction may create the effect at each location in the space that a listener may be at a corresponding location of the space of the known multi-dimensional sound signature composite and the listener may generate, at least in part, the sound contemporaneously originating in the space.

In embodiments, the reproduction may create the effect at each location in the space that a listener may be at a corresponding location of the space of the known multi-dimensional sound signature composite. The listener may generate, at least in part, the sound contemporaneously originating in the space, such that the reproduced version of the sound generated by the listener may be substantially as it would sound had the sound been generated in the space of the space of the known multi-dimensional sound signature composite.

In embodiments, the reproduction may create the effect that a listener may be at the location of the known multi-dimensional sound signature composite. The listener may generates, at least in part, the sound contemporaneously originating in the space, such that the reproduced version of the sound generated by the listener may be more similar to sound generated at the location.

In embodiments, the application of the known multi-dimensional sound signature may be performed with a computer processor.

In embodiments, the modification may be performed with a computer processor, a sound mixing facility, a sound recording and playback facility, a sound processing facility, and the like. The sound processing facility may include a plurality of channels configured to adjust timing of sounds played from specified locations in the space.

In embodiments, the known multi-dimensional sound signature may be for a location in an actual space, a hypothetical space, a location in the audience area of a space, a location in the stage area of a space, and the like.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and system for handling sound in a space equipped with a microphone and at least one speaker may be provided. The methods and systems may include reproducing sound contemporaneously originating in the space, using at least in part the microphone and the at least one speaker, in accordance with a known multi-sound signature for a location. Such reproduction may apply the known multi-dimensional sound signature to the reproduced sound. In embodiments, applying the known multi-dimensional sound signature may include adjusting at least one of the timing and volume of sound emitted by a speaker at a specified location within the space. In embodiments, timing of sounds emitted from speakers placed at rear and side locations in the space may be adjusted to increase similarity to timing of rear and side reflections specified in the multi-dimensional sound signature. In embodiments, the timing of sounds emitted from speakers placed at side locations may be adjusted to mimic primary and secondary side reflections specified in the multi-dimensional sound signature. In embodiments, the volume of sounds emitted from speakers placed at rear and side locations in the space may be adjusted to increase similarity to amplitude of rear and side reflections specified in the multi-dimensional sound signature.

In embodiments, the space may be a substantially anechoic room, an anechoic room, a practice room, a rehearsal location, a virtual reality environment, a simulation environment, a computer gaming environment, a sound recording studio, and the like. In embodiments, the sound recording studio may include a sound mixing facility and a sound recording facility. In embodiments, the at least one speaker may be headphones, a surround sound system, a subwoofer, an array of speakers arranged to produce multi-dimensional sound in the space, a monitor, a monitor located on a stage.

In embodiments, the at least one microphone may include a direct input. In embodiments, the at least one microphone may include a direct input from a musical instrument. In embodiments, the reproduction may be in real-time. In embodiments, the reproduction may be substantially in real-time. In embodiments, the reproduction may be of live sound originating in the space. In embodiments, the reproduction may create the effect that a listener may be at a location of the known multi-dimensional sound signature. In embodiments, the reproduction may create the effect that a listener may be at a location of the known multi-dimensional sound signature and the listener may generate, at least in part, the sound contemporaneously originating in the space. In embodiments, the reproduction may create the effect that a listener may be at the location of the known multi-dimensional sound signature and the listener may generate, at least in part, the sound contemporaneously originating in the space, such that the reproduced version of the sound generated by the listener may be substantially as it would sound had the sound been generated at the location. In embodiments, the reproduction may create the effect that a listener may be at the location of the known multi-dimensional sound signature and the listener may generate, at least in part, the sound contemporaneously originating in the space, such that the reproduced version of the sound generated by the listener may be more similar to sound generated at the location.

In embodiments, the application of the known multi-dimensional sound signature may be performed with a computer processor. In embodiments, the modification may be performed with a computer processor, a sound mixing facility, a sound recording and playback facility, a sound processing facility. In embodiments, the sound processing facility may include a plurality of channels configured to adjust timing of sounds played from specified locations in the space.

In embodiments, the reproduction may be in real-time. In embodiments, the reproduction may be substantially in real-time. In embodiments, the reproduction may create the effect at each location in the space that a listener may be at a corresponding location of the space of the known multi-dimensional sound signature composite. In embodiments, the reproduction may create the effect at each location in the space that a listener may be at a corresponding location of the space of the known multi-dimensional sound signature composite and the listener may generate, at least in part, the sound contemporaneously originating in the space.

In embodiments, the reproduction may create the effect at each location in the space that a listener may be at a corresponding location of the space of the known multi-dimensional sound signature composite. The listener may generate, at least in part, the sound contemporaneously originating in the space, such that the reproduced version of the sound generated by the listener may be substantially as it would sound had the sound been generated in the space of the space of the known multi-dimensional sound signature composite.

In embodiments, the reproduction may create the effect that a listener may be at the location of the known multi-dimensional sound signature composite. The listener may generates, at least in part, the sound contemporaneously originating in the space, such that the reproduced version of the sound generated by the listener may be more similar to sound generated at the location.

In embodiments, the application of the known multi-dimensional sound signature may be performed with a computer processor.

In embodiments, the modification may be performed with a computer processor, a sound mixing facility, a sound recording and playback facility, a sound processing facility, and the like. The sound processing facility may include a plurality of channels configured to adjust timing of sounds played from specified locations in the space.

In embodiments, the known multi-dimensional sound signature may be for a location in an actual space, a hypothetical space, a location in the audience area of a space, a location in the stage area of a space, and the like.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for re-creating a known acoustic environment in a rehearsal space may be provided. The methods and systems may include determining the acoustic characteristics of the known environment, storing a multi-dimensional sound signature composite, determining the acoustic environment of the rehearsal space, comparing the determined acoustic environment of the rehearsal space with the stored multi-dimensional sound signature composite of the known space and modifying the sound characteristics of the rehearsal space such as to reduce the differences between the acoustic environment of the rehearsal space and the multi-dimensional sound signature composite of the known space when a sound may be produced in the rehearsal space.

In embodiments, determining the acoustic environment may include making a multi-dimensional sound measurement. In embodiments, determining the acoustic environment may include specifying a multi-dimensional sound signature. In embodiments, determining may result in a multi-dimensional sound profile across a plurality of locations of the known acoustic environment. In embodiments, the multi-dimensional sound signature composite may include a combination of a plurality of different sound dimensions selected from the group consisting of timing, direction, amplitude and frequency of sound reflections of the known acoustic environment. In embodiments, the sound dimensions of the sound signature composite may be selected from the group consisting of timing, direction, amplitude and frequency of reflections of sound associated with the known acoustic environment. In embodiments, the reflections may include primary and secondary reflections from similar directions. In embodiments, the reflections may include primary, secondary and tertiary reflections from similar directions.

In embodiments, determining the acoustic environment of the rehearsal space may include the creation of a multi-dimensional sound signature for the rehearsal space. In embodiments, the stated comparing includes the comparison of the multi-dimensional sound signature of the rehearsal space with the multi-dimensional sound signature of the known space. In embodiments, the plurality of locations may be a plurality of sound initiation locations. In embodiments, the plurality of locations may be a plurality of sound measurement locations. In embodiments, the plurality of locations may be a plurality of sound initiation locations and a plurality of sound measurement locations.

In embodiments, the space may be a substantially anechoic room, an anechoic room, a practice room, a rehearsal location, a virtual reality environment, a simulation environment, a computer gaming environment, a sound recording studio, and the like. In embodiments, the sound recording studio may include a sound mixing facility and a sound recording facility. In embodiments, the at least one speaker may be headphones, a surround sound system, a subwoofer, an array of speakers arranged to produce multi-dimensional sound in the space, a monitor, a monitor located on a stage.

In embodiments, the at least one microphone may include a direct input. In embodiments, the at least one microphone may include a direct input from a musical instrument. In embodiments, the reproduction may be in real-time. In embodiments, the reproduction may be substantially in real-time. In embodiments, the reproduction may be of live sound originating in the space. In embodiments, the reproduction may create the effect that a listener may be at a location of the known multi-dimensional sound signature. In embodiments, the reproduction may create the effect that a listener may be at a location of the known multi-dimensional sound signature and the listener may generate, at least in part, the sound contemporaneously originating in the space. In embodiments, the reproduction may create the effect that a listener may be at the location of the known multi-dimensional sound signature and the listener may generate, at least in part, the sound contemporaneously originating in the space, such that the reproduced version of the sound generated by the listener may be substantially as it would sound had the sound been generated at the location. In embodiments, the reproduction may create the effect that a listener may be at the location of the known multi-dimensional sound signature and the listener may generate, at least in part, the sound contemporaneously originating in the space, such that the reproduced version of the sound generated by the listener may be more similar to sound generated at the location.

In embodiments, the application of the known multi-dimensional sound signature may be performed with a computer processor. In embodiments, the modification may be performed with a computer processor, a sound mixing facility, a sound recording and playback facility, a sound processing facility. In embodiments, the sound processing facility may include a plurality of channels configured to adjust timing of sounds played from specified locations in the space.

In embodiments, the reproduction may be in real-time. In embodiments, the reproduction may be substantially in real-time. In embodiments, the reproduction may create the effect at each location in the space that a listener may be at a corresponding location of the space of the known multi-dimensional sound signature composite. In embodiments, the reproduction may create the effect at each location in the space that a listener may be at a corresponding location of the space of the known multi-dimensional sound signature composite and the listener may generate, at least in part, the sound contemporaneously originating in the space.

In embodiments, the reproduction may create the effect at each location in the space that a listener may be at a corresponding location of the space of the known multi-dimensional sound signature composite. The listener may generate, at least in part, the sound contemporaneously originating in the space, such that the reproduced version of the sound generated by the listener may be substantially as it would sound had the sound been generated in the space of the space of the known multi-dimensional sound signature composite.

In embodiments, the reproduction may create the effect that a listener may be at the location of the known multi-dimensional sound signature composite. The listener may generates, at least in part, the sound contemporaneously originating in the space, such that the reproduced version of the sound generated by the listener may be more similar to sound generated at the location.

In embodiments, the application of the known multi-dimensional sound signature may be performed with a computer processor.

In embodiments, the modification may be performed with a computer processor, a sound mixing facility, a sound recording and playback facility, a sound processing facility, and the like. The sound processing facility may include a plurality of channels configured to adjust timing of sounds played from specified locations in the space.

In embodiments, the known multi-dimensional sound signature may be for a location in an actual space, a hypothetical space, a location in the audience area of a space, a location in the stage area of a space, and the like.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for handling sound in a space equipped with a microphone and at least one speaker adapted to play sound from the microphone may be provided. The methods and systems may include determining a multi-dimensional sound signature composite for the space, comparing the multi-dimensional sound signature composite to a known multi-dimensional sound signature composite, and modifying the sound emitted by the speaker such that the similarity between the multi-dimensional sound signature composite for the space and the known multi-dimensional sound signature composite may be increased.

In embodiments, the space may be a substantially anechoic room, an anechoic room, a practice room, a rehearsal location, a virtual reality environment, a simulation environment, a computer gaming environment, a sound recording studio, and the like. In embodiments, the sound recording studio may include a sound mixing facility and a sound recording facility. In embodiments, the at least one speaker may be headphones, a surround sound system, a subwoofer, an array of speakers arranged to produce multi-dimensional sound in the space, a monitor, a monitor located on a stage.

In embodiments, the at least one microphone may include a direct input. In embodiments, the at least one microphone may include a direct input from a musical instrument. In embodiments, the reproduction may be in real-time. In embodiments, the reproduction may be substantially in real-time. In embodiments, the reproduction may be of live sound originating in the space. In embodiments, the reproduction may create the effect that a listener may be at a location of the known multi-dimensional sound signature. In embodiments, the reproduction may create the effect that a listener may be at a location of the known multi-dimensional sound signature and the listener may generate, at least in part, the sound contemporaneously originating in the space. In embodiments, the reproduction may create the effect that a listener may be at the location of the known multi-dimensional sound signature and the listener may generate, at least in part, the sound contemporaneously originating in the space, such that the reproduced version of the sound generated by the listener may be substantially as it would sound had the sound been generated at the location. In embodiments, the reproduction may create the effect that a listener may be at the location of the known multi-dimensional sound signature and the listener may generate, at least in part, the sound contemporaneously originating in the space, such that the reproduced version of the sound generated by the listener may be more similar to sound generated at the location.

In embodiments, the application of the known multi-dimensional sound signature may be performed with a computer processor. In embodiments, the modification may be performed with a computer processor, a sound mixing facility, a sound recording and playback facility, a sound processing facility. In embodiments, the sound processing facility may include a plurality of channels configured to adjust timing of sounds played from specified locations in the space.

In embodiments, the reproduction may be in real-time. In embodiments, the reproduction may be substantially in real-time. In embodiments, the reproduction may create the effect at each location in the space that a listener may be at a corresponding location of the space of the known multi-dimensional sound signature composite. In embodiments, the reproduction may create the effect at each location in the space that a listener may be at a corresponding location of the space of the known multi-dimensional sound signature composite and the listener may generate, at least in part, the sound contemporaneously originating in the space.

In embodiments, the reproduction may create the effect at each location in the space that a listener may be at a corresponding location of the space of the known multi-dimensional sound signature composite. The listener may generate, at least in part, the sound contemporaneously originating in the space, such that the reproduced version of the sound generated by the listener may be substantially as it would sound had the sound been generated in the space of the space of the known multi-dimensional sound signature composite.

In embodiments, the reproduction may create the effect that a listener may be at the location of the known multi-dimensional sound signature composite. The listener may generates, at least in part, the sound contemporaneously originating in the space, such that the reproduced version of the sound generated by the listener may be more similar to sound generated at the location.

In embodiments, the application of the known multi-dimensional sound signature may be performed with a computer processor.

In embodiments, the modification may be performed with a computer processor, a sound mixing facility, a sound recording and playback facility, a sound processing facility, and the like. The sound processing facility may include a plurality of channels configured to adjust timing of sounds played from specified locations in the space.

In embodiments, the known multi-dimensional sound signature may be for a location in an actual space, a hypothetical space, a location in the audience area of a space, a location in the stage area of a space, and the like.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for handling sound in a space equipped with a microphone and at least one speaker may be provided. The methods and systems may include reproducing sound contemporaneously originating in the space using at least in part the microphone and the at least one speaker, in accordance with a known multi-dimensional sound signature composite. In embodiments, such reproduction may apply the known multi-dimensional sound signature composite to the reproduced sound. In embodiments, applying the known multi-dimensional sound signature may include adjusting at least one of the timing and volume of sound emitted by a speaker at a specified location within the space. In embodiments, timing of sounds emitted from speakers placed at rear and side locations in the space may be adjusted to increase similarity to timing of rear and side reflections specified in the multi-dimensional sound signature. In embodiments, timing of sounds emitted from speakers placed at side locations may be adjusted to mimic primary and secondary side reflections specified in the multi-dimensional sound signature. In embodiments, the volume of sounds emitted from speakers placed at rear and side locations in the space may be adjusted to increase similarity to amplitude of rear and side reflections specified in the multi-dimensional sound signature.

In embodiments, the space may be a substantially anechoic room, an anechoic room, a practice room, a rehearsal location, a virtual reality environment, a simulation environment, a computer gaming environment, a sound recording studio, and the like. In embodiments, the sound recording studio may include a sound mixing facility and a sound recording facility. In embodiments, the at least one speaker may be headphones, a surround sound system, a subwoofer, an array of speakers arranged to produce multi-dimensional sound in the space, a monitor, a monitor located on a stage.

In embodiments, the at least one microphone may include a direct input. In embodiments, the at least one microphone may include a direct input from a musical instrument. In embodiments, the reproduction may be in real-time. In embodiments, the reproduction may be substantially in real-time. In embodiments, the reproduction may be of live sound originating in the space. In embodiments, the reproduction may create the effect that a listener may be at a location of the known multi-dimensional sound signature. In embodiments, the reproduction may create the effect that a listener may be at a location of the known multi-dimensional sound signature and the listener may generate, at least in part, the sound contemporaneously originating in the space. In embodiments, the reproduction may create the effect that a listener may be at the location of the known multi-dimensional sound signature and the listener may generate, at least in part, the sound contemporaneously originating in the space, such that the reproduced version of the sound generated by the listener may be substantially as it would sound had the sound been generated at the location. In embodiments, the reproduction may create the effect that a listener may be at the location of the known multi-dimensional sound signature and the listener may generate, at least in part, the sound contemporaneously originating in the space, such that the reproduced version of the sound generated by the listener may be more similar to sound generated at the location.

In embodiments, the application of the known multi-dimensional sound signature may be performed with a computer processor. In embodiments, the modification may be performed with a computer processor, a sound mixing facility, a sound recording and playback facility, a sound processing facility. In embodiments, the sound processing facility may include a plurality of channels configured to adjust timing of sounds played from specified locations in the space.

In embodiments, the reproduction may be in real-time. In embodiments, the reproduction may be substantially in real-time. In embodiments, the reproduction may create the effect at each location in the space that a listener may be at a corresponding location of the space of the known multi-dimensional sound signature composite. In embodiments, the reproduction may create the effect at each location in the space that a listener may be at a corresponding location of the space of the known multi-dimensional sound signature composite and the listener may generate, at least in part, the sound contemporaneously originating in the space.

In embodiments, the reproduction may create the effect at each location in the space that a listener may be at a corresponding location of the space of the known multi-dimensional sound signature composite. The listener may generate, at least in part, the sound contemporaneously originating in the space, such that the reproduced version of the sound generated by the listener may be substantially as it would sound had the sound been generated in the space of the space of the known multi-dimensional sound signature composite.

In embodiments, the reproduction may create the effect that a listener may be at the location of the known multi-dimensional sound signature composite. The listener may generates, at least in part, the sound contemporaneously originating in the space, such that the reproduced version of the sound generated by the listener may be more similar to sound generated at the location.

In embodiments, the application of the known multi-dimensional sound signature may be performed with a computer processor.

In embodiments, the modification may be performed with a computer processor, a sound mixing facility, a sound recording and playback facility, a sound processing facility, and the like. The sound processing facility may include a plurality of channels configured to adjust timing of sounds played from specified locations in the space.

In embodiments, the known multi-dimensional sound signature may be for a location in an actual space, a hypothetical space, a location in the audience area of a space, a location in the stage area of a space, and the like.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite. In embodiments, the known multi-dimensional sound signature composite may be a multiple source multi-dimensional sound signature composite. In embodiments, the known multi-dimensional sound signature composite may be a multiple source, multiple location, multi-dimensional sound signature composite. In embodiments, the known multi-dimensional sound signature composite may be a hypothetical multi-dimensional sound signature composite. In embodiments, the known multi-dimensional sound signature composite may be an ambient multi-dimensional sound signature composite.

In embodiments, methods and systems for assisting a live performance in a performance space may be provided. The methods and systems may include determining a multi-dimensional sound signature for an audience location in the performance space, taking sound from the live performance, modifying the sound from the live performance to increase conformance to at least one dimension of the multi-dimensional sound signature determined at the audience location, and feeding the modified sound to at least one performer to facilitate adjustment of the live performance based on the sound experienced by an audience member.

In embodiments, methods and systems for re-creating a known acoustic environment in a performance space may be performed. The methods and systems may include determining the acoustic characteristics of the known environment, including determining a multi-dimensional sound profile, storing the multiple dimensions of the multi-dimensional sound profile as a multi-dimensional sound signature, determining the acoustic environment of a performance space, comparing the acoustic environment of the performance space with the stored multi-dimensional sound signature of the known space, and modifying the sound characteristics of the performance space such as to reduce the differences as determined in the comparison between the acoustic environment of the performance space and the multi-dimensional sound signature of the known space when a sound may be produced through the sound system of the performance space. In embodiments, the multi-dimensional sound signature may include a combination of a plurality of different sound parameters associated with sound reflections of the known acoustic environment.

In embodiments, the multiple dimensions of the sound signature may be selected from the group consisting of timing, direction, amplitude and frequency of reflections of sound associated with the known acoustic environment. In embodiments, the reflections may include primary and secondary reflections from similar directions.

In embodiments, the reflections may include primary, secondary and tertiary reflections from similar directions. In embodiments, the determining of the acoustic environment of the performance space may include the creation of a multi-dimensional sound signature for the performance space. In embodiments, the stated comparing may include the comparison of the multi-dimensional sound signature of the rehearsal space with the multi-dimensional sound signature of the known space. In embodiments, modifying the sound characteristics may include modifying a reflective characteristic of the rehearsal space. In embodiments, modifying the sound characteristics may include modifying an absorption characteristic of the rehearsal space. In embodiments, modifying the sound characteristics may include adjusting a sound system of the rehearsal space. In embodiments, adjusting a sound system may include adjusting at least one of timing, location, direction and volume of at least one speaker in the space. In embodiments, adjusting a sound system may include adjusting a parameter of a sound mixing system. In embodiments, the parameter may include adjusting at least one of the timing, frequency, and volume of sound that will be played by at least one speaker. In embodiments, modifying the sound characteristics may include modifying at least one reflection to mimic at least one of a secondary and a tertiary reflection in the space. In embodiments, determining the acoustic environment may include making a multi-dimensional sound measurement. In embodiments, determining the acoustic environment may include specifying a multi-dimensional sound signature.

In embodiments, the first location may be that of a performer. In embodiments, the first location may be on a stage located in the space. In embodiments, the second location may be that of an audience member. In embodiments, the second location may be in an auditorium of the space. In embodiments, the modification may be performed with a computer processor.

In embodiments, the space may be a performance space. In embodiments, the space may include a stage, a substantially anechoic room, an anechoic room, a practice room, a rehearsal location, a recording studio, a virtual reality environment, a simulation environment, a computer gaming environment, and the like. In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, a opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the at least one speaker may be a monitor, a monitor located on a stage. In embodiments, at least one speaker may be a headphone speaker. In embodiments, the at least one speaker may be a part of a surround sound system. In embodiments, the at least one speaker may include a subwoofer.

In embodiments, the at least one speaker may be part of an array of speakers arranged to produce multi-dimensional sound in the space.

In embodiments, the at least one microphone may include a direct input such as for a musical instrument.

In embodiments, methods and system of handling sound in a space equipped with a microphone and at least one speaker adapted to play sound from the microphone may be provided. The methods and systems may include determining the multi-dimensional sound signature for the first location within the space, determining the multi-dimensional sound signature for a second location within the space, comparing the multi-dimensional sound signature for the first and second locations, and modifying the sound emitted by the speaker such that the multi-dimensional sound signature for the first location may be modified to increase its similarity with the multi-dimensional sound signature for the second location.

In embodiments, determining the acoustic environment may include making a multi-dimensional sound measurement. In embodiments, determining the acoustic environment may include specifying a multi-dimensional sound signature.

In embodiments, the first location may be that of a performer. In embodiments, the first location may be on a stage located in the space. In embodiments, the second location may be that of an audience member. In embodiments, the second location may be in an auditorium of the space. In embodiments, the modification may be performed with a computer processor.

In embodiments, the space may be a performance space. In embodiments, the space may include a stage, a substantially anechoic room, an anechoic room, a practice room, a rehearsal location, a recording studio, a virtual reality environment, a simulation environment, a computer gaming environment, and the like. In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, a opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the at least one speaker may be a monitor, a monitor located on a stage. In embodiments, at least one speaker may be a headphone speaker. In embodiments, the at least one speaker may be a part of a surround sound system. In embodiments, the at least one speaker may include a subwoofer.

In embodiments, the at least one speaker may be part of an array of speakers arranged to produce multi-dimensional sound in the space.

In embodiments, the at least one microphone may include a direct input such as for a musical instrument.

In embodiments, methods and systems for re-creating a known acoustic environment in a performance space may be provided. The methods and systems may include determining the acoustic environment of the known space, storing the measurements as a multi-dimensional sound signature composite, measuring the acoustic environment of the performance space, comparing the measured acoustic environment of the performance space with the stored multi-dimensional sound signature composite of the known space, and modifying the sound characteristics of at least one sound system component of the performance space such as to minimize the differences as determined in the comparison between the acoustic environment of the performance space and the multi-dimensional sound signature composite of the known space when a sound may be produced through the sound system of the performance space. The multi-dimensional sound signature may include a combination of a plurality of different sound parameters associated with sound reflections of the known acoustic environment. The multi-dimensional sound signature composite may include a combination of a plurality of different measured sound dimensions. In embodiments, determining the acoustic environment may include making a multi-dimensional sound measurement. In embodiments, determining the acoustic environment may include specifying a multi-dimensional sound signature. In embodiments, determining of the acoustic environment of the performance space may include the creation of a multi-dimensional sound signature for the performance space. In embodiments, the stated comparing may include the comparison of the multi-dimensional sound signature of the performance space with the multi-dimensional sound signature of the known space.

In embodiments, the plurality of locations may be a plurality of sound initiation locations, a plurality of sound measurement locations, and the like. In embodiments, the plurality of locations may be a plurality of sound initiation locations and a plurality of sound measurement locations.

In embodiments, determining the acoustic environment may include making a multi-dimensional sound measurement. In embodiments, determining the acoustic environment may include specifying a multi-dimensional sound signature.

In embodiments, the first location may be that of a performer. In embodiments, the first location may be on a stage located in the space. In embodiments, the second location may be that of an audience member. In embodiments, the second location may be in an auditorium of the space. In embodiments, the modification may be performed with a computer processor.

In embodiments, the space may be a performance space. In embodiments, the space may include a stage, a substantially anechoic room, an anechoic room, a practice room, a rehearsal location, a recording studio, a virtual reality environment, a simulation environment, a computer gaming environment, and the like. In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, a opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the at least one speaker may be a monitor, a monitor located on a stage, and the like. In embodiments, at least one speaker may be a headphone speaker. In embodiments, the at least one speaker may be a part of a surround sound system. In embodiments, the at least one speaker may include a subwoofer.

In embodiments, the at least one speaker may be part of an array of speakers arranged to produce multi-dimensional sound in the space.

In embodiments, the at least one microphone may include a direct input such as for a musical instrument.

In embodiments, methods and systems for handling sound in a space equipped with a microphone and at least one speaker adapted to play sound from the microphone may be provided. The methods and system may include determining a multi-dimensional sound signature composite for the space, selecting a second location in the space, and modifying the sound emitted by the speaker such that the sound heard at the first location may be changed to increase its similarity with the sound heard at the second location with the use of the multi-dimensional sound signature composite.

In embodiments, determining the acoustic environment may include making a multi-dimensional sound measurement. In embodiments, determining the acoustic environment may include specifying a multi-dimensional sound signature.

In embodiments, the first location may be that of a performer. In embodiments, the first location may be on a stage located in the space. In embodiments, the second location may be that of an audience member. In embodiments, the second location may be in an auditorium of the space. In embodiments, the modification may be performed with a computer processor.

In embodiments, the space may be a performance space. In embodiments, the space may include a stage, a substantially anechoic room, an anechoic room, a practice room, a rehearsal location, a recording studio, a virtual reality environment, a simulation environment, a computer gaming environment, and the like. In embodiments, the space may be occupied or unoccupied. In embodiments, the space may be occupied by an audience. In embodiments, the space may be occupied by material approximating an audience.

In embodiments, the space may include both a stage and an auditorium. In embodiments, the space may include both a performance location and a performance observation location. In embodiments, the space may include a stage. A first and second location may be located on the stage. In embodiments, the space may include only a stage. In embodiments, the space may include only a performance location. In embodiments, the space may be less than all the volume of the structure housing the space. In embodiments, the space may be a subset of the structure housing the space. In embodiments, the space may be a Great Hall. In embodiments, the space may be an ante room, a choir box, a ball court, an organ church, a Bach organ church, a basilica, a baroque opera house, a opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like.

In embodiments, the at least one speaker may be a monitor, a monitor located on a stage. In embodiments, at least one speaker may be a headphone speaker. In embodiments, the at least one speaker may be a part of a surround sound system. In embodiments, the at least one speaker may include a subwoofer In embodiments, the at least one speaker may be part of an array of speakers arranged to produce multi-dimensional sound in the space. In embodiments, the at least one microphone may include a direct input such as for a musical instrument.

In embodiments, methods and systems for simulating an acoustic environment may be provided. The methods and systems may include determining the acoustic environment of a first space, including obtaining a multi-dimensional sound profile, storing the multiple dimensions of the multi-dimensional sound profile as a multi-dimensional sound signature, determining the acoustic environment of a second space, comparing the determined acoustic environment of the second space with the stored multi-dimensional sound signature of the first space, and modifying the sound characteristics of the second space such as to reduce the differences as determined in the comparison between the acoustic environment of the second space and the multi-dimensional sound signature of the first space. The multi-dimensional sound signature may include a combination of a plurality of different sound parameters. In embodiments, the multiple dimensions of the sound signature may be selected from the group consisting of timing, direction, amplitude and frequency of reflections of sound associated with the known acoustic environment. In embodiments, the reflections may include primary and secondary reflections from similar directions. In embodiments, the reflections may include primary, secondary and tertiary reflections from similar directions.

In embodiments, modifying the sound characteristics may include modifying a reflective characteristic of the rehearsal space. In embodiments, modifying the sound characteristics may include modifying an absorption characteristic of the rehearsal space. In embodiments, modifying the sound characteristics may include adjusting a sound system of the rehearsal space. In embodiments, adjusting a sound system may include adjusting at least one of timing, location, direction and volume of at least one speaker in the space. In embodiments, adjusting a sound system may include adjusting a parameter of a sound mixing system. In embodiments, the parameter may include adjusting at least one of the timing, frequency, and volume of sound that will be played by at least one speaker.

In embodiments, modifying the sound characteristics may include modifying at least one reflection to mimic at least one of a secondary and a tertiary reflection in the space. In embodiments, determining the acoustic environment may include making a multi-dimensional sound measurement. In embodiments, determining the acoustic environment may include specifying a multi-dimensional sound signature. In embodiments, measuring of the acoustic environment of the second space may include the creation of a multi-dimensional sound signature for the second space. In embodiments, the stated comparing may include the comparison of the multi-dimensional sound signature of the second space with the multi-dimensional sound signature of the first space. In embodiments, the first space may be a known space, a hypothetical space, and the like. In embodiments, the sound system component may include a speaker system, a headphone, and the like.

In embodiments, the space may be a recording studio, a virtual reality environment, a simulation environment, a computer gaming environment, and the like.

In embodiments, the at least one speaker may be a monitor, a monitor located on a stage, a headphone speaker, and the like. In embodiments, the at least one speaker may be part of a surround sound system. In embodiments, the at least one speaker may include a subwoofer. In embodiments, the at least one speaker may be a part of an array of speakers arranged to produce multi-dimensional sound in the space.

In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the one or more speakers may be headphones, a surround sound system, an array of speakers arranged to produce multi-dimensional sound in the space, and the like. In embodiments, the one or more speakers may include a subwoofer.

In embodiments, the modification may create the effect that a listener may be at the location of the known multi-dimensional sound signature. In embodiments, the modification may create the effect that a listener may be at the location of the known multi-dimensional sound signature selected by the listener. The location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. The location may be a seat in the space, a stage located in the space, and the like. In embodiments, the modification may be performed with a computer processor. In embodiments, the known multi-dimensional sound signature may be for a location in an actual space, a hypothetical space, an audience area of a space, a stage area of a space, and the like.

In embodiments, the known multi-dimensional sound signature composite may be for an actual space, a hypothetical space, and the like. In embodiments, the known multi-dimensional sound signature composite may result from manipulation of one or more other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature may be for a location in an actual space, a hypothetical space, audience area of a space, a location in the stage area of a space, and the like.

In embodiments, methods and systems for handling sound in a space equipped with at least one speaker may be provided. The methods and systems may include determining a multi-dimensional sound signature for a location within the space, comparing the multi-dimensional sound signature to a known multi-dimensional sound signature, and modifying the sound emitted by the speaker such that the similarity between the multi-dimensional sound signature for the location within the space and the known multi-dimensional sound signature may be increased.

In embodiments, methods and systems for simulating an acoustic environment may be provided. The methods and systems may include determining the acoustic environment of a first space, storing the multiple dimensions of the multi-dimensional sound measurement as a multi-dimensional sound signature composite, determining the acoustic environment of a second space, comparing the determined acoustic environment of the second space with the stored multi-dimensional sound signature composite of the first space, and modifying the sound characteristics of at least one sound system component of the second space such as to minimize the differences as determined in the comparison between the acoustic environment of the second space and the multi-dimensional sound signature composite of the first space when a sound may be produced through the sound system component of the second space. The stated determining may result in a multi-dimensional sound profile across a plurality of locations of the known acoustic environment. The multi-dimensional sound signature composite may include a combination of a plurality of different measured sound dimensions.

In embodiments, measuring of the acoustic environment of the second space may include the creation of a multi-dimensional sound signature composite for the second space. In embodiments, the stated comparing may include the comparison of the multi-dimensional sound signature composite of the second space with the multi-dimensional sound signature composite of the first space. In embodiments, the first space may be a known space, a hypothetical space, and the like. In embodiments, the sound system component may include a speaker system. In embodiments, the sound system component may include a headphone. In embodiments, determining the acoustic environment may include making a multi-dimensional sound measurement. In embodiments, determining the acoustic environment may include specifying a multi-dimensional sound signature.

In embodiments, the space may be a recording studio, a virtual reality environment, a simulation environment, a computer gaming environment, and the like.

In embodiments, the at least one speaker may be a monitor, a monitor located on a stage, a headphone speaker, and the like. In embodiments, the at least one speaker may be part of a surround sound system. In embodiments, the at least one speaker may include a subwoofer. In embodiments, the at least one speaker may be a part of an array of speakers arranged to produce multi-dimensional sound in the space.

In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the one or more speakers may be headphones, a surround sound system, an array of speakers arranged to produce multi-dimensional sound in the space, and the like. In embodiments, the one or more speakers may include a subwoofer.

In embodiments, the modification may create the effect that a listener may be at the location of the known multi-dimensional sound signature. In embodiments, the modification may create the effect that a listener may be at the location of the known multi-dimensional sound signature selected by the listener. The location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. The location may be a seat in the space, a stage located in the space, and the like. In embodiments, the modification may be performed with a computer processor. In embodiments, the known multi-dimensional sound signature may be for a location in an actual space, a hypothetical space, an audience area of a space, a stage area of a space, and the like.

In embodiments, the known multi-dimensional sound signature composite may be for an actual space, a hypothetical space, and the like. In embodiments, the known multi-dimensional sound signature composite may result from manipulation of one or more other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature may be for a location in an actual space, a hypothetical space, audience area of a space, a location in the stage area of a space, and the like.

In embodiments, methods and systems for handling sound in a space equipped with at least one speaker may be provided. The methods and systems may include determining a multi-dimensional sound signature composite for the space, comparing the multi-dimensional sound signature composite to a known multi-dimensional sound signature composite, and modifying the sound emitted by the speaker such that the similarity between the multi-dimensional sound signature composite for the space and the known multi-dimensional sound signature composite may be increased.

In embodiments, the space may be a recording studio, a virtual reality environment, a simulation environment, a computer gaming environment, and the like.

In embodiments, the at least one speaker may be a monitor, a monitor located on a stage, a headphone speaker, and the like. In embodiments, the at least one speaker may be part of a surround sound system. In embodiments, the at least one speaker may include a subwoofer. In embodiments, the at least one speaker may be a part of an array of speakers arranged to produce multi-dimensional sound in the space.

In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the one or more speakers may be headphones, a surround sound system, an array of speakers arranged to produce multi-dimensional sound in the space, and the like. In embodiments, the one or more speakers may include a subwoofer.

In embodiments, the modification may create the effect that a listener may be at the location of the known multi-dimensional sound signature. In embodiments, the modification may create the effect that a listener may be at the location of the known multi-dimensional sound signature selected by the listener. The location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. The location may be a seat in the space, a stage located in the space, and the like. In embodiments, the modification may be performed with a computer processor. In embodiments, the known multi-dimensional sound signature may be for a location in an actual space, a hypothetical space, an audience area of a space, a stage area of a space, and the like.

In embodiments, the known multi-dimensional sound signature composite may be for an actual space, a hypothetical space, and the like. In embodiments, the known multi-dimensional sound signature composite may result from manipulation of one or more other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature may be for a location in an actual space, a hypothetical space, audience area of a space, a location in the stage area of a space, and the like.

In embodiments, methods and systems of handling sound in a space equipped with at least one speaker may be provided. The methods and systems may include reproducing sound not contemporaneously originating in the space, in accordance with a known multi-sound signature composite. In embodiments, such reproduction may apply the known multi-dimensional sound signature composite to the reproduced sound. In embodiments, applying the known multi-dimensional sound signature may include adjusting at least one of the timing and volume of sound emitted by a speaker at a specified location within the space.

In embodiments, timing of sounds emitted from speakers placed at rear and side locations in the space may be adjusted to increase similarity to timing of rear and side reflections specified in the multi-dimensional sound signature. In embodiments, timing of sounds emitted from speakers placed at side locations may be adjusted to mimic primary and secondary side reflections specified in the multi-dimensional sound signature. In embodiments, volume of sounds emitted from speakers placed at rear and side locations in the space may be adjusted to increase similarity to amplitude of rear and side reflections specified in the multi-dimensional sound signature.

In embodiments, the space may be a recording studio, a virtual reality environment, a simulation environment, a computer gaming environment, and the like.

In embodiments, the at least one speaker may be a monitor, a monitor located on a stage, a headphone speaker, and the like. In embodiments, the at least one speaker may be part of a surround sound system. In embodiments, the at least one speaker may include a subwoofer. In embodiments, the at least one speaker may be a part of an array of speakers arranged to produce multi-dimensional sound in the space.

In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the one or more speakers may be headphones, a surround sound system, an array of speakers arranged to produce multi-dimensional sound in the space, and the like. In embodiments, the one or more speakers may include a subwoofer.

In embodiments, the modification may create the effect that a listener may be at the location of the known multi-dimensional sound signature. In embodiments, the modification may create the effect that a listener may be at the location of the known multi-dimensional sound signature selected by the listener. The location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. The location may be a seat in the space, a stage located in the space, and the like. In embodiments, the modification may be performed with a computer processor. In embodiments, the known multi-dimensional sound signature may be for a location in an actual space, a hypothetical space, an audience area of a space, a stage area of a space, and the like.

In embodiments, the known multi-dimensional sound signature composite may be for an actual space, a hypothetical space, and the like. In embodiments, the known multi-dimensional sound signature composite may result from manipulation of one or more other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature may be for a location in an actual space, a hypothetical space, audience area of a space, a location in the stage area of a space, and the like.

In embodiments, methods and systems for simulating an acoustic environment may be provided. The methods and systems may include determining the acoustic environment of a first space, including determining a multi-dimensional sound profile, storing the multiple dimensions of the multi-dimensional sound profile as a multi-dimensional sound signature, determining the sound characteristics of an item of media content, and configuring the media content to increase similarity to the multi-dimensional sound signature when the media is played in an anticipated acoustic environment. The multi-dimensional sound signature may include a combination of a plurality of different sound parameters. The multiple dimensions of the sound signature may be selected from the group consisting of timing, direction, amplitude and frequency of reflections of sound associated with the known acoustic environment.

In embodiments, the reflections may include primary and secondary reflections from similar directions. In embodiments, the reflections may include primary, secondary and tertiary reflections from similar directions. In embodiments, determining the acoustic environment may include making a multi-dimensional sound measurement. In embodiments, determining the acoustic environment may include specifying a multi-dimensional sound signature.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for simulating an acoustic environment may be provided. The methods and systems may include determining the acoustic environment of a first space, including determining a multi-dimensional sound profile, storing the multiple dimensions of the multi-dimensional sound profile as a multi-dimensional sound signature, determining the sound characteristics of an item of media content, and configuring a media playback system of a playback environment to increase similarity of the sounds in the playback environment to sounds occurring in the first space. The multi-dimensional sound signature may include a combination of a plurality of different sound parameters.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and system for simulating an acoustic environment may be provided. The methods and systems may include determining the acoustic environment of a first space, including determining a multi-dimensional sound profile, storing the multiple dimensions of the multi-dimensional sound profile as a multi-dimensional sound signature, determining the sound characteristics of an item of media content, and configuring the sound characteristics of the media content item and the media playback system of a playback environment to increase similarity of the sounds in the playback environment to sounds occurring in the first space. The multi-dimensional sound signature may include a combination of a plurality of different sound parameters.

In embodiments, determining the acoustic environment of the second space may include the creation of a multi-dimensional sound signature for the second space. In embodiments, the stated comparing may include the comparison of the multi-dimensional sound signature of the second space with the multi-dimensional sound signature of the first space. In embodiments, the first space may be a known space, a hypothetical space, and the like.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for handling sound in a space equipped with at least one speaker may be provided. The methods and systems may include determining a multi-dimensional sound signature for a location within the space, selecting a known multi-dimensional sound signature, comparing the multi-dimensional sound signature to the known multi-dimensional sound signature, and modifying the sound emitted by the speaker such that the similarity between the multi-dimensional sound signature for the location within the space and the known multi-dimensional sound signature may be increased.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for simulating an acoustic environment may be provided. The methods and systems may include determining the acoustic characteristics of a first space, storing a multi-dimensional sound signature composite, determining the sound characteristics of an item of media content, and configuring the media content to increase similarity to the multi-dimensional sound signature when the media may be played in an anticipated acoustic environment. In embodiments, the determining may results in a multi-dimensional sound profile across a plurality of locations of the known acoustic environment. The multi-dimensional sound signature composite may include a combination of a plurality of different sound dimensions selected from the group consisting of timing, direction, amplitude and frequency of sound reflections of the known acoustic environment.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for simulating an acoustic environment may be provided. The methods and systems may include determining the acoustic characteristics of a first space, storing a multi-dimensional sound signature composite, determining the sound characteristics of an item of media content, and configuring a media playback system of a playback environment to increase similarity of the sounds in the playback environment to sounds occurring in the first space. In embodiments, the stated determining may result in a multi-dimensional sound profile across a plurality of locations of the known acoustic environment. In embodiments, the multi-dimensional sound signature composite may include a combination of a plurality of different sound dimensions selected from the group consisting of timing, direction, amplitude and frequency of sound reflections of the known acoustic environment.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for simulating an acoustic environment may be provided. The methods and systems may include determining the acoustic characteristics of a first space, storing a multi-dimensional sound signature composite, determining the sound characteristics of an item of media content, and configuring the sound characteristics of the media content item and the media playback system of a playback environment to increase similarity of the sounds in the playback environment to sounds occurring in the first space. The stated determining may result in a multi-dimensional sound profile across a plurality of locations of the known acoustic environment. The multi-dimensional sound signature composite may include a combination of a plurality of different sound dimensions selected from the group consisting of timing, direction, amplitude and frequency of sound reflections of the known acoustic environment.

In embodiments, determining the acoustic environment may include making a multi-dimensional sound measurement. In embodiments, determining the acoustic environment may include specifying a multi-dimensional sound signature. In embodiments, determining of the acoustic environment of the second space may include the creation of a multi-dimensional sound signature composite for the second space. In embodiments, the stated comparing may include the comparison of the multi-dimensional sound signature composite of the second space with the multi-dimensional sound signature composite of the first space. In embodiments, the first space may be a known space, a hypothetical space, and the like.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for handling sound in a space equipped with at least one speaker may be provided. The methods and systems may include determining a multi-dimensional sound signature composite for the space, selecting a known multi-dimensional sound signature composite, comparing the multi-dimensional sound signature composite to the known multi-dimensional sound signature composite, and modifying the sound emitted by the speaker such that the similarity between the multi-dimensional sound signature composite for the space and the known multi-dimensional sound signature composite may be increased.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for handling sound in a space equipped with at least one speaker may be provided. The methods and systems may include selecting a known multi-dimensional sound signature composite and reproducing sound not contemporaneously originating in the space, in accordance with the known multi-sound signature composite. Such reproduction may apply the known multi-dimensional sound signature composite to the reproduced sound.

In embodiments, applying the known multi-dimensional sound signature may include adjusting at least one of the timing and volume of sound emitted by a speaker at a specified location within the space. In embodiments, the timing of sounds emitted from speakers placed at rear and side locations in the space may be adjusted to increase similarity to timing of rear and side reflections specified in the multi-dimensional sound signature. In embodiments, timing of sounds emitted from speakers placed at side locations may be adjusted to mimic primary and secondary side reflections specified in the multi-dimensional sound signature. In embodiments, volume of sounds emitted from speakers placed at rear and side locations in the space may be adjusted to increase similarity to amplitude of rear and side reflections specified in the multi-dimensional sound signature.

In embodiments, the space may be a recording studio, a virtual reality environment, a simulation environment, a computer gaming environment, and the like. In embodiments, the at least one speaker may be a monitor, a monitor located on a stage, a headphone speaker, a surround sound system, and the like. In embodiments, the at least one speaker may include a subwoofer. In embodiments, the at least one speaker may be a part of an array of speakers arranged to produce multi-dimensional sound in the space.

In embodiments, the item of content may include sound, audio, audio and video, a movie, film, television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the at least one speaker may be headphones, a surround sound system, an array of speakers arranged to produce multi-dimensional sound in the space, and the like. In embodiments, at least one speaker may include a subwoofer. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, the content may contain audio and video information and the known multi-dimensional sound signature may be selected based on the video information. In embodiments, the content may contain audio and video information and the known multi-dimensional sound signature may be selected by a processor based on the video information. In embodiments, the content may contain audio and video information and the known multi-dimensional sound signature may be selected by a processor based on a determination of the location shown in the video information.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information and the known multi-dimensional sound signature composite may be selected based on the video information. In embodiments, the content may contain audio and video information and the known multi-dimensional sound signature composite may be selected by a processor based on the video information. In embodiments, the content may contain audio and video information and the known multi-dimensional sound signature composite may be selected by a processor based on a determination of the location shown in the video information.

In embodiments, the modification may create the effect that a listener may be at the location of the known multi-dimensional sound signature. In embodiments, the modification may create the effect that a listener may be at the location of the known multi-dimensional sound signature and that location may be selected by the listener. In embodiments, the location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the location may be a seat in the space, a stage located in the space, and the like.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, methods and systems for ticket seating selection may be provided. The methods and systems may include determining the acoustic environment of the space, storing the multiple dimensions of the multi-dimensional sound measurement as a multi-dimensional sound signature, and providing a ticket purchase selection option to the user that relates the location of a seat for selection to a sound characteristic for the location of the seat as based upon the stored multi-dimensional sound signature. The measuring may be a multi-dimensional sound measurement, and the space may be associated with the ticket seating selection by a user. The multi-dimensional sound signature may include a combination of a plurality of different measured sound dimensions.

In embodiments, the multiple dimensions of the sound signature may be selected from the group consisting of timing, direction, amplitude and frequency of reflections of sound associated with the known acoustic environment. In embodiments, the reflections may include primary and secondary reflections from similar directions. In embodiments, the reflections may include primary, secondary and tertiary reflections from similar directions. In embodiments, determining the acoustic environment may include making a multi-dimensional sound measurement. In embodiments, determining the acoustic environment may include specifying a multi-dimensional sound signature.

In embodiments, the ticket may be categorized as for a direct zone, a diamond zone, a middle zone, a deep envelopment zone, and the like. In embodiments, the ticket may be categorized as for a location with high-quality sound. In embodiments, the ticket may be categorized as for a location with medium-quality sound. In embodiments, the ticket may be categorized as for a location with low-quality sound. In embodiments, the ticket may be categorized as for a location with sound characterized by bass frequencies. In embodiments, the ticket may be categorized as for a location with sound characterized by mid-range frequencies. In embodiments, the ticket may be categorized as for a location with sound characterized by treble frequencies.

In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, methods and tickets for making a ticket available for a location may be provided. The methods and systems may include determining a multi-dimensional sound signature for a selected location in a space and making available a ticket for the location. Such ticket may be categorized based on the multi-dimensional sound signature.

In embodiments, methods and systems for making a ticket available for a location may be provided. The methods and systems may include determining a preferred multi-dimensional sound signature for an individual, determining a multi-dimensional sound signature for a selected location in a space, and making available a ticket for the location. The multi-dimensional sound signature for the location may correspond to the preferred multi-dimensional sound signature.

In embodiments, the ticket may be categorized as for a direct zone, a diamond zone, a middle zone, a deep envelopment zone, and the like. In embodiments, the ticket may be categorized as for a location with high-quality sound. In embodiments, the ticket may be categorized as for a location with medium-quality sound. In embodiments, the ticket may be categorized as for a location with low-quality sound. In embodiments, the ticket may be categorized as for a location with sound characterized by bass frequencies. In embodiments, the ticket may be categorized as for a location with sound characterized by mid-range frequencies. In embodiments, the ticket may be categorized as for a location with sound characterized by treble frequencies.

In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, methods and systems for ticket seating selection may be provided. The methods and system may include determining the acoustic environment of the space, storing the multiple dimensions of the multi-dimensional sound measurement as a multi-dimensional sound signature composite, and providing a ticket purchase selection option to the user that may relate the location of a seat for selection to a sound characteristic for the location of the seat as based upon the stored multi-dimensional sound signature composite. In embodiments, the multi-dimensional sound signature composite may include a combination of a plurality of different measured sound dimensions. In embodiments, determining the acoustic environment may include making a multi-dimensional sound measurement. In embodiments, determining the acoustic environment may include specifying a multi-dimensional sound signature.

In embodiments, the ticket may be categorized as for a direct zone, a diamond zone, a middle zone, a deep envelopment zone, and the like. In embodiments, the ticket may be categorized as for a location with high-quality sound. In embodiments, the ticket may be categorized as for a location with medium-quality sound. In embodiments, the ticket may be categorized as for a location with low-quality sound. In embodiments, the ticket may be categorized as for a location with sound characterized by bass frequencies. In embodiments, the ticket may be categorized as for a location with sound characterized by mid-range frequencies. In embodiments, the ticket may be categorized as for a location with sound characterized by treble frequencies.

In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, methods and systems for making a ticket available for a location may be provided. The methods and systems may include determining a multi-dimensional sound signature composite for a space, selecting a location in the space, and making available a ticket for the location. Such ticket may be categorized based on the multi-dimensional sound signature.

In embodiments, the ticket may be categorized as for a direct zone, a diamond zone, a middle zone, a deep envelopment zone, and the like. In embodiments, the ticket may be categorized as for a location with high-quality sound. In embodiments, the ticket may be categorized as for a location with medium-quality sound. In embodiments, the ticket may be categorized as for a location with low-quality sound. In embodiments, the ticket may be categorized as for a location with sound characterized by bass frequencies. In embodiments, the ticket may be categorized as for a location with sound characterized by mid-range frequencies. In embodiments, the ticket may be categorized as for a location with sound characterized by treble frequencies.

In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, methods and systems for providing a venue seating sound sample for ticket seating selection may be described. The methods and systems may include determining the acoustic environment of the space, storing the multiple dimensions of the multi-dimensional sound measurement as a multi-dimensional sound signature, and providing a sound sample associated with the ticket purchase selection by the user that relates the location of a seat for selection to a sound characteristic for the location of the seat as based upon the stored multi-dimensional sound signature.

In embodiments, the sound may be a sample of a performance of a type typically performed in the space. In embodiments, the sound was created by an artist who will be performing in the venue. In embodiments, the sound may be a sample of an upcoming performance to be held in the venue. In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, the location may be a seat, an area of seating, a zone of the space, and the like. In embodiments, the reproduced sound may be provided in connection with a representation of the view from the location in the space. In embodiments, the reproduced sound may be provided in connection with an interactive representation of the view from the location in the space. In embodiments, the reproduced sound may be provided in connection with an image of the view from the location in the space. In embodiments, the reproduced sound may be provided in connection with an interactive image of the view from the location in the space. In embodiments, the space may be a performance space and the reproduced sound may be provided in connection with an interactive representation of the view from the location in the space. In embodiments, the space may be a performance space and the reproduced sound may be provided in connection with an interactive representation of the view from the location in the space showing a stage in the performance space. In embodiments, the location may be selected using a graphical user interface that may be associated with the sound an interactive representation of the view from the location in the space. In embodiments, methods and systems may allow a listener to purchase tickets for the location.

In embodiments, measuring acoustic environment may be a multi-dimensional sound measurement. The space may be associated with the ticket seating selection by a user. The multi-dimensional sound signature may include a combination of a plurality of different measured sound dimensions. In embodiments, the multiple dimensions of the sound signature may be selected from the group consisting of timing, direction, amplitude and frequency of reflections of sound associated with the known acoustic environment. In embodiments, the reflections may include primary and secondary reflections from similar directions. In embodiments, the reflections may include primary, secondary and tertiary reflections from similar directions. In embodiments, determining the acoustic environment may include making a multi-dimensional sound measurement. In embodiments, determining the acoustic environment may include specifying a multi-dimensional sound signature.

In embodiments, methods and systems for reproducing sound may be provided. The methods and systems may include determining a multi-dimensional sound signature for a selected location in a space and reproducing sound in accordance with the multi-sound signature. Such reproduction may apply the multi-dimensional sound signature to the reproduced sound so that the sound may be heard as it would be heard at the location in the space.

In embodiments, the sound may be a sample of a performance of a type typically performed in the space. In embodiments, the sound was created by an artist who will be performing in the venue. In embodiments, the sound may be a sample of an upcoming performance to be held in the venue. In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, the location may be a seat, an area of seating, a zone of the space, and the like. In embodiments, the reproduced sound may be provided in connection with a representation of the view from the location in the space. In embodiments, the reproduced sound may be provided in connection with an interactive representation of the view from the location in the space. In embodiments, the reproduced sound may be provided in connection with an image of the view from the location in the space. In embodiments, the reproduced sound may be provided in connection with an interactive image of the view from the location in the space. In embodiments, the space may be a performance space and the reproduced sound may be provided in connection with an interactive representation of the view from the location in the space. In embodiments, the space may be a performance space and the reproduced sound may be provided in connection with an interactive representation of the view from the location in the space showing a stage in the performance space. In embodiments, the location may be selected using a graphical user interface that may be associated with the sound an interactive representation of the view from the location in the space. In embodiments, methods and systems may allow a listener to purchase tickets for the location.

In embodiments, methods and systems for providing a venue seating sound sample for ticket seating selection may be described. The methods and systems may include determining the acoustic environment of the space, storing the multiple dimensions of the multi-dimensional sound measurement as a multi-dimensional sound signature composite, and providing a sound sample associated with the ticket purchase selection by the user that relates the location of a seat for selection to a sound characteristic for the location of the seat as based upon the stored multi-dimensional sound signature composite.

In embodiments, the measurement of the acoustic environment may include multi-dimensional sound measurements across a plurality of locations. The space may be associated with the ticket seating selection by a user. In embodiments, the multi-dimensional sound signature composite may include a combination of a plurality of different measured sound dimensions. In embodiments, determining the acoustic environment may include making a multi-dimensional sound measurement. In embodiments, determining the acoustic environment may include specifying a multi-dimensional sound signature.

In embodiments, the sound may be a sample of a performance of a type typically performed in the space. In embodiments, the sound was created by an artist who will be performing in the venue. In embodiments, the sound may be a sample of an upcoming performance to be held in the venue. In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, the location may be a seat, an area of seating, a zone of the space, and the like. In embodiments, the reproduced sound may be provided in connection with a representation of the view from the location in the space. In embodiments, the reproduced sound may be provided in connection with an interactive representation of the view from the location in the space. In embodiments, the reproduced sound may be provided in connection with an image of the view from the location in the space. In embodiments, the reproduced sound may be provided in connection with an interactive image of the view from the location in the space. In embodiments, the space may be a performance space and the reproduced sound may be provided in connection with an interactive representation of the view from the location in the space. In embodiments, the space may be a performance space and the reproduced sound may be provided in connection with an interactive representation of the view from the location in the space showing a stage in the performance space. In embodiments, the location may be selected using a graphical user interface that may be associated with the sound an interactive representation of the view from the location in the space. In embodiments, methods and systems may allow a listener to purchase tickets for the location.

In embodiments, methods and systems for reproducing sound may be provided. The methods and systems may include determining a multi-dimensional sound signature composite for a space, selecting a location in the space, and reproducing sound in accordance with the multi-sound signature composite. Such reproduction may apply the multi-dimensional sound signature composite to the reproduced sound so that the sound may be heard as it would be heard at the location in the space.

In embodiments, the sound may be a sample of a performance of a type typically performed in the space. In embodiments, the sound was created by an artist who will be performing in the venue. In embodiments, the sound may be a sample of an upcoming performance to be held in the venue. In embodiments, the space may be a performance hall, a concert hall, a sports venue, an arena, an entertainment venue, a movie theater, an IMAX theater, a museum, a vehicle interior, and the like.

In embodiments, the methods may be implemented in a software application executed on a computer. In embodiments, the methods may be implemented using a graphical user interface. In embodiments, the methods may be implemented using a web interface, a processor, a computer, and the like. In embodiments, the methods may be implemented by providing a storage media containing a sound as it would be heard at multiple locations. In embodiments, the storage media may be a compact disc, a DVD, and the like.

In embodiments, the location may be a seat, an area of seating, a zone of the space, and the like. In embodiments, the reproduced sound may be provided in connection with a representation of the view from the location in the space. In embodiments, the reproduced sound may be provided in connection with an interactive representation of the view from the location in the space. In embodiments, the reproduced sound may be provided in connection with an image of the view from the location in the space. In embodiments, the reproduced sound may be provided in connection with an interactive image of the view from the location in the space. In embodiments, the space may be a performance space and the reproduced sound may be provided in connection with an interactive representation of the view from the location in the space. In embodiments, the space may be a performance space and the reproduced sound may be provided in connection with an interactive representation of the view from the location in the space showing a stage in the performance space. In embodiments, the location may be selected using a graphical user interface that may be associated with the sound an interactive representation of the view from the location in the space. In embodiments, methods and systems may allow a listener to purchase tickets for the location.

In embodiments, methods and systems for providing an acoustical environment graphical user interface may be described. The methods and systems may include determining an acoustic environment of a space, storing the multiple dimensions of the multi-dimensional sound measurement as a multi-dimensional sound signature, and enabling a visual representation of the stored multi-dimensional sound signature through the acoustical environment graphical user interface. In embodiments, the measurement of the acoustic environment may be a multi-dimensional sound measurement. In embodiments, the multi-dimensional sound signature may include a combination of a plurality of different measured sound dimensions.

In embodiments, determining the acoustic environment may include making a multi-dimensional sound measurement. In embodiments, determining the acoustic environment may include specifying a multi-dimensional sound signature.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, methods and systems for providing an acoustical environment graphical user interface may be described. The methods and systems may include determining an acoustic environment of a space, storing the multiple dimensions of the multi-dimensional sound measurement as a multi-dimensional sound signature composite, and enabling a visual representation of the stored multi-dimensional sound signature composite through the acoustical environment graphical user interface.

In embodiments, the measuring of the acoustic environment may include multi-dimensional sound measurements across a plurality of locations. In embodiments, the multi-dimensional sound signature composite may include a combination of a plurality of different measured sound dimensions. In embodiments, determining the acoustic environment may include making a multi-dimensional sound measurement. In embodiments, determining the acoustic environment may include specifying a multi-dimensional sound signature.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a graphical user interface may be provided. The graphical user interface may include at least one field for representation of at least one of a multi-dimensional sound signature and a multi-dimensional sound signature composite, and an input means for manipulating the at least one of a multi-dimensional sound signature and a multi-dimensional sound signature composite.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a software interface capable of visually representing at least one of a multi-dimensional sound signature and a multi-dimensional sound signature composite may be provided.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a graphical user interface may be provided. The graphical user interface may include at least one field for visually representation of at least one of a multi-dimensional sound signature and a multi-dimensional sound signature composite, and an input means for manipulating the at least one of a multi-dimensional sound signature and a multi-dimensional sound signature composite.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a software interface for manipulation of at least one of a multi-dimensional sound signature and a multi-dimensional sound signature composite may be provided.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a graphical user interface may be provided. The graphical user interface may include at least one field for manipulation of at least one of a multi-dimensional sound signature and a multi-dimensional sound signature composite, and an input means for manipulating the at least one of a multi-dimensional sound signature and a multi-dimensional sound signature composite.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a software interface for designing a space in consideration of at least one of a multi-dimensional sound signature and a multi-dimensional sound signature composite may be provided.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a computer-implemented program for designing a space may be provided. The computer-implemented program may include a design module capable of visually representing parameters of a planned space as specified by a user of the design module, a sound signature representation module capable of visually representing a multi-dimensional sound signature in the space, and an analytical acoustics module capable of determining the predicted impact of changes to parameters in the design module on a multi-dimensional sound signature in the planned space. In embodiments, a modified multi-dimensional sound signature may be presented to the user upon modification of parameters of the space in the design module.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a computer-implemented program for designing a space may be provided. The methods and systems may include a design module capable of visually representing parameters of a planned space as specified by a user of the design module, a sound signature representation module capable of visually representing a multi-dimensional sound signature composite in the space, and an analytical acoustics module capable of determining the predicted impact of changes to parameters in the design module on a multi-dimensional sound signature composite in the planned space. In embodiments, a modified multi-dimensional sound signature may be presented to the user upon modification of parameters of the space in the design module.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a software interface for designing a space including feedback based on comparison to preferred signatures may be provided.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a computer-implemented program for designing a space may be provided. The methods and systems may include a design module capable of visually representing parameters of a planned space as specified by a user of the design module, a sound signature representation module capable of visually representing a multi-dimensional sound signature in the space, and an analytical acoustics module capable of determining the predicted impact of changes to parameters in the design module on a multi-dimensional sound signature in the planned space. The sound signature representation module may be capable of accessing a representation of at least one multi-dimensional sound signature from at least one preferred acoustical environment. In embodiments, a modified multi-dimensional sound signature may be presented to the user. In embodiments, a feedback module for facilitating comparison of the predicted multi-dimensional sound signature of the planned space to the multi-dimensional sound signature of a preferred acoustical environment may be presented upon modification of parameters of the space in the design module.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a computer-implemented program for designing a space may be provided. The methods and systems may include a design module capable of visually representing parameters of a planned space as specified by a user of the design module, a sound signature representation module capable of visually representing a multi-dimensional sound signature composite in the space, the sound signature representation module capable of accessing a representation of at least one multi-dimensional sound signature composite from at least one preferred acoustical environment, and an analytical acoustics module capable of determining the predicted impact of changes to parameters in the design module on a multi-dimensional sound signature composite in the planned space. In embodiments, a modified multi-dimensional sound signature composite may be presented to the user upon modification of parameters of the space in the design module. In embodiments, a feedback module for facilitating comparison of the predicted multi-dimensional sound signature composite of the planned space to the multi-dimensional sound signature composite of a preferred acoustical environment may be presented to the user.

In embodiments, the feedback module may facilitate visual comparison. In embodiments, the feedback module may facilitate comparison of reflections from various directions. In embodiments, the comparison may include comparison of at least one of timing, amplitude, frequency and direction of reflections between the planned space and the preferred acoustical environment. In embodiments, the comparison may include comparison of primary and secondary reflections from similar directions. In embodiments, the feedback module may visually presents preferred ranges of parameters of the multi-dimensional sound signature. In embodiments, the feedback module may indicate whether a specified parameter may be within a preferred range. In embodiments, the feedback module may suggest modifications that would reduce differences between the planned space and the preferred acoustical space.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a software interface for designing a space including feedback based on preferred ranges may be provided.

In embodiments, a computer-implemented program for designing a space may be provided. The computer implemented program may include a design module capable of visually representing parameters of a planned space as specified by a user of the design module, a sound signature representation module capable of visually representing a multi-dimensional sound signature in the space, an analytical acoustics module capable of determining the predicted impact of changes to parameters in the design module on a multi-dimensional sound signature in the planned space, and a feedback module for facilitating comparison of the predicted multi-dimensional sound signature of the planned space to a range of parameters for a known acoustical environment. In embodiments, a modified multi-dimensional sound signature may be presented to the user upon modification of parameters of the space in the design module.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a computer-implemented program for designing a space may be provided. The methods and systems may include a design module capable of visually representing parameters of a planned space as specified by a user of the design module, a sound signature representation module capable of visually representing a multi-dimensional sound signature composite in the space, an analytical acoustics module capable of determining the predicted impact of changes to parameters in the design module on a multi-dimensional sound signature composite in the planned space, and a feedback module for facilitating comparison of the predicted multi-dimensional sound signature composite of the planned space to a range of parameters for a known acoustical environment. In embodiments, a modified multi-dimensional sound signature composite may be presented to the user upon modification of parameters of the space in the design module.

In embodiments, the feedback module may facilitate visual comparison. In embodiments, the feedback module may facilitate comparison of reflections from various directions. In embodiments, the comparison may include comparison of at least one of timing, amplitude, frequency and direction of reflections between the planned space and a preferred set of ranges for such parameters. In embodiments, the preferred set of ranges may be based on a ranges measured in at least one preferred acoustical environment. In embodiments, the comparison may include comparison of primary and secondary reflections from similar directions. In embodiments, the feedback module visually may present preferred ranges of parameters of the multi-dimensional sound signature. In embodiments, the feedback module may indicate whether a specified parameter may be within a preferred range. In embodiments, the feedback module may suggest modifications that would reduce differences between the planned space and a preferred acoustical space.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a software interface for optimizing a space in consideration of at least one of a multi-dimensional sound signature and a multi-dimensional sound signature composite may be provided.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a computer-implemented program for optimizing a space may be provided. The methods and systems may include a design module capable of visually representing parameters of a planned space as specified by a user of the design module, a sound signature representation module capable of visually representing a multi-dimensional sound signature in the space, and an analytical acoustics module capable of determining the predicted impact of changes to parameters in the design module on a multi-dimensional sound signature in the planned space. In embodiments, a modified multi-dimensional sound signature may be presented to the user upon optimizations of parameters of the space in the design module.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, a computer-implemented program for optimizing a space may be provided. The computer-implemented program may include a design module capable of visually representing parameters of a planned space as specified by a user of the design module, a sound signature representation module capable of visually representing a multi-dimensional sound signature composite in the space, and an analytical acoustics module capable of determining the predicted impact of changes to parameters in the design module on a multi-dimensional sound signature composite in the planned space. In embodiments, a modified multi-dimensional sound signature may be presented to the user upon optimizations of parameters of the space in the design module.

In embodiments, the space may be a hypothetical space. In embodiments, the manipulation may be combination, decomposition, and the like. In embodiments, the multi-dimensional sound signature composite may be for an actual space, a hypothetical space, and the like. In embodiments, the multi-dimensional sound signature composite may result from manipulation of at least one other multi-dimensional sound signature composite. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be a single source multi-dimensional sound signature composite. In embodiments, the multi-dimensional sound signature composite may be a multiple source multi-dimensional sound signature composite. In embodiments, the multi-dimensional sound signature composite may be a multiple source, multiple location, multi-dimensional sound signature composite. In embodiments, the multi-dimensional sound signature composite may be a hypothetical multi-dimensional sound signature composite. In embodiments, the multi-dimensional sound signature composite may be an ambient multi-dimensional sound signature composite.

In embodiments, the present invention may provide mounting of a flat to the tracking system by way of a tapered spade/socket system. The present invention may provide scenery changes in a performance space, such as providing a stage-level scenery flat tracking system, where the stage-level scenery flat tracking system may include at least one of a plurality of individual tracks and at least one of a plurality of bottom-only supported scenery flats, provide at least one tapered spade on the bottom edge of each bottom-only supported scenery flat, provide a wheeled carriage assembly mounted on at least each track to accept the tapered spade from at least one scenery flat, where the carriage assembly accepts the tapered spade into a tapered socket, and the like. In embodiments, the carriage assembly may include a latch mechanism to secure the tapered spade in the tapered socket. The plurality of individual tracks may be closely spaced. The carriage of the stage-level scenery flat tracking system may be driven by a motor drive system. The motor drive system may be a computer controlled motor drive system. The motor drive system may be a sound damped motor drive system. The drive system may include a plurality of sound dampened motor drives, where each of the plurality of sound dampened motor drives may control a single carriage, a plurality of carriages, a combination of carriages, and the like. The bottom-only supported scenery flats may be provided a rigid construction, where the rigid construction may enable scenery flat motion of the bottom-only supported scenery flats on adjacent tracks of the stage-level scenery flat tracking system without physical contact between bottom-only supported scenery flats on adjacent tracks while in motion. The tapered spade may be mounted into the tapered socket to enable rapid scenery changes, where the rapid scenery change may be in view of the audience.

In embodiments the present invention may provide for rapid scene changes through a stage-level scenery flat tracking system. The present invention may provide for rapid scenery changes in a performance space, such as by providing a stage-level scenery flat tracking system, where the stage-level scenery flat tracking system may include at least one of a plurality of individual tracks and at least one of a plurality of bottom-only supported scenery flats; providing at least one mounting fixture on the bottom edge of each bottom-only supported scenery flat; providing a wheeled carriage assembly mounted on at least each track to accept the mounting fixture from at least one scenery flat, where the use of a scenery flat with the mounting fixture may enable rapid scenery changes, and the like. In embodiments, the carriage assembly may include a latch mechanism to secure the mounting fixture. The rapid scenery change may be in view of the audience. The plurality of individual tracks may be closely spaced. The carriage of the stage-level scenery flat tracking system may be driven by a motor drive system. The motor drive system may be a computer controlled motor drive system, where the motor drive system may be a sound damped motor drive system, a plurality of sound dampened motor drives, each of the plurality of sound dampened motor drives may control a single carriage, each of the plurality of sound dampened motor drives may control a plurality of carriages, and the like. The bottom-only supported scenery flats may be provided a rigid construction, where the rigid construction may enable scenery flat motion of the bottom-only supported scenery flats on adjacent tracks of the stage-level scenery flat tracking system without physical contact between bottom-only supported scenery flats on adjacent tracks while in motion. In embodiments, the rapid scenery changes may include box sets, or other modern stage scenery.

In embodiments the present invention may provide for a mechanized tracking system for improved synchronization of movement. The present invention may provide scenery changes in a performance space, such as providing a computer controlled mechanized stage-level scenery flat tracking system, where the tracking system may include at least one of a plurality of individual tracks and a plurality of bottom-only supported scenery flats, and where the tracking system may provide an increased synchronization of scenery flat movement. In embodiments, the synchronization may be for all of the bottom-only supported scenery flats, for one bottom-only supported scenery flat, for a combination of bottom-only supported scenery flats, and the like.

In embodiments the present invention may provide for a mechanized tracking system for improved reliability of movement. The present invention may provide for scenery changes in a performance space, such as providing a computer controlled mechanized stage-level scenery flat tracking system, where the tracking system may include at least one of a plurality of individual tracks and a plurality of bottom-only supported scenery flats, and where the tracking system may provide an increased repeatability of scenery flat movement.

In embodiments the present invention may provide for three dimensional renditions on scenery flats. The present invention may provide for scenery changes in a performance space, such as providing a stage-level scenery flat tracking system, where the tracking system may include at least one of a plurality of individual tracks and a plurality of bottom-only supported scenery flats, and a software rendering facility for creation of three-dimensional visualization on the scenery flat, where the scenery flat surface is two-dimensional.

In embodiments the present invention may provide for more pleasing acoustics due to the absence of a fly tower. The present invention may provide for scenery changes in a performance space, such as providing a stage-level scenery flat tracking system, where the tracking system may include at least one of a plurality of individual tracks and a plurality of bottom-only supported scenery flats, and where the acoustics of the performance space may be improved due to the use of the stage-level scenery flat tracking system, where the stage-level scenery flat tracking system may have no fly tower.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE DRAWINGS

The invention and the following detailed description of certain embodiments thereof may be understood by reference to the following figures:

FIG. 119 depicts a flow process diagram in an embodiment of the present invention.

FIG. 120 depicts a flow process diagram in an embodiment of the present invention.

FIG. 121 depicts a flow process diagram in an embodiment of the present invention.

FIG. 122 depicts a flow process diagram in an embodiment of the present invention.

FIG. 123 depicts a flow process diagram in an embodiment of the present invention.

FIG. 124 depicts a flow process diagram in an embodiment of the present invention.

Figure 1:
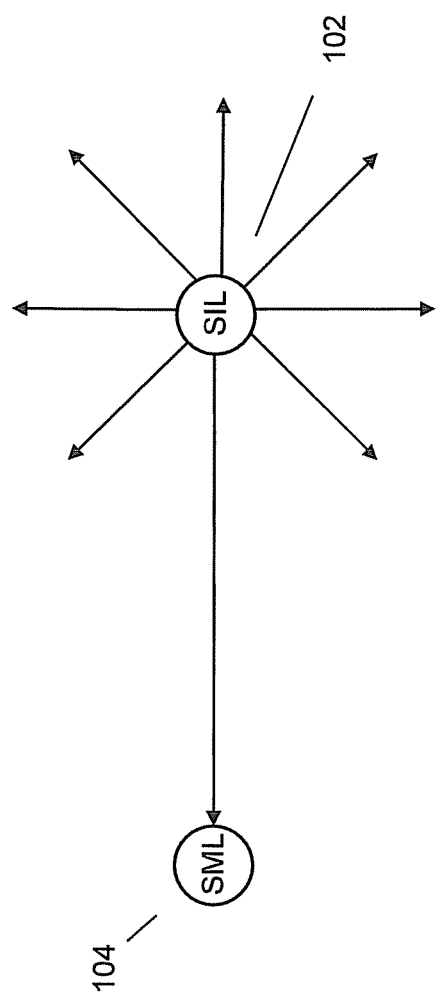
FIG. 1 depicts a sound generated at a single sound initiation location (SIL) and being directly received at a sound measurement location (SML).

While the invention has been described in connection with certain preferred embodiments, other embodiments would be understood by one of ordinary skill in the art and are encompassed herein.

All documents referenced herein are hereby incorporated by reference.

DESCRIPTION OF THE PREFERRED EMBODIMENTS

The present invention may provide for improved methods and systems for characterizing an acoustic environment, and using that characterization to provide an enhanced listening experience to a user. For example, a listening environment may be a music hall where the acoustic environment has been demonstrated over time to produce a superior listening experience to users, and where the present invention may be used to characterize the existing environment in order to aid in the design of a new venue, the redesign of an existing venue, the development of a rehearsal space that reproduces the acoustic environment of the venue, the use of the characterization for a reproduction of the sound in a movie theater or in home theater, for the use in an entertainment facility, for use in a sound system or sound component, for use in acoustic analysis, and the like.

For instance, examples of such music halls with superior listening experience may include the great opera houses of Europe, such as the L'Opera Royal in Chateau de Versailles France, the Markgrafliches Operhaus in Bayreuth Germany, the Drottningholms Slottsteater near Stockholm Sweden, the Rokokotheater in Schwetzingen Germany, and the like. Such a list of opera venues is in no way meant to limit the present invention to opera houses, or musical venues in general, but is provided as examples of what might be considered acoustic environments of demonstrated quality. The present invention may be considered a generalizable method for the acoustic characterization of an acoustic environment, and then the application of such acoustic characterization to some other acoustic application. For example, the present invention may allow for the characterization of a sports arena for the sake of reproducing the acoustic environment of the arena in an entertainment facility, the creation of sound feedback systems for performers rehearsing in an empty venue but where the present invention provides the acoustic environment to the performers as if the audience where present, the reproduction of an acoustic environment in a sound system or headphones such that the user is able to experience the music or sound being played as if the music or sound had been recorded in that acoustic environment, and the like. The present invention may provide for a way to characterize an acoustic environment that allows such reproductions of the acoustical environment in ways that are superior to existing methods. As the present invention is described herein, one skilled in the art will appreciate that the present invention may be utilized across a broad range of acoustic environmental applications.

To better appreciate the methods and systems of the present invention, it may be useful to briefly describe an example of how such acoustical environments are currently modeled, in this case, for the acoustic design of a performance center. The acoustic design of a performance center has traditionally been based on the application of a number of standard ratios, many of which have been incorporated into ISO standards such as ISO 3382, that measure properties such as clarity (early to late arriving sound energy ratio, sometimes called $C_{XX}$), definition (early to total sound energy ratio, sometimes called $D_{XX}$), Early Decay Time (EDT) and reverberation time (e.g., R60 is the time interval for a 60 dB sound decay). Design is also influenced by ratios of width to height, length to width and volume to seating area. These parameters are typically applied to measure the acoustic and physical characteristics of an auditorium as a whole, despite the fact that the perceived clarity, definition, and other attributes can vary widely from seat to seat in the auditorium and despite the fact that perceived sound can vary widely depending on the shape of the auditorium space. The parameters are also deficient in that they do not measure or describe pitch distribution and timbre, nor do they measure the actual perception of sound as a multi-dimensional experience having a spatial and temporal balance, nor do they describe or predict the effect of changes in stage house shape and design, auditorium shape and design, scenery design, design and materials on the perceived ease of performance and quality of acoustics, and the like. The present invention uses parameters that measure sound as a multi-directional and multi-dimensional experience to more accurately measure and predict the acoustic characteristics of performance centers.

The method and system of the present invention is rooted in the measurement technique utilized, and as such we begin with a description of the present invention's sound measurement technique, and how it creates multi-dimensional sound signatures for a measurement location, and multi-dimensional sound signature records for the characterization of an acoustic space.

Referring to FIG. 1, an 'open' space is shown with what we will refer to as a sound initiation location (SIL) 102 and a sound measurement location (SML) 104, where the open space is defined as an ideal space where there are no objects or media to cause a sound wave to propagate from the source, here referred to as the SIL 102, in any direction other than a straight line path, such as by reflection, refraction, diffraction, interference, and the like. It should be noted that for the sake of simplicity, this disclosure will be restricted to changes in straight line path due to only reflection, but that one skilled in the art will recognize that other acoustic parameters may apply to examples herein. As shown, in the open space as defined, the only sound that reaches the SML 104 from the SIL 102 is by a direct path. For instance, the SIL 102 may be a sound source, such as a person's voice or from a speaker, and the SML 104 may be a person's ear(s) or a microphone. In an example, the SIL 102 may be a performer and the SML 104 may be a listener, and the only sound that the listener hears is propagated directly from the performer to the listener. In common terminology, this space may be considered a 'dead' space, as there are no reflections of sound being brought to the listener from any direction other than directly from the performer.

At this point, some definitions are called for in order to allow the following description to be clear and understandable, yet not limiting to the present invention in any way. In embodiments, what we refer to as a space may be a region encompassing an acoustic space, where all sounds are generated within the acoustic space. For example, a space may be a room, such as a theater, music hall, rehearsal room, opera hall, ballet, performance room, gymnasium, sports arena, room in a home, room in a business, a hall, an alcove, an apartment, a cave, a lodging, amphitheater, arena, assembly hall, auditorium, cinema, coliseum, concert hall, playhouse, gallery, salon, church, casino, dance hall, inside an airplane, in a train, a room on a ship, and the like. A space may also be an acoustical space not defined by say the walls of a physical structure, such as in a room, including such acoustical spaces as an outdoor theater or amphitheater, an outdoor park, a valley, a mountain, a river, a gorge, an ocean, a beach, a march, a road, an airport, a train station, a ship yard, and the like.

In embodiments, the SIL 102 may include a sound source, such as a human voice, a musical instrument, siren, an animal noise, an effect of the weather or nature, background noise, and the like. In embodiments, the SIL 102 may include a sound source being projected through a sound system, such as from a speaker, dodecahedral speaker, multi-directional speakers, full range speaker, subwoofer, woofer, mid-range driver, tweeter, horn loudspeakers, piezoelectric speakers, electrostatic loudspeakers, ribbon and planar magnetic loudspeakers, bending wave loudspeakers, flat panel loudspeakers, distributed mode loudspeakers, Heil air motion transducers, plasma arc speakers, through a sound amplifier, from a sound generator, a vibrating or oscillating mechanism, electric sound generator, and the like.

In embodiments, the SML 104 may include a way to measure, record, or perceive a received incident sound, such as by way of a human ear, an animal ear, a microphone, a sound measuring facility, and the like. In embodiments, a microphone may be a condenser, capacitor or electrostatic microphone, condenser microphone, dynamic microphone, carbon microphone, piezoelectric microphone, fiber optical microphone, laser microphone, liquid microphone, mems microphone, speakers as microphones, and the like. In embodiments, a sound measuring facility may include sound level meters, data logging sound level meter, integrating sound level meter, noise dosi meters, shock tube, hydrophone, frequency analyzers, graphic level recorder, magnetic tape recorders, and the like.

In embodiments, a sound, as the term is used herein, may be a mechanical vibration transmitted through an elastic medium, such as through a solid, liquid, gas, or plasma; the auditory effect of sound waves as transmitted or recorded by a particular system of sound reproduction; the sensation produced by stimulation of the organs of hearing by vibrations transmitted through the air or other medium; and the like, and may include 'sounds' that are both audible and inaudible to the human ear.

Referring again to FIG. 1, in this instance, the only sound that is received at the SML 104 from the SIL 102 is a direct sound. That is, there are no reflected sounds being received, or measured, at the SML 104.

Figure 2:
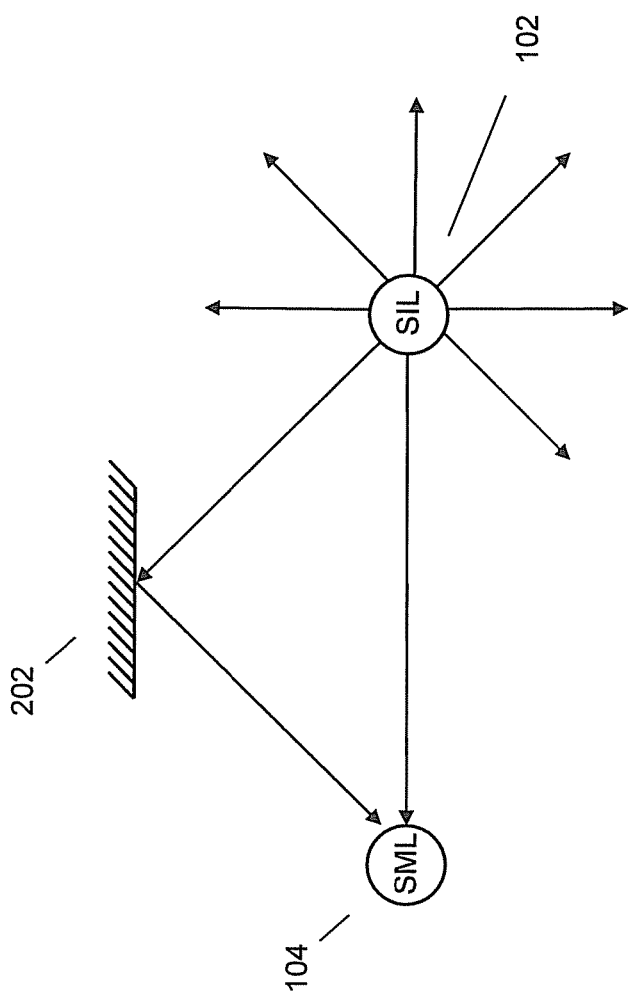
FIG. 2 depicts an SIL and SML with a single reflection surface.
Figure 3:
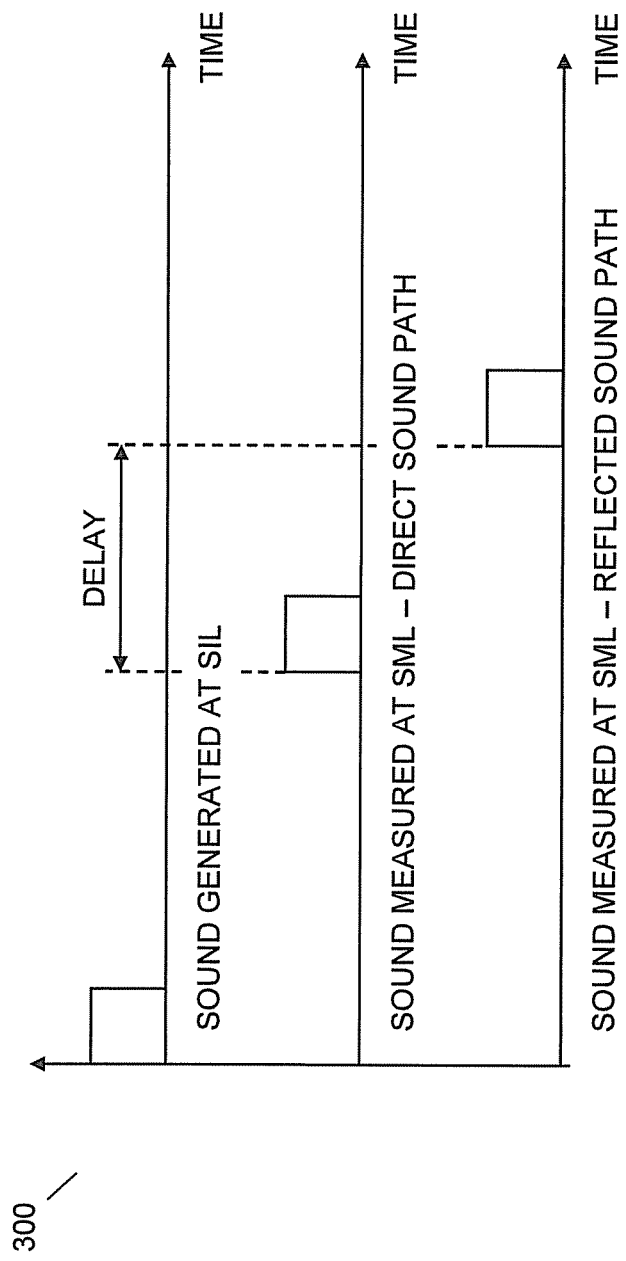
FIG. 3 depicts a timing diagram for the configuration as depicted in FIG. 2.

Referring to FIG. 2, in addition to the direct sound received at the SML 104 from the SIL 102, there is now a reflected sound that is initiated at the SIL 102, reflecting off a reflective surface 202, and reflected to the SML 104. Note that the reflected sound path is longer in distance than the direct sound path, which results in a time delay between a sound reaching the SML 104 by the direct path vs. the sound reaching the SML 104 by the reflected path. FIG. 3 shows a timing diagram 300 that illustrates this delayed timing relationship between the direct and reflected sound paths for a short duration idealized sound pulse as measured at the SML 104. This time delay turns out to be an important aspect in the character of an acoustic environment, and is one of the dimensions that may be measured by the present invention in developing the multi-dimensional acoustic characterization for a space. Note that this simple diagram is only meant to illustrate the timing delay, and for simplicity, shows the direct sound pulse terminating before the start of the reflected sound pulse. In this instance, an observer located at the SML 104 would hear two distinct sound pulses, one directly from the source and one reflected off a surface. In reality, and especially in a music venue, the direct and reflected sounds would indeed be delayed with respect to each other, but may be overlapped in occurrence, and it is this delay/overlapping that begins to reveal the acoustic character of the space, and where the present invention provides useful product.

Figure 4:
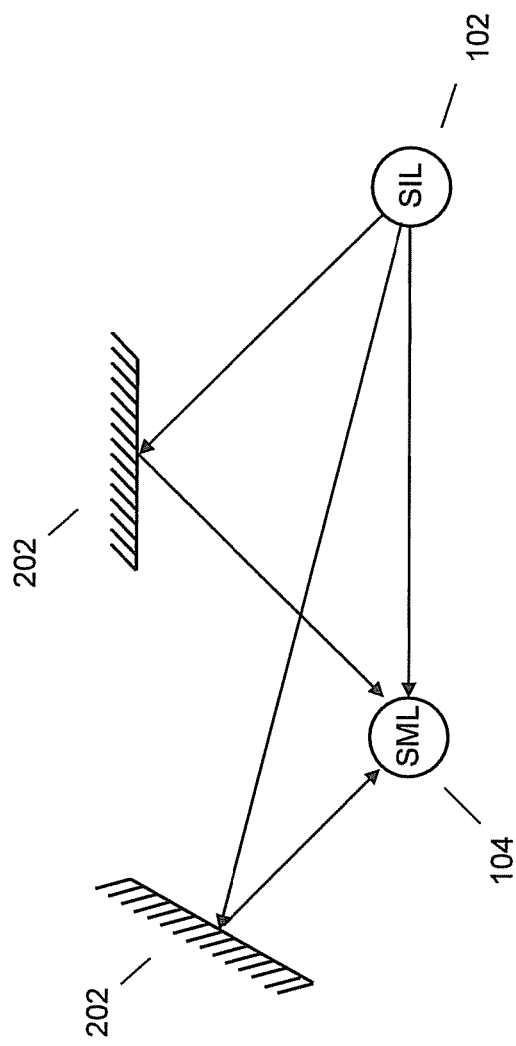
FIG. 4 depicts an SIL and SML with a two reflection surfaces.
Figure 5:
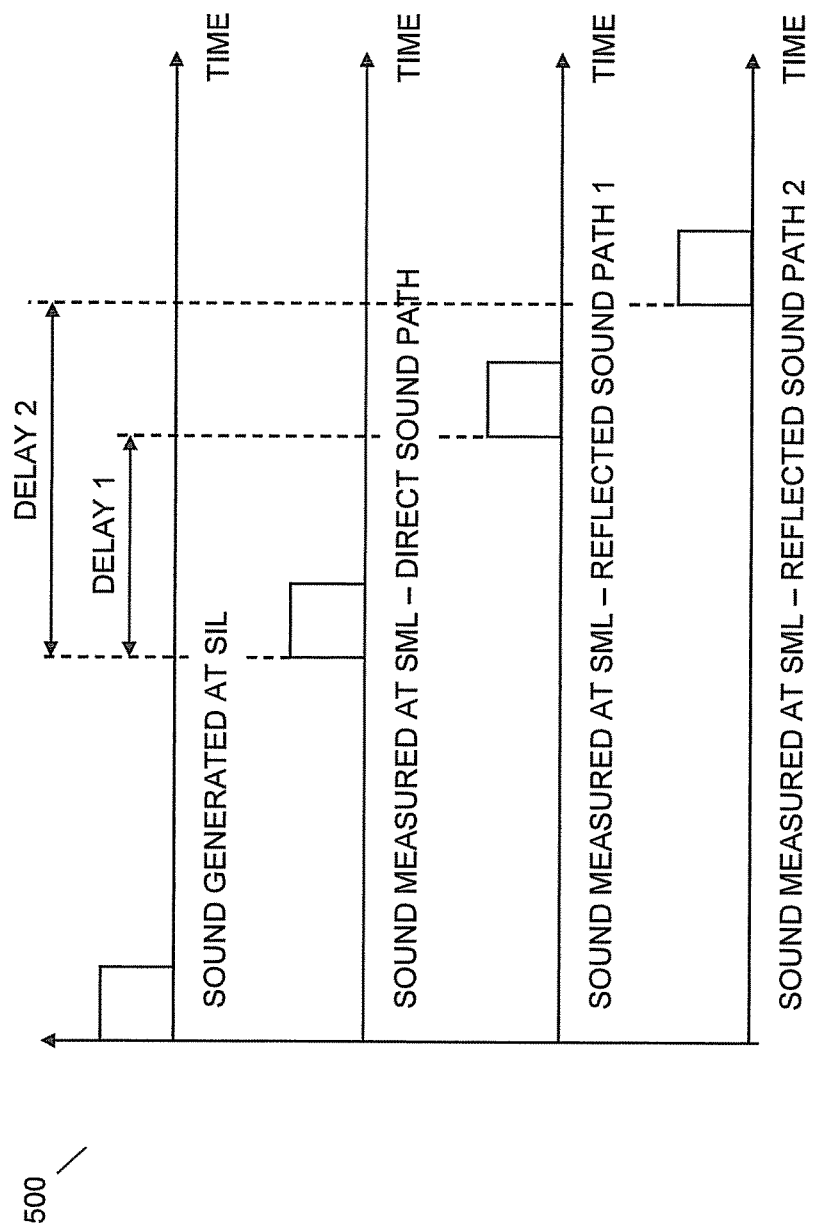
FIG. 5 depicts a timing diagram for the configuration as depicted in FIG. 4.

In a further illustration, FIG. 4 shows two reflecting surfaces 202 that reflect the sound back to the SML 104 in addition to the direct sound. Note in this instance the path length of each reflected wave is not only greater than the direct sound path, but are different from each other. FIG. 5 shows a multiple reflections timing diagram 500 showing the general relationship between the direct sound and the two reflected sounds. Here there is a first delay for the first reflected sound, and a second delay for the second reflected sound. As was the case in the last example, this diagram shows very short duration sound pulses, where a user listening at the SML 104 would now hear three distinct sounds, one for the direct sound pulse, one for the first reflection and one for the second reflection. As was the case in the last example, the sound generated at the SMI may be of a time duration such that the sound received at eh SML 104 may include an overlap of the direct sound and the first reflection, an overlap of the direct sound and both reflections, an overlap of the two reflections after the direct sound has diminished, and the like. In embodiments, the sequencing and overlapping of the direct sound with reflected sounds may contribute to the characterization of the acoustic space.

Figure 6:
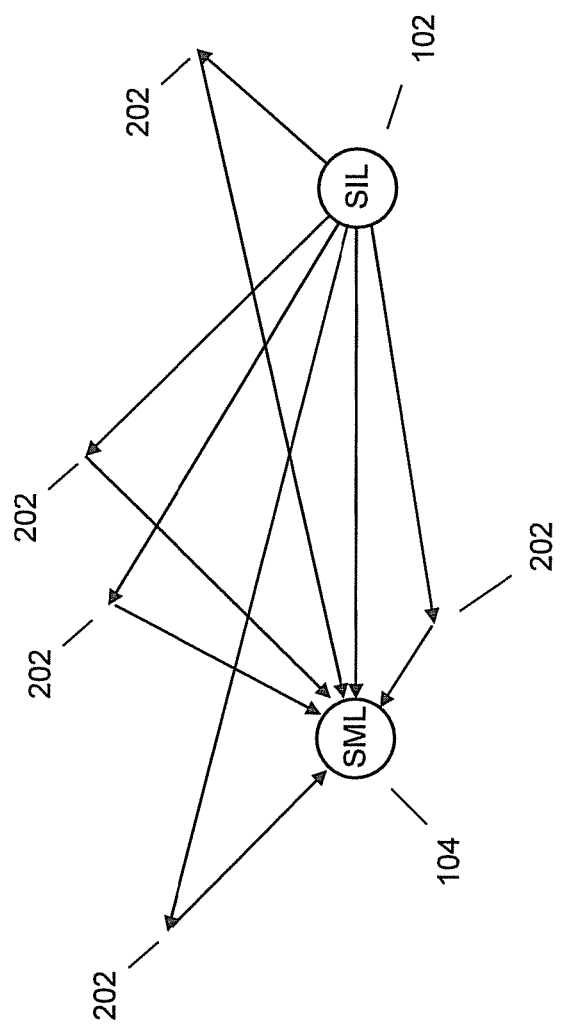
FIG. 6 depicts an SIL and SML with multiple reflections.
Figure 7:
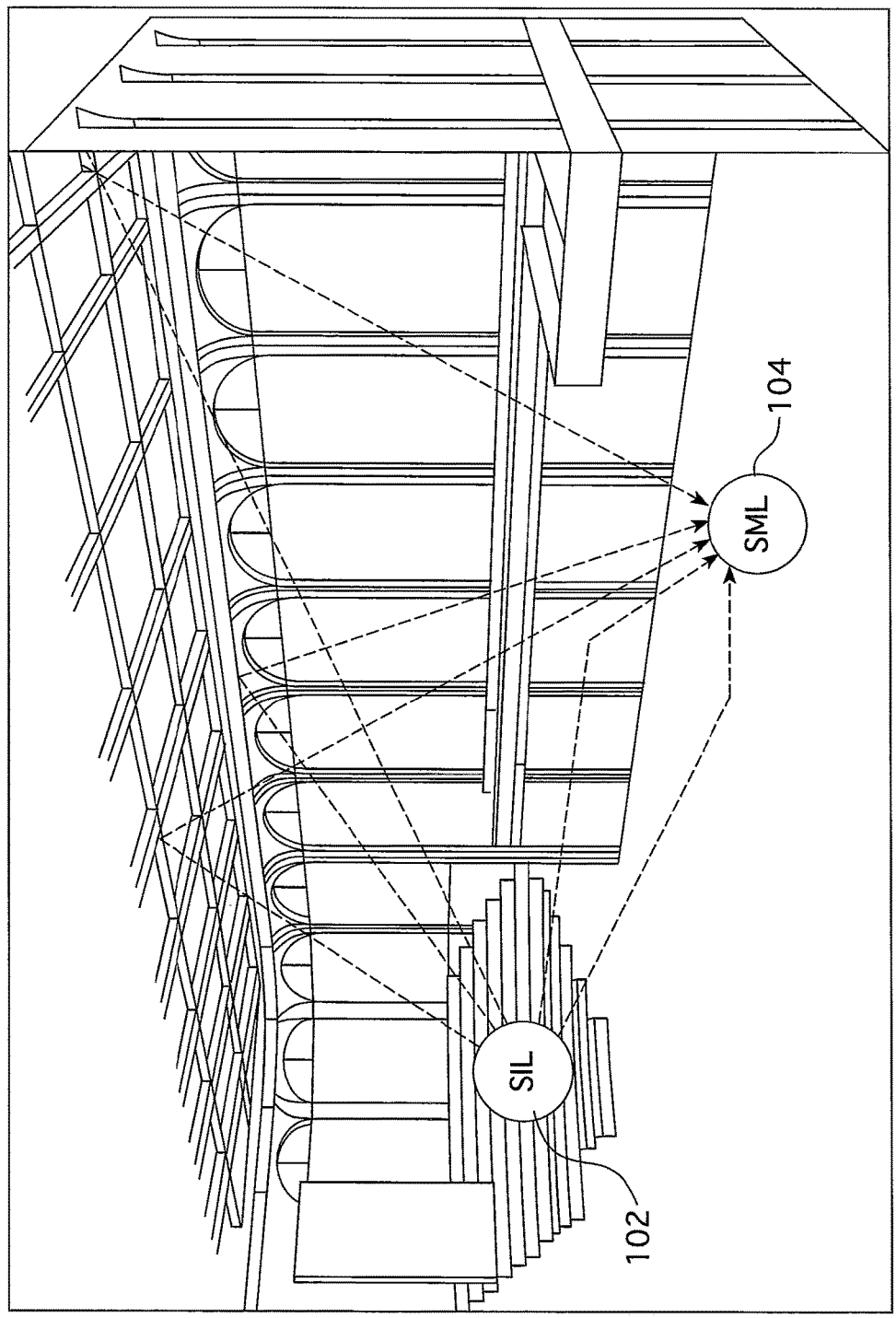
FIG. 7 depicts an example embodiment for multiple reflections relative to an SIL and SML.

In embodiments, there may be a plurality of reflections associated with the physical configuration of the space, where the sequencing and overlap of the reflections and the direct sound together contribute to the characterization of the acoustic space. For instance, FIG. 6 shows a space configuration that shows five reflections arriving at the SML 104 in addition to the sound traveling directly from the SIL 102 to the SML 104. Here, a measurement device, or user, may experience a combination of the sounds from the plurality of reflections and the direct sound, and this combination may contribute to what may be regarded as a sound signature for that SML 104. In addition, and would be appreciated by one skilled in the art, that this sound signature may include other sound parameters that may be either determined by the sound source at the SIL 102 or by the environment of the space, such as loudness, frequency, harmonics, and the like. In embodiments, the combined measurement of each of these sound parameters, and others as described herein, may be considered to me various dimensions of the sound character as measured at the SML 104, and so as related to the sound character of the space. FIG. 7 shows an example of music hall where the SIL 102 is located in some performance space, and the SML 104 is located down in a location in the audience. Here, five representative reflected sounds are shown traveling from the SIL 102 to the SML 104. This diagram is also meant to show that the reflected sounds are traveling out from the SIL 102 in all directions and reflecting off the ceiling, floor, side wall, back wall, and the like, and arriving at the SML 104 from different directions. In addition, it will be appreciated, that sounds are reflecting off a plurality of surface features, architectural features, people, and the like, where each of the reflections may contribute to the sound signature as measured at the SML 104.

Figure 8:
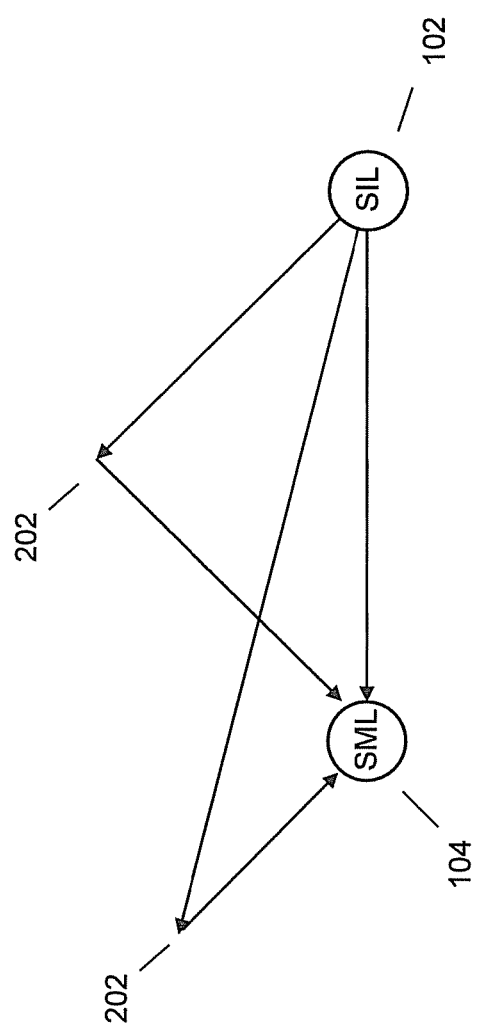
FIG. 8 depicts an SIL and SML with two reflections.
Figure 9:
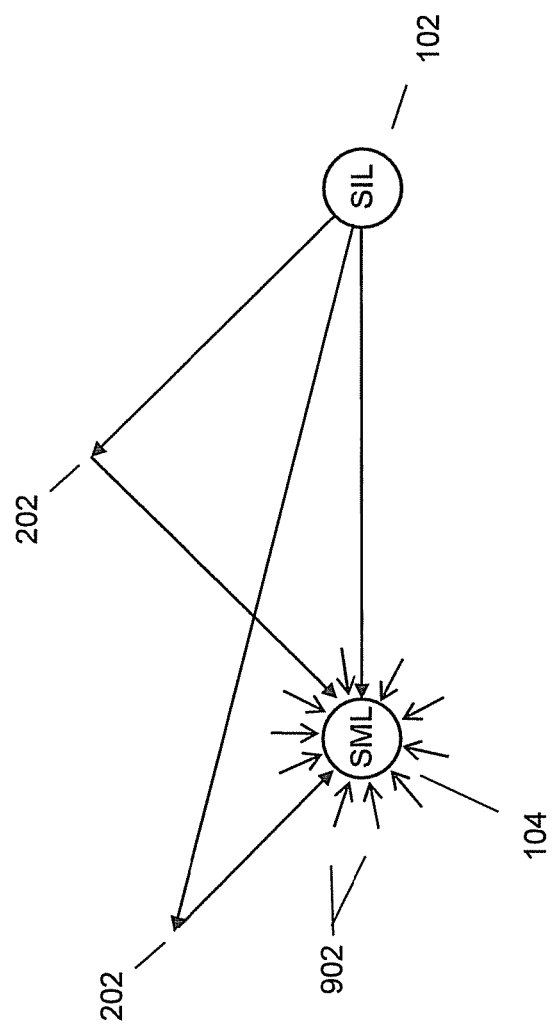
FIG. 9 depicts embodiment measurement input directions for an SML.

Returning to a simpler instance, FIG. 8 again shows the direct sound path from the SIL 102 to the SML 104, and two reflected sounds arriving at the SML 104. However, this diagram is only meant to be illustrative of two representative reflected sounds, and so only shows two reflected sounds. In reality, it can be appreciated, that these are but two of a continuum of the three dimensional sound waves that are propagating out from the SIL 102, out into the space, reflected off the surfaces of the space, and traveling back to the SML 104. In this way, there may be a plurality of reflected sounds being received at the SML 104 as the result of a sound generated at the SIL 102, all of which may contribute to the characterization of the acoustic space. FIG. 9 illustrates a simplified diagram of this case, where a measurement facility of the present invention may measure sounds from a plurality of directions 902 as incident upon the SML 104. In embodiments, the present invention may measure the sound incident upon the SML 104 in the three special dimensions, such as separated by an angular displacement, and as such, covering the sound incident upon the SML 104 from all directions. In this way, the present invention may include the three spatial dimensions as sound signature dimensions in the overall measurement of sound signature. In embodiments, the present invention may measure the sound incident upon the SML 104 as a multi-dimensional sound signature, including not only the spatial dimensions of the incident sound, but also sound parameters such as frequency, loudness, quality, and the like, and all measured as the sound generated at the SIL 102 is received at the SML 104 over time from the direct and all reflected sounds. In embodiments, the present invention may measure a multi-dimensional sound signature for the SML 104 as a result of a sound generated at the SIL 102, including sound direction, amplitude, intensity, attenuation, frequency, frequency distribution, pitch, time, time lag, time delay, loudness at a frequency, clarity, definition, timbre, arrival time, azimuth, elevation path length, reverberation time (RT), integrated energy, sound pressure, early decay time (EDT), early to late arriving sound energy ratio, early to total sound energy ratio, early-to-late sound index, early lateral energy fraction (LF), total relative sound level (G), and the like. In embodiments, the sound as generated at the SIL 102 may be audible, inaudible, multi-frequency, single frequency, varied over time, initiated by a user, a sound system (as described herein), and the like. In embodiments, the space may be unoccupied, occupied, occupied by an audience, occupied by material approximating an audience, and the like. In embodiments, the sound may not initiated but is a sound source inherent to the space, generated by at least one sound source inherent to the space, initiated by at least one sound source inherent to the space, and the like.

Figure 10:
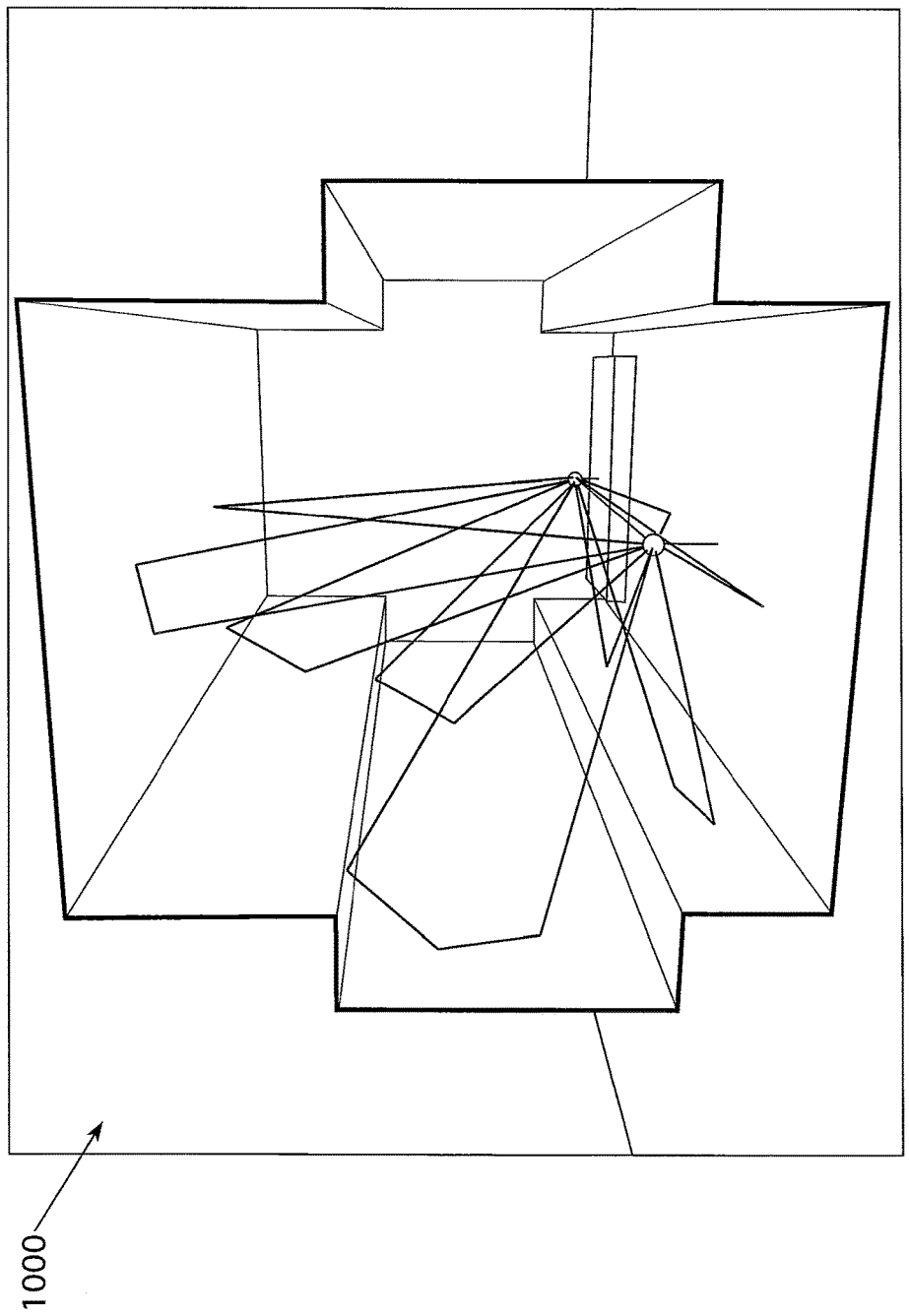
FIG. 10 depicts an example embodiment of a 'Great Hall' space with reflections shown.

In an example embodiment of a multi-dimensional sound signature, a set of measurements for a space we will refer to as the 'Great Hall' are provided in Table 1 for an SML 104 on the left side of the Great Hall's auditorium and Table 2 for an SML 104 on the right side of the Great hall, where the SIL 102 is at the center of the stage twelve feet away from the rear wall of the stage. The measurement data is for 14 reflections, and the dimensions are for minimum (min) and maximum (max) for time (T in ms), azimuth angle (Az in degrees), elevation angle (El in degrees), and level difference (A in dB). The data for Table 1 is plotted graphically 1000 in FIG. 10. In embodiments, the number of reflections required may vary for the room, such as only needing 2, 3, 5, 15, 20, and the like reflections to characterize the space. In embodiments, the present invention may only need a small number of key reflections to provide the proper characterization for the space. In embodiments, the use of values provided in Table 1 and/or Table 2 may be used with the embodiments described herein. For instance, the values, or a subset of the values, as provided in Table 1 and Table 2, may be used in the design of a new space, the redesign of an existing space, the simulation of a hypothetical space, and the like, as described herein, in order to make that space have a more pleasing acoustical character.

TABLE 1

|    |            | Tmin | Tmax | Azmin | Azmax | Elmin | Elmax | Amin  | Amax |
|----|------------|------|------|-------|-------|-------|-------|-------|------|
| R1 | floor      | 0.5  | 1.5  | −5    | 0     | 6     | −6    | −7.4  | −7.0 |
| R2 | side left  | 5.0  | 30.7 | 19    | 73    | 2     | 6     | −10.8 | −0.7 |
| R3 | side right | 7.9  | 34.8 | −76   | 22    | 2     | 5     | −10.5 | −0.9 |
| R4 | upper left | 25.4 | 69.1 | 26    | 77    | 28    | 50    | −16.6 | −2.5 |
| R5 | upper right| 28.7 | 71.4 | −79   | −29   | 27    | 47    | −16.4 | −2.7 |
| R6 | ceiling    | 39.4 | 83.9 | −36   | 0     | 45    | 83    | −17.8 | −3.2 |

TABLE 1-continued

|     |                        | Tmin | Tmax  | Azmin | Azmax | Elmin | Elmax | Amin  | Amax |
|-----|------------------------|------|-------|-------|-------|-------|-------|-------|------|
| R7  | ceiling corner left    | 43.0 | 92.5  | 19    | 73    | 42    | 70    | -18.8 | -3.7 |
| R8  | ceiling corner right   | 45.3 | 92.8  | -76   | -22   | 42    | 66    | -18.7 | -3.8 |
| R9  | rear wall              | 7.2  | 175.3 | -180  | -175  | 1     | 2     | -23.7 | -0.8 |
| R10 | side-rear left         | 11.8 | 179.8 | -202  | -190  | 1     | 2     | -24.2 | -1.5 |
| R11 | side-rear right        | 14.6 | 179.5 | -168  | -155  | 1     | 2     | -24.2 | -1.7 |
| R12 | upper corner rear left | 31.1 | 192.0 | -208  | -194  | 17    | 27    | -24.9 | -3.2 |
| R13 | upper corner rear right| 34.3 | 191.5 | -164  | -149  | 17    | 27    | -24.9 | -3.3 |
| R14 | ceiling-rear           | 44.6 | 198.3 | -180  | -175  | 27    | 43    | -25.0 | -3.8 |

TABLE 2

|     |                        | Tmin | Tmax  | Azmin | Azmax | Elmin | Elmax | Amin  | Amax |
|-----|------------------------|------|-------|-------|-------|-------|-------|-------|------|
| R1  | floor                  | 0.5  | 1.5   | 0     | 5     | -6    | -6    | -7.5  | -7.0 |
| R2  | side left              | 7.9  | 34.8  | 22    | 76    | 2     | 5     | -10.5 | -0.9 |
| R3  | side right             | 5.0  | 30.7  | -73   | -19   | 2     | 6     | -10.8 | -0.7 |
| R4  | upper left             | 28.7 | 71.4  | 29    | 79    | 27    | 47    | -16.4 | -2.7 |
| R5  | upper right            | 25.4 | 69.1  | -77   | -26   | 28    | 50    | -16.6 | -2.5 |
| R6  | ceiling                | 39.4 | 83.9  | 0     | 36    | 45    | 83    | -17.8 | -3.2 |
| R7  | ceiling corner left    | 45.3 | 92.8  | 22    | 76    | 42    | 66    | -18.7 | -3.8 |
| R8  | ceiling corner right   | 43.0 | 92.5  | -73   | -19   | 42    | 70    | -18.8 | -3.7 |
| R9  | rear wall              | 7.2  | 175.3 | 175   | 180   | 1     | 2     | -23.7 | -0.8 |
| R10 | side-rear left         | 14.6 | 179.5 | 155   | 168   | 1     | 2     | -24.2 | -1.7 |
| R11 | side-rear right        | 11.8 | 179.8 | 190   | 202   | 1     | 2     | -24.2 | -1.5 |
| R12 | upper corner rear left | 34.3 | 191.5 | 149   | 164   | 17    | 27    | -24.9 | -3.3 |
| R13 | upper corner rear right| 31.1 | 192.0 | 194   | 208   | 17    | 27    | -24.9 | -3.2 |
| R14 | ceiling-rear           | 44.6 | 198.3 | 175   | 180   | 27    | 43    | -25.0 | -3.8 |

We shall now provide a brief description of the Great Hall as perspective in relation to the values provided in Tables 1 and 2. In its basic description, the "Great Hall" is an elongated cross-shape form. Its volume may be set to provide 2.5 seconds of reverberation under occupied conditions. Its dimensions (length, width, height) have been carefully set to create an array of sound reflections to maximize the subjective impressions of sound, such as for example, 43 feet wide, 92 feet long, and 60 feet high (also referred to as the "basic room"). The listener may receive a greater number of the optimal reflections if there is an extension from this basic room on the entire long sides, such as 11 feet up from the floor extending 40 feet up, and extending 8 feet outward from the basic room. For an individual listener, there may be certain combinations of sound reflection timing, direction, and amplitude (relative to the direct sound) that produce the particularity pleasing sound quality. In embodiments, there may be a very limited number of combinations. In embodiments, it may be possible to design a room for which a large number of listeners will experience particularity pleasing sound quality, not just a few listeners.

In embodiments, at the lowest level, the room may be a narrow rectangle with a flat floor, where most of the audience is seating. The bottom rectangle may allow the creation of strong early frontal lateral reflections, such as may fall within 30 ms for all seats after the direct sound arrival, and rear lateral reflections which may reach the listeners ears from behind. At the lowest level, the room may be a narrow rectangle with a flat floor, where most of the audience is seating. The bottom rectangle may allow for the creation of strong early frontal lateral reflections, such as falling within 30 ms for all seats after the direct sound arrival, and rear lateral reflections which may reach the listeners ears from behind. These early reflections may have a primary role in the sensation of early envelopment (subjective source width) and intimacy. The choice of a flat floor may have the effect, as the listener moved towards the rear, to bring to the same level of amplitude the reflections created by the room geometry with the direct sound attenuated with distance. This may have the effect to increase the sensation of envelopment and intimacy from the center to the rear. In an example, the choice of a 46' wide room at the bottom may ensure that all the audience members may benefit from the early lateral reflections on both left and right sides. The choice of a flat floor may have the effect, as the listener moved towards the rear, to bring to the same level of amplitude the reflections created by the room geometry with the direct sound attenuated with distance. This may have the effect to increase the sensation of envelopment and intimacy from the center to the rear. The choice of a 46' wide room at the bottom ensures that all the audience members will benefit from the early lateral reflections on both left and right sides.

In embodiments, the room may then extend out in cross-section to create 2 upper corners. These may be set in space to generate upper lateral reflections coming from the sides with a 45° down angle but also from the 3D corners at the rear, to augment the sensation of "late" envelopment. These reflections may be set in time, amplitude and incidence to balance the lateral reflections created by the bottom rectangle of the room with the sensation of envelopment not only from the bottom but also from the top of the room and therefore to create an enhanced surround sound effect (these extensions on the sides may compensate for the inherent un-balance of lower versus upper lateral sound that may occur in a pure shoebox hall of the same scale). In embodiments, the geometry may then reduce in cross-section to create a top hat to encapsulate the volume for reverberation. The upper walls may be kept parallel to maximize the number of reflections occurring in the top hat for reverberation effect In embodiments, the described geometry and dimensions may have been set to create 14 key sound reflections for every audience member, which may form the basis of an array of subsequent sound reflections which constitute the base of the resulting acoustic response of the room.

The acoustics of the "Great Hall" may therefore be characterized by a reverberated sound combined with clarity and intimacy due to the proximity of the audience to sound reflective surfaces everywhere in the hall and the channeling of sound created by the side walls, and high envelopment due to the careful location of sound reflective walls and corners to create sound reflections surrounding the audience.

Figure 11:
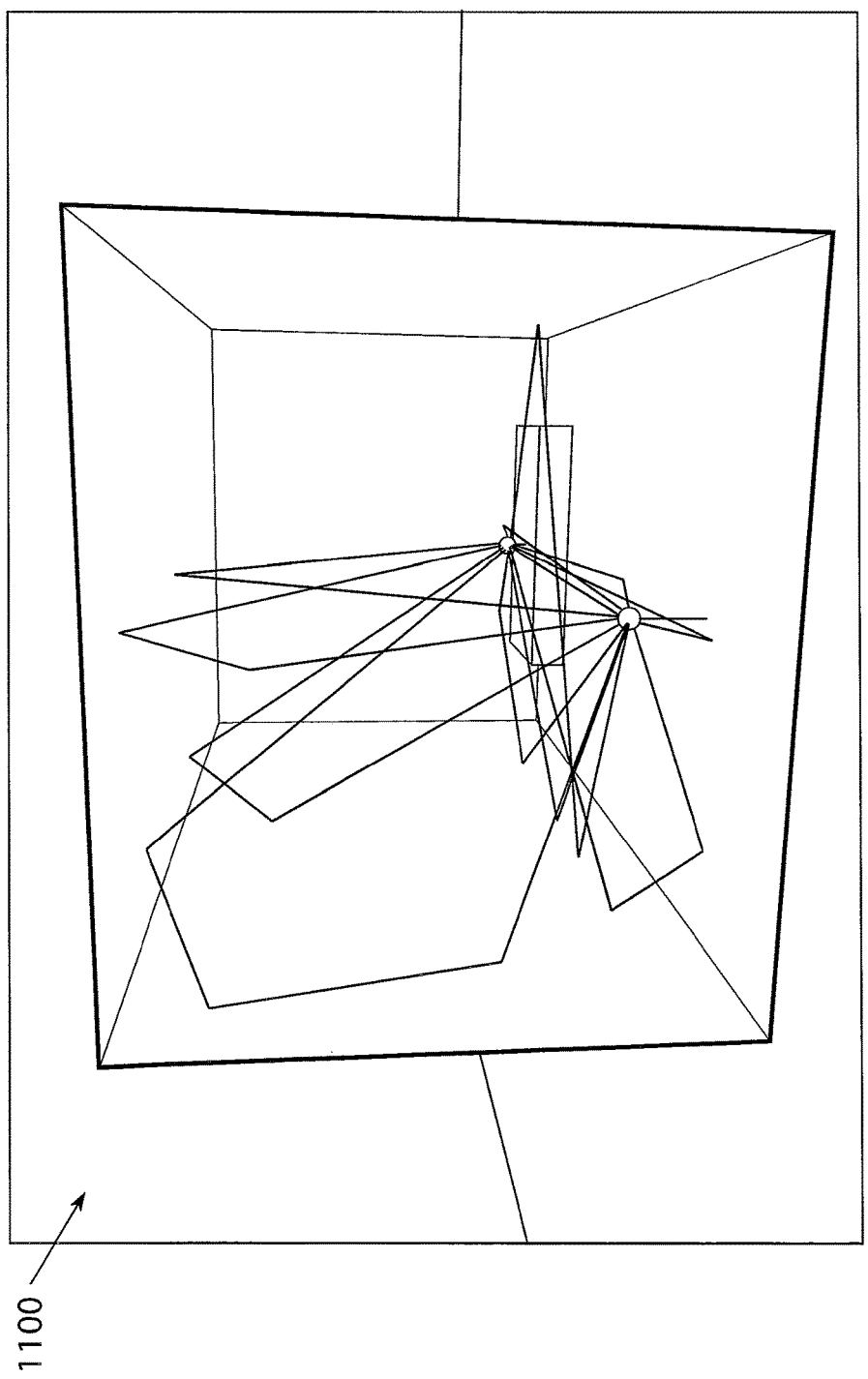
FIG. 11 depicts an example embodiment of a 'Jewel Room' space with reflections shown.

In another example embodiment of a multi-dimensional sound signature, a set of measurements for a space we will refer to as the 'Jewel Box' are provided in Table 3 for an SML 104 on the left side of the Jewel Box's auditorium and Table 4 for an SML 104 on the right side of the Jewel Box, where the SIL 102 is at the center of the stage, five feet away from the rear of the stage. The measurement data is for 17 reflections, and the dimensions are for minimum (min) and maximum (max) for time (T in ms), azimuth angle (Az in degrees), elevation angle (El in degrees), and level difference (A in dB). The data for Table 1 is plotted graphically 1100 in FIG. 11. In embodiments, the number of reflections required may vary for the room, such as only needing 2, 3, 5, 15, 20, and the like reflections to characterize the space. In embodiments, the present invention may only need a small number of key reflections to provide the proper characterization for the space. In embodiments, the use of values provided in Table 1 and/or Table 2 may be used with the embodiments described herein. For instance, the values, or a subset of the values, as provided in Table 1 and Table 2, may be used in the design of a new space, the redesign of an existing space, the simulation of a hypothetical space, and the like, as described herein, in order to make that space have a more pleasing acoustical character.

TABLE 3

|  |  | Tmin | Tmax | Azmin | Azmax | Elmin | Elmax | Amin | Amax |
|---|---|---|---|---|---|---|---|---|---|
| R1 | floor | 0.8 | 1.9 | −36 | 0 | −26 | −12 | −7.8 | −7.1 |
| R2 | front | 7.0 | 8.9 | −29 | 0 | 2 | 6 | −5.7 | −2.1 |
| R3 | side left | 3.2 | 22.1 | 27 | 71 | 2 | 5 | −10.2 | −1.1 |
| R4 | side right | 10.6 | 28.0 | −76 | −38 | 2 | 3 | −10.2 | −2.5 |
| R5 | rear | 8.3 | 67.3 | −180 | −167 | 2 | 2 | −17.8 | −2.0 |
| R6 | side-rear left | 10.9 | 73.3 | −213 | −194 | 1 | 2 | −18.9 | −2.9 |
| R7 | side-rear right | 17.6 | 73.3 | −158 | −139 | 1 | 2 | −18.9 | −4.1 |
| R8 | ceiling | 19.3 | 35.0 | −46 | 0 | 47 | 76 | −13.1 | −3.8 |
| R9 | ceiling-corner left | 21.5 | 44.6 | 27 | 71 | 41 | 63 | −15.2 | −4.5 |
| R10 | ceiling-corner right | 27.4 | 46.8 | −75 | −38 | 37 | 54 | −15.2 | −5.4 |
| R11 | ceiling-rear | 25.2 | 79.1 | −180 | −167 | 30 | 43 | −19.5 | −5.0 |
| R12 | side-side left | 23.3 | 52.2 | 52 | 80 | 1 | 2 | −16.3 | −4.8 |
| R13 | side-side right | 33.8 | 58.5 | −82 | −57 | 1 | 2 | −16.3 | −6.2 |
| R14 | front-side left | 11.3 | 25.9 | 22 | 58 | 2 | 4 | −11.6 | −3.0 |
| R15 | front-side right | 17.9 | 31.0 | −65 | −32 | 2 | 3 | −11.6 | −4.1 |
| R16 | ceiling-rear-side left | 27.3 | 84.3 | −213 | −194 | 28 | 40 | −20.4 | −5.8 |
| R17 | ceiling-rear-side right | 32.8 | 84.3 | −158 | −139 | 27 | 38 | −20.4 | −6.6 |

TABLE 4

|  |  | Tmin | Tmax | Azmin | Azmax | Elmin | Elmax | Amin | Amax |
|---|---|---|---|---|---|---|---|---|---|
| R1 | floor | 0.8 | 1.9 | 0 | 36 | −26 | −12 | −7.8 | −7.1 |
| R2 | front | 7.0 | 8.9 | 0 | 29 | 2 | 6 | −5.7 | −2.1 |
| R3 | side left | 10.6 | 28.0 | 38 | 76 | 2 | 3 | −10.2 | −2.5 |
| R4 | side right | 3.2 | 22.1 | −71 | −27 | 2 | 5 | −10.2 | −1.1 |
| R5 | rear | 8.3 | 67.3 | 167 | 180 | 2 | 2 | −17.8 | −2.0 |
| R6 | side-rear left | 17.6 | 73.3 | 139 | 158 | 1 | 2 | −18.9 | −4.1 |
| R7 | side-rear right | 10.9 | 73.3 | 194 | 213 | 1 | 2 | −18.9 | −2.9 |
| R8 | ceiling | 19.3 | 35.0 | 0 | 46 | 47 | 76 | −13.1 | −3.8 |
| R9 | ceiling-corner left | 27.4 | 46.8 | 38 | 75 | 37 | 54 | −15.2 | −5.4 |
| R10 | ceiling-corner right | 21.5 | 44.6 | −71 | −27 | 41 | 63 | −15.2 | −4.5 |
| R11 | ceiling-rear | 25.2 | 79.1 | 167 | 180 | 30 | 43 | −19.5 | −5.0 |
| R12 | side-side left | 33.8 | 58.5 | 57 | 82 | 1 | 2 | −16.3 | −6.2 |
| R13 | side-side right | 23.3 | 52.2 | −80 | −52 | 1 | 2 | −16.3 | −4.8 |
| R14 | front-side left | 17.9 | 31.0 | 32 | 65 | 2 | 3 | −11.6 | −4.1 |
| R15 | front-side right | 11.3 | 25.9 | −58 | −22 | 2 | 4 | −11.6 | −3.0 |
| R16 | ceiling-rear-side left | 32.8 | 84.3 | 139 | 158 | 27 | 38 | −20.4 | −6.6 |
| R17 | ceiling-rear-side right | 27.3 | 84.3 | 194 | 213 | 28 | 40 | −20.4 | −5.8 |

We shall now provide a brief description of the Jewel Box as perspective in relation to the values provided in Tables 3 and 4. The shape of the "Jewel Box" may be rectangular. Its volume may be set to provide 2.0 seconds of reverberation under occupied conditions. Its dimensions length, width, height may have been set to create an array of sound reflections to maximize the subjective impressions of sound. In embodiments, the Jewel Box room dimensions may be 52 ft by 36 ft by 26 ft in height. The width is such as to keep lateral reflections within 30 ms. The height/width ratio may be close to unity so that the ceiling corners create cue-ball reflections with angle of incidence close to 45° on average across the audience area, and so that these reflections reach the audience just after the side wall reflections (e.g. 20-40 ms time frame). In embodiments, the room may have a flat floor and its length is 55" to maintain strong reflections from the rear.

In embodiments, the described geometry and dimensions may have been set to create 17 key sound reflections for every audience member, which may form the basis of an array of subsequent sound reflections which constitute the base of the resulting acoustic response of the room.

The "Jewel Box" dimensions and simple geometry may therefore result in sound reflections that may surround the audience members. The acoustical result may be a loud and reverberant acoustics due to its high volume per seat and smaller dimensions and with clear, intimate and enveloping sound because of the optimized reflection timing.

Figure 12:
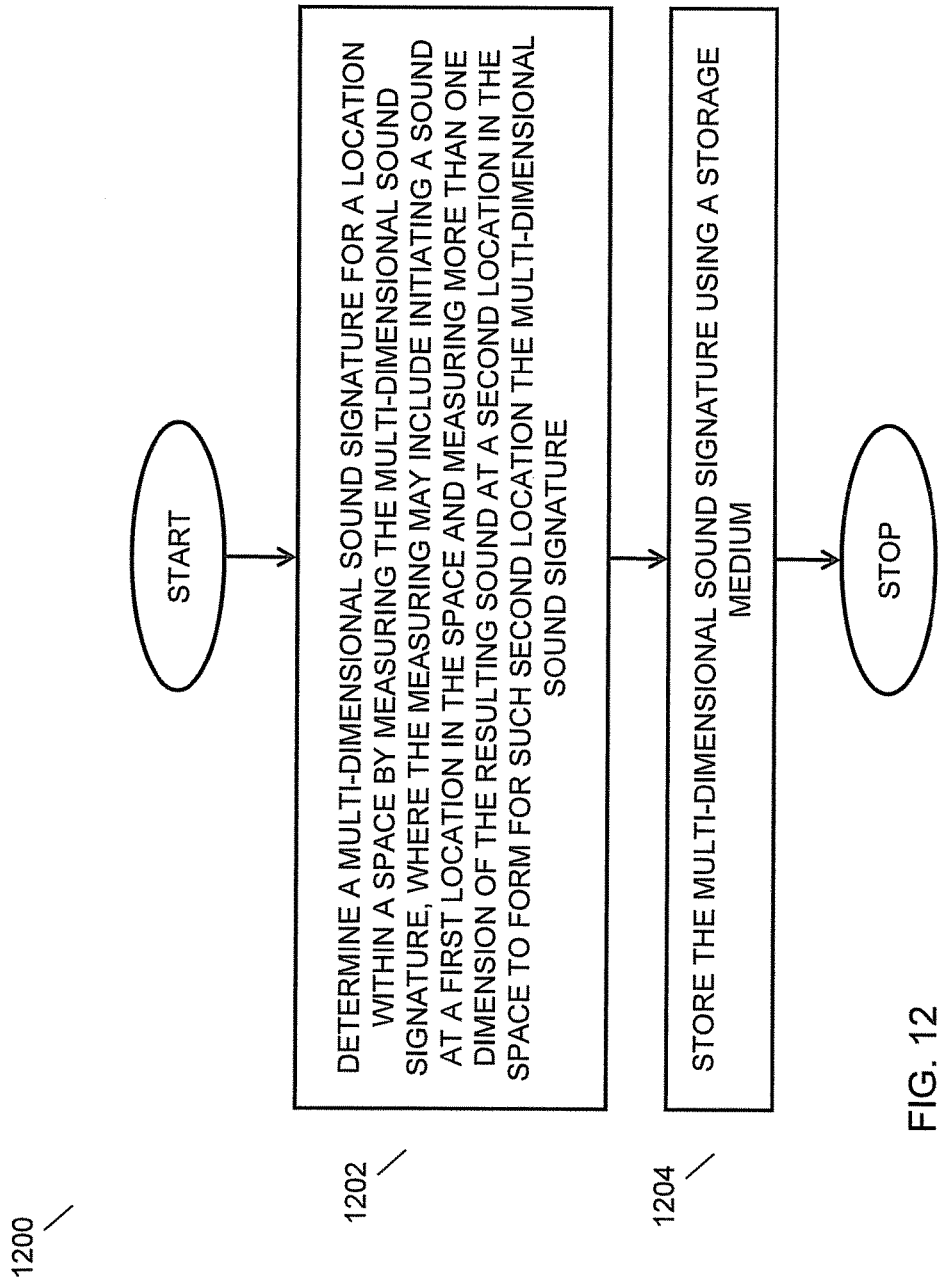
FIG. 12 depicts a flow process diagram in an embodiment of the present invention.

FIG. 12 provides an embodiment flow diagram 1200 for the present invention, where the sound is generated at a single SIL 102 and measured at a single SML 104. In embodiments, a multi-dimensional sound signature may be determined for a location within a space by measuring the multi-dimensional sound signature, where the measuring may include initiating a sound at a first location in the space and measuring more than one dimension of the resulting sound at a second location in the space to form for such second location the multi-dimensional sound signature. Further, the multi-dimensional sound signature may be stored using a storage medium. Alternately, a multi-dimensional sound signature may be determined for a location within a space, where the multi-dimensional sound signature may define a preferential order for reception of sound from a plurality of incidence directions, by measuring the multi-dimensional sound signature, where the measuring may include initiating a sound at a first location in the space and measuring more than one dimension of the resulting sound at a second location in the space to form for such second location the multi-dimensional sound signature, and storing the multi-dimensional sound signature using a storage medium. In another alternate embodiment, a sound at a first location in a space may be initiated, measuring more than one dimension of the resulting sound at a second location in the space, and storing the measurements in a storage medium to form a multi-dimensional sound signature for the second location in the space. In another alternate embodiment, a sound may be initiated at a first location in a space, measuring more than one dimension of the resulting sound at a second location in the space, and storing the measurements in a storage medium to form a multi-dimensional sound signature for the second location in the space where the multi-dimensional sound signature may define a preferential order for reception of sound from a plurality of incidence directions.

In embodiments, the multi-dimensional sound signature may consist of a plurality of sound vectors, each representing the incidence of sound at the second location from a direction defined by three spatial dimensions, and each including the time lag and loudness at a frequency from the direction. The multi-dimensional sound signature may consist of a plurality of sound vectors, each representing the incidence of sound at the second location from a direction defined by three spatial dimensions, and each including the time lag and loudness from the direction. The dimensions may include direction defined by three spatial dimensions, time lag, amplitude, and the like. The more than one dimension may include loudness amplitude and time-lag defined by three spatial dimensions. A dimension may be the difference in the timing of arrival of sound at the second location from different directions. A dimension may be the difference between the timing of arrival of reflected sound versus sound traveling directly from the first location to the second location. A dimension may be the difference in the amplitude of the sound arriving at the second location from different directions. A dimension may be the difference between the amplitude of reflected sound versus sound traveling directly from the first location to the second location. The multi-dimensional sound signature may associate a timing range for each incidence direction following reflection relative to sound reaching each location without reflection. The multi-dimensional sound signature may associate a timing range for each incidence direction following reflection relative to a time in which the sound was created. The multi-dimensional sound signature may define a preferential timing for reception of sound from a plurality of incidence directions. The multi-dimensional sound signature defines a preferential order for reception of sound from a plurality of incidence directions.

In embodiments, representations of a multi-dimensional sound signature may include measured values are represented by a vector diagram, where the length of the vector in the vector diagram may represent loudness, the direction of the vector in the vector diagram may represent the incident angle of the incoming sound, the color of the vector in the vector diagram may represent time lag, and the like. In embodiments, the creation of a multi-dimensional sound signature may be made at different angles, such as repeating measurements at specific degree increments, making the measurement at increments of approximately a certain angle, making the measurement at angular separation granulation for vector representation of a given angle, and the like, where the angle may be 10 degrees, 15 degrees, 20 degrees, and the like. In embodiments, the sound signature may be represented as a time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, a space may be an open or a closed space, such as in the outdoors or in a closed room, hall, and such. A space may include both a stage and an auditorium, both a performance location and a performance observation location, a stage and the first and second location both located on the stage, only a stage, only a performance location, less than all of the volume of the structure housing the space, a subset of the structure housing the space, and the like. In embodiments, the space may be an ante room, choir box, ball court, organ church, Bach organ church, is a basilica, baroque opera house, opera house, cathedral, amphitheater, conference room, office, gymnasium, movie theater, vehicle interior, automobile interior, aircraft interior, train interior, marine interior, public space, airport, train station, subway station, hospital, a great hall, a jewel box, a music salon, a ballroom, an oratorio, and the like. In embodiments, an example of a great hall space may have the dimensions of 43 feet wide, 92 feet long, and 60 feet high. In embodiments, an example of a jewel box space may have the dimensions of 52 feet wide, 36 feet long, and 26 feet high. In embodiments, an example of a music salon may have the dimensions of 26 feet wide, 36 feet long, and 16 feet high. In embodiments, an example of a ballroom may have the dimensions of 26 feet wide, 62 feet long, and 16 feet high. In embodiments, an example of an oratorio may be 26 feet wide, 62 feet long, and 40 feet high.

Figure 13:
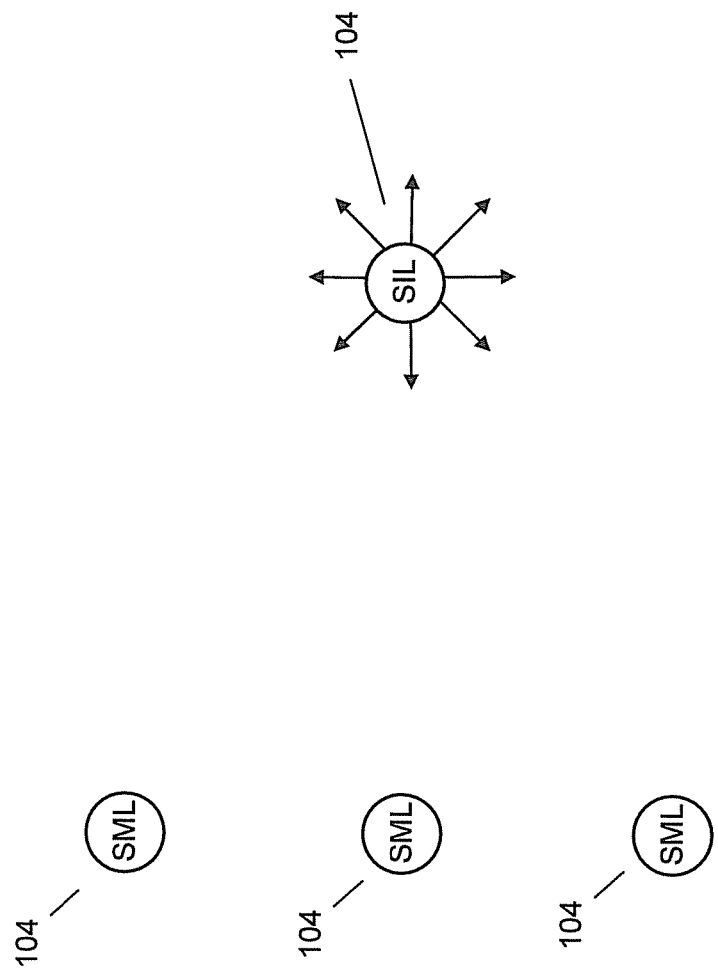
FIG. 13 depicts a single SIL and multiple SMLs.

In embodiments, a multi-dimensional sound signature for a sound initiated an SIL 102 may be measured at a plurality of different SMLs 104, such as illustrated in FIG. 13, and where the measurements taken at the different SMLs 104 are combined into a single multi-dimensional sound signature composite. For example, a speaker is placed at an SIL 102 to producing a sound for measurement (which may consist of any of the dimensions described herein), such as where a singer would stand during a performance. A sound measuring facility may then be placed each of a plurality of locations, such as where audience members would be seated during the performance. The multi-dimensional sound signature for each SML 104 may then be combined to create a multi-dimensional sound signature composite. In this way, the multi-dimensional sound signature composite may provide a characteristic sound signature for a listening area, as opposed to a multi-dimensional sound signature for a single SML 104. In embodiments, the multi-dimensional sound signature composite may enable the characterization across a number of SMLs 104, such as in providing an average of specific dimensions, a range of specific dimensions, a figure of merit associated with certain profiles of dimensions such as related to multi-dimensional sound signatures from other spaces or from the same space from a different time or different set of circumstances, and the like. In embodiments, a multi-dimensional sound signature composite may enable the present invention to characterize the listening environment for an acoustic venue, such as an indoor or outdoor venue, a sports venue, an entertainment venue, a manmade environment, a natural environment, and the like. In embodiments, one could image a great number of applications for using a multi-dimensional sound signature composite, such as to design a new venue to reproduce the signature of a known venue, re-design a venue, re-create the acoustic environment for rehearsal or entertainment facilities, and the like, such as described herein.

Figure 14:
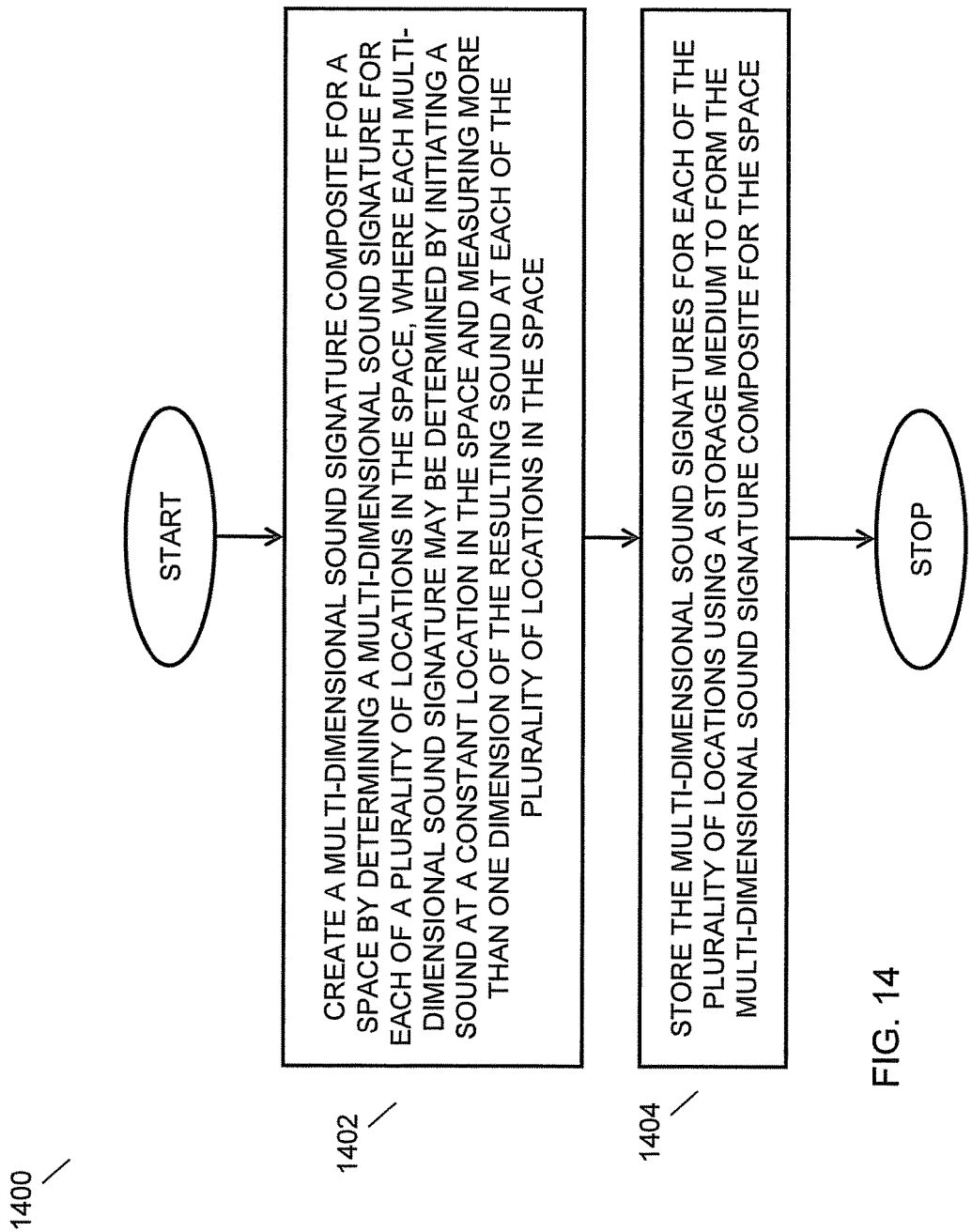
FIG. 14 depicts a flow process diagram in an embodiment of the present invention.

FIG. 14 provides an embodiment flow diagram 1400 for the present invention, where the sound is generated at a single SIL 102 and measured at a plurality of SMLs 104. In embodiments, a multi-dimensional sound signature composite for a space may be created by determining a multi-dimensional sound signature for each of a plurality of locations in the space, where each multi-dimensional sound signature may be determined by initiating a sound at a constant location in the space and measuring more than one dimension of the resulting sound at each of the plurality of locations in the space. Further, the multi-dimensional sound signatures may be stored for each of the plurality of locations using a storage medium to form the multi-dimensional sound signature composite for the space. Alternately, a multi-dimensional sound signature composite may be created for a space, where the multi-dimensional sound signature composite may define a preferential order for reception of sound from a plurality of incidence directions by determining a multi-dimensional sound signature for each of a plurality of locations in the space. Each multi-dimensional sound signature may be determined by initiating a sound at a constant location in the space and measuring more than one dimension of the resulting sound at each of the plurality of locations in the space. The multi-dimensional sound signatures for each of the plurality of locations may then be stored by using a storage medium to form the multi-dimensional sound signature composite for the space. In another alternate embodiment, storing in a multi-dimensional sound signature composite for a space the multi-dimensional sound signatures for a plurality of locations with the space in respect of sound initiated at a source location within the space. In another alternate embodiment, storing in a multi-dimensional sound signature composite for a space the multi-dimensional sound signatures for a plurality of locations with the space in respect of sound initiated at a source location within the space, where the multi-dimensional sound signature composite may defines a preferential order for reception of sound from a plurality of incidence directions. In another alternate embodiment, a sound may be initiated at a first location in a space, measuring more than one dimension of the resulting sound at a plurality of other locations in the space, and storing the measurements for each other location in a storage medium to form a multi-dimensional sound signature composite for the space. In an alternate embodiment, a sound may be initiated at a first location in a space, measuring more than one dimension of the resulting sound at a plurality of other locations in the space, and storing the measurements for each other location in a storage medium to form a multi-dimensional sound signature composite for the space. The multi-dimensional sound signature composite may define a preferential order for reception of sound from a plurality of incidence directions.

In embodiments, the multi-dimensional sound signature composite may be a data record, a table, stored in a database, and the like. The multi-dimensional sound signature composite may associate a timing range for each incidence direction following reflection relative to sound reaching each location without reflection. The multi-dimensional sound signatures in the multi-dimensional sound signature composite may associate a timing range for each incidence direction following reflection relative to a time in which the sound was created. The multi-dimensional sound signatures in the multi-dimensional sound signature composite may define a preferential timing for reception of sound from a plurality of incidence directions. The multi-dimensional sound signatures in the multi-dimensional sound signature composite may define an amplitude range for each incidence direction. The multi-dimensional sound signatures in the multi-dimensional sound signature composite may define a preferential order for reception of sound from a plurality of incidence directions. The multi-dimensional sound signature composite may include information about the tonal distribution of sound reaching the plurality of locations from a plurality of incidence directions. The multi-dimensional sound signature composite may include information about the tonal distribution of sound reaching the plurality of locations from a plurality of incidence directions and where the tonal distribution may include a high-frequency drop-off that is greater than the masking effect of air. In embodiments, the creation of a multi-dimensional sound signature composite may include a repeat process, such as repeating measurements at a specific degree increments, the measurement is repeated at increments of approximately a certain angle, the angular separation granulation for vector representation is a given angle, and the like, where the angle may be 10 degrees, 15 degrees, 20 degrees, and the like.

Figure 15:
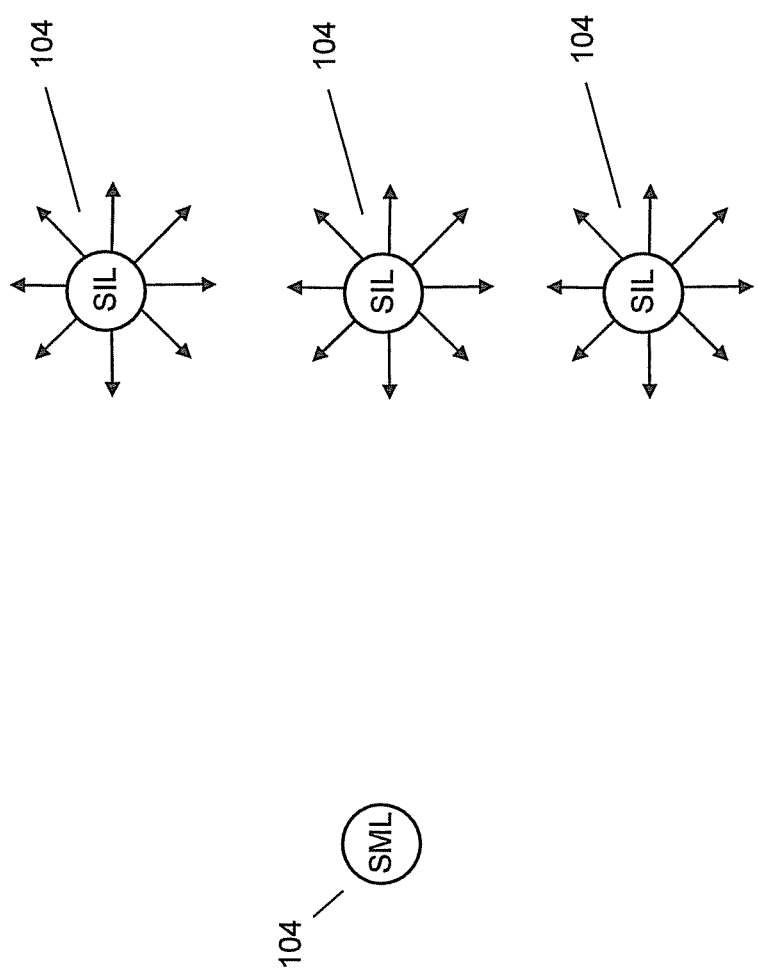
FIG. 15 depicts multiple SILs and a single SML.

In embodiments, a multi-dimensional sound signature for a sound initiated at a plurality of SILs 102 may be measured at a single SML 104, such as illustrated in FIG. 15, and where the measurements taken as a result of sound generated at the plurality of SMLs 104 are combined into a single multi-dimensional sound signature composite. For example, a speaker is placed at a plurality of SILs 102 to produce a sound for measurement (which may consist of any of the dimensions described herein), such as where a performing group would stand during a performance. A sound measuring facility may then be placed at the SML 104, such as at a select location where an audience member would be seated during the performance. The multi-dimensional sound signature, as a result of the plurality of SILs 102, may then be combined to create a multi-dimensional sound signature composite. In this way, the multi-dimensional sound signature composite may provide a characteristic sound signature for a sound generation area, such as a performance area, as opposed to a multi-dimensional sound signature for a single SML 104 from a single SIL 102. In embodiments, the multi-dimensional sound signature composite may enable the characterization across a number of SILs 102, such as in providing an average of specific dimensions, a range of specific dimensions, a figure of merit associated with certain profiles of dimensions such as related to multi-dimensional sound signatures from other spaces or from the same space from a different time or different set of circumstances, and the like. In embodiments, a multi-dimensional sound signature composite may enable the present invention to characterize the sound environment for an acoustic venue, such as an indoor or outdoor venue, a sports venue, an entertainment venue, a manmade environment, a natural environment, and the like. In embodiments, one could image a great number of applications for using a multi-dimensional sound signature composite, such as to design a new venue to reproduce the signature of a known venue, re-design a venue, re-create the acoustic environment for rehearsal or entertainment facilities, and the like, such as described herein. In embodiments, one skilled in the art will appreciate that the combining of measurements may include any combination of isolated or simultaneous SIL 102 activations, such a generating sound from a single SIL 102 at a time, from all SILs 102 at once, from multiple of SILs 102 at a time, and the like, and then combining the measurements to create the multi-dimensional sound signature composite. In embodiments, the multi-dimensional sound signature composite may also be used to determine the ambient or baseline multi-dimensional sound signature for a space, where the sound sources are the sound sources inherent to the space.

Figure 16:
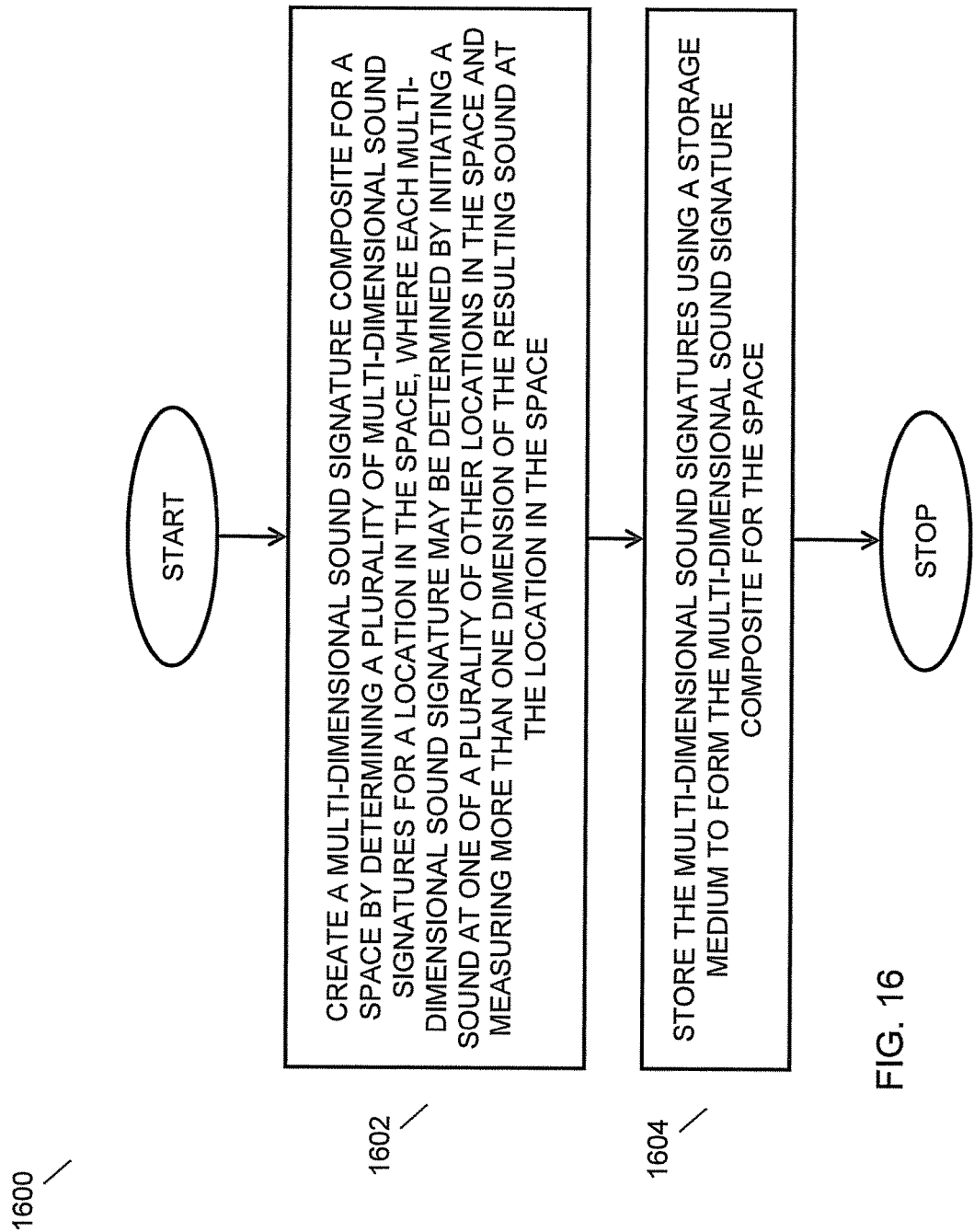
FIG. 16 depicts a flow process diagram in an embodiment of the present invention.

FIG. 16 provides an embodiment flow diagram 1600 for the present invention, where the sound is generated at a multiple SILs 102 and measured at a single SML 104. In embodiments, a multi-dimensional sound signature composite may be created for a space, where the multi-dimensional sound signature composite may define a preferential order for reception of sound from a plurality of incidence directions, by determining a plurality of multi-dimensional sound signatures for a location in the space. Each multi-dimensional sound signature may be determined by initiating a sound at one of a plurality of other locations in the space and measuring more than one dimension of the resulting sound at the location in the space. The multi-dimensional sound signatures may then be stored using a storage medium to form the multi-dimensional sound signature composite for the space. In an alternate embodiment, a multi-dimensional sound signature composite may be stored for a space the multi-dimensional sound signatures for a location within the space in respect of sound initiated at a plurality of source locations within the space. In another alternate embodiment, a multi-dimensional sound signature composite of the multi-dimensional sound signatures may be stored for a space for a location within the space in respect of sound initiated at a plurality of source locations within the space, where the multi-dimensional sound signatures may define a preferential order for reception of sound from a plurality of incidence directions. In another alternative embodiment, more than one dimension of the sound at a location may be measured in a space resulting from sound initiated at a plurality of other locations in the space, and storing the measurements in a storage medium to form a multi-dimensional sound signature composite for the space. In another alternative embodiment, more than one dimension of the sound may be measured at a location in a space resulting from sound initiated at a plurality of other locations in the space, and storing the measurements in a storage medium to form a multi-dimensional sound signature composite for the space, where the multi-dimensional sound signature composite may define a preferential order for reception of sound from a plurality of incidence directions.

In embodiments, the multi-dimensional sound signature composite may be a data record, a table, a database, and the like. The multi-dimensional sound signatures in the multi-dimensional sound signature composite may associate a timing range for each incidence direction following reflection relative to sound reaching each location without reflection. The multi-dimensional sound signatures in the multi-dimensional sound signature composite may associate a timing range for each incidence direction following reflection relative to a time in which the sound was created. The multi-dimensional sound signatures in the multi-dimensional sound signature composite define a preferential timing for reception of sound from a plurality of incidence directions. The multi-dimensional sound signatures in the multi-dimensional sound signature composite may define an amplitude range for each incidence direction. The multi-dimensional sound signatures in the multi-dimensional sound signature composite may define a preferential order for reception of sound from a plurality of incidence directions. The multi-dimensional sound signature composite may include information about the tonal distribution of sound reaching the plurality of locations from a plurality of incidence directions. The multi-dimensional sound signature composite may include information about the tonal distribution of sound reaching the plurality of locations from a plurality of incidence directions and the tonal distribution includes a high-frequency drop-off that is greater than the masking effect of air. In embodiments, the creation of a multi-dimensional sound signature composite may include a repeat process, such as repeating measurements at a specific degree increments, the measurement is repeated at increments of approximately a certain angle, the angular separation granulation for vector representation is a given angle, and the like, where the angle may be 10 degrees, 15 degrees, 20 degrees, and the like.

Figure 17:
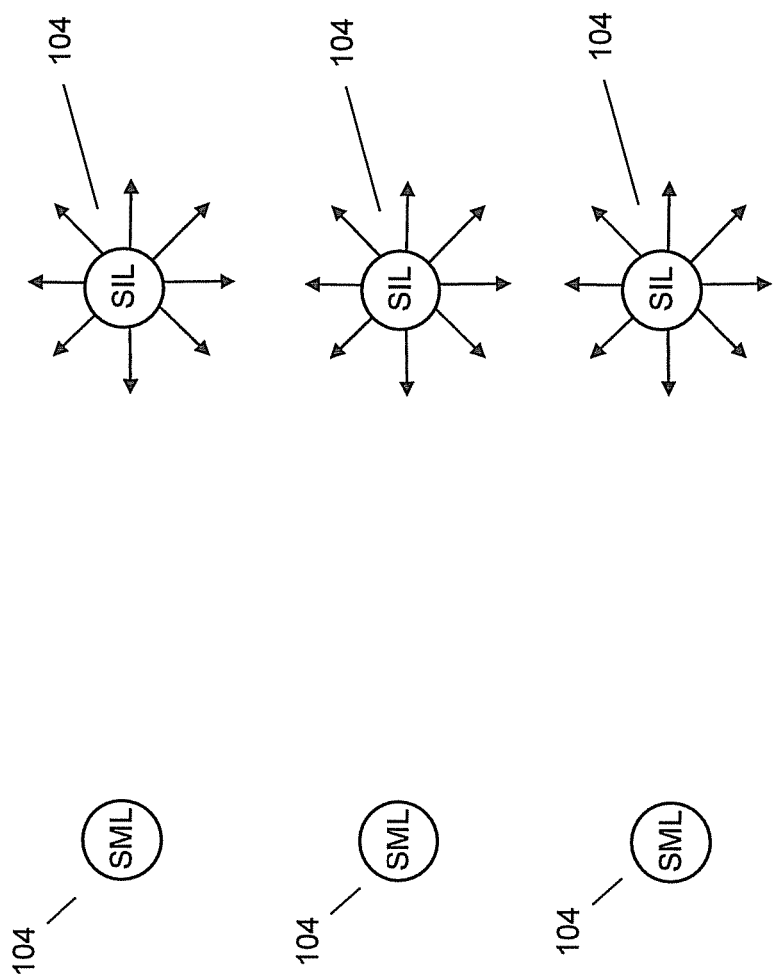
FIG. 17 depicts multiple SILs and multiple SMLs.

In embodiments, a multi-dimensional sound signature for a sound initiated at a plurality of SILs 102 may be measured at a plurality of SMLs 104, such as illustrated in FIG. 17, and where the measurements taken as a result of sound generated at the plurality of SMLs 104 are combined into a multi-dimensional sound signature composite. For example, a speaker is placed at a plurality of SILs 102 to produce a sound for measurement (which may consist of any of the dimensions described herein), such as where a performing group would stand during a performance. A sound measuring facility may then be placed at each of the SMLs 104, such as at select locations where an audience member would be seated during the performance. The multi-dimensional sound signatures as measured by each of the plurality of SMLs 104, and as a result of the sound generated at the plurality of SILs 102, may then be combined to create a multi-dimensional sound signature composite. In this way, the multi-dimensional sound signature composite may provide a characteristic sound signature for space, such as a combination of a performance area and a listening area. In embodiments, the multi-dimensional sound signature composite may enable the characterization across a plurality of SILs 102 for a plurality of SMLs 104, such as in providing an average of specific dimensions, a range of specific dimensions, a figure of merit associated with certain profiles of dimensions such as related to multi-dimensional sound signatures from other spaces or from the same space from a different time or different set of circumstances, and the like. In embodiments, a multi-dimensional sound signature composite may enable the present invention to characterize the sound environment for an acoustic venue, such as an indoor or outdoor venue, a sports venue, an entertainment venue, a manmade environment, a natural environment, and the like. In embodiments, one could image a great number of applications for using a multi-dimensional sound signature composite, such as to design a new venue to reproduce the signature of a known venue, re-design a venue, re-create the acoustic environment for rehearsal or entertainment facilities, and the like, such as described herein. In embodiments, one skilled in the art will appreciate that the combining of measurements may include any combination of isolated or simultaneous SIL 102 activations, such a generating sound from a single SIL 102 at a time, from all SILs 102 at once, from multiple of SILs 102 at a time, and the like, and then combining the measurements to create the multi-dimensional sound signature composite at each SML 104, for combinations of SML 104 at once, for all SMLs 104 at once, and the like. In embodiments, the multi-dimensional sound signature composite may also be used to determine the ambient or baseline multi-dimensional sound signature for a space, where the sound sources are the sound sources inherent to the space.

Figure 18:
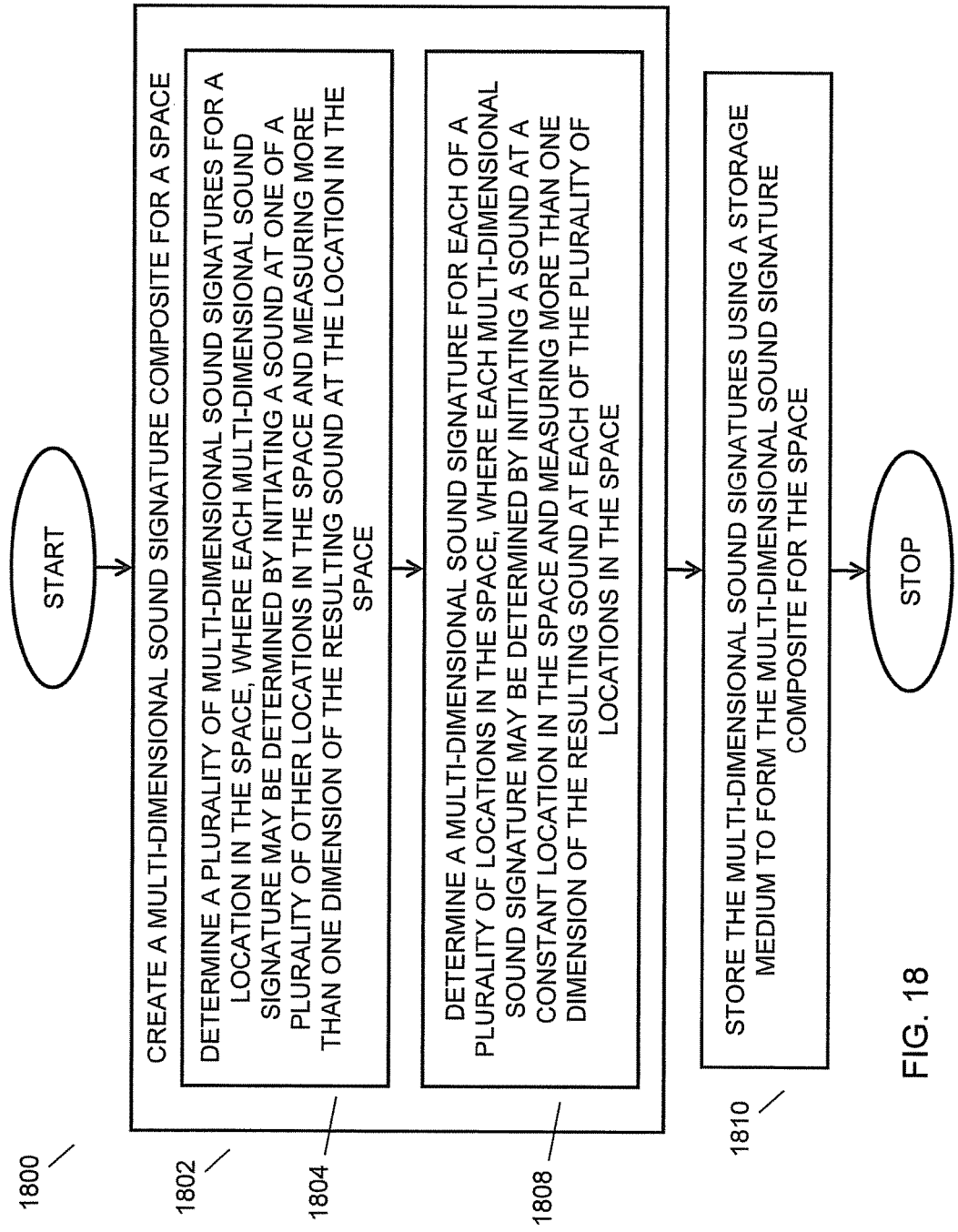
FIG. 18 depicts a flow process diagram in an embodiment of the present invention.

FIG. 18 provides an embodiment flow diagram 1800 for the present invention, where the sound is generated at multiple SILs 102 and measured at multiple SMLs 104. In embodiments, a multi-dimensional sound signature composite may be created for a space by, (i) determining a plurality of multi-dimensional sound signatures for a location in the space, where each multi-dimensional sound signature may be determined by initiating a sound at one of a plurality of other locations in the space and measuring more than one dimension of the resulting sound at the location in the space and (ii) determining a multi-dimensional sound signature for each of a plurality of locations in the space, where each multi-dimensional sound signature may be determined by initiating a sound at a constant location in the space and measuring more than one dimension of the resulting sound at each of the plurality of locations in the space. The multi-dimensional sound signatures may then be stored using a storage medium to form the multi-dimensional sound signature composite for the space. In an alternate embodiment, a multi-dimensional sound signature composite may be created for a space by: (i) determining a plurality of multi-dimensional sound signatures for a location in the space, where each multi-dimensional sound signature may be determined by initiating a sound at one of a plurality of other locations in the space and measuring more than one dimension of the resulting sound at the location in the space and (ii) determining a multi-dimensional sound signature for each of a plurality of locations in the space, where each multi-dimensional sound signature may be determined by initiating a sound at a constant location in the space and measuring more than one dimension of the resulting sound at each of the plurality of locations in the space. The multi-dimensional sound signatures may be stored using a storage medium to form the multi-dimensional sound signature composite for the space, where the multi-dimensional sound signature composite may define a preferential order for reception of sound from a plurality of incidence directions. In another alternate embodiment, a multi-dimensional sound signature composite may be stored for a space the (i) multi-dimensional sound signatures for a location within the space in respect of sound initiated at a plurality of source locations within the space and (ii) multi-dimensional sound signatures for a plurality of locations within the space in respect of sound initiated at a source location within the space. In another alternate embodiment, a multi-dimensional sound signature composite may be stored for a space, where the multi-dimensional sound signature composite may define a preferential order for reception of sound from a plurality of incidence directions, the (i) multi-dimensional sound signatures for a location within the space in respect of sound initiated at a plurality of source locations within the space and (ii) multi-dimensional sound signatures for a plurality of locations within the space in respect of sound initiated at a source location within the space. In another alternate embodiment, more than one dimension of the sound may be measured at a location in a space resulting from sound initiated at a plurality of other locations in the space, initiating a sound at a first location in a space and measuring more than one dimension of the resulting sound at a plurality of other locations in the space, and storing the measurements in a storage medium to form a multi-dimensional sound signature composite for the space. In another alternate embodiment, more than one dimension of the sound may be measured at a location in a space resulting from sound initiated at a plurality of other locations in the space, initiating a sound at a first location in a space and measuring more than one dimension of the resulting sound at a plurality of other locations in the space, and storing the measurements in a storage medium to form a multi-dimensional sound signature composite for the space, where the multi-dimensional sound signature composite may define a preferential order for reception of sound from a plurality of incidence directions.

In embodiments, the multi-dimensional sound signature composite may be a data record, a table, a database, and the like. The multi-dimensional sound signatures in the multi-dimensional sound signature composite may associate a timing range for each incidence direction following reflection relative to sound reaching each location without reflection. The multi-dimensional sound signatures in the multi-dimensional sound signature composite may associate a timing range for each incidence direction following reflection relative to a time in which the sound was created. The multi-dimensional sound signatures in the multi-dimensional sound signature composite may define a preferential timing for reception of sound from a plurality of incidence directions. The multi-dimensional sound signatures in the multi-dimensional sound signature composite may define an amplitude range for each incidence direction. The multi-dimensional sound signatures in the multi-dimensional sound signature composite may define a preferential order for reception of sound from a plurality of incidence directions. The multi-dimensional sound signature composite may include information about the tonal distribution of sound reaching the plurality of locations from a plurality of incidence directions. The multi-dimensional sound signature composite may include information about the tonal distribution of sound reaching the plurality of locations from a plurality of incidence directions and the tonal distribution may include a high-frequency drop-off that is greater than the masking effect of air.

Figure 19:
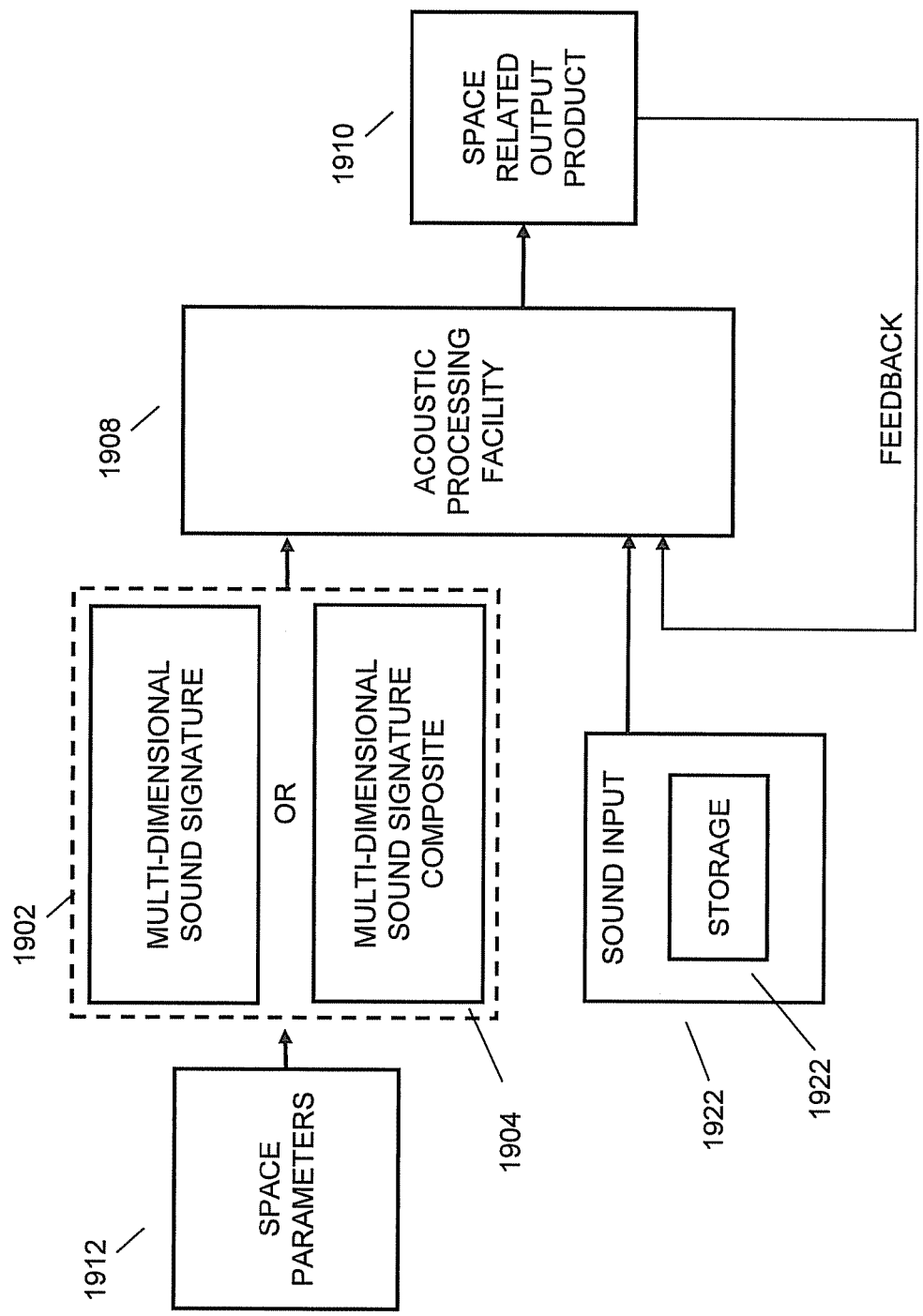
FIG. 19 depicts an embodiment block diagram of the present invention.

In embodiments, the present invention may be used to provide a space related output product, such as for the design of a new space, the modification or optimization of an existing space, the modification or optimization of a hypothetical space, recreation of an acoustic environment in a space, modification of a sound environment during a performance, modification of a sound generated during a performance, modification of a rehearsal environment, modification of a sound generated during a rehearsal, sound simulation, sound simulation through a media, selection of a seat in a venue based on a sound characteristic at the seat, providing of sound samples for a venue based on a sound characteristic at the seat, and the like. Referring to FIG. 19, in embodiments, the present invention may provide for an acoustic processing facility 1908 where either the multi-dimensional sound signature 1902 or the multi-dimensional sound signature composite 1904 may be used as an input to the acoustic processing facility 1908 to generate the space related output product 1910. In embodiments, a sound input 1922, provided in real-time (such as from a live source or from another sound source equipment) or from storage 1922 may be provided to the acoustic processing facility 1908, such as to have the sound input modified based on either the multi-dimensional sound signature or the multi-dimensional sound signature composite. In an example embodiment, a musical group playing in a performance space or rehearsal space may be provided as the sound input (e.g. a microphone and associated sound system), and the acoustic processing facility 1908 may modify the sound created by the musical group based the multi-dimensional sound signature composite, such as for the Great Hall, and where the space related output product is a sound output by the sound system that is more similar to the acoustics of the Great Hall. In embodiments, there may be no existing space providing the space parameters that generate the multi-dimensional sound signature or the multi-dimensional sound signature composite, such as the space parameters being based on a simulation, a hypothetical space, derived from existing spaces, and the like. In embodiments, there may be no sound input to 'modify', as the space related output product may be something other than a modified sound, such as assisting in seating selection, development of an acoustic figure of merit, providing a sound sample, providing an analysis, and the like, related to the multi-dimensional sound signature or the multi-dimensional sound signature composite. In addition, there may be feedback provided from the space related output product to the acoustic processing facility 1908, such as to adapt to changing conditions, user input, and the like. For instance, the system may provide feedback by assessing the result against the state at the beginning of the process and then takes/recommends a next action based on the comparison. In embodiments, the next action may be to repeat the method or to implement another method. For example, in a live performance, where the feedback is from the sound being projected to an audience from the sound system as modified, the acoustic processing facility 1908 may sense that some parameters are not within pre-determined limits, and may adjust the output product to help bring the output back to within the limits. In embodiments, this process may continually be fed back.

In embodiments, the acoustic processing facility 1908 may include hardware and/or software to provide the necessary processing for the given application. For example, the acoustic processing facility 1908 may provide for audio signal processing, sometimes referred to as audio processing, providing an alteration of sound signals. As audio signals may be electronically represented in either digital or analog format, signal processing may occur in either domain. The acoustic processing facility 1908 may include analog processors that operate directly on an electrical signal, and digital processors operate mathematically on the binary representation of that signal. In embodiments, the present invention may perform audio signal processing on a sound input in order to make the sound input more similar to the acoustic characteristics as reflected in the multi-dimensional sound signature or the multi-dimensional sound signature composite. In order to perform the audio signal processing, the acoustic processing facility 1908 may need to convert an analog sound input into a digital signal. Alternately, the acoustic processing facility 1908 may process an analog sound input directly, such as in analog audio processing. A digital representation would express the pressure wave-form of a sound as a sequence of symbols, usually binary numbers. This permits signal processing, such as may be provided in the acoustic processing facility 1908, such as in using digital circuits such as microprocessors and computers. Although such a conversion may be prone to loss, the acoustic processing facility 1908 may use this approach as the techniques of digital signal processing may be much more powerful and efficient than analog domain signal processing. In order to convert a continuous-time analog sound input to a discrete-time digital representation, the acoustic processing facility 1908 may have the capability to sample and quantize, where sampling is the division of the signal into discrete intervals at which analog voltage readings will be taken, and quantization is the conversion of the instantaneous analog voltage into a binary representation. As such, the acoustic processing facility 1908 may include an analog-to-digital converter. In addition, processing methods and application areas may include storage, level compression, data compression, transmission, mixing, enhancement, equalization, filtering, noise cancellation, echo or reverb removal or addition, and the like.

In embodiments, the acoustic processing facility 1908 may include a digital audio editor, such as to perform modifications to the sound input. A digital audio editor may be a computer application for audio editing and manipulation of digital audio, such as including recording audio from one or more inputs and storing recordings in the acoustic processing facility 1908's memory as digital audio; editing the start time, stop time, and duration of any sound on the audio timeline; mixing multiple sound sources/tracks, combine them at various volume levels and panning from channel to channel to one or more output tracks; applying simple or advanced effects or filters, including compression, expansion, flanging, reverb, audio noise reduction and equalization to change the audio; playing back sound (such as after being mixed) that can be sent to one or more outputs, such as speakers, additional processors, a recording medium, and the like; converting between different audio file formats, or between different sound quality levels; and the like, where these tasks may be performed in a manner that is both non-linear and non-destructive. In embodiments, the acoustic processing facility 1908 may provide for a combination of audio multi-track software and high-quality audio hardware, a specialized audio converter unit which may perform some variety of analog-to-digital (ADC) and/or digital-to-analog (DAC) signal conversion. In embodiments, the acoustic processing facility 1908 may include some form of automation, such as performed through "envelopes". Envelopes may be procedural line segment-based or curve-based interactive graphs. The lines and curves of the automation graph may be joined by or comprised of adjustable points. By creating and adjusting multiple points along a waveform or control events, the user can specify parameters of the output over time.

In embodiments, the acoustic processing facility 1908 may include audio mixing, the process by which a multitude of recorded sounds are combined into one or more channels, most commonly two-channel stereo. In the process, the source signals' level, frequency content, dynamics and panoramic position may be manipulated and effects such as reverb might be added. This practical, aesthetic or otherwise creative treatment may be done in order to produce an elevated mix that is more appealing to listeners. The mixing stage often follows the multi-track recording stage. The acoustic processing facility 1908 may also include functions for routing the source signals, equalization, compression, and the like. In embodiments, mixing may be executed in a plurality of domains, such as for level, frequency, special aspects, depth, and the like. In embodiments, the acoustic processing facility 1908 may include, audio amplifiers, audio players, audio storage, sound chips, speakers, testing equipment, noise reduction, and the like.

In embodiments, the acoustic processing facility 1908 may include computer hardware and/or software for comparing and manipulating a sound input, for editing the sound input, for adjusting the dimensions of the sound input, to better match the acoustic characteristics of the multi-dimensional sound signature or multi-dimensional sound signature composite. The acoustic processing facility 1908 may include computer hardware and/or software for the analysis of the multi-dimensional sound signature or multi-dimensional sound signature composite. The acoustic processing facility 1908 may include hardware and/or software for relating the multi-dimensional sound signature or multi-dimensional sound signature composite to a space, such as for determining what sound is represented at a given location. In embodiments, the acoustic processing facility 1908 may include different acoustic equipment known to the art to provide the necessary processing capabilities for the application.

Figure 20:
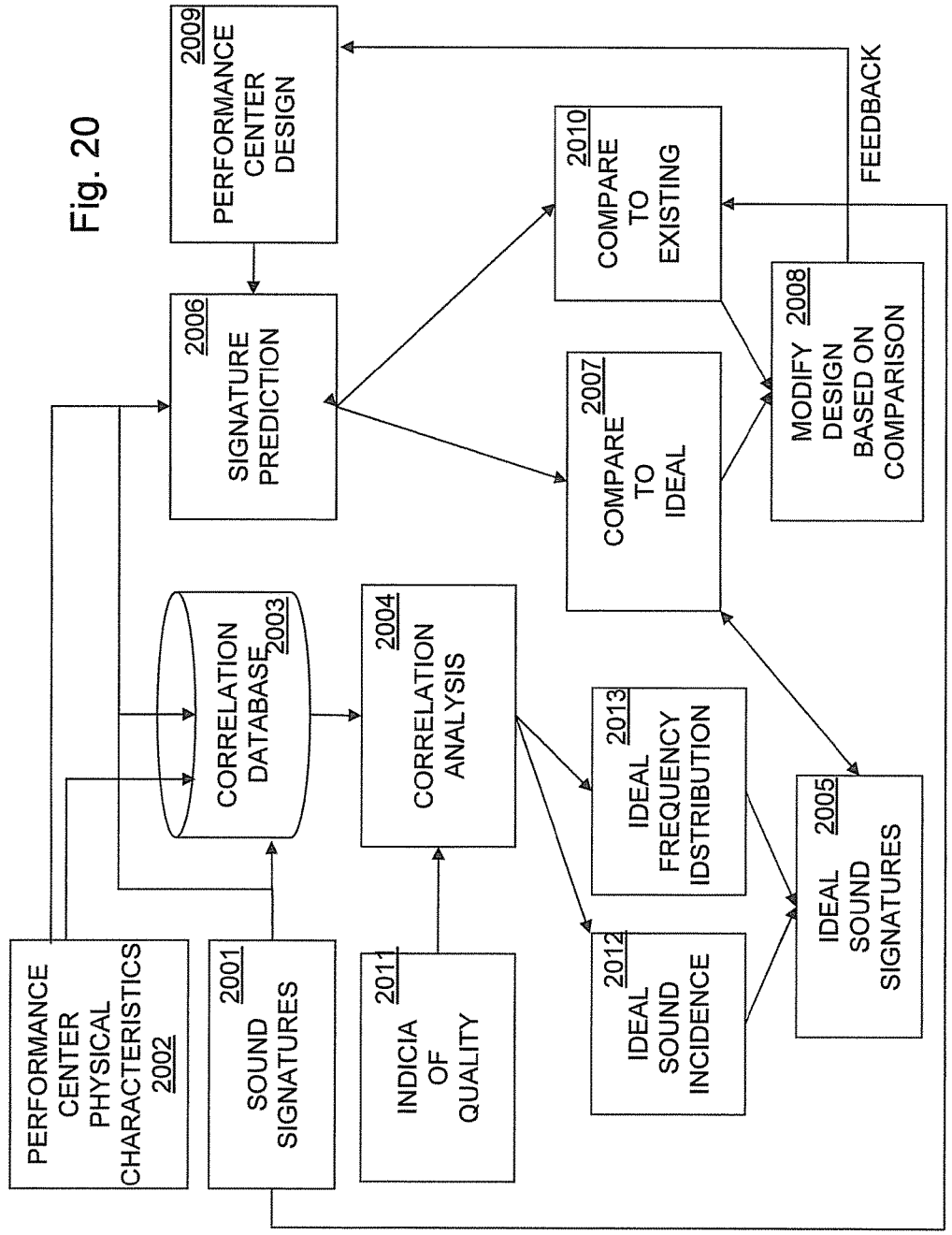
FIG. 20 depicts an example embodiment block diagram of the present invention.

At this point, it may be appropriate to describe an embodiment of the present invention where the processing requirements for the acoustic processing facility 1908 may be more well defined. To this end, FIG. 20 provides an exemplary flow chart for the present invention, where in this embodiment, the acoustic processing facility 1908 may be adapted to the application of improving the design of a performance center. In embodiments, information about the multi-dimensional acoustic 2001 and physical 2002 characteristics of an existing performance center may be collected and stored in a computer or manual database 2003. For instance, the information may be collected by initiating sound at or near the location where performers such as singers or an orchestra would perform. In embodiments, the sound may be generated by a speaker, such as dodecahedral speaker equipped with a subwoofer. The speaker may in embodiments generate sweep signals, or may play pre-recorded music or other sounds. One or more directional microphones may be placed at locations within the auditorium or in the stage house to capture measurements using, in embodiments, a Soundfield ST-250 microphone system and Neumann KU-100 "dummy head" microphone. In embodiments, the microphones may be B-format, Omni+FIG. 8 or Binaural, but one skilled in the art will appreciate that any microphone systems capable of capturing both direction and loudness at one or more pitches can be used. The sound source and microphones may be associated with a computer and an information storage device to capture information about the incidence of sound at each microphone location, such as in at least four dimensions. For instance, the lag time between initial capture directly from the sound source and capture of reflected sound, as recorded by each directional microphone, and a three-dimensional vector showing the direction from which sound at each lag point in time is perceived to have come, including in embodiments further information about the sound, including in embodiments its loudness at multiple frequencies, clarity, definition, and timbre. The sound reaching the microphones may be recorded, such that the loudness and time lag between direct and indirect capture of sound may be determined from each direction in a three dimensional space, divided into increments, such as of approximately 15°. In embodiments the recording may be accomplished using test signals that are sine sweep played through a dodecahedron and a subwoofer and recorded digitally, such as using Zaxcom Deva II digital recorder or other commercially available recording equipment. The recorded information or sound track may then be analyzed and summarized 2004. In embodiments, the information for each location may be represented by a diagram, such as using vectors whose length represents loudness, whose orientation represents direction and whose color represents time lag from initiation of the sound to arrival at the location. In embodiments, information about loudness, direction, time lag, timbre and other factors may be represented by tables or other well understood means of expression. In embodiments the frequency distribution 2401 of the sound reaching the microphone may also be captured and recorded.

The assemblage of information about direction, loudness and time lag of sound reaching a location within a performance space, sometimes referred to as the sound incidence at that location, and, in embodiments, additional parameters such as timbre, frequency distribution and pitch, which may in embodiments be associated with one or more of the sound incidence vectors, may be referred to herein as the sound signature of the performance space at that location.

A study of the sound signatures of locations within existing performance centers may permit one to define one or more sound incidence ranges 2012 within which a sound signature may need to fall to achieve optimum acoustic characteristics 2011. Such a range may be referred to herein as an ideal or preferred sound incidence range 2012. The preferred sound incidence range may be incorporated into a preferred sound signature range 2005. The preferred sound incidence range may be associated with the shape, size and other physical characteristics of a performance hall.

A study of the frequency distributions of existing performance centers can also permit one to define one or more ranges within which the frequency distribution must fall to achieve optimum acoustic characteristics 2011. This may be referred to as the preferred frequency distribution range 2013. This information may be incorporated into a preferred sound signature range 2005. In one preferred embodiment of the invention, an ideal frequency distribution range may include a tonal distribution, such as including a mid-base reverberation dip in the range of approximately 60 to 200 hZ.

In certain preferred embodiments, a preferred sound signature may be composed of a series of reflections that have, for a given frequency or group of frequencies, a specified table of ranges for a specified series of discrete reflections of a direct sound, where the table may indicate a timing range for each reflection (relative to the direct sound); amplitude range for each reflection; direction range for the reflection (and optionally the frequency or other characteristics of the reflections), and the like. For example, a preferred signature, such as determined by analysis of a great concert hall known to have highly desirable listening properties, might have a reflection occurring at between eleven and twenty milliseconds from the side (the early reflection); another one (that often comes from a "punch-out" architectural features from the side) at about twenty milliseconds (in some cases more from above the listener than the early reflection); another reflection at about 40 milliseconds that comes from above; a reflection at about 80 milliseconds from the ceiling; and a later one that comes from the back corner in a "cue ball" effect. Each reflection in a series is preferably ordered in time so that it is short enough to integrate into the listener's perception of the sound, while being sufficiently distinct in amplitude and direction such that it provides an overall rich tone. In embodiments, a program using trigonometry can identify the major reflections in a venue (such as, for example, eight reflections measured in a great hall as described herein) in amplitude, timing and/or direction, then replicate those reflections in a sound system or in a different venue, such as by design of the venue (including the basic dimensions and various fixtures therein). In embodiments techniques using impulse results or swept sine wave may be used to perform measurements on a venue, thereby allowing population of the table of reflections, or sound signature table. The sound signature table allows one to test a room or a proposed room (or seats within a room or a proposed room), for the presence or absence of the desired series of reflections, thereby predicting 2006 whether a room or part thereof is likely to have satisfactory listening qualities 2011. The prediction may be compared 2007 with the ideal or preferred sound signatures 105, and, where the prediction differs from the ideal, modifications to the design of the room may be proposed 2008. The revised design 2009 may then be re-tested 2006 and the entire process repeated.

In certain preferred embodiments, one can build a hall that has many seats for which a series of reflections of a direct sound will fall within the specified ranges on a desired table of ranges, and one can identify the seats in a hall that have those ranges.

It should be noted that in preferred embodiments different sound signature tables exist for different optimal halls; for example, there are tables that produce different emotional content throughout most of the seats in certain optimal halls. Different tables produce different emotional content, but delivering the optimal reflection set throughout the hall maximizes the benefits to the audience as a whole. The jewel box type of hall, for example, is likened to being in an enclosed sphere with rapid reflections, with high clarity and great reverberation at the same time (characteristics once thought by conventional acousticians to be inconsistent with each other). For example, a hall may be designed with great clarity of tone, while having long (e.g., 2.5 second) reverberations (the reverberations being as long as those associated with a great church). Another type of hall, the ball course, can be likened to a sandwich, with a feeling of hearing from the front and back in a nice way. The Odeon sound (a rounded room of modest size) is likened to a rain of a series of reflections all relatively quickly and relatively together, with a clear, connected sound. By analogy, a hall is like an instrument, with different overall sound (or timbre). While a general shape of hall may tend to produce a general type of result, more precise design allows consistent generation of the desired signature for most or all of the seats within the venue.

In embodiments, additional methods and systems may enhance the sound produced based on the sound signature table. Among other methods, a high base frequency "notch" and the high frequency fall-off that results from the shaping of the frequency response curve may be handled independently from the reflections, amplitudes, etc. of the sound signature table. For example, one may seek to absorb half of the base and part of the high end in a "lazy boy" shape, and one might do that for all frequencies in the table.

Thus, in embodiments of the methods and systems disclosed herein, a sound signature table may be used to store a range of desired characteristics of a type of venue, such as for analysis of existing and new venues, renovation of existing venues, and design of new venues. Use of the methods and systems disclosed herein further enable the development of novel venues, or room shapes, that have desired characteristics, both satisfying a predicted range of timing, duration and amplitudes for reflections in a sound signature table and having desired frequency shaping characteristics.

As used herein, the term sound signature should be understood to encompass use of a multi-dimensional representation of sound incident at a location within a hall, a sound frequency table, a sound signature table, use of frequency shaping, or combinations of those elements, as is appropriate for the context. In embodiments, the sound signature of a location within proposed performance space may be predicted 2006 using a correlation analysis 2004 combined with information about the shape and reflective characteristics of the performance space 2002 combined with the speed of sound and other relevant factors. In embodiments, the predicted sound signature of a location within a proposed performance space 2006 may be compared 2010 with the sound signature of a location within an existing performance space 2001 that has been recorded as described above. In embodiments, the predicted sound signature 2006 may be compared 2007 with ideal or preferred sound signatures 2005 that have been determined as described above. In embodiments, the physical characteristics of a proposed performance space may be altered 2008 so that the sound signature for a location within the proposed performance space more nearly match those of one or more existing performance spaces 2001 or preferred sound signatures 2005. In embodiments, the physical characteristics of a proposed performance space may be altered 2008 so that the proposed sound signature for a location within the proposed performance space more distinctly differ from those of one or more existing performance spaces 2001 or from ideal sound signatures 2005.

In embodiments, the predicted sound signature of a location within a proposed performance space may be compared with the ideal sound signature range. In embodiments, the characteristics of a proposed performance space may be altered so that the predicted sound signature of a location within the proposed performance space falls within the ideal sound signature range.

In embodiments, the frequency distribution at a location within proposed performance space may be predicted 2006 using information about the shape and reflective characteristics of the performance space 2002 (and fixtures, scenery, audience members and the like anticipated to be disposed therein) combined with the correlation analysis and tables 2005 and speed of sound, the absorptive characteristics of air, and other relevant factors. In embodiments, the predicted frequency distribution of a location within a proposed performance space may be compared with the frequency distribution of a location within an existing performance space 2010 that has been recorded as described. In embodiments, the physical characteristics of a proposed performance space may be altered 2008 so that the frequency distribution for a location within the proposed performance space more nearly matches that of one or more existing performance spaces. In embodiments, the physical characteristics of a proposed performance space may be altered so that the predicted frequency distribution at a location within the proposed performance space more distinctly differs from that at one or more existing performance spaces.

In embodiments, the predicted frequency distribution of a location within a proposed performance space 2006 may be compared with the ideal frequency distribution range 2013. In embodiments, the physical characteristics of a proposed performance space may be altered 2008 so that the predicted frequency distribution at a location within the proposed performance space falls within the ideal frequency distribution range. In embodiments, the ideal frequency distribution could be achieved by the use of materials selected for their reflective or absorption characteristics (e.g., using comparatively soft materials such as non-dense varieties of wood, loose plaster or paper maché layered over stone, concrete or other dense masonry to diminish reflection, or using hard surfaces to increase reflection).

In embodiments, the sound signature 2001 could include additional information about the sound perceived at a location from each direction, including such parameters and measurements as clarity, definition, timber and the like. In embodiments, the signature may be captured with the performance space populated with individuals and with the performance space empty, and correlations may be drawn with respect to the impact of the audience population on the sound signature at each location.

In embodiments, information about the sound signature of locations within a performance center may also be correlated 2003 with information gathered about its shape, scenery design and mechanisms, dimensions and/or construction materials and techniques 2002. In embodiments, this correlation may be used to predict 2006 the effect that changes in shape, scenery design and mechanisms, dimensions and/or construction materials and techniques may have on the sound signature of proposed performance centers. In embodiments, these predictions may be used to design 2009 elements of a performance center including as examples its shape, size, the selection, disposition and layering of construction materials, the disposition of balconies within the performance center, the location of seats an composition of seating materials, the curvature, orientation and other physical characteristics of walls, columns, balcony fronts, balcony undersides, proscenium arch, surrounds of the proscenium arch, and the like.

In embodiments, information about the sound signature 2001 of locations on the stage or within the stage house of existing performance centers may be collected and correlated 2003 with the physical characteristics of such stage houses 2002 including such elements as the disposition and composition of scenery flats and lighting structures, sound reflective structures, the existence and contents of any fly space above the stage, the geometric shape, material composition and angular disposition of the floor, ceiling and walls in the stage house. In embodiments, these correlations may be used to predict 2006 the sound signatures that would be perceived by performers in proposed performance centers and to design 2009 or adjust 2008 the physical characteristics of the stage house in proposed performance centers to achieve a desired sound signature at selected locations on the stage.

In embodiments, information about sound signatures 2001 collected from existing performance venues, and their correlation with the physical characteristics 2002 of existing performance venues 2003, may be analyzed and used to design new sound signatures not found in any existing performance centers having new combinations of desirable acoustic and visual characteristics, and to design new performance centers having the physical characteristics necessary to produce the desired new sound signatures.

In embodiments, construction techniques and design of the auditorium may also be used, either alone or in combination with other elements, to achieve desired multi-dimensional acoustic and visual qualities in the auditorium. An elliptical shape may be used to create an illusion of proximity to the stage at the point in the auditorium that represents the focus of the ellipse opposite the stage, which may in turn be associated with higher prices for premium seating. A rectangular or "shoebox" shape may be used to create strong sound reflections from the exposed parallel surfaces and a uniform distribution of energy across the auditorium. The fronts and curved undersides of balconies may be used to generate angular sound reflections as well. The overall dimensions of the room may also be manipulated to achieve desired four-dimensional acoustic effects.

It will be appreciated that the invention is not limited to the design of new performance centers, but may be applied to any circumstance in which there is a desire to replicate the acoustic experience of performers or listeners in existing performance centers, or to predict the acoustic experience of performers or listeners in proposed performance centers. In embodiments, an electronic sound system may be designed that simulates the sound signature at a location where a performer would perform on the stage of an existing performance center, based on data about the sound signature in the stage house of that performance center. The electronic sound system may be deployed, for example, in speakers, in a studio or in headphones. In embodiments, the simulated performance stage may take the form of an anechoic room with speakers disposed three-dimensionally throughout the room and driven by a computer-based system that causes each speaker to respond sequentially to input from a performer situated in the room, in proportion and in relation to the sound signature of a location within the stagehouse of a given performance center. In embodiments, the electronic sound system may be used to create a rehearsal space for a performer that would anticipate the experience of performing on the stage of the existing performance center without actually being on the stage.

In embodiments, an electronic sound system may be designed that simulates the multi-dimensional sound signature perceived by someone sitting in a given position in the auditorium of a given performance center, based on data that has been either collected from that performance center. The electronic sound system may be deployed, for example, in speakers, in a studio or in headphones. In embodiments, the simulated auditorium may similarly take the form of an anechoic room with speakers disposed three-dimensionally throughout the room and driven by a computer-based system that causes each speaker to respond sequentially to input from a pre-recorded performance, or from a live performance, in proportion and in relation to the sound signature at a location within the auditorium of an existing performance center. In embodiments, a sound system or set of headphones designed for home entertainment center use may similarly reproduce the sound signature at a location in the auditorium of a given performance center. In embodiments, the sound system could provide the listener with the option of selecting the virtual performance venue from a menu of options provided to with the home entertainment equipment, or the option of selecting a different location within a given performance center.

It will also be appreciated that the invention is not limited to musical, operatic or theatrical performances, rehearsals and reproductions, but can also be extended to any circumstance in which there is a desire to control, create or reproduce the actual four-dimensional perception of sound, either combined with visual cues or independent of visual cues. In embodiments, a movie director may first sample, collect and store through sound equipment and computers the sound signature of the locations to be depicted in a movie. The sound track for the movie would contain files capturing the sound signature of each location, and queue the projection sound system with those properties in association with each scene in the movie. A sound system may be disposed in each movie theater that is capable of reading such queues and reproducing the sound signature of each physical location depicted on the screen, so that the ambient sound perceived by the audience in the movie theater has the same multi-dimensional quality that would be perceived in the actual location depicted on the screen. In other embodiments, the sound system may be disposed in a stadium, in galleries, or in restaurants where a particular aural effect is desired.

In other embodiments, the invention may be deployed in recording studios to support initial recordings of performances and to alter captured sounds in post-production editing to duplicate the effect of a performance in any venue for which the sound signature has been captured and recorded, such as a performance center, an intimate club or a stadium.

In other embodiments, electronic recordings of musical or other performances may be modified such that when they are performed through suitable sound reproduction equipment they produce a tonal distribution that is substantially equivalent to the ideal tonal distribution charted above. In embodiments, a home entertainment center or other sound reproduction equipment may be designed such that when it performs recorded music it differentially suppresses or enhances sound at particular frequencies to produce a tonal distribution pattern substantially equivalent to the ideal tonal distribution pattern shown above.

Figure 21:
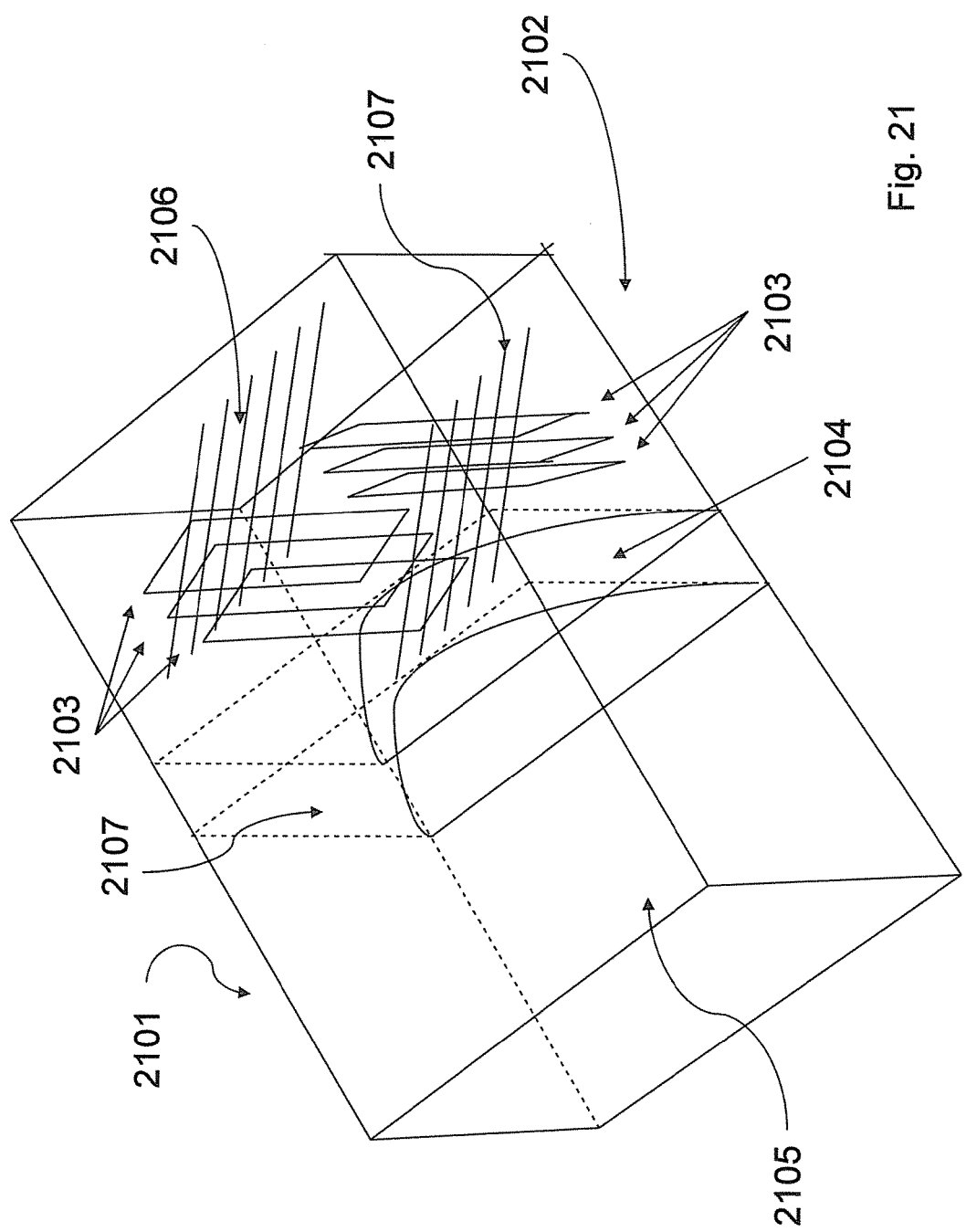
FIG. 21 depicts an example embodiment of a room with reflections.

Referring to FIG. 21, a block diagram of a preferred embodiment of the invention is provided. In this embodiment, horizontally disposable scenery flats 2103 may be used to create perspective effects and quick scene changes while at the same time assisting in the projection of sound from the stage house 2102 into the auditorium 2105. The horizontally disposable scenery flats 2103 may be controlled by a computer and electromechanical technologies that are correlated with scene changes in a performance and could also be correlated with desired acoustic effects during the performance. In the embodiment shown in FIG. 21, the horizontally disposable scenery flats could permit replacement of the modern "fly space" with a solid, flat ceiling 2106 in the stage house 202 and thereby enhance the acoustic "liveness" of the stage house 2102 and ease of performance for the performers on the stage. In embodiments, the scenery flats would be portable, facilitating transportation of the sets from one performance center to another and storage of the sets between performances.

In this embodiment, a stage house 2102 is provided within a performance center. Scenery flats 2103 may disposed on either side of the stage within the stage house. The scenery flats may move laterally to effect scenery changes. The timing, sequence and range of lateral movement of the scenery flats may be controlled by one or more computers that control electromechanics that move the scenery.

In embodiments, the scenery flats may be constructed of sound-reflective material. In embodiments, the scenery flats are disposed at an angle such that sound on the stage is projected by them into the auditorium. In embodiments, the stage house contains a ceiling and a floor constructed of one or more solid materials that reflect sound. In embodiments, one or both of the ceiling and floor are angled such that the distance between them is less at the rear of the state house than at the front.

In embodiments, the stage house may have a deep proscenium arch 204 and surrounds that separate the stage house 2102 from the auditorium 2105 and project sound from the stage onto the auditorium. In embodiments, a deep (3 m approximately) proscenium that is substantially narrower than either the stage house or the auditorium could be disposed between the auditorium and the stage house. The smoothness and sound reflective quality of its inner service is not in some embodiments disrupted by lighting or other equipment that would interfere with its sound-reflective nature. In embodiments, the proscenium arch 2104 may be surrounded by features 2107 extending into the auditorium that effectively extend the shape of the arch into the auditorium and visually connect the proscenium arch with the balconies and other features in the auditorium. This arch may be used to avoid acoustic coupling between the auditorium and stage house. The arch may also enhance the sound projection qualities of horizontally disposable sets in the stage house. This arch may also be associated with reflective surfaces in its surrounds to further enhance their sound projecting effect.

In embodiments, regularly spaced scenery flats may be disposed on a slanted stage floor 2107 to create visual illusion of perspective to vanishing point at rear of the stage house and to assist in the projection of sound from the stage house 2102 to the auditorium 205. In other embodiments, multiple perspective points may be displayed.

In embodiments, the auditorium 2105 may be rectangular, elliptical or ovoid. In embodiments, the stage house 2102 may be in volume approximately as large as or larger than the volume of the auditorium. In embodiments, the ceiling of the stage house 206 may be at a height comparable to the height of the ceiling in the auditorium. In embodiments, the floor of the stage house 2107 may be slanted toward the auditorium. In embodiments, the floor of the auditorium 2107 may be flat.

In embodiments, the scenery flats 2103 may be stored in a cartridge and selected therefrom by a computer operating a tracking system in coordination with the scenes of a performance. In embodiments, the effect of the horizontally disposable scenery flats on the sound signature 2001 of a stage house or auditorium sound may be captured and stored, using the methods and systems disclosed elsewhere herein. In embodiments, the correlation between the multi-dimensional sound signature 2001 of the stage house 2102 and auditorium 2105 and their physical characteristics 2002 including in embodiments shape, height of ceiling, size and disposition of proscenium arch 204, may be captured and stored 2003 and analyzed 2004. In embodiments, soft finishing materials that are transparent to sound at certain frequencies such as wood, paper maché or stucco may be layered over harder materials such as concrete or stone to damp reverberation build-up at certain low frequencies while retaining reverberation at frequencies above or below the damped range. In embodiments, these techniques may be used to replicate the acoustic characteristics of historical halls and to create specific acoustic effects.

In embodiments, the scenery flats 2103 may be produced using large format printing technologies. The scenes depicted on the scenery flats may be coordinated using computer technologies to produce the illusion of perspective using one or more "vanishing points." The scenery flats may also be coordinated with lighting effects that supplement or replace physical displacement of the scenery flats.

In embodiments, a combination of elements such as those described herein could be used to produce live acoustics inside the stage times with RT values approximately 20% longer than in the associated auditoria and early decay within 85% and 100% of reverberation.

Figure 22:
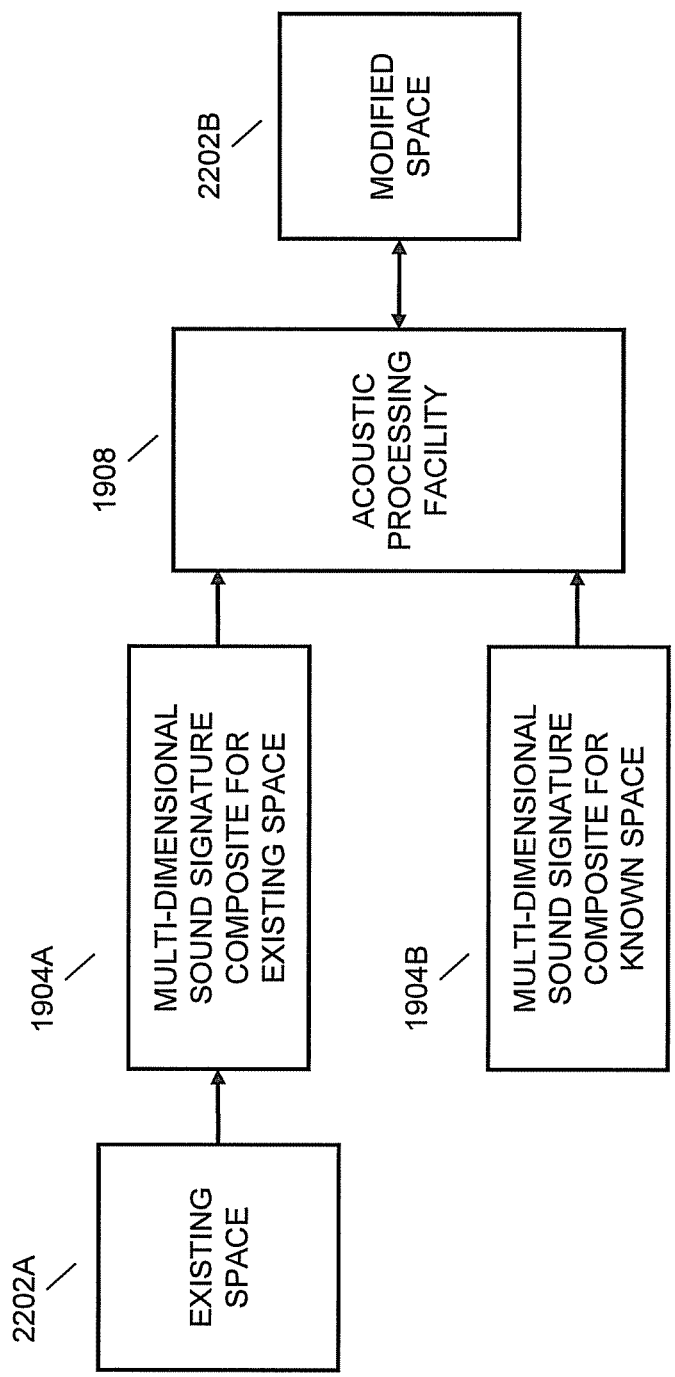
FIG. 22 depicts an embodiment block diagram of the present invention.

In embodiments, the present invention may be used to modify an existing space in respect of a multi-dimensional sound signature. For instance, and referring to FIG. 22, there may be a desire to improve the acoustic characteristics of an existing space, such as a music venue, a sports venue, a public space, and the like, or any other space as described herein. In embodiments, a modification may include changes to the structures of the space, to the layout of the space, to the shape of the space, and the like. A multi-dimensional sound signature composite may be produced from measurements of the existing space, and this composite may be compared to the multi-dimensional sound signature for a known space, such as in an acoustic processing facility 1908. This comparison may then be used to modify the existing space to a modified space that has acoustic characteristics that are similar to the known space. In embodiments, the acoustic processing facility 1908 may include any of the acoustical equipment described herein to perform the comparison, manipulation, and the like, between the multi-dimensional sound signature composite of the exiting space and the known space.

In a more specific example, consider a night club owner that has bands play in the club on a regular basis. Perhaps the night club owner visits another night club, say the Hard Rock Café in Los Angeles, and realizing that the same band playing in the Hard Rock Café sounds substantially better, or more pleasing, than when the same band plays in his night club, that he decides to modify the acoustic space of his night club to sound more similar to the Hard Rock Café. In embodiments, the present invention may provide for an improved way to modify an existing acoustic space to match the acoustic characteristics of a known space, such as through the known space already having a multi-dimensional sound signature composite, through the measurement of an existing space that has a target acoustic characteristic, and the like.

Figure 23:
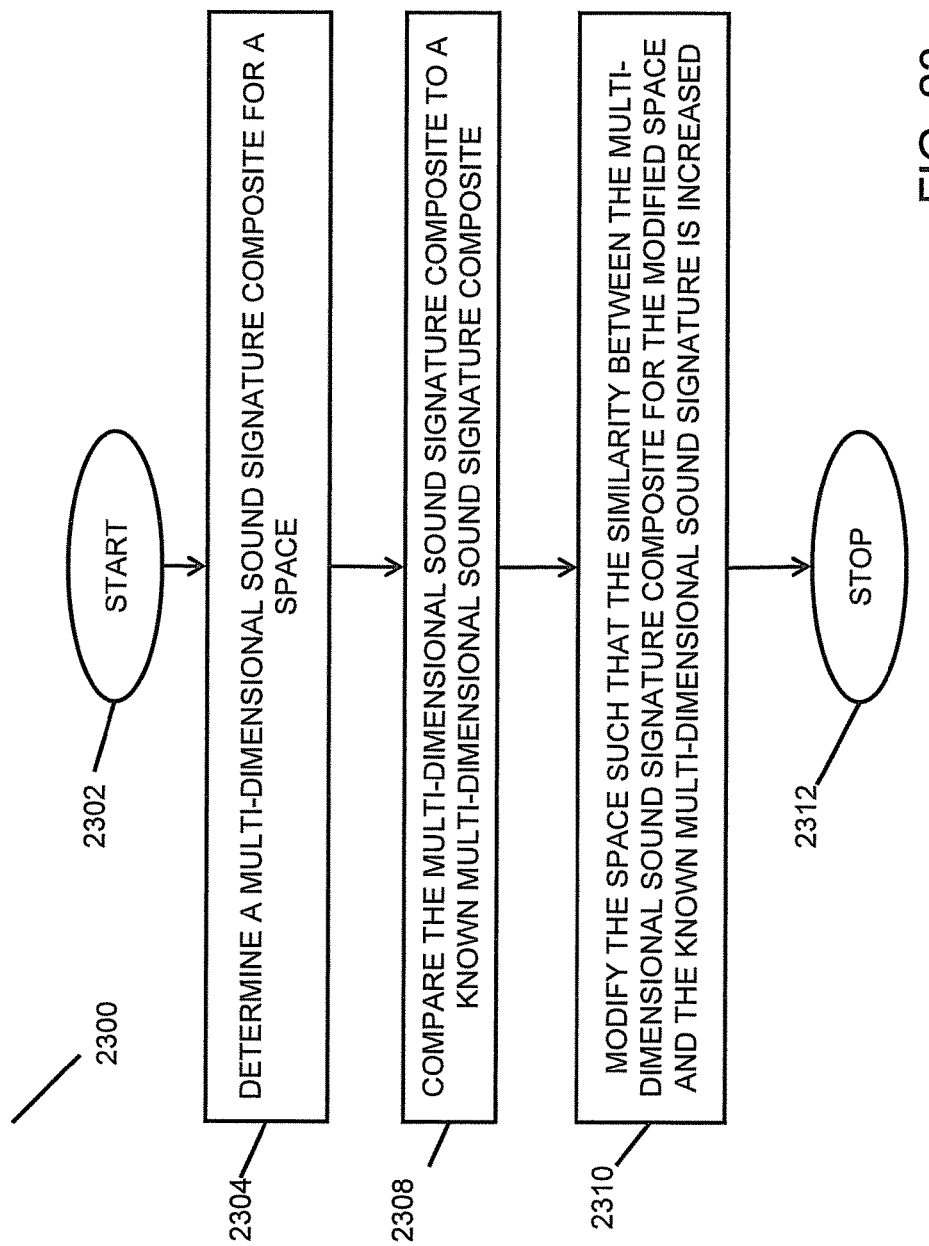
FIG. 23 depicts a flow process diagram in an embodiment of the present invention.

In embodiments, the creation or re-creation of a reflection, such as according to a multi-dimensional sound signature or multi-dimensional sound signature composite as discussed throughout this disclosure, may include a reflective surface, speaker (as described herein), a sound reproduction device (e.g. a device that can output a sound of predetermined acoustic characteristic upon being triggered by an incident sound, such as at the trigger time or delayed from the trigger time), a composite material to create a reflected sound with altered acoustic characteristics, parabolic reflector, and the like, or some combination of these. For example, speakers might be used on the facing wall to produce the "back" reflection, but the side wall reflections might be accomplished by some reflective facility. In embodiments, reflections may be a combination of reflective facilities that take sound in and re-release it in a particular direction with a predictable delay, such as in combination with speakers. In embodiments, if speakers are the only sound source in the room, sound-absorbing materials or configurations (e.g., walls used in sound studios to deaden sound, such as having a plurality of different edges facing in all directions to disperse any reflections in a chaotic way) may be used to filter everything except the intended reflections that are returned to the rehearsing performer. In embodiments, In embodiments, referring to FIG. 23, methods and systems for modifying the existing space in respect of a multi-dimensional sound signature composite may be provided. As shown in FIG. 23, a process 2300 for modifying an existing space in light of a multi-dimensional sound signature composite in accordance with various embodiments of the present invention may be provided.

The process 2300 starts at step 2302. At step 2304, the multi-dimensional sound signature composite may be determined for a particular space. In embodiments, the multi-dimensional sound signature composite may be a single source multi-dimensional sound signature composite; a multiple source multi-dimensional sound signature composite; a multiple source, multiple location, multi-dimensional sound signature composite; a multiple source multi-dimensional sound signature composite; a hypothetical multi-dimensional sound signature composite; an ambient multi-dimensional sound signature composite; and the like. In embodiments, the space may correspond to the Great Hall, and the known multi-dimensional sound signature composite corresponds to the Great Hall multi-dimensional sound signature composite; the space corresponds to the Jewel Box and the known multi-dimensional sound signature composite corresponds to the Jewel Box multi-dimensional sound signature composite; and the like.

At step 2308, the multi-dimensional sound signature composite for the particular space may be compared with a known multi-dimensional sound signature composite. In embodiments, the known multi-dimensional sound signature composite may be an actual multi-dimensional sound signature composite for another space, an idealized multi-dimensional sound signature composite, a multi-dimensional sound signature composite for a hypothetical space, and the like. In embodiments, the known multi-dimensional sound signature composite may result from manipulation of one or more other multi-dimensional sound signature composites. In embodiments, the known multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like.

At step 2310, the space may be modified such that the similarity between the determined multi-dimensional sound signature composite for the modified space and the known multi-dimensional sound signature composite may be increased.

In embodiments, the space may be modified by adding fabric, removing fabric, moving fabric, adding concrete, moving concrete, removing concrete, adding wood, removing wood, moving wood, adding scenery located on a stage, removing scenery located on a stage, moving scenery located on a stage or adding, removing and/or moving some other material. In embodiments, the similarity may be increased for one or more dimensions of the multi-dimensional sound signature composite. In addition, the similarity may be increased for one or more locations in the space.

In embodiments, the modification of space may refer to altering the design of the hypothetical space. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material. In embodiments, the hypothetical space may be modified by the construction of fixtures designed to create reflections of sound within a defined range of time, amplitude and direction. In embodiments, the hypothetical space may be modified by adding, removing, moving fixtures designed to create reflections of sound within a defined range of time, amplitude and direction. The range for the above stated embodiments may be defined based on a preferred, multi-dimensional sound signature.

The process 2300 may end at step 2312.

Figure 24:
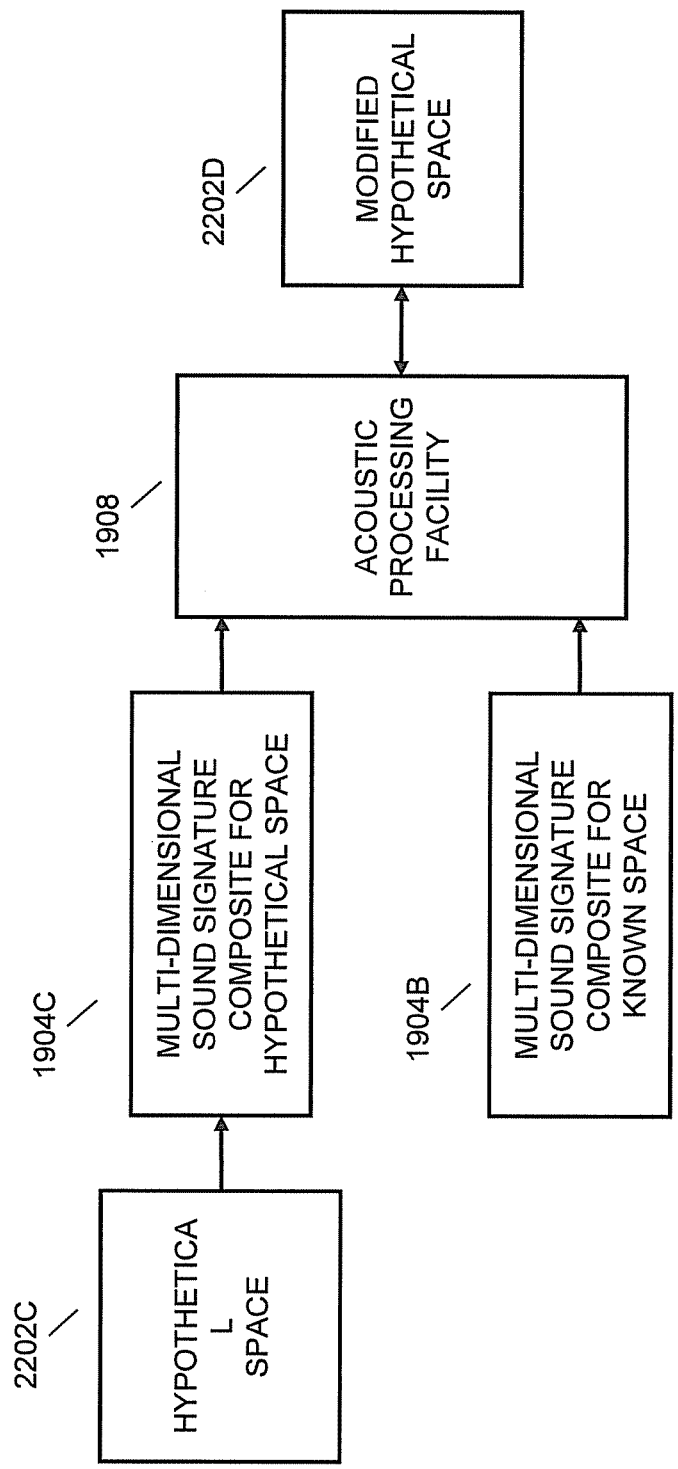
FIG. 24 depicts an embodiment block diagram of the present invention.

In embodiments, the present invention may be used to modify a hypothetical space in respect of a multi-dimensional sound signature. For instance, and referring to FIG. 24, there may be a desire to improve the acoustic characteristics of a hypothetical space 2202C, such as a proposed or in-design music venue, sports venue, public space, and the like, or any other space as described herein. In embodiments, a modification may include changes to the structures of the space, to the layout of the space, to the shape of the space, and the like. A multi-dimensional sound signature composite 1904C may be produced for the hypothetical space, and this composite may be compared to the multi-dimensional sound signature 1904B for a known space, such as in an acoustic processing facility 1908. This comparison may then be used to modify the hypothetical space to a modified hypothetical space 2202D that has acoustic characteristics that may be similar to the known space. In embodiments, the acoustic processing facility 1908 may include any of the acoustical equipment described herein to perform the comparison, manipulation, and the like, between the multi-dimensional sound signature composite of the hypothetical space and the known space.

In a more specific example, consider a concert hall that is in design (i.e., a hypothetical space, in that it is not yet built), and where from the current design a multi-dimensional sound signature may be determined for the proposed concert hall. The developers of the proposed concert hall may have a desire to produce an acoustic environment in their new concert hall that matches or approximates the acoustic environment of a known concert hall, such as for a known concert hall with known pleasing sound characteristics. In embodiments, the present invention may enable the comparison of the know concert hall composite with the current design's composite to develop a modified design with improved acoustic characteristics, such as with the pleasing sound characteristics of the known concert hall.

Figure 25:
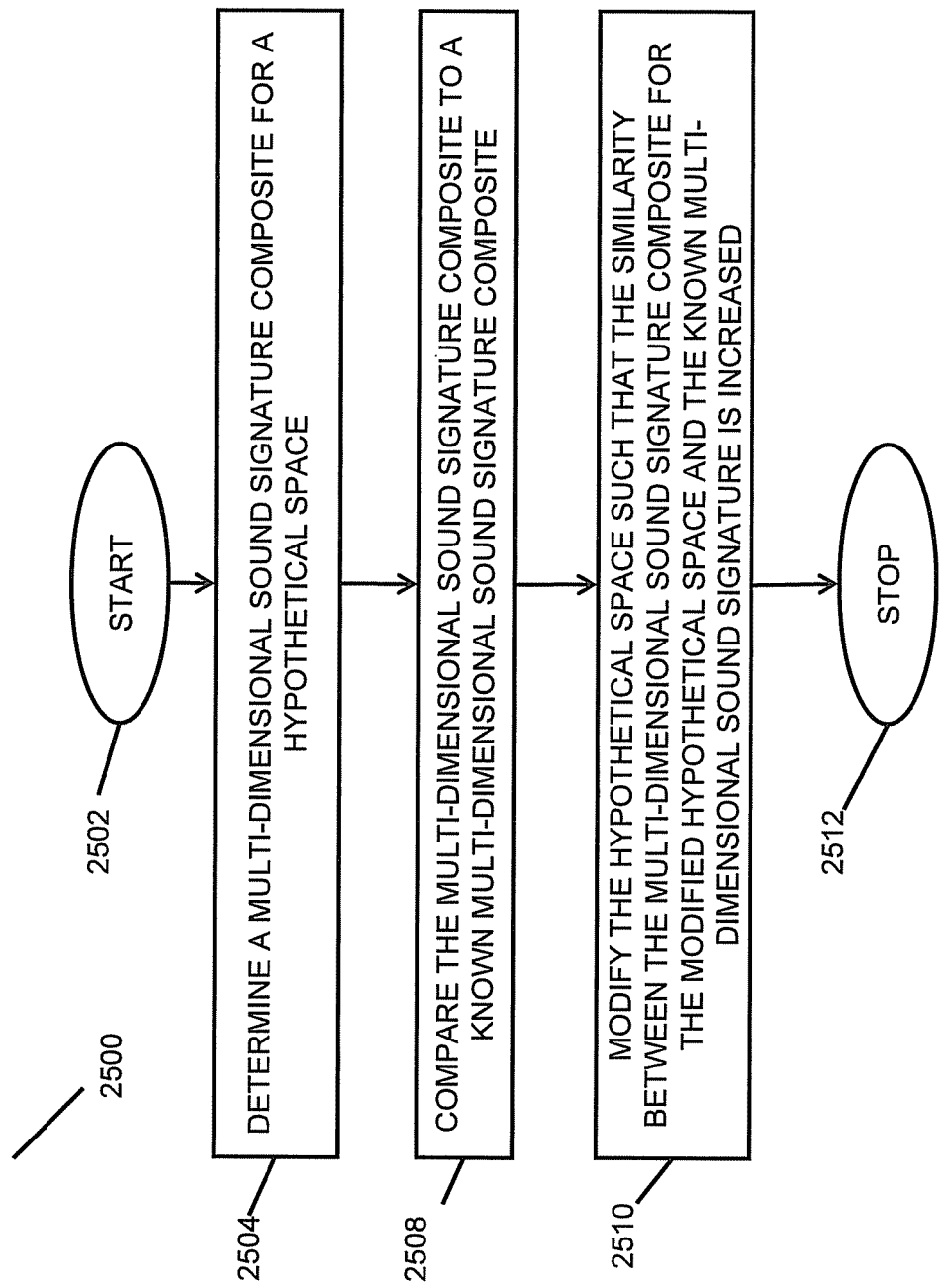
FIG. 25 depicts a flow process diagram in an embodiment of the present invention.

In embodiments, referring to FIG. 25, methods and systems for modifying a hypothetical space in respect of a multi-dimensional sound signature composite may be provided. As shown in FIG. 25, a process 2500 for modifying a hypothetical space in light of a multi-dimensional sound signature composite in accordance with various embodiments of the present invention may be provided.

The process 2500 starts at step 2502. At step 2504, the multi-dimensional sound signature composite for a hypothetical space may be determined. In embodiments, the determined multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

At step 2508, the multi-dimensional sound signature composite may be compared with a known multi-dimensional sound signature composite. In embodiments, the known multi-dimensional sound signature composite may be an actual multi-dimensional sound signature composite for another space, an idealized multi-dimensional sound signature composite, a multi-dimensional sound signature composite for a hypothetical space, and the like. In embodiments, the known multi-dimensional sound signature composite may result from manipulation of one or more multi-dimensional sound signature composites. In embodiments, the known multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like.

At step 2510, the hypothetical space may be modified such that the similarity between the multi-dimensional sound signature composite for the modified hypothetical space and the known multi-dimensional sound signature may be increased. In embodiments, the similarity may be increased for one or more dimensions of the multi-dimensional sound signature composite. In embodiments, the similarity may be increased for one or more locations in the hypothetical space.

In embodiments, the modification of space may refer to altering the design of the hypothetical space. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material. In embodiments, the hypothetical space may be modified by the construction of fixtures designed to create reflections of sound within a defined range of time, amplitude and direction. In embodiments, the hypothetical space may be modified by adding, removing, moving fixtures designed to create reflections of sound within a defined range of time, amplitude and direction. The range for the above stated embodiments may be defined based on a preferred, multi-dimensional sound signature.

The process 2500 may end at step 2512.

Figure 26:
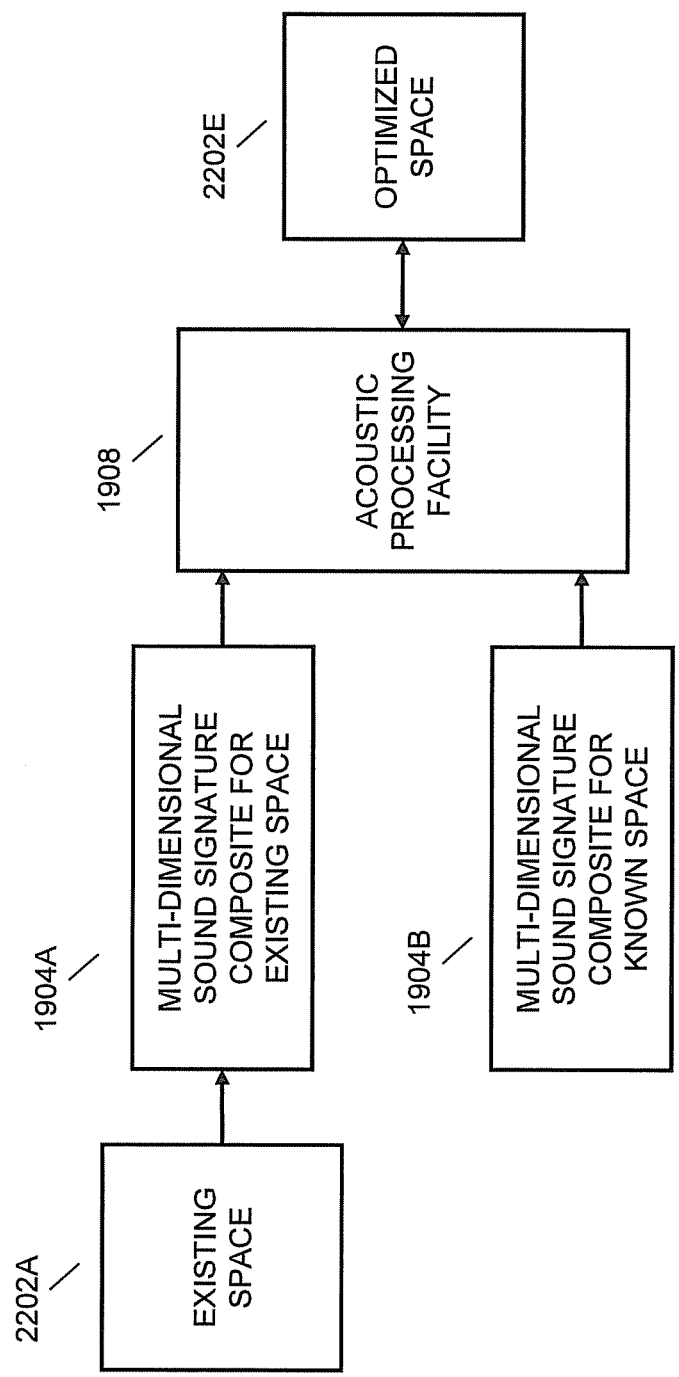
FIG. 26 depicts an embodiment block diagram of the present invention.

In embodiments, the present invention may be used to optimize an existing space in respect of a multi-dimensional sound signature. For instance, and referring to FIG. 26, there may be a desire to improve the acoustic characteristics of an existing space 2202A, such as a music venue, a sports venue, a public space, and the like, or any other space as described herein. In embodiments, an optimization may include changes to materials used in the space, changes in furniture, changes in how performers and/or audience members are placed, addition of structural features, addition of mobile walls, and the like. A multi-dimensional sound signature composite 1904A may be produced from measurements of the existing space, and this composite may be compared to the multi-dimensional sound signature 1904B for a known space, such as in an acoustic processing facility 1908. This comparison may then be used to optimize the existing space to an optimized space 2202E that has acoustic characteristics that are similar to the known space. In embodiments, the acoustic processing facility 1908 may include any of the acoustical equipment described herein to perform the comparison, manipulation, and the like, between the multi-dimensional sound signature composite of the exiting space and the known space.

In a more specific example, consider an opera house that has been recently constructed, but whose acoustics are not quite as good as other similar opera houses. In embodiments, the present invention may be used to model the acoustics of the new opera house through the generation of a multi-dimensional sound signature composite for the new opera house. This composite may now be compared to the multi-dimensional sound signature composite of an existing opera house that has the sound characteristics the designers of the new opera house were seeking. Through the present invention, the two composites may be compared, such as through the acoustic processing facility 1908, and used to develop an optimized opera house space. For instance, the optimizations may include the additions of certain materials to surfaces within the opera house, the addition or subtraction of isle way rugs, a change in the seating arrangement, changes in stage scenery and/fixtures, and the like. In embodiments, the present invention may enable the optimization of an existing acoustic space through comparison of multi-dimensional sound signatures for the existing space and a desired space.

Figure 27:
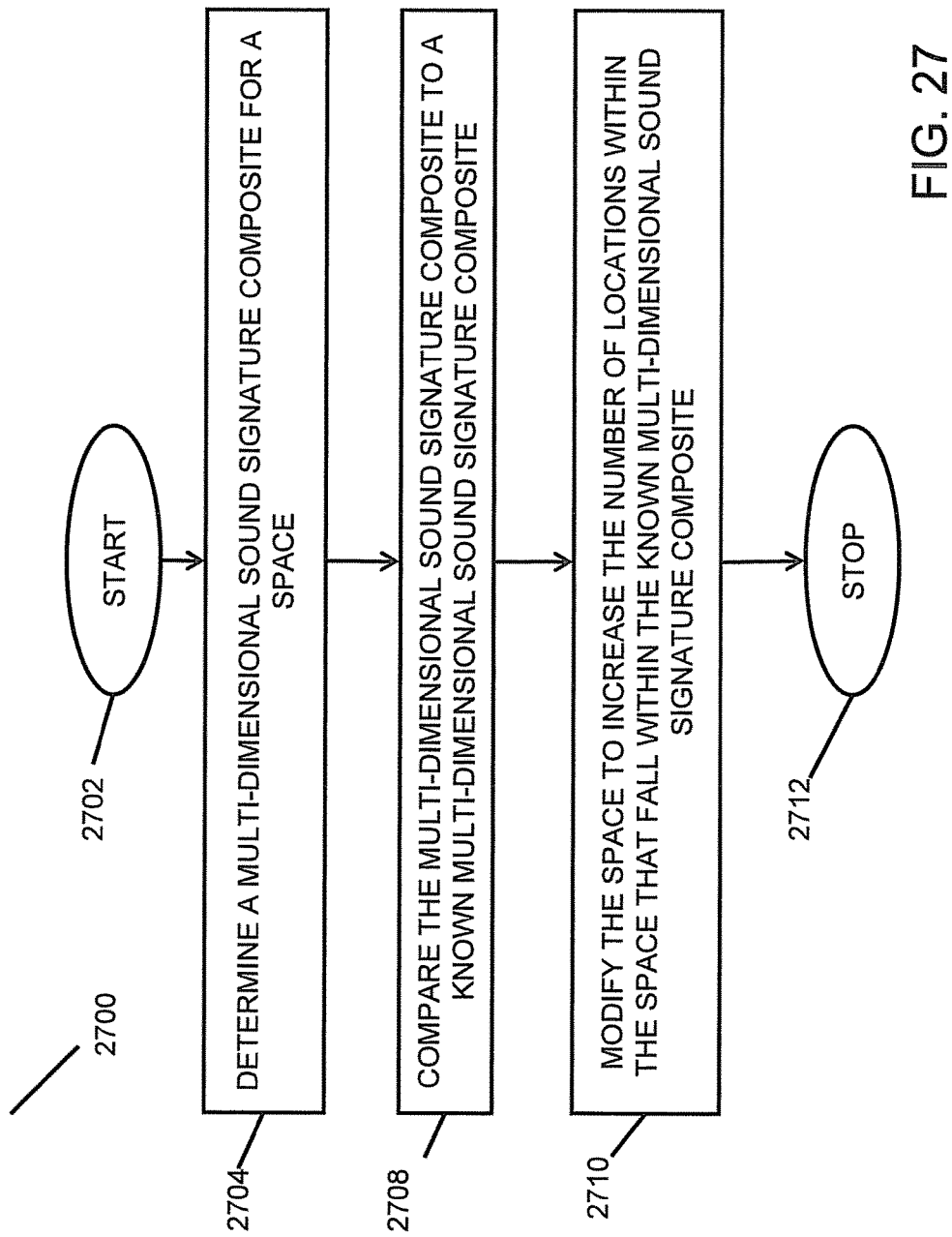
FIG. 27 depicts a flow process diagram in an embodiment of the present invention.

In embodiments, referring to FIG. 27, methods and systems for optimization of an existing space in respect of a multi-dimensional sound signature composite in accordance with an embodiment may be provided. As shown in FIG. 27, a process 2700 for modifying an existing space in light of a multi-dimensional sound signature in accordance with various embodiments of the present invention may be provided.

The process 2700 starts at step 2702. At step 2704, the multi-dimensional sound signature composite may be determined for a particular space. In embodiments, the determined multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

At step 2708, the multi-dimensional sound signature composite may be compared with a known multi-dimensional sound signature composite. In embodiments, the known multi-dimensional sound signature composite may be an actual multi-dimensional sound signature composite for another space; an idealized multi-dimensional sound signature composite; a multi-dimensional sound signature composite for a hypothetical space; a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like. In embodiments, as stated above, the known multi-dimensional sound signature composite may result from manipulation of one or more other multi-dimensional sound signature composites.

At step 2710, the space may be modified such that the number of locations within the space that may fall within the known multi-dimensional sound signature composite may be increased. In embodiments, the number of locations falling within the known multi-dimensional sound signature may be increased for a dimension. In embodiments, the number of locations falling within the known multi-dimensional sound signature may be increased for more than one dimension. In embodiments, as stated above, the space may also be modified by the construction of fixtures designed to create reflections of sound within a defined range of time, amplitude and direction. In embodiments, the space may be modified by adding, removing, and/or moving fixtures designed to create reflections of sound within a defined range of time, amplitude and direction. The range for all the above stated embodiments may be defined based on a preferred, multi-dimensional sound signature. In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material.

The process 2700 may end at 2712.

Figure 28:
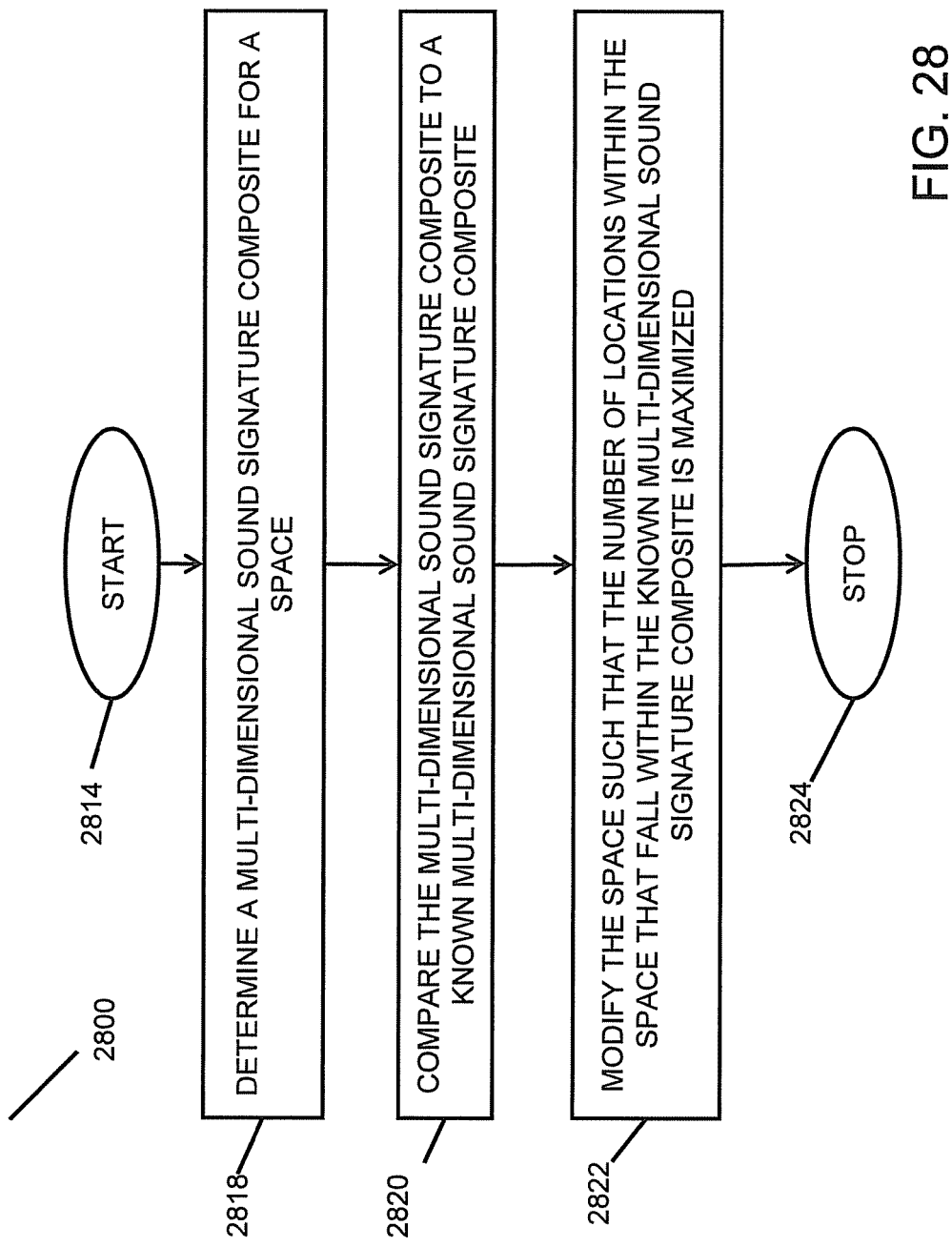
FIG. 28 depicts a flow process diagram in an embodiment of the present invention.

In embodiments, referring to FIG. 28, methods and systems for optimizing an existing space in accordance with another embodiment may be provided. As shown in FIG. 28, a process 2800 for optimizing an existing space in accordance with another embodiment may be provided.

The process 2800 starts at step 2814. At step 2818, similar to the step 2804 of process 2800A, the multi-dimensional sound signature composite for a space may be determined. As described above, the determined multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like.

At step 2820, the multi-dimensional sound signature composite may be compared with a known multi-dimensional sound signature composite. In embodiments, as described above, the known multi-dimensional sound signature composite may be an actual multi-dimensional sound signature composite for another space; an idealized multi-dimensional sound signature composite; a multi-dimensional sound signature composite for a hypothetical space; a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like. In embodiments, as stated above, the known multi-dimensional sound signature composite may result from manipulation of one or more other multi-dimensional sound signature composites.

At step 2822, the space may be modified such that the number of locations within the space that fall within the known multi-dimensional sound signature composite may be increased. In embodiments, the number of locations falling within the known multi-dimensional sound signature may be increased for a dimension. In embodiments, the number of locations falling within the known multi-dimensional sound signature may be increased for more than one dimension. In embodiments, as stated above, the space may also be modified by the construction of fixtures designed to create reflections of sound within a defined range of time, amplitude and direction. In embodiments, the space may be modified by adding, removing, and/or moving fixtures designed to create reflections of sound within a defined range of time, amplitude and direction. The range for all the above stated embodiments may be defined based on a preferred, multi-dimensional sound signature. In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material.

The process 2800 may end at step 2824.

Figure 29:
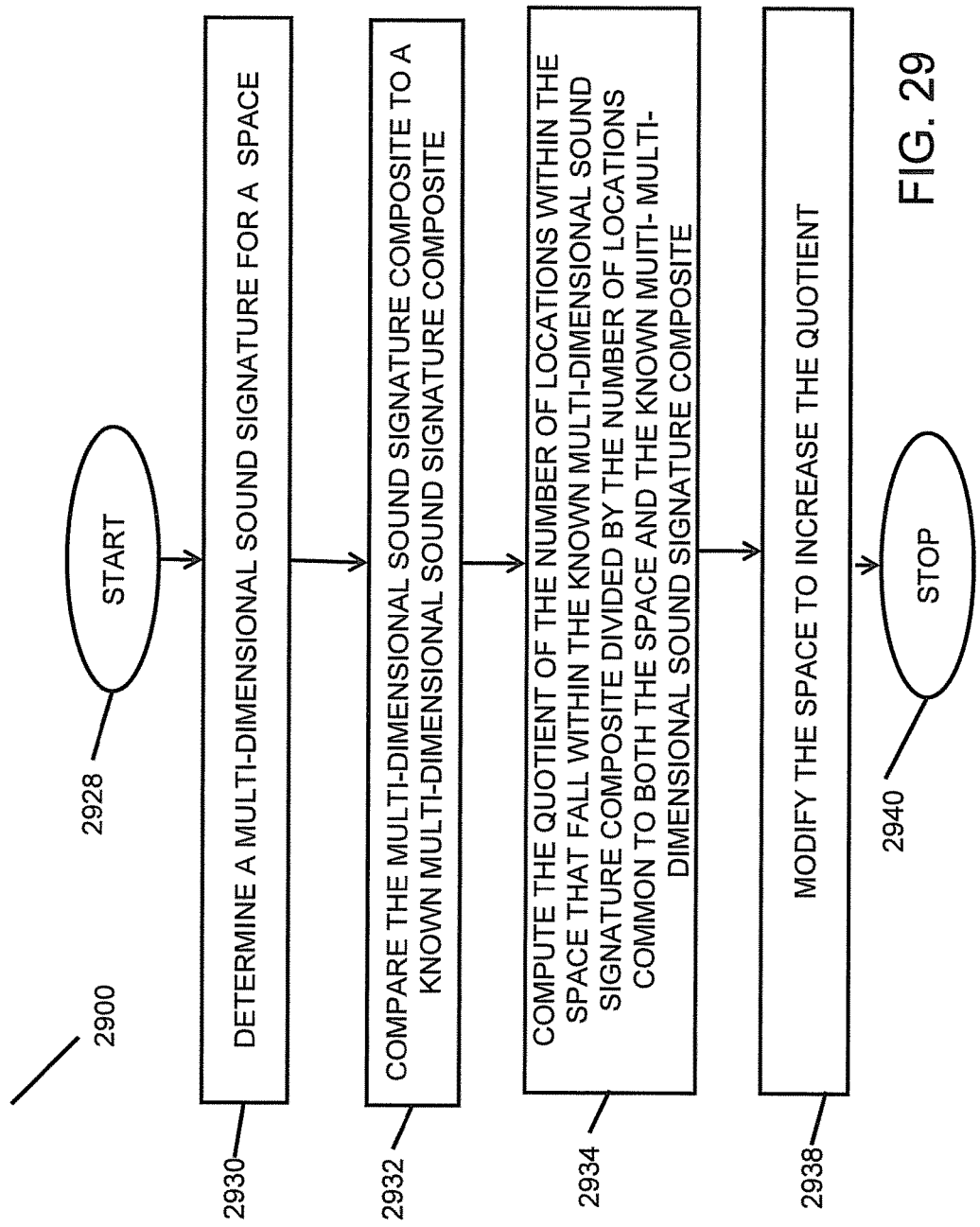
FIG. 29 depicts a flow process diagram in an embodiment of the present invention.

In embodiments, referring to FIG. 29, methods and systems for optimizing an existing space in accordance with yet another embodiment may be provided. As shown in FIG. 29, a process 2900 for optimizing an existing space in accordance with yet another embodiment may be provided.

The process 2900 starts at step 2928. At step 2930, similar to the step 2904 of process 2900A, a multi-dimensional sound signature composite for a space may be determined. As described above, the determined multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like.

At step 2932, the multi-dimensional sound signature composite may be compared to a known multi-dimensional sound signature composite. In embodiments, as described above, the known multi-dimensional sound signature composite may be an actual multi-dimensional sound signature composite for another space; an idealized multi-dimensional sound signature composite; a multi-dimensional sound signature composite for a hypothetical space; a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like. In embodiments, as stated above, the known multi-dimensional sound signature composite may result from manipulation of one or more other multi-dimensional sound signature composites.

At step 2934, the quotient of the number of locations within the space that may fall within the known multi-dimensional sound signature composite divided by the number of locations common to both the space and the known multi-dimensional sound signature composite may be computed. In embodiments, the number of locations falling within the known multi-dimensional sound signature may be increased for a dimension. In embodiments, the number of locations falling within the known multi-dimensional sound signature may be increased for more than one dimension.

At step 2938, the space may be modified such that the quotient may be increased. In embodiments, as stated above, the space may also be modified by the construction of fixtures designed to create reflections of sound within a defined range of time, amplitude and direction. In embodiments, the space may be modified by adding, removing, and/or moving fixtures designed to create reflections of sound within a defined range of time, amplitude and direction. The range for all the above stated embodiments may be defined based on a preferred, multi-dimensional sound signature. In embodiments, the space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material.

The process 2900 may end at step 2940.

Figure 30:
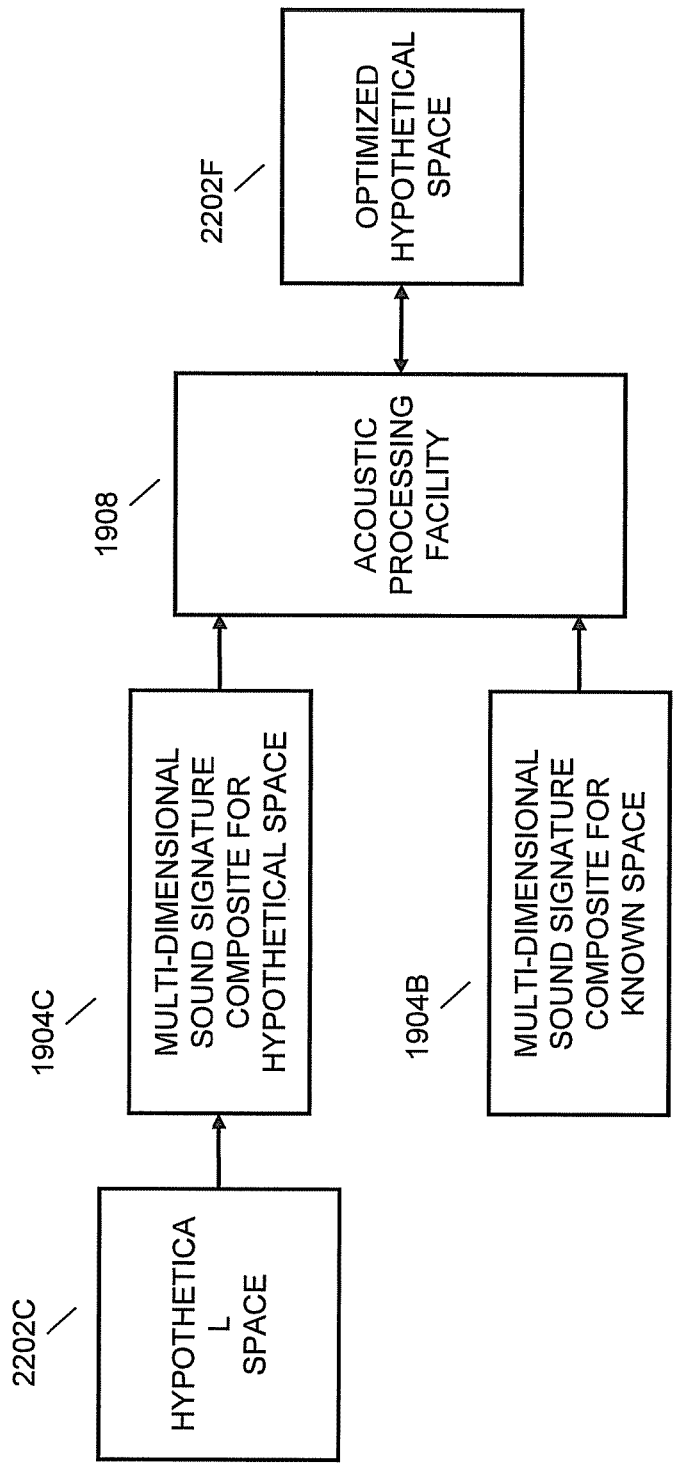
FIG. 30 depicts an embodiment block diagram of the present invention.

In embodiments, the present invention may be used to optimize a hypothetical space in respect of a multi-dimensional sound signature. For instance, and referring to FIG. 30, there may be a desire to improve the acoustic characteristics of a hypothetical space 2202C, such as a proposed or in-design music venue, sports venue, public space, and the like, or any other space as described herein. In embodiments, an optimization may include changes to materials proposed for use in the space, changes in furniture, changes in how performers and/or audience members are placed, addition of structural features, addition of mobile walls, and the like. A multi-dimensional sound signature composite 1904C may be produced for the hypothetical space 2202C, and this composite may be compared to the multi-dimensional sound signature 1904B for a known space, such as in an acoustic processing facility 1908. This comparison may then be used to optimize the hypothetical space to an optimized hypothetical space 2202F that has acoustic characteristics that may be similar to the known space. In embodiments, the acoustic processing facility 1908 may include any of the acoustical equipment described herein to perform the comparison, manipulation, and the like, between the multi-dimensional sound signature composite of the hypothetical space and the known space.

In a more specific example, consider a proposed sports arena that is in the last stages of design. In embodiments, the design and layout of the final sports arena may be optimized based on a comparison between a multi-dimensional sound signature composite of the current design, and the multi-dimensional sound signature composite of an existing sports arena that has the acoustic characteristics that the developers are looking for. Through the comparison of the two composites, the designers of the mew sports arena may be able to optimize the acoustics of the new design, such as the addition of structural features, changes to proposed materials, addition and/or subtraction of non-supporting walls, changes to advertisement materials, and the like.

Figure 31:
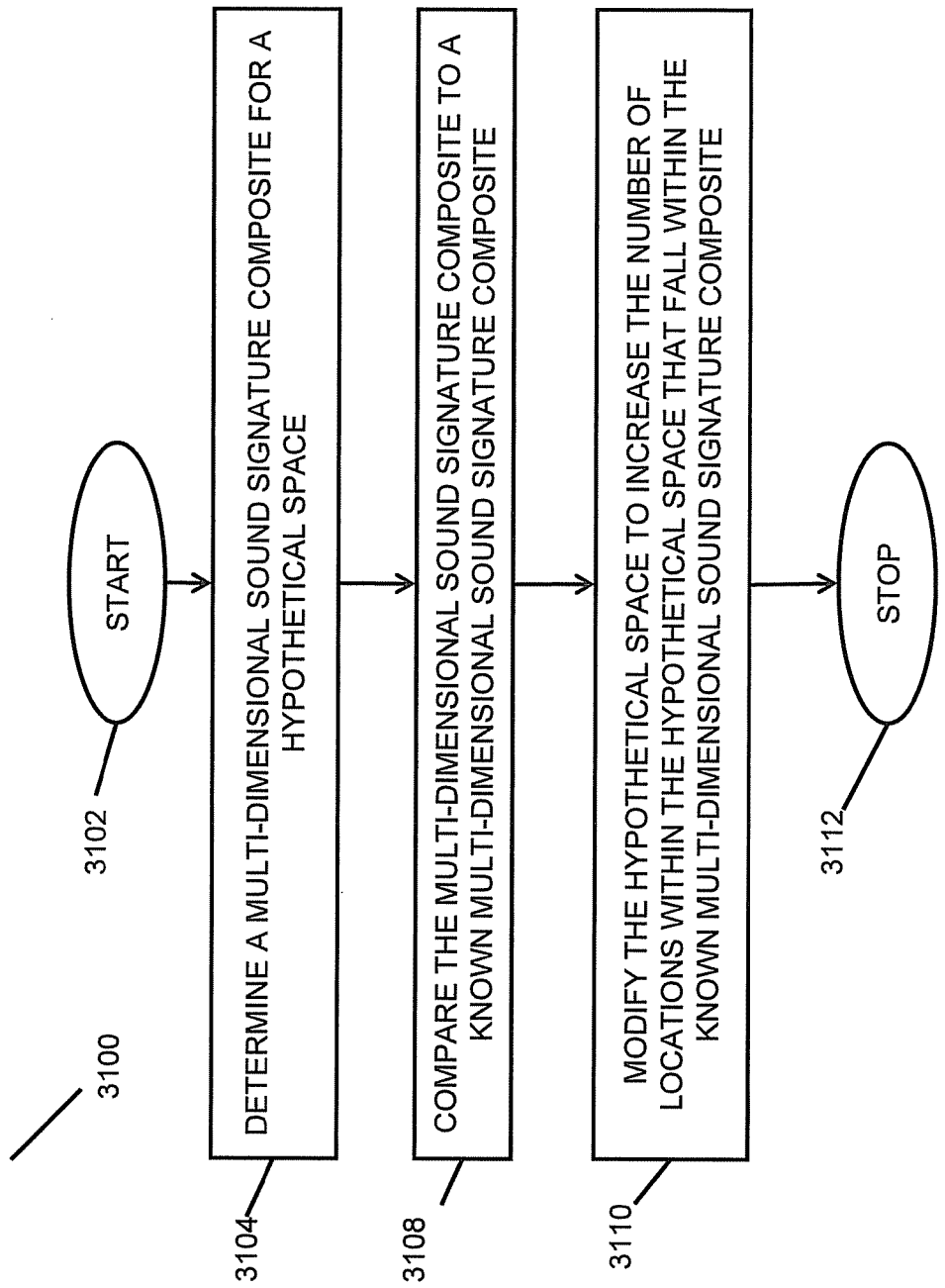
FIG. 31 depicts a flow process diagram in an embodiment of the present invention.

In embodiments, referring to FIG. 31, methods and systems for optimization of a hypothetical space in respect of a multi-dimensional sound signature composite in accordance with an embodiment may be provided. As shown in FIG. 31, a process 3100 for maximizing the number of locations in a hypothetical space that matches a known multi-dimensional sound signature composite may be provided.

The process 3100 starts at step 3102. At step 3104, a multi-dimensional sound signature composite for a hypothetical space may be determined. In embodiments, the determined multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like. In embodiments, as stated above, the known multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like.

At step 3108, the multi-dimensional sound signature composite may be compared to a known multi-dimensional sound signature composite. In embodiments, the known multi-dimensional sound signature composite may be an actual multi-dimensional sound signature composite for another space, an idealized multi-dimensional sound signature composite, a multi-dimensional sound signature composite for a hypothetical space, and the like. In embodiments, as stated above, the known multi-dimensional sound signature composite may result from manipulation of one or more other multi-dimensional sound signature composites.

At step 3110, the hypothetical space may be modified to increase the number of locations within the hypothetical space that fall within the known multi-dimensional sound signature composite. The modification may include altering the design of the hypothetical space. In embodiments, the number of locations falling within the known multi-dimensional sound signature may be increased for a dimension. In embodiments, the number of locations falling within the known multi-dimensional sound signature may be increased for more than one dimension. In embodiments, the hypothetical space may be modified by the construction of fixtures designed to create reflections of sound within a defined range of time, amplitude and direction. In embodiments, the hypothetical space may be modified by adding, removing, and/or moving fixtures designed to create reflections of sound within a defined range of time, amplitude and direction. The range for all the above stated embodiments may be defined based on a preferred, multi-dimensional sound signature. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material.

The process 3100 may end at step 3112.

Figure 32:
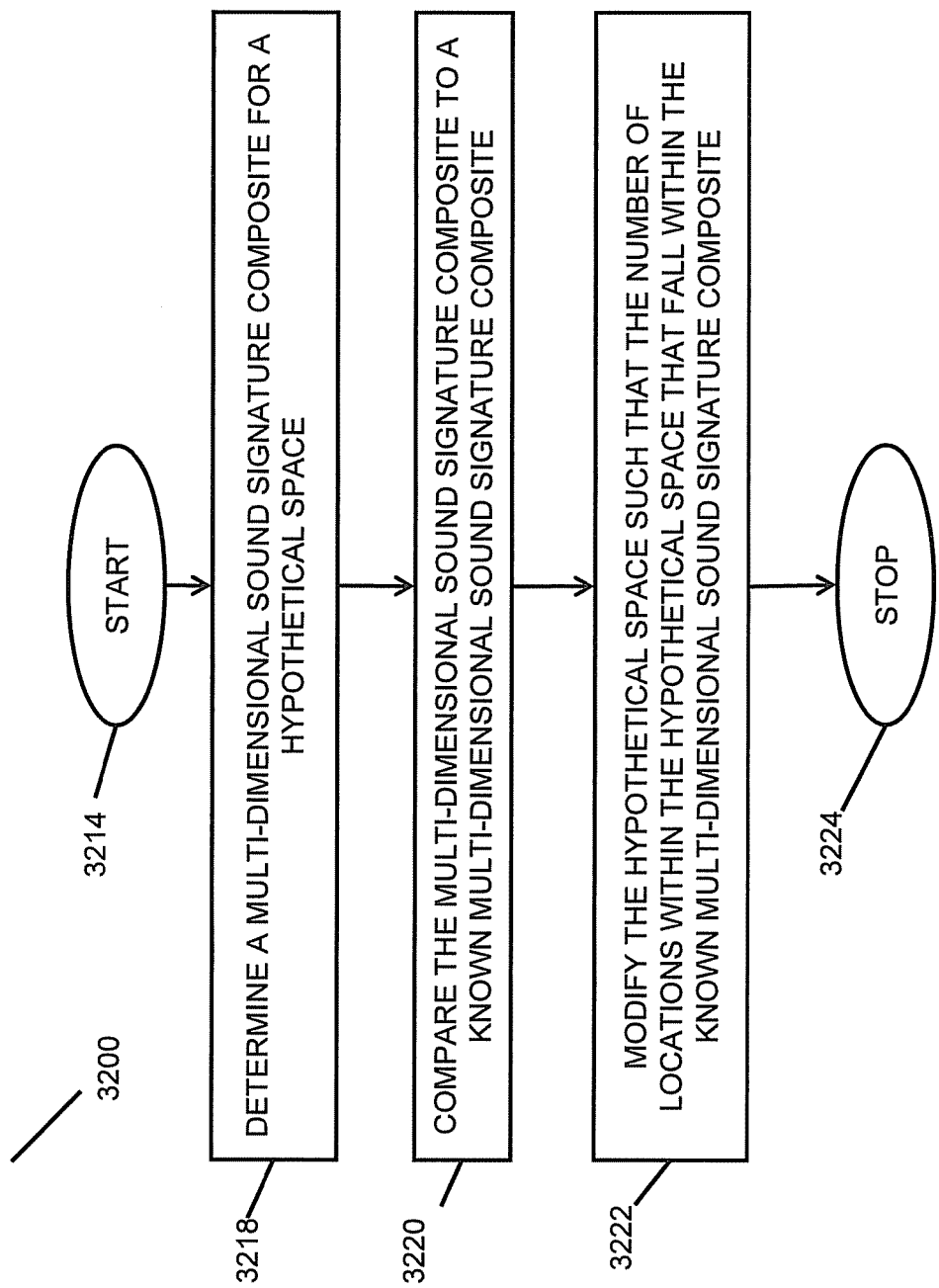
FIG. 32 depicts a flow process diagram in an embodiment of the present invention.

In embodiments, referring to FIG. 32, methods and systems for optimizing the hypothetical space in accordance with another embodiment may be provided. As shown in FIG. 32, a process 3200 for optimizing the hypothetical space in accordance with another embodiment may be provided.

The process 3200 starts at step 3214. In embodiments, the determined multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

At step 3218, similar to step 3204 of the process 3200A, a multi-dimensional sound signature composite for a hypothetical space may be determined. At step 3220, the multi-dimensional sound signature composite may be compared to a known multi-dimensional sound signature composite. In embodiments, as stated above, the known multi-dimensional sound signature composite may be an actual multi-dimensional sound signature composite for another space, an idealized multi-dimensional sound signature composite, a multi-dimensional sound signature composite for a hypothetical space, and the like. In embodiments, as stated above, the known multi-dimensional sound signature composite may result from manipulation of one or more other multi-dimensional sound signature composites. In embodiments, as stated above, the known multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like.

At step 3222, the hypothetical space may be modified such that the number of locations within the hypothetical space that fall within the known multi-dimensional sound signature composite may be maximized. As stated above, the modification may include altering the design of the hypothetical space. In embodiments, as stated above, the number of locations falling within the known multi-dimensional sound signature may be increased for a dimension. In embodiments, the number of locations falling within the known multi-dimensional sound signature may be increased for more than one dimension. In embodiments, the hypothetical space may be modified by the construction of fixtures designed to create reflections of sound within a defined range of time, amplitude and direction. In embodiments, the hypothetical space may be modified by adding, removing, and/or moving fixtures designed to create reflections of sound within a defined range of time, amplitude and direction. The range for all the above stated embodiments may be defined based on a preferred, multi-dimensional sound signature. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material.

The process 3200 may end at step 3224.

Figure 33:
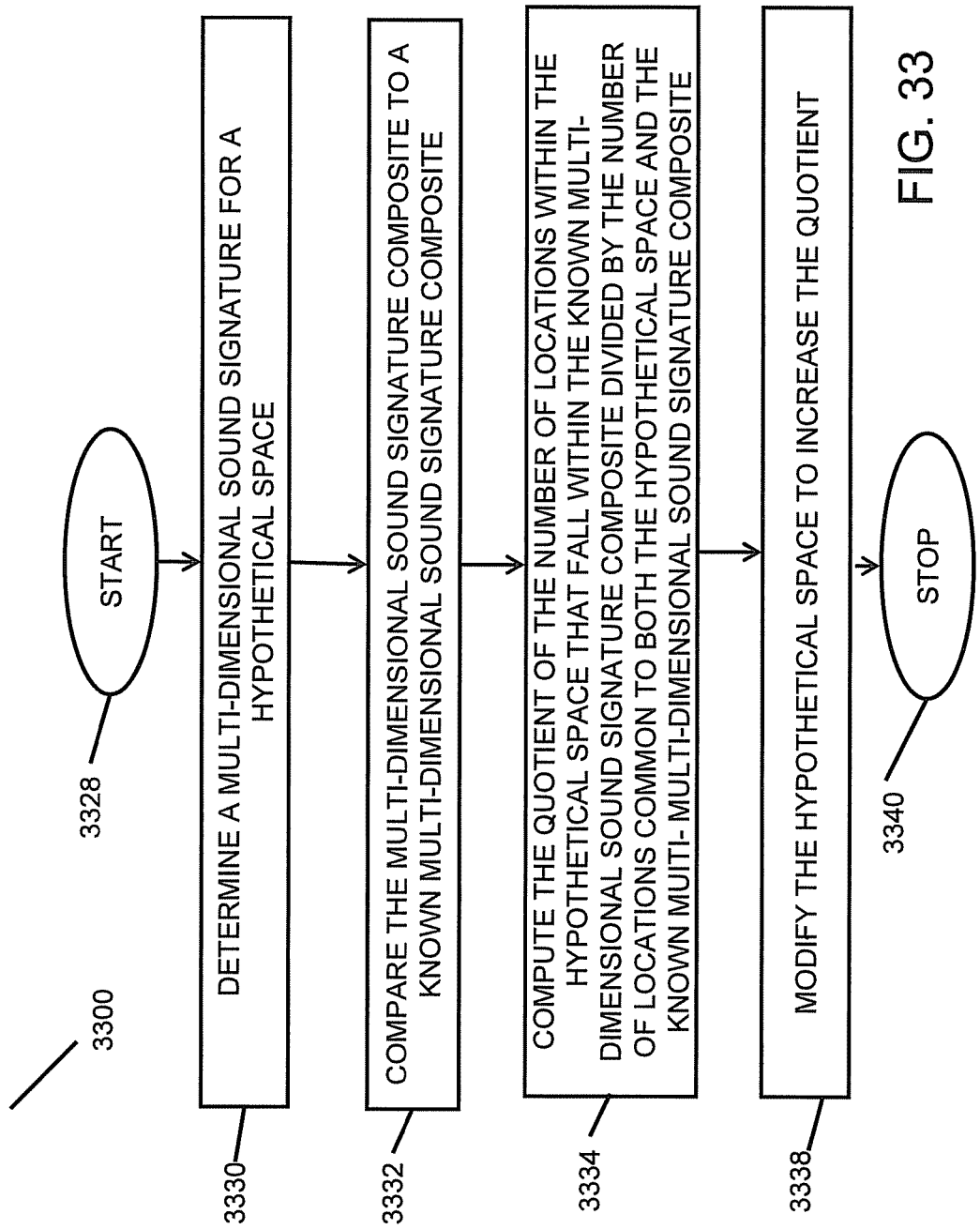
FIG. 33 depicts a flow process diagram in an embodiment of the present invention.

In embodiments, referring to FIG. 33, methods and systems for optimizing the hypothetical space in accordance with yet another embodiment may be provided. As shown in FIG. 33, the process 3300 for optimizing the hypothetical space in accordance with yet another embodiment may be provided.

The process 3300 starts at step 3328. At step 3330, similar to the step 3304 of the process 3300A, a multi-dimensional sound signature composite for a hypothetical space may be determined. In embodiments, the determined multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

At step 3332, the multi-dimensional sound signature composite may be compared to a known multi-dimensional sound signature composite. In embodiments, as stated above, the known multi-dimensional sound signature composite may be an actual multi-dimensional sound signature composite for another space, an idealized multi-dimensional sound signature composite, a multi-dimensional sound signature composite for a hypothetical space, and the like. In embodiments, as stated above, the known multi-dimensional sound signature composite may result from manipulation of one or more other multi-dimensional sound signature composites. In embodiments, as stated above, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

At step 3334, the quotient of the number of locations within the hypothetical space that fall within the known multi-dimensional sound signature composite divided by the number of locations common to both the hypothetical space and the known multi-dimensional sound signature composite may be computed. In embodiments, as stated above, the number of locations falling within the known multi-dimensional sound signature may be increased for a dimension. In embodiments, the number of locations falling within the known multi-dimensional sound signature may be increased for more than one dimension.

At step 3338, the hypothetical space may be modified such that the quotient is increased. The modification may include altering the design of the hypothetical space. In embodiments, as stated above, the hypothetical space may be modified by the construction of fixtures designed to create reflections of sound within a defined range of time, amplitude and direction. In embodiments, the hypothetical space may be modified by adding, removing, and/or moving fixtures designed to create reflections of sound within a defined range of time, amplitude and direction. The range for all the above stated embodiments may be defined based on a preferred, multi-dimensional sound signature. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material.

The process 3300 may end at step 3340.

Figure 34:
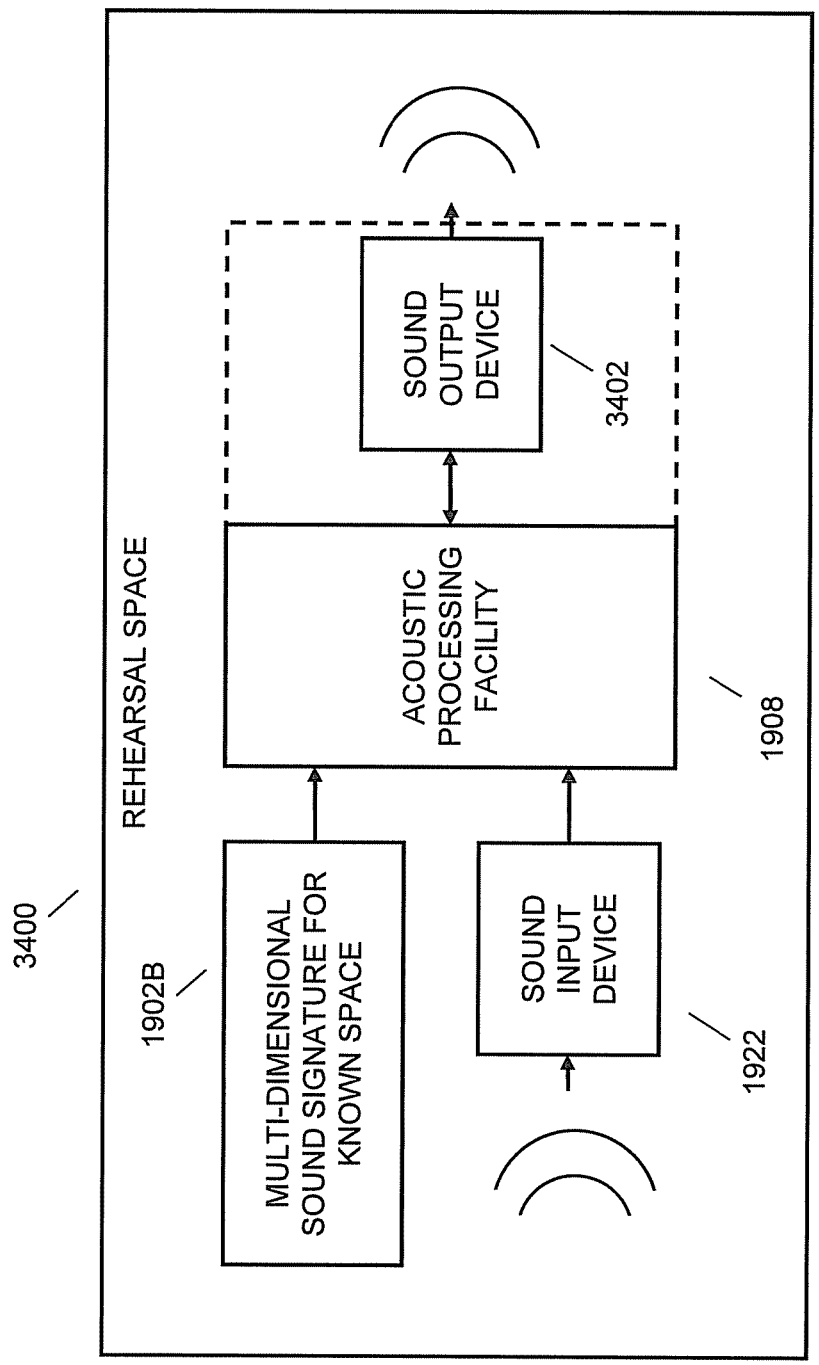
FIG. 34 depicts an embodiment block diagram of the present invention.

In embodiments, the present invention may provide for the re-creation of a multi-dimensional sound signature and/or multi-dimensional sound signature composites in a rehearsal space, where the performer is in the rehearsal space and the sounds they make and input to a sound input device (e.g. microphone) may be re-created contemporaneously at a sound output device (e.g. speaker(s), headphones) such that the original sounds of the performer may be output according to the multi-dimensional sound signature and/or multi-dimensional sound signature composites. Referring to FIG. 34, a user may produce a sound, and input that sound to a sound input device 1922, which may be then provided to an acoustic processing facility 1908 as an input sound stream. In addition, a multi-dimensional sound signature 1902B or a multi-dimensional sound signature composite 1904B may be provided to the acoustic processing facility 1908, where multi-dimensional sound signature or a multi-dimensional sound signature composite may correspond to a music venue that the performer wants to emulate. The acoustic processing facility 1908 may then create an output sound stream that modifies the sound input stream in terms of the provided multi-dimensional sound signature or a multi-dimensional sound signature composite. The output sound stream may then be provided to the sound output device 3402, which may allow the performer to hear the original sound input as if they were making the sound in the space that created the multi-dimensional sound signature or a multi-dimensional sound signature composite. In embodiments, the acoustic processing facility 1908 may include any of the acoustical equipment described herein to perform the comparison, manipulation, and the like, between the multi-dimensional sound signature of the known space and the sound input device. In addition, and as indicted in FIG. 34, the components and functions of the acoustic processing facility 1908 may be included in the sound output device.

For example, a performer may be forced to rehearse at a rehearsal studio for a performance at a music hall, rather than the preferred music hall itself. The disadvantage being that the performer would not normally get the same acoustic characteristics in the rehearsal studio that they would get in the music hall. In embodiments, the present invention may provide the performer with a way to rehearse in the rehearsal studio, yet sound like they're performing in the music hall. In embodiments, the present invention may provide this alteration in real-time, such as to a sound system in the rehearsal studio or to headphones. In another example, the present invention may provide this facility to a performer while performing in the concert hall with no audience, but where the performer hears the sound projected to them as if the music hall was full of people. The present invention may enable this by providing the acoustic processing facility 1908 with a multi-dimensional sound signature or a multi-dimensional sound signature composite of the music hall with an audience. In embodiments, the output sound steam may provide the performer with the multi-dimensional sound signature for any of a plurality of locations in the measured space of the multi-dimensional sound signature composite. In embodiments, the present invention may provide a real-time alteration of a sound input stream for other environments, and one skilled in the art will appreciate that this system may be applied to a wide range of applications, including for entertainment, simulations, home performance, sports applications, and the like.

Figure 35:
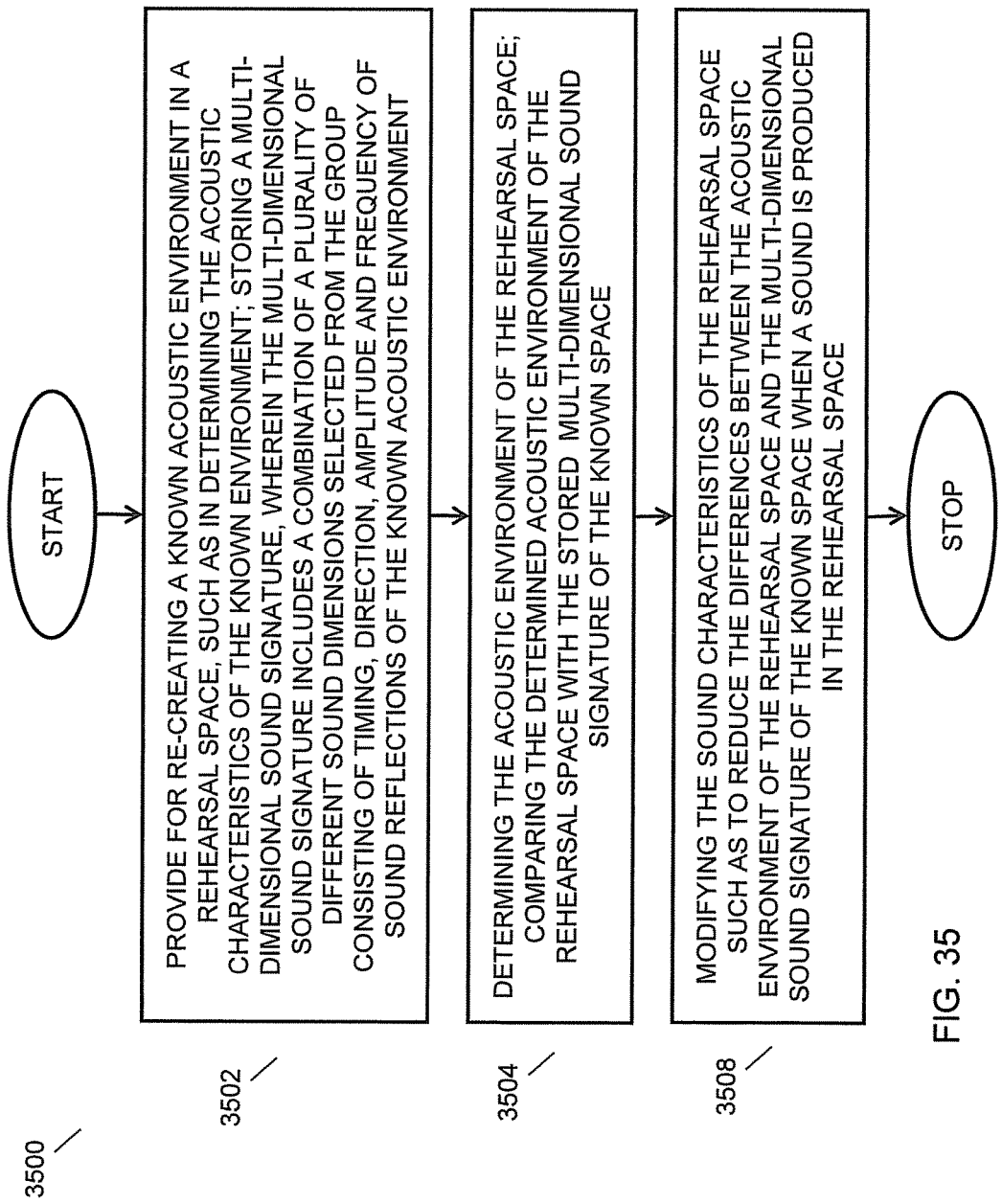
FIG. 35 depicts a flow process diagram in an embodiment of the present invention.
Figure 36:
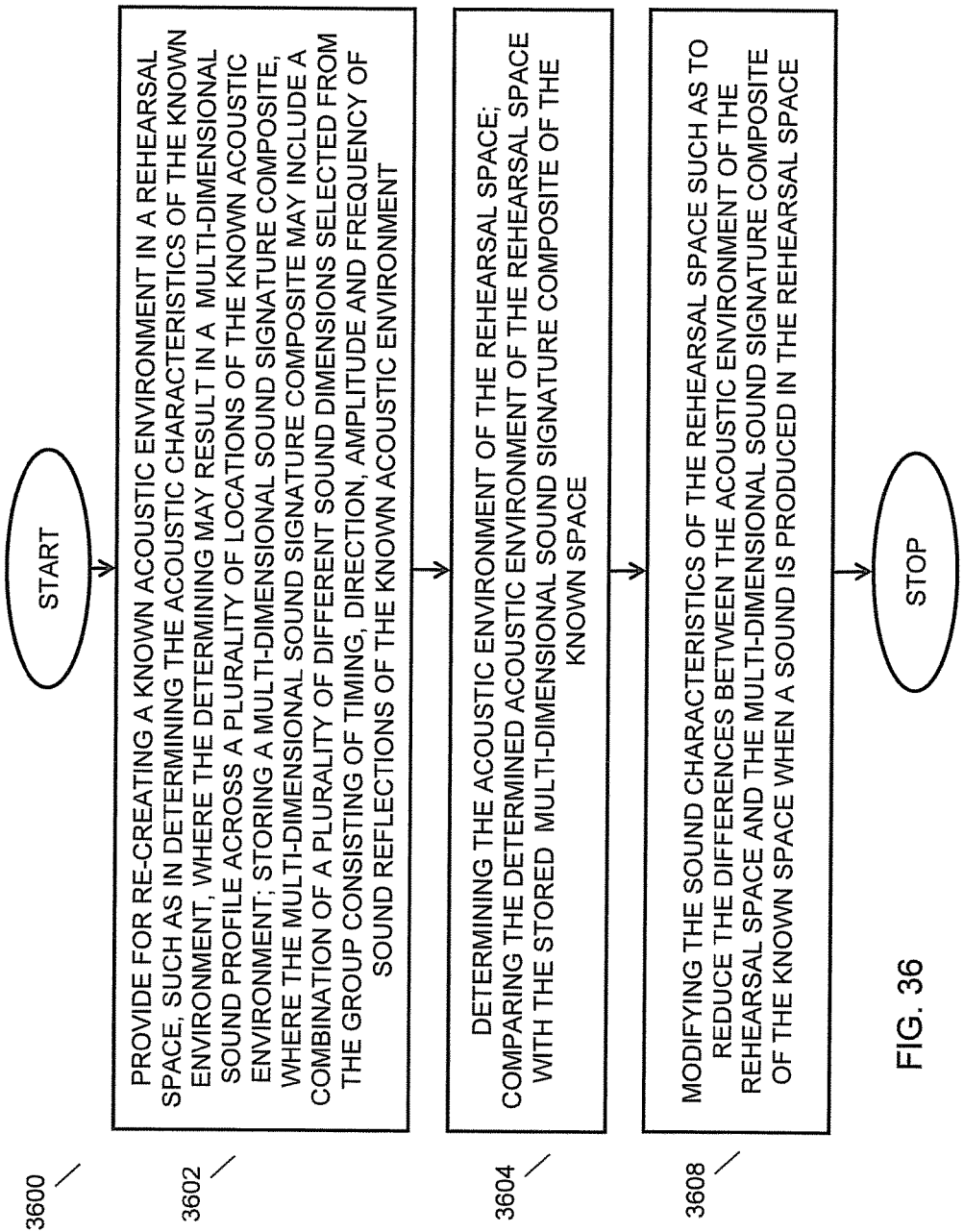
FIG. 36 depicts a flow process diagram in an embodiment of the present invention.

Referring to FIG. 35, in embodiments the present invention may provide for re-creating a known acoustic environment in a rehearsal space 3500, such as in determining the acoustic characteristics of the known environment; storing a multi-dimensional sound signature, wherein the multi-dimensional sound signature includes a combination of a plurality of different sound dimensions selected from the group consisting of timing, direction, amplitude and frequency of sound reflections of the known acoustic environment; determining the acoustic environment of the rehearsal space; comparing the determined acoustic environment of the rehearsal space with the stored multi-dimensional sound signature of the known space; and modifying the sound characteristics of the rehearsal space such as to reduce the differences between the acoustic environment of the rehearsal space and the multi-dimensional sound signature of the known space when a sound is produced in the rehearsal space. In embodiments, determining the acoustic environment may include making a multi-dimensional sound measurement, specifying a multi-dimensional sound signature, and the like. In embodiments, the determining of the acoustic environment of the rehearsal space may include the creation of a multi-dimensional sound signature for the rehearsal space. The comparing may include the comparison of the multi-dimensional sound signature of the rehearsal space with the multi-dimensional sound signature of the known space. The sound characteristics may include modifying a reflective characteristic of the rehearsal space, modifying an absorption characteristic of the rehearsal space, adjusting a sound system of the rehearsal space, modifying at least one reflection to mimic at least one of a secondary and a tertiary reflection in the space, and the like. Adjusting a sound system of the rehearsal space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the rehearsal space may include the creation of a multi-dimensional sound signature for the rehearsal space. The comparing may include the comparison of the multi-dimensional sound signature of the rehearsal space with the multi-dimensional sound signature of the known space. The plurality of locations may be a sound initiation locations, a plurality of sound measurement locations, a plurality of sound initiation location and a sound measurement location, and the like Referring to FIG. 36, in embodiments, the present invention may provide for re-creating a known acoustic environment in a rehearsal space 3600, such as in determining the acoustic characteristics of the known environment, where the determining may result in a multi-dimensional sound profile across a plurality of locations of the known acoustic environment; storing a multi-dimensional sound signature composite, where the multi-dimensional sound signature composite may include a combination of a plurality of different sound dimensions selected from the group consisting of timing, direction, amplitude and frequency of sound reflections of the known acoustic environment; determining the acoustic environment of the rehearsal space; comparing the determined acoustic environment of the rehearsal space with the stored multi-dimensional sound signature composite of the known space; and modifying the sound characteristics of the rehearsal space such as to reduce the differences between the acoustic environment of the rehearsal space and the multi-dimensional sound signature composite of the known space when a sound is produced in the rehearsal space. In embodiments, determining the acoustic environment may include making a multi-dimensional sound measurement, specifying a multi-dimensional sound signature, and the like. In embodiments, the determining of the acoustic environment of the rehearsal space may include the creation of a multi-dimensional sound signature for the rehearsal space. The comparing may include the comparison of the multi-dimensional sound signature of the rehearsal space with the multi-dimensional sound signature of the known space. The sound characteristics may include modifying a reflective characteristic of the rehearsal space, modifying an absorption characteristic of the rehearsal space, adjusting a sound system of the rehearsal space, modifying at least one reflection to mimic at least one of a secondary and a tertiary reflection in the space, and the like. Adjusting a sound system of the rehearsal space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the rehearsal space may include the creation of a multi-dimensional sound signature for the rehearsal space. The comparing may include the comparison of the multi-dimensional sound signature of the rehearsal space with the multi-dimensional sound signature of the known space. The plurality of locations may be a plurality of sound initiation locations, a plurality of sound measurement locations, a plurality of sound initiation locations and a plurality of sound measurement locations, and the like.

Figure 37:
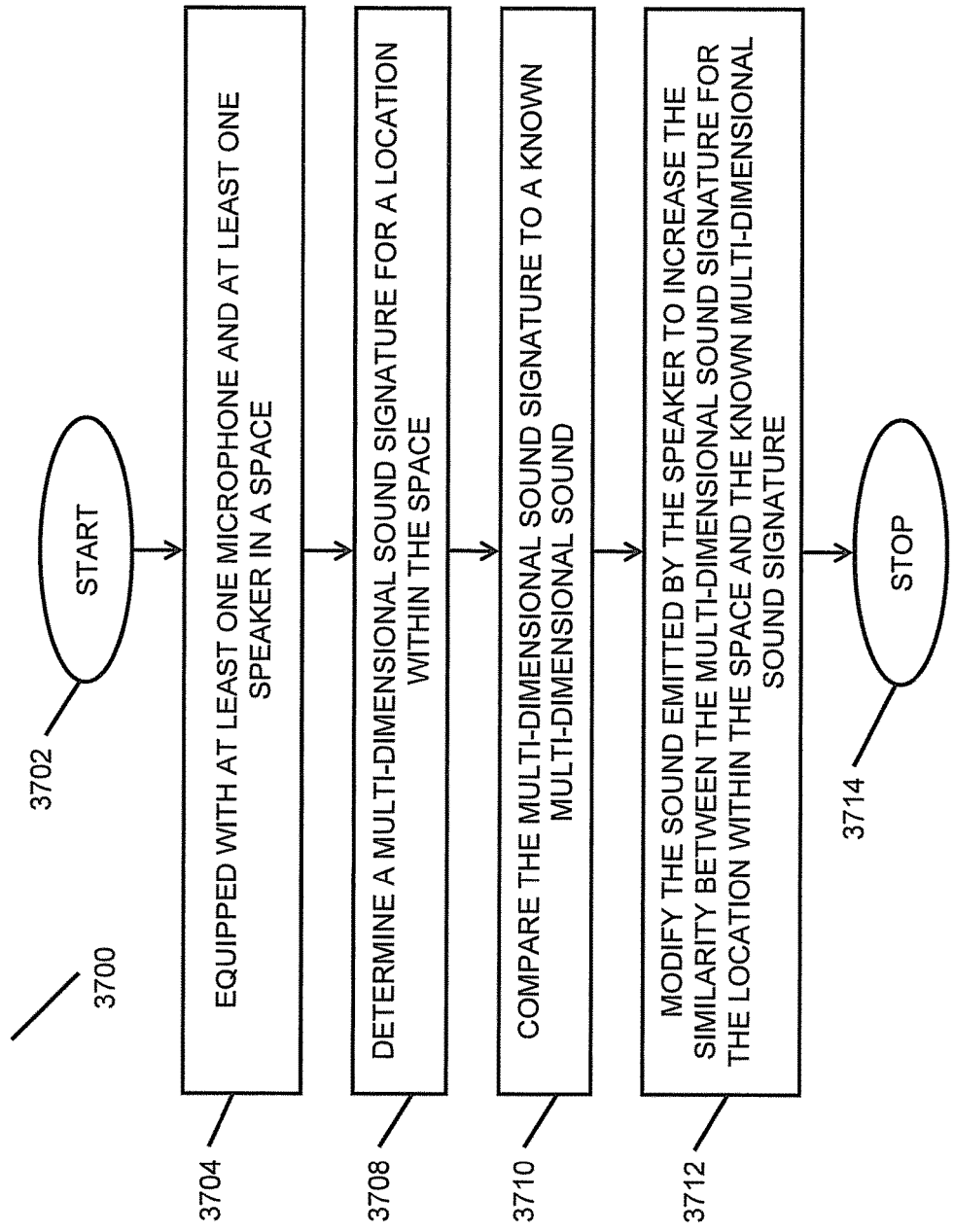
FIG. 37 depicts a flow process diagram in an embodiment of the present invention.

In embodiments, referring to FIGS. 37-40, methods and systems for recreation of multi-dimensional sound signatures and multi-dimensional sound signature composites in a rehearsal space may be provided. As shown in FIG. 37, a process 3700 for recreation of multi-dimensional sound signatures and multi-dimensional sound signature composites in a rehearsal space, in accordance with various embodiments of the present invention, may be provided.

The process 3700 starts at step 3702. At step 3704, at least one microphone and at least one speaker in a space may be provided. In embodiments, at least one microphone may be configured to sense sound that may originate in the space. Additionally, at least one speaker may be configured to emit sound that may be sensed by the microphone. In embodiments, here and in embodiments elsewhere in this application, the space may be a substantially anechoic room, an anechoic room, a practice room, a rehearsal location, a recording studio, a virtual reality environment, a simulation environment, a computer gaming environment, a sound recording studio, a sound recording studio that may include a sound mixing facility and/or a sound recording facility, and the like. In embodiments, the speakers may be in the form of headphone, a subwoofer, a surround sound system, an array of speakers that may be arranged to produce multi-dimensional sound in the space, a monitor, a monitor located on stage, and the like. In embodiments, the microphone may include a direct input such as for a musical instrument and the like.

At step 3708, a multi-dimensional sound signature for a location within the space may be determined. At step 3710, the multi-dimensional sound signature may be compared to a known multi-dimensional sound signature. In embodiments, the known multi-dimensional sound signature may be for the locations described herein, including an actual space, a hypothetical space, audience area of a space, stage area of a space, and the like.

At step 3712, the sound that may be emitted by the speaker may be modified. In embodiments, the sound may be modified such that the similarity between the multi-dimensional sound signature for the location within the space and the known multi-dimensional sound signature may be increased.

The process 3700 may end at step 3714.

Figure 38:
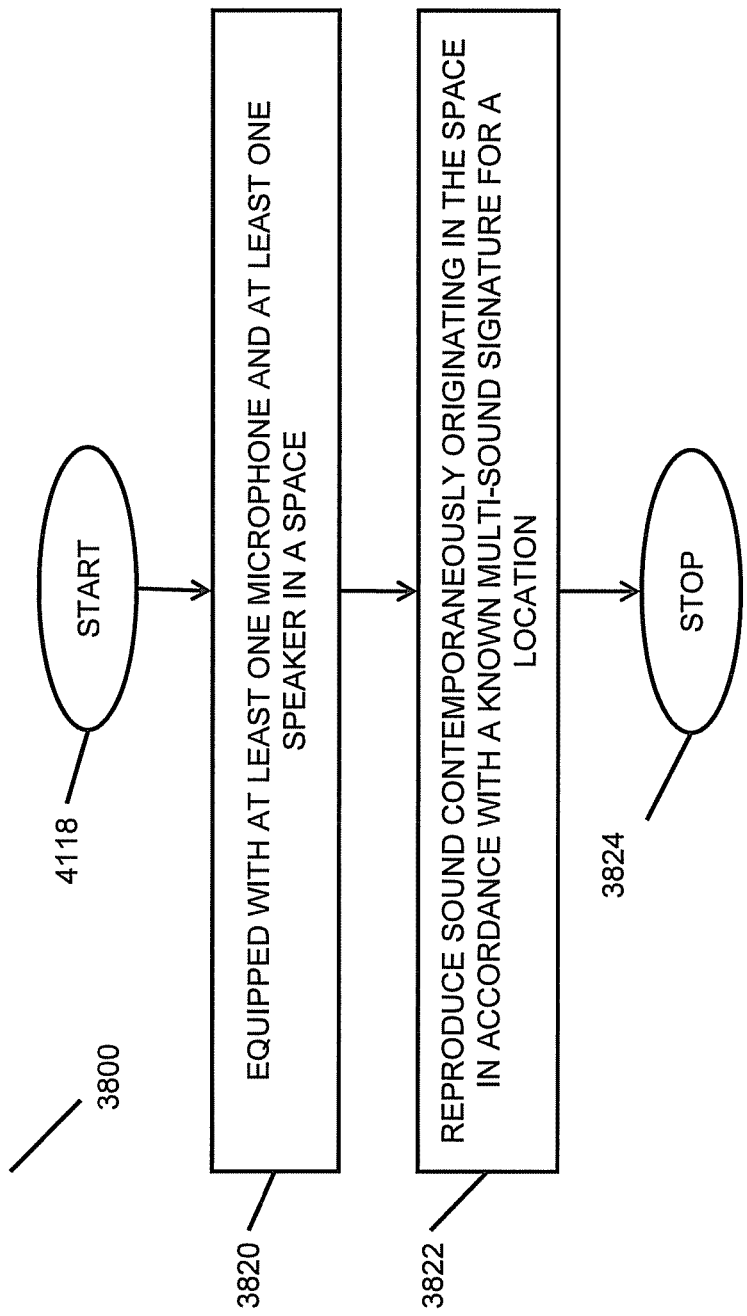
FIG. 38 depicts a flow process diagram in an embodiment of the present invention.

In embodiments referring to FIG. 38, methods and systems for recreation of multi-dimensional sound signatures and multi-dimensional sound signature composites in a rehearsal space may be provided. As shown in FIG. 38, a process 3800 for recreation of multi-dimensional sound signatures and multi-dimensional sound signature composites in a rehearsal space, in accordance with various embodiments of the present invention, may be provided.

The process 3800 starts at step 3818. At step 3820, at least one microphone and at least one speaker in a space may be provided. In embodiments, the space may be a substantially anechoic room, an anechoic room, a practice room, a rehearsal location, and/or some other type of space. In embodiments, the speakers may be headphones, a surround sound system, an array of speakers arranged to produce multi-dimensional sound in the space, and/or some other type of speakers. In embodiments, the speakers may include a subwoofer. In embodiments, the microphone may include a direct input such as for a musical instrument and the like.

At step 3822, sound originating in the space may be reproduced contemporaneously in accordance with a known multi-sound signature for a location, using at least in part the at least one microphone and at least one speaker. In embodiments, such reproduction may apply the known multi-dimensional sound signature to the reproduced sound. In embodiments, such reproduction may create the effect that a listener is at the location of the known multi-dimensional sound signature and the listener generates, at least in part, the sound contemporaneously originating in the space, such that the reproduced version of the sound generated by the listener may be more similar to sound generated at the location. In embodiments, the known multi-dimensional sound signature may be for an actual space, a hypothetical space, audience area of a space, stage area of a space, and the like locations. In embodiments, applying the known multi-dimensional sound signature may include adjusting at least one of the timing and volume of sound emitted by a speaker at a specified location within the space. Timing of sounds emitted from speakers placed at rear and side locations in the space may be adjusted to increase similarity to timing of rear and side reflections specified in the multi-dimensional sound signature. Timing of sounds emitted from speakers placed at side locations may be adjusted to mimic primary and secondary side reflections specified in the multi-dimensional sound signature. Volume of sounds emitted from speakers placed at rear and side locations in the space is adjusted to increase similarity to amplitude of rear and side reflections specified in the multi-dimensional sound signature.

In embodiments, the reproduction may occur in real-time or substantially in real-time. In embodiments, the reproduction may be of live sound originating in the space. In embodiments, the reproduction may create the effect that a listener may be at the location of the known multi-dimensional sound signature. In embodiments, the reproduction may create the effect that a listener may be at the location of the known multi-dimensional sound signature, and the listener may generate, at least in part, the sound contemporaneously originating in the space. In embodiments, in the above scenario, the reproduced version of the sound generated by the listener may be substantially similar to the sound that had been generated at the location. In embodiments, the application of the known multi-dimensional sound signature may be performed with a computer processor. In embodiments, the modification may also be performed with a computer processor, a mixing faculty, a sound recording and playback facility, a sound processing facility where the sound processing facility may include a plurality of channels configured to adjust timing of sounds played from specified locations in the space.

The process 3800 may end at step 3824.

Figure 39:
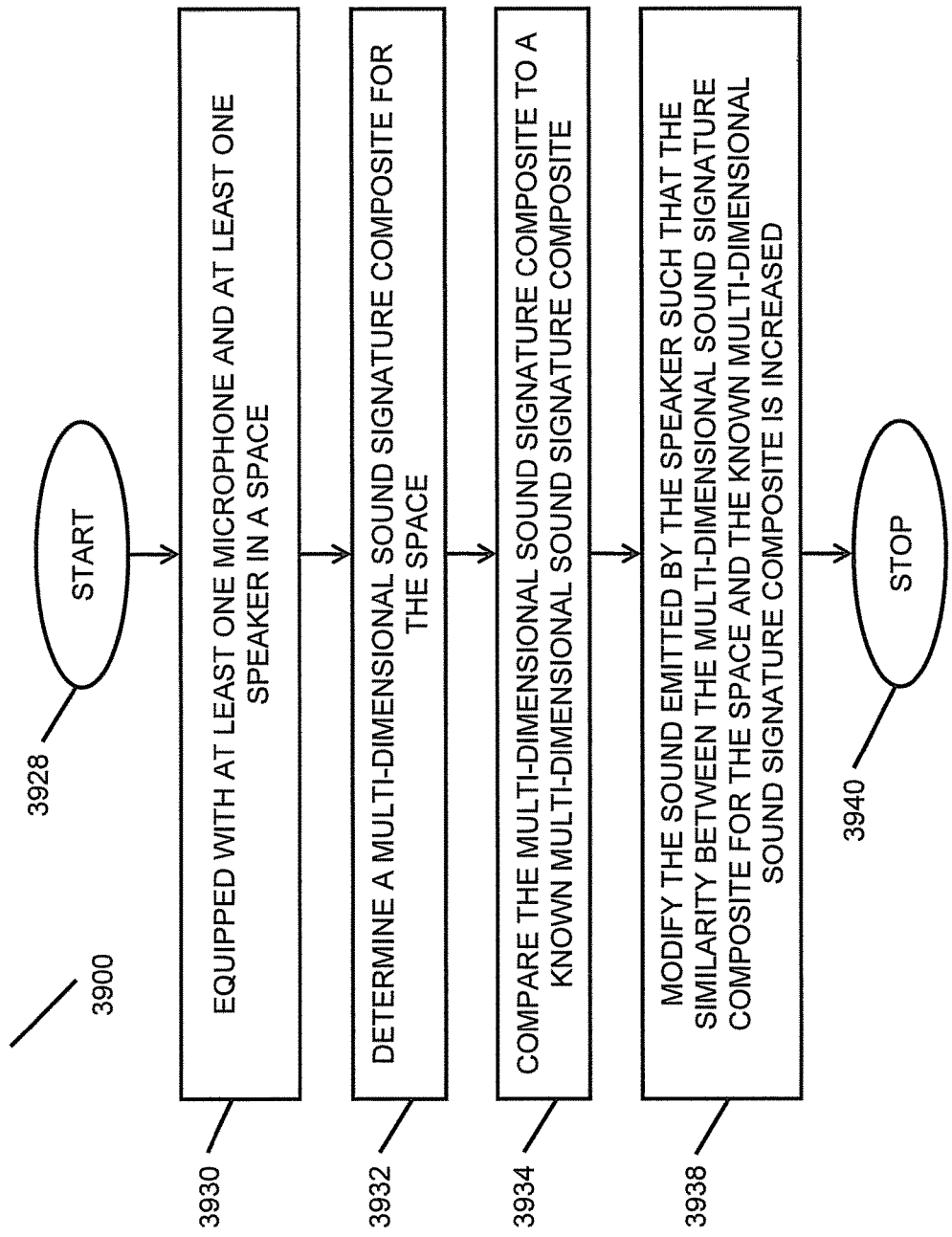
FIG. 39 depicts a flow process diagram in an embodiment of the present invention.

In embodiments referring to FIG. 39, methods and systems for recreation of multi-dimensional sound signatures and multi-dimensional sound signature composites in a rehearsal space may be provided. As shown in FIG. 39, a process 3900 for recreation of multi-dimensional sound signatures and multi-dimensional sound signature composites in a rehearsal space, in accordance with various embodiments of the present invention, may be provided.

The process 3900 starts at step 3928. At step 3930, at least one microphone and at least one speaker in a space may be provided. In embodiments, at least one microphone may be configured to sense sound that may originate in the space. Additionally, at least one speaker may be configured to emit sound that may be sensed by the microphone. In embodiments, the space may be a substantially anechoic room, an anechoic room, a practice room, a rehearsal location, a recording studio, a virtual reality environment, a simulation environment, a computer gaming environment, a sound recording studio, a sound recording studio that may include a sound mixing facility and/or a sound recording facility, and/or some other type of space. In embodiments, the speakers may be headphones, a surround sound system, an array of speakers arranged to produce multi-dimensional sound in the space, a monitor, a monitor located on stage, and/or some other type of speakers. In embodiments, the speakers may include a subwoofer. In embodiments, the microphone may include a direct input such as for a musical instrument and the like.

At step 3932, a multi-dimensional sound signature composite for the space may be determined. At step 3934, the multi-dimensional sound signature composite may be compared to a known multi-dimensional sound signature composite. In embodiments, the known multi-dimensional sound signature composite may be for locations such as an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like.

At step 3938, the sound emitted by the speaker may be modified such that the similarity between the multi-dimensional sound signature composite for the space and the known multi-dimensional sound signature composite may be increased.

The process 3900 may end at step 3940.

Figure 40:
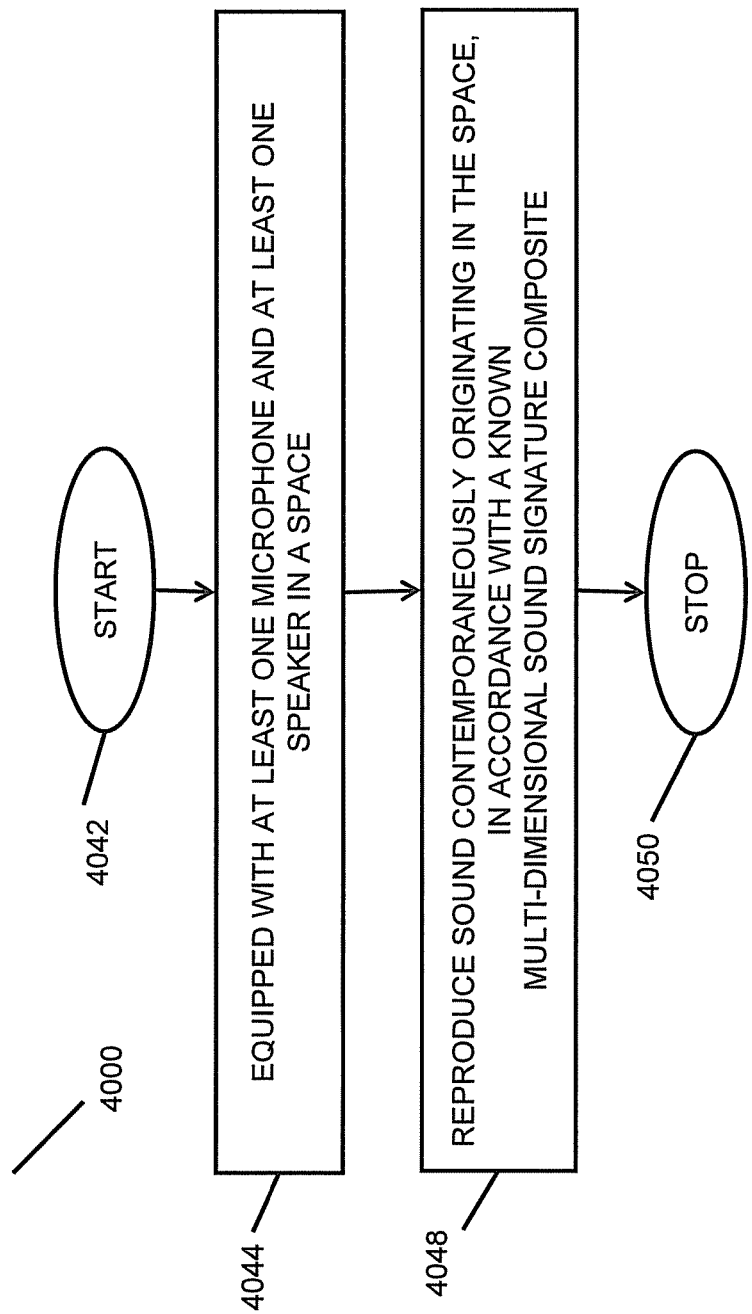
FIG. 40 depicts a flow process diagram in an embodiment of the present invention.

In embodiments referring to FIG. 40, methods and systems for recreation of multi-dimensional sound signatures and multi-dimensional sound signature composites in a rehearsal space may be provided. As shown in FIG. 40, a process 4000 for recreation of multi-dimensional sound signatures and multi-dimensional sound signature composites in a rehearsal space, in accordance with various embodiments of the present invention, may be provided.

The process 4000 starts at step 4042. At step 4044, at least one microphone and at least one speaker in a space may be provided. In embodiments, at least one microphone may be configured to sense sound that may originate in the space. Additionally, at least one speaker may be configured to emit sound that may be sensed by the microphone. In embodiments, the space may be a substantially anechoic room, an anechoic room, a practice room, a rehearsal location, and/or some other type of space. In embodiments, the speakers may be headphones, a surround sound system, an array of speakers arranged to produce multi-dimensional sound in the space, and/or some other type of speakers. In embodiments, the speakers may include a subwoofer. In embodiments, the microphone may include a direct input such as for a musical instrument and the like.

At step 4048, using at least in part the at least one microphone and at least one speaker, in accordance with a known multi-dimensional sound signature composite, sound contemporaneously originating in the space, may be reproduced. In embodiments, this reproduction, may apply the known multi-dimensional sound signature composite to the reproduced sound. In embodiments, such reproduction may create the effect that a listener is at the location of the known multi-dimensional sound signature and the listener generates, at least in part, the sound contemporaneously originating in the space, such that the reproduced version of the sound generated by the listener may be more similar to sound generated at the location. In embodiments, the known multi-dimensional sound signature composite may be for locations such as an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite. In embodiments, the known multi-dimensional sound signature composite is a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple location, multi-dimensional sound signature composite; a hypothetical multi-dimensional sound signature composite; an ambient multi-dimensional sound signature composite; and the like. In embodiments, applying the known multi-dimensional sound signature may include adjusting at least one of the timing and volume of sound emitted by a speaker at a specified location within the space. Timing of sounds emitted from speakers placed at rear and side locations in the space may be adjusted to increase similarity to timing of rear and side reflections specified in the multi-dimensional sound signature. Timing of sounds emitted from speakers placed at side locations may be adjusted to mimic primary and secondary side reflections specified in the multi-dimensional sound signature. Volume of sounds emitted from speakers placed at rear and side locations in the space is adjusted to increase similarity to amplitude of rear and side reflections specified in the multi-dimensional sound signature.

In embodiments, the reproduction may occur in real-time or substantially in real-time. In embodiments, the reproduction may create the effect at each location in the space that a listener may be at a corresponding location of the space of the known multi-dimensional sound signature composite. In embodiments, the reproduction may create the effect at each location in the space that a listener may be at a corresponding location of the space of the known multi-dimensional sound signature composite and the listener may generate, at least in part, the sound contemporaneously originating in the space. In the above scenario, the reproduced version of the sound that may be generated by the listener may be substantially similar to the sound that has been generated at the location in the space of the known multi-dimensional sound signature composite. In embodiments, the application of the known multi-dimensional sound signature may be performed with a computer processor. In embodiments, the modification may also be performed with a computer processor, a mixing facility, a sound recording and playback facility, a sound processing facility where the sound processing facility may include a plurality of channels configured to adjust timing of sounds played from specified locations in the space.

The process 4000 may end at step 4050.

Figure 41:
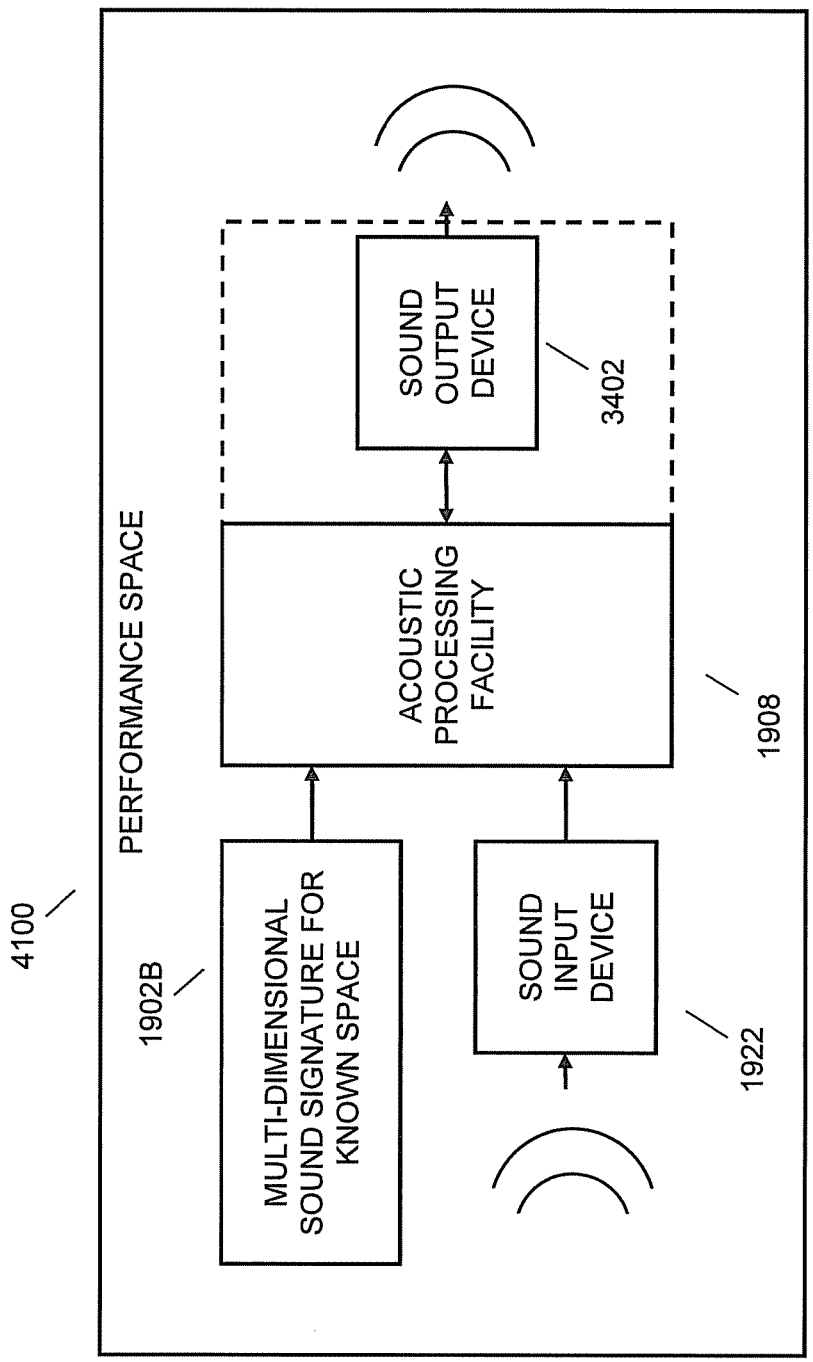
FIG. 41 depicts an embodiment block diagram of the present invention.

In embodiments, the present invention may provide for the re-creation of a multi-dimensional sound signature and/or multi-dimensional sound signature composite in a performance space, where the performer is in the performance space and the sounds they make and input to a sound input device (e.g. microphone) may be re-created contemporaneously at a sound output device (e.g. speaker(s), headphones) such that the original sounds of the performer may be output according the multi-dimensional sound signature and/or multi-dimensional sound signature composites. Referring to FIG. 41, a user may produce a sound, and input that sound to a sound input device 1922, which may be then provided to an acoustic processing facility 1908 as an input sound stream. In addition, a multi-dimensional sound signature 1902B or a multi-dimensional sound signature composite 1904B may be provided to the acoustic processing facility 1908, where multi-dimensional sound signature or a multi-dimensional sound signature composite may correspond to the music venue that the performer is performing in. The acoustic processing facility 1908 may then create an output sound stream that modifies the sound input stream in terms of the multi-dimensional sound signature or a multi-dimensional sound signature composite. The output sound stream may then be provided to the sound output device 3402, which may allow the performer to hear the sound as if heard from the audience, from a measured location in the audience as per the multi-dimensional sound signature or a multi-dimensional sound signature composite, and the like. In embodiments, the acoustic processing facility 1908 may include any of the acoustical equipment described herein to perform the comparison, manipulation, and the like, between the multi-dimensional sound signature of the known space and the sound input device. In addition, and as indicted in FIG. 41, the components and functions of the acoustic processing facility 1908 may be included in the sound output device. For example, a performer may want to hear how they sound to the audience while performing, and even be interested in specific locations in the audience. The present invention my enable the performer to hear what they sound like to the audience, such as on average, by location, and the like, as according to the multi-dimensional sound signature or a multi-dimensional sound signature composite.

Figure 42:
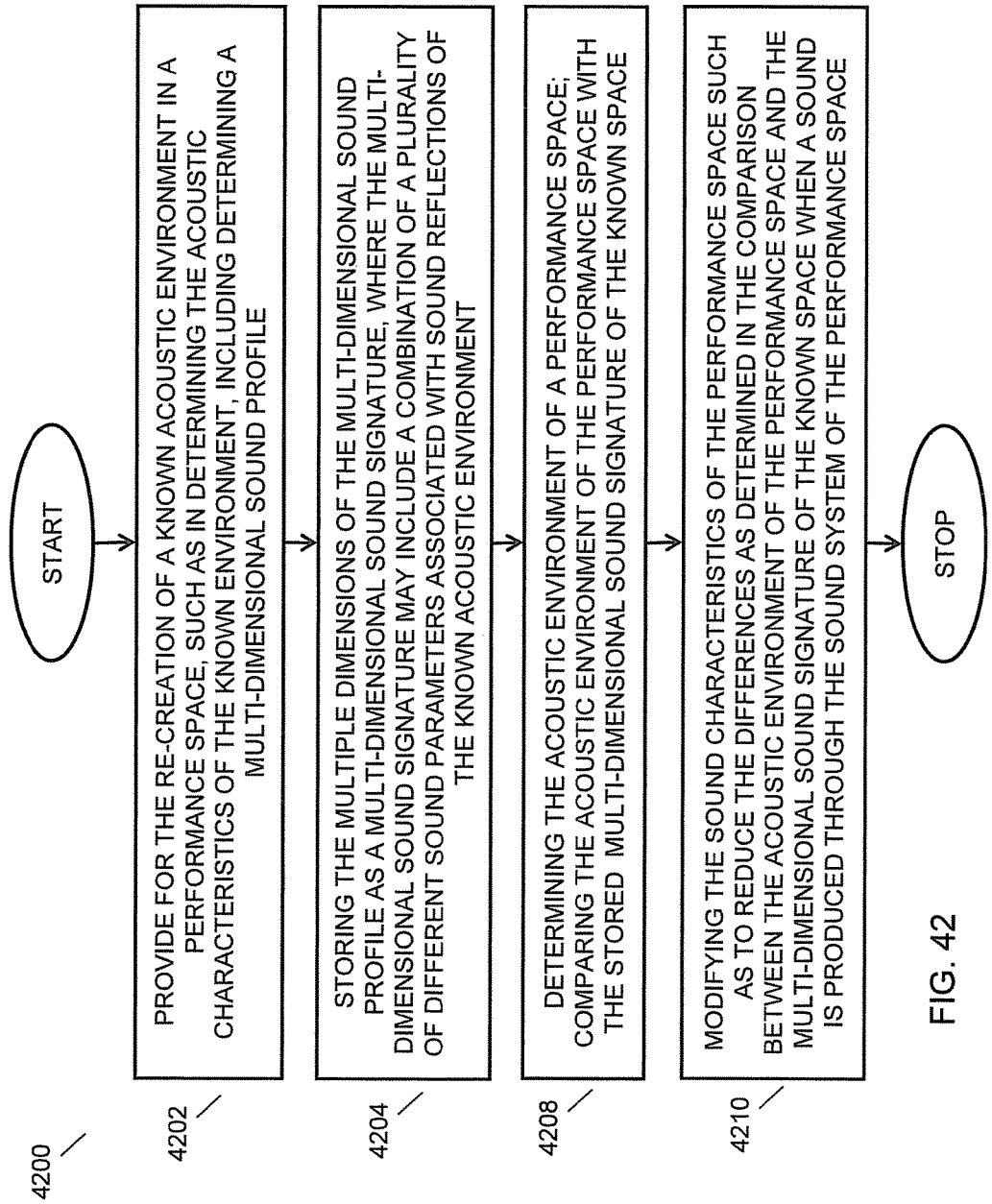
FIG. 42 depicts a flow process diagram in an embodiment of the present invention.

Referring to FIG. 42, in embodiments the present invention may provide for the re-creation of a known acoustic environment in a performance space 4200, such as in determining the acoustic characteristics of the known environment, including determining a multi-dimensional sound profile; storing the multiple dimensions of the multi-dimensional sound profile as a multi-dimensional sound signature, where the multi-dimensional sound signature may include a combination of a plurality of different sound parameters associated with sound reflections of the known acoustic environment; determining the acoustic environment of a performance space; comparing the acoustic environment of the performance space with the stored multi-dimensional sound signature of the known space; and modifying the sound characteristics of the performance space such as to reduce the differences as determined in the comparison between the acoustic environment of the performance space and the multi-dimensional sound signature of the known space when a sound is produced through the sound system of the performance space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a sound initiation location and a sound measurement location, and the like.

Figure 43:
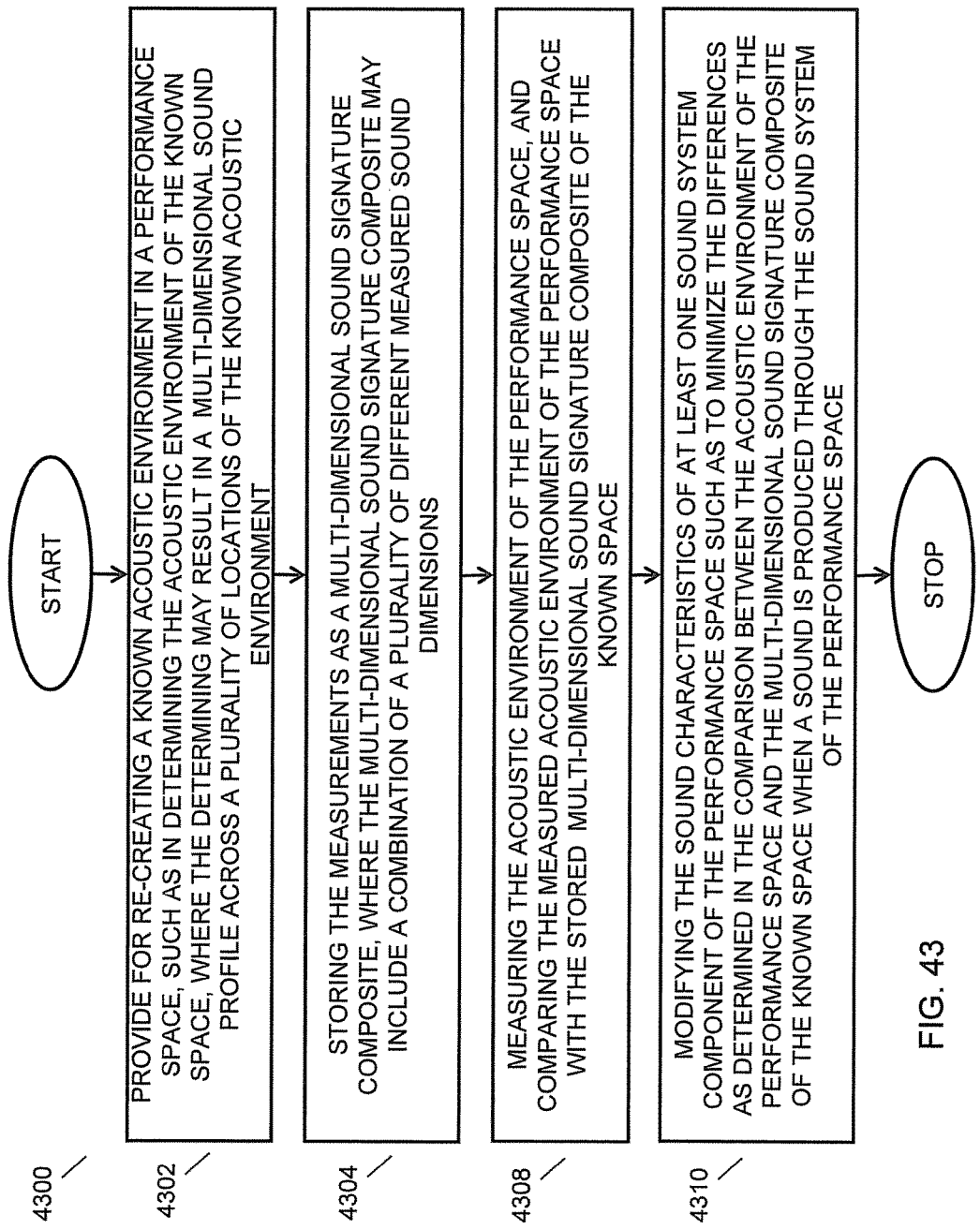
FIG. 43 depicts a flow process diagram in an embodiment of the present invention.

Referring to FIG. 43, in embodiments, the present invention may provide for re-creating a known acoustic environment in a performance space 4300, such as in determining the acoustic environment of the known space, where the determining may result in a multi-dimensional sound profile across a plurality of locations of the known acoustic environment; storing the measurements as a multi-dimensional sound signature composite, where the multi-dimensional sound signature composite may include a combination of a plurality of different measured sound dimensions; measuring the acoustic environment of the performance space, and comparing the measured acoustic environment of the performance space with the stored multi-dimensional sound signature composite of the known space; and modifying the sound characteristics of at least one sound system component of the performance space such as to minimize the differences as determined in the comparison between the acoustic environment of the performance space and the multi-dimensional sound signature composite of the known space when a sound is produced through the sound system of the performance space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 44:
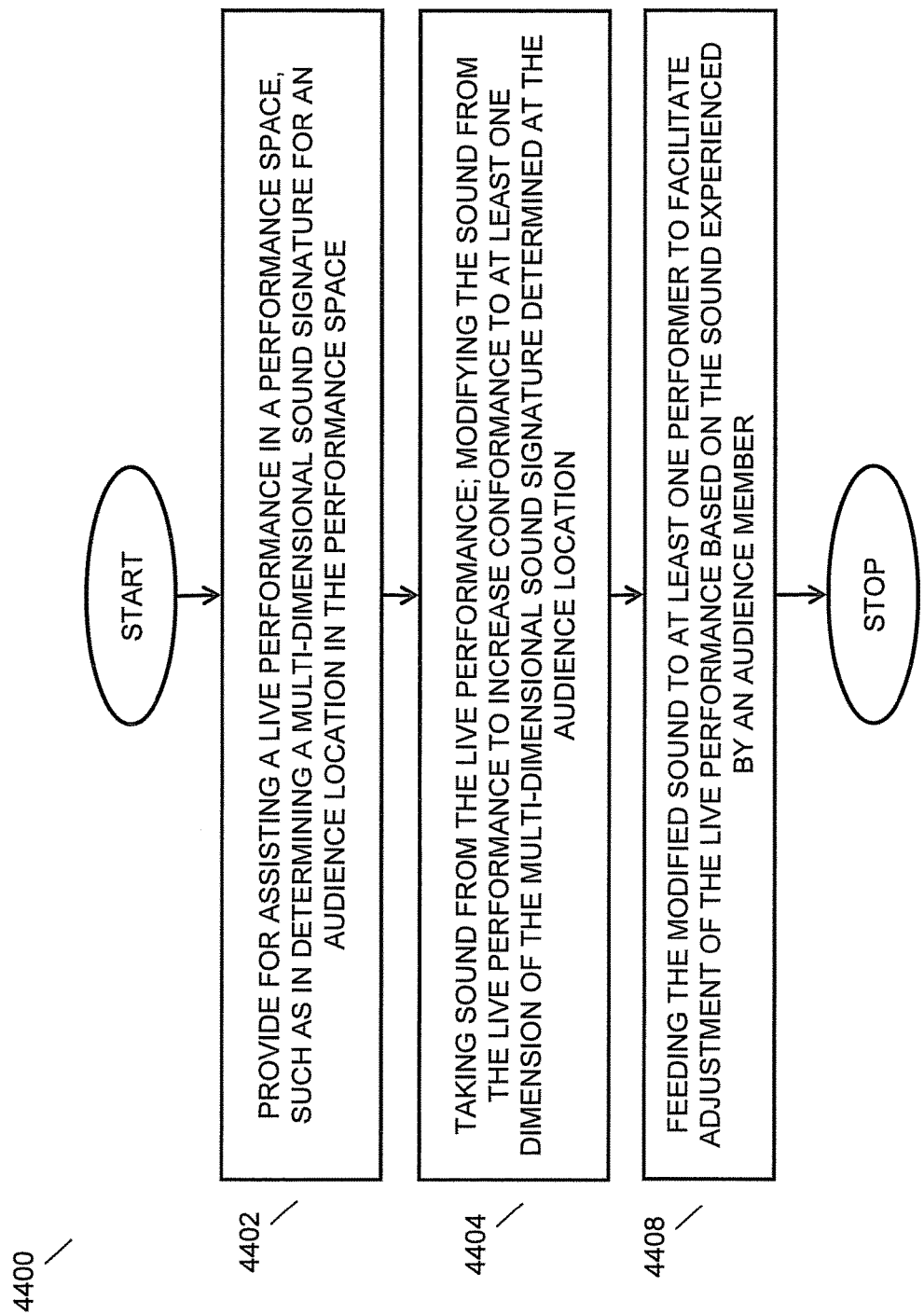
FIG. 44 depicts a flow process diagram in an embodiment of the present invention.

Referring to FIG. 44, in embodiments the present invention may provide for assisting a live performance in a performance space 4400, such as in determining a multi-dimensional sound signature for an audience location in the performance space; taking sound from the live performance; modifying the sound from the live performance to increase conformance to at least one dimension of the multi-dimensional sound signature determined at the audience location; and feeding the modified sound to at least one performer to facilitate adjustment of the live performance based on the sound experienced by an audience member.

Figure 45:
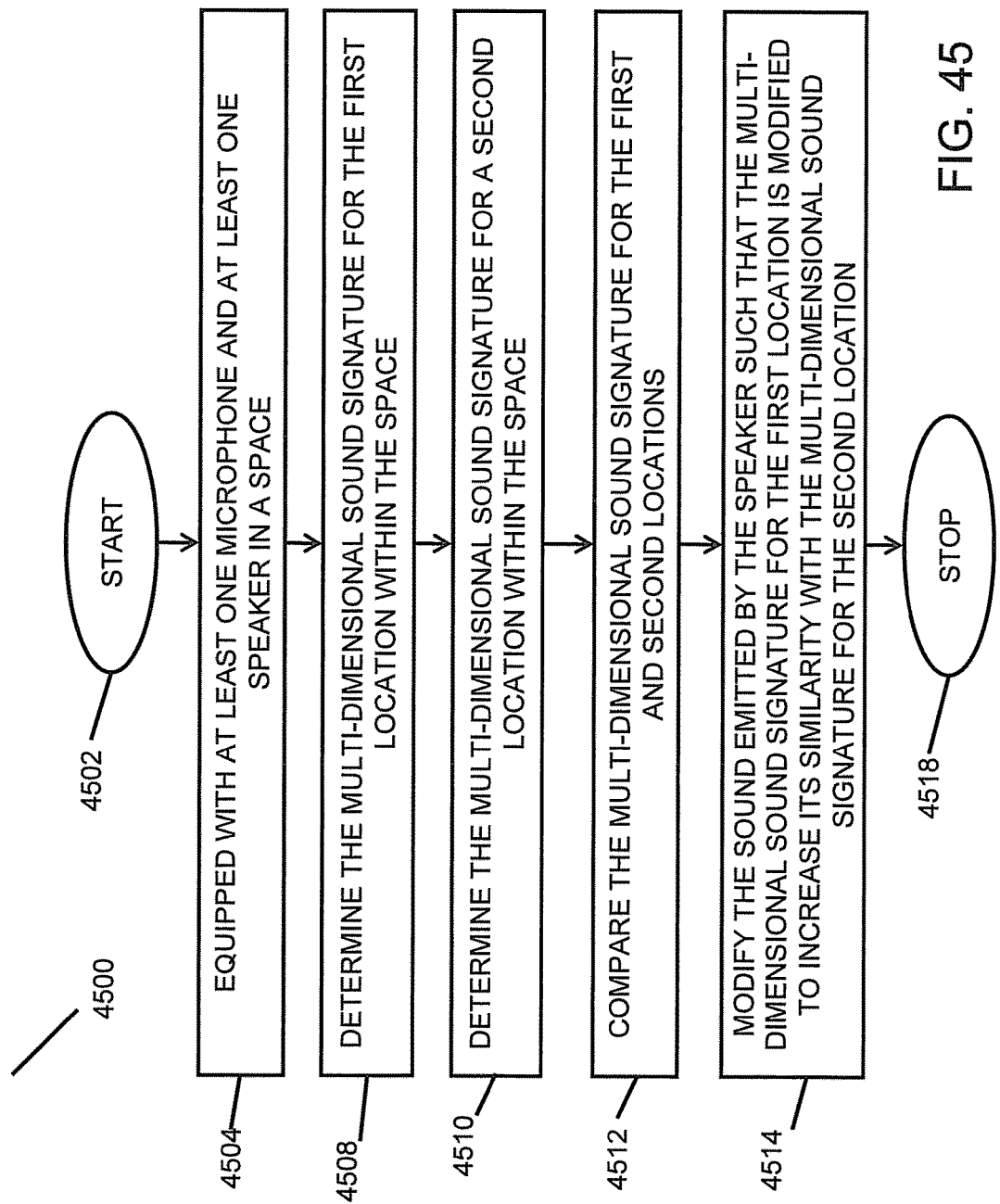
FIG. 45 depicts a flow process diagram in an embodiment of the present invention.

In embodiments, referring to FIG. 45, methods and systems for modifying the sound emitted by a speaker may be provided. As shown in FIG. 45, a process 4500 for modifying the sound emitted by a speaker in accordance with an embodiment of the present invention may be provided.

The process 4500 starts at step 4502. At step 4504, one or more microphones and one or more speakers in a space may be provided. The one or more microphones may be configured to sense sound originating from at least a first location in the space. One or more speakers may be configured to emit sound sensed by the microphone. At step 4508, the multi-dimensional sound signature for the first location within the space may be determined. At step 4510, the multi-dimensional sound signature for a second location within the space may be determined. In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, and the like. In embodiments, the space may be a performance space, a substantially anechoic room, practice room, rehearsal location, a recording studio, a virtual reality environment, a simulation environment, a computer gaming environment, a sound recording studio, a sound recording studio that may include a sound mixing facility and/or a sound recording facility, and the like. In embodiments, the space may include a stage.

In embodiments, one or more speakers may be a monitor; the monitor may be located on a stage, a headphone, a surround sound system, a subwoofer, an array of speakers arranged to produce multi-dimensional sound in the space, and the like. In embodiments, one or more microphones may include a direct input such as for a musical instrument and the like.

At step 4512, the multi-dimensional sound signature for the first and second locations may be compared. In embodiments, the sound emitted by the speaker may be modified such that the multi-dimensional sound signature for the first location may be modified to increase its similarity with the multi-dimensional sound signature for the second location. In embodiments, the first location may be that of a performer. In embodiments, the first location may be on a stage located in the space. In embodiments, the second location may be that of an audience member. In embodiments, the second location may be in an auditorium of the space. At step 4514, the sound emitted by the speaker may be modified such that the multi-dimensional sound signature for the first location may be changed to increase its similarity with the multi-dimensional sound signature for the second location. In embodiments, the modification may be performed with a computer processor, a mixing facility, a sound recording and playback facility, a sound processing facility where the sound processing facility may include a plurality of channels configured to adjust timing of sounds played from specified locations in the space.

The process 4500 may end at step 4518.

Figure 46:
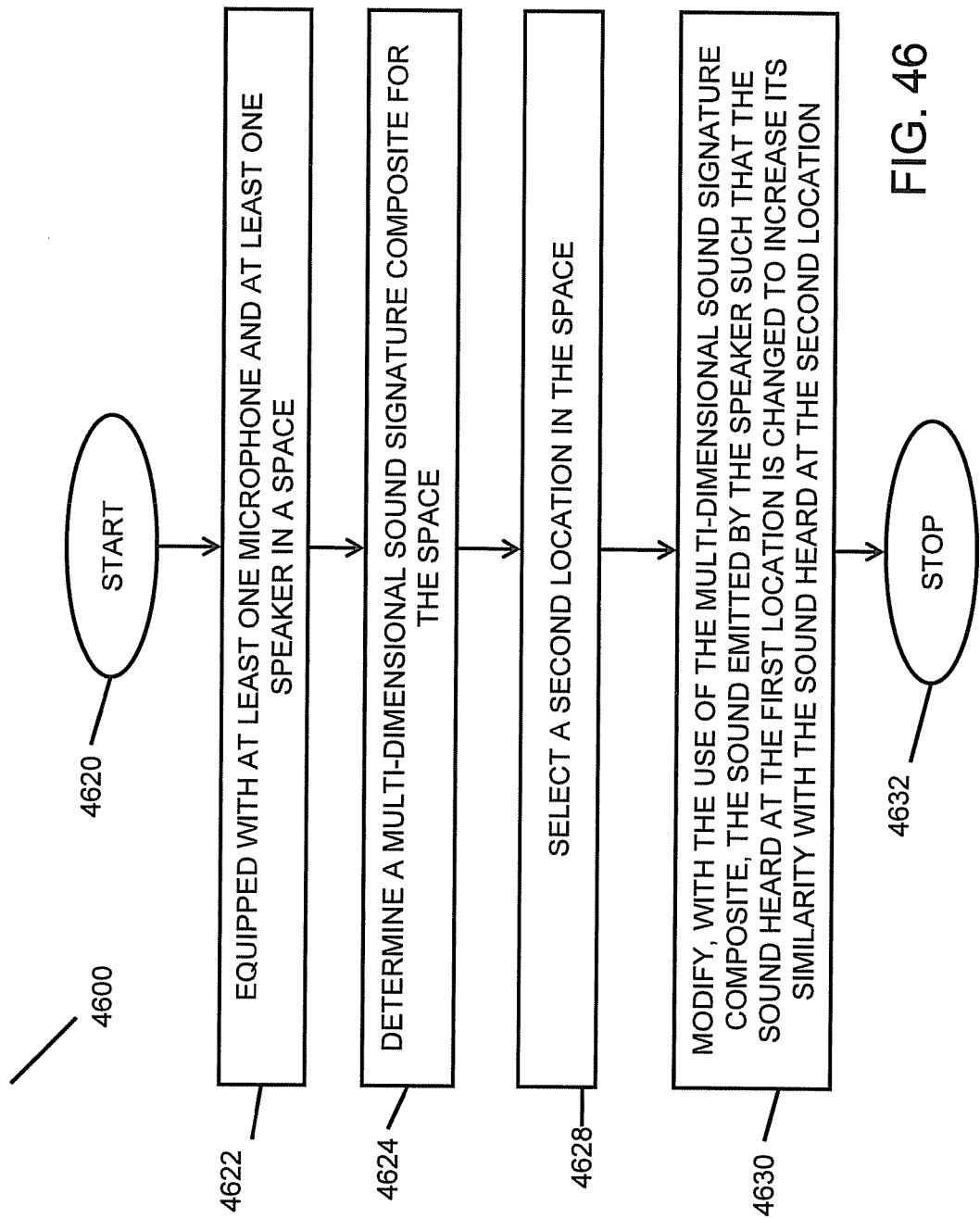
FIG. 46 depicts a flow process diagram in an embodiment of the present invention.

In embodiments, referring to FIG. 46, methods and systems for modifying the sound emitted by a speaker with the use of the multi-dimensional sound signature composite may be provided. As shown in FIG. 46, a process 4600 for the sound emitted by a speaker with the use of the multi-dimensional sound signature composite in accordance with various embodiments of the present invention may be provided.

The process 4600 starts at step 4620. At step 4622, one or more microphones and one or more speakers in a space may be provided. The one or more microphones may be configured to sense sound originating from at least a first location in the space. One or more speakers may be configured to emit sound sensed by the microphone. At step 4624, a multi-dimensional sound signature composite may be determined for the space. In embodiments, the space may include a stage and an auditorium, a performance location and a performance observation location, a stage and the first and second location on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital, a recording studio, a virtual reality environment, a simulation environment, a computer gaming environment, a sound recording studio, a sound recording studio that may include a sound mixing facility and/or a sound recording facility, and the like. In embodiments, the space may be a performance space, a substantially anechoic room, practice room, rehearsal location, and the like. In embodiments, the space may include a stage.

In embodiments, one or more speakers may be a monitor, a monitor located on a stage, a headphone, a surround sound system, a subwoofer, an array of speakers arranged to produce multi-dimensional sound in the space, and the like. In embodiments, one or more microphones may include a direct input such as for a musical instrument and the like.

At step 4628, a second location in the space may be selected. At step 4630, the sound emitted by the speaker may be modified with the use of the multi-dimensional sound signature composite such that the sound heard at the first location may be changed to increase its similarity with the sound heard at the second location. In embodiments, the first location may be that of a performer. In embodiments, the first location may be on a stage located in the space. In embodiments, the second location may be that of an audience member. In embodiments, the second location may be in an auditorium of the space. In embodiments, the modification may be performed with a computer processor, a mixing facility, a sound recording and playback facility, a sound processing facility where the sound processing facility may include a plurality of channels configured to adjust timing of sounds played from specified locations in the space.

The process 4600 may end at step 4632.

Figure 47:
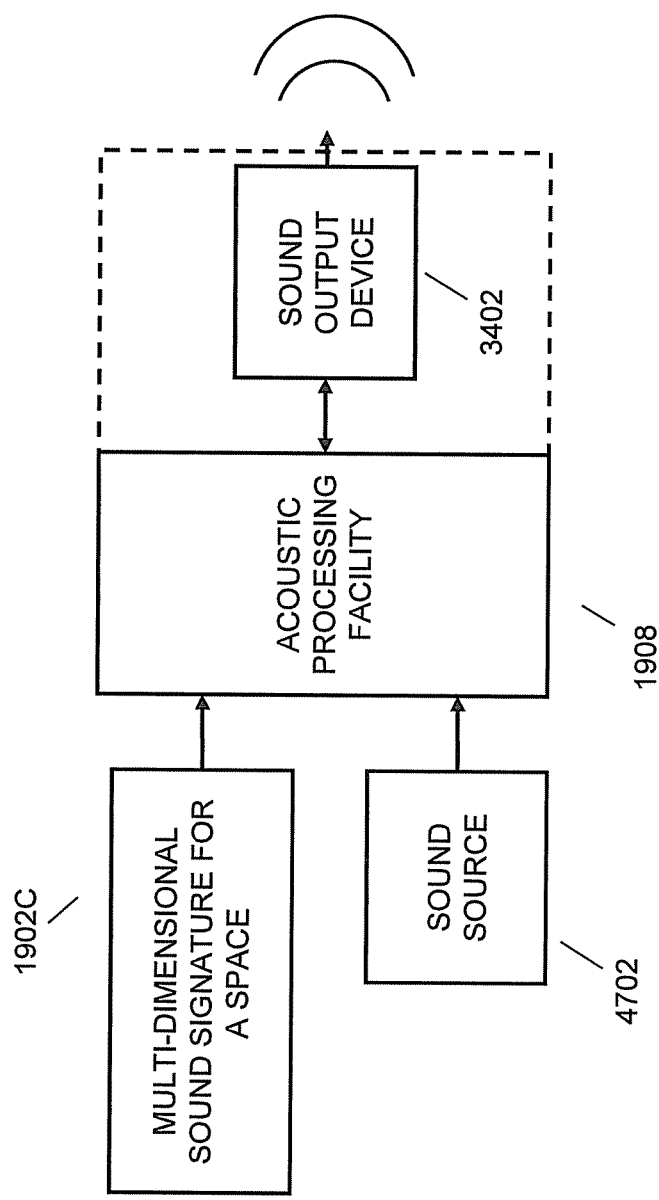
FIG. 47 depicts an embodiment block diagram of the present invention.

In embodiments, the present invention may provide for sound simulation using multi-dimensional sound signatures and multi-dimensional sound signature composites, where a known multi-dimensional sound signature may be recreated in a space using a sound output device (e.g. speakers, headphones) for sound not contemporaneously originating in the space. In embodiments, the recreated sound may be for any location in any other actual or hypothetical space. In addition, the sound recreated may be at a plurality of locations in the space matching locations of the known multi-dimensional sound signature composite. For instance, the space may be any space, including a movie theater, home theater, living room, sports venue, conference room, and the like, or any other space as described herein. In embodiments, the present invention may make use of a sound signature to time a series of sound waves in user headphones to simulate listening to media in a preferred environment, in a home entertainment speaker system, and the like. In embodiments, the present invention may make use of a multi-dimensional sound signature to configure a performance simulation environment to facilitate simulation of performance in a specific live venue. Referring to FIG. 47, a multi-dimensional sound signature 1902C for a space may be provided to an acoustic processing facility 1908 along with a sound source 4702, where the sound source may be live, recorded, stored, and the like. The acoustic processing facility 1908 may then modify the sound source input to match the multi-dimensional sound signature for the space, and output the result to a sound output device 3402 (e.g. speaker(s), headphones). In embodiments, the acoustic processing facility 1908 may include any of the acoustical equipment described herein to perform the comparison, manipulation, and the like, between the multi-dimensional sound signature of the space and the sound source. In addition, and as indicted in FIG. 47, the components and functions of the acoustic processing facility 1908 may be included in the sound output device. For example, the present invention may be incorporated into a home theater system, where the sound source is the output from the home theater system that would normally go directly to the speakers. In this case however, the sound source is input to the acoustic processing facility 1908, and after being modified per the input multi-dimensional sound signature, is sent to the speaker system where the sound now emerges as per the multi-dimensional sound signature, such as for a selected music venue, sports venue, entertainment venue, and the like, or any other space as described herein.

Figure 48:
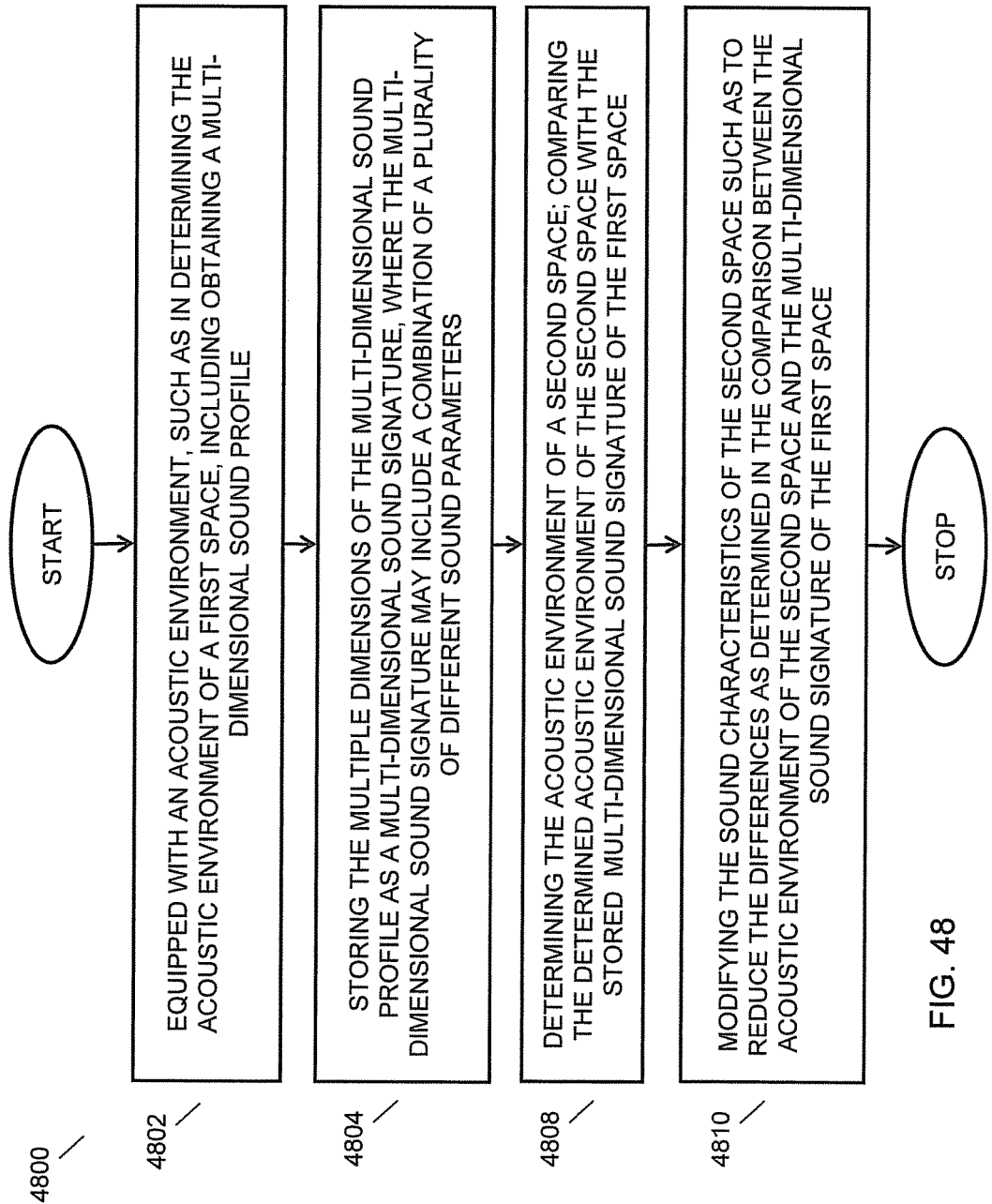
FIG. 48 depicts a flow process diagram in an embodiment of the present invention.

Referring to FIG. 48, in embodiments the present invention may provide an acoustic environment 4800, such as in determining the acoustic environment of a first space, including obtaining a multi-dimensional sound profile; storing the multiple dimensions of the multi-dimensional sound profile as a multi-dimensional sound signature, where the multi-dimensional sound signature may include a combination of a plurality of different sound parameters; determining the acoustic environment of a second space; comparing the determined acoustic environment of the second space with the stored multi-dimensional sound signature of the first space; and modifying the sound characteristics of the second space such as to reduce the differences as determined in the comparison between the acoustic environment of the second space and the multi-dimensional sound signature of the first space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 49:
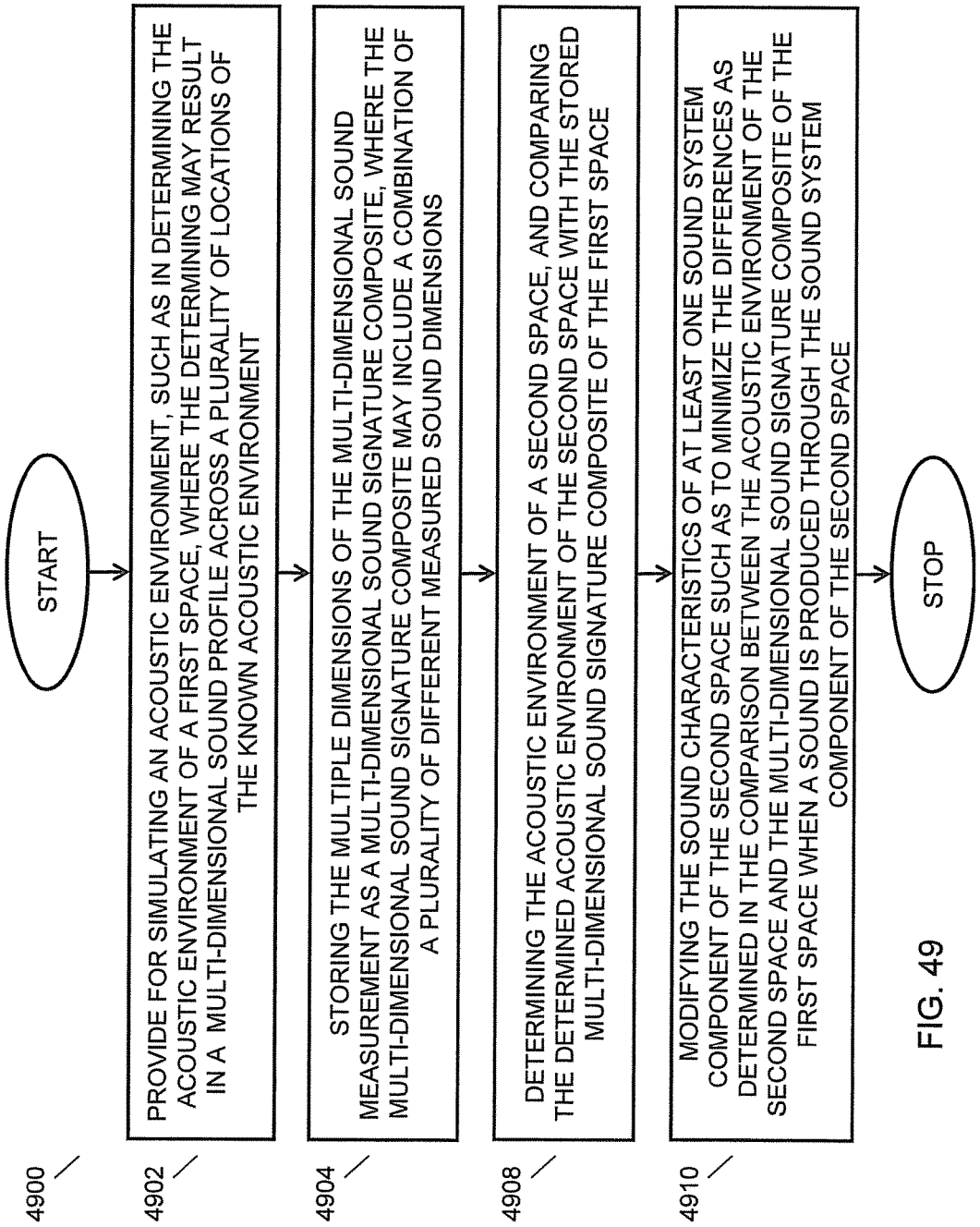
FIG. 49 depicts a flow process diagram in an embodiment of the present invention.

Referring to FIG. 49, in embodiments, the present invention may provide for simulating an acoustic environment 4900, such as in determining the acoustic environment of a first space, where the determining may result in a multi-dimensional sound profile across a plurality of locations of the known acoustic environment; storing the multiple dimensions of the multi-dimensional sound measurement as a multi-dimensional sound signature composite, where the multi-dimensional sound signature composite may include a combination of a plurality of different measured sound dimensions; determining the acoustic environment of a second space, and comparing the determined acoustic environment of the second space with the stored multi-dimensional sound signature composite of the first space; and modifying the sound characteristics of at least one sound system component of the second space such as to minimize the differences as determined in the comparison between the acoustic environment of the second space and the multi-dimensional sound signature composite of the first space when a sound is produced through the sound system component of the second space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 50:
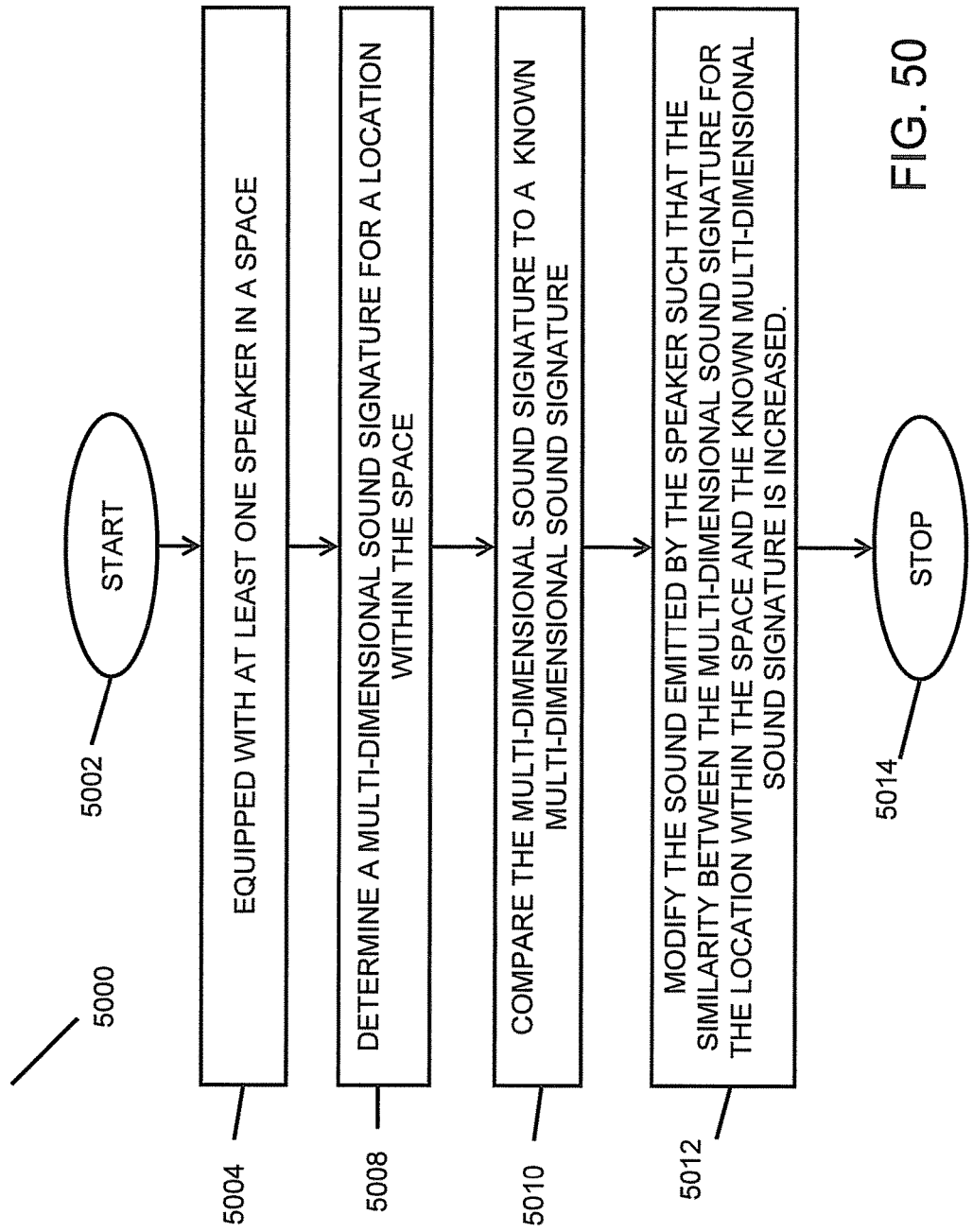
FIG. 50 depicts a flow process diagram in an embodiment of the present invention.

In embodiments, referring to FIG. 50, methods and systems for modifying the sound emitted by a speaker may be provided. As shown in FIG. 50, a process 5000 for modifying the sound emitted by the speaker in accordance with another embodiment of the present invention may be provided.

The process 5000 starts at step 5002. At step 5004, one or more speakers in a space may be provided. At step 5008, a multi-dimensional sound signature for a location within the space may be determined.

In embodiments, the space may be a movie theater, an IMAX theater, a living room, a media room, a recording studio, a virtual reality environment, simulation environment, computer gaming environment, a sound recording studio, a sound recording studio that may include a sound mixing facility and/or a sound recording facility, a home media room, a conference room, a museum, a gallery, an arena, a restaurant, a sports venue, a vehicle interior, a substantially anechoic room, an anechoic room, a practice room, a rehearsal location, and the like.

In embodiments, the one or more speakers may be headphones, a surround sound system, an array of speakers arranged to produce multi-dimensional sound in the space, a monitor, a monitor located on stage, and the like. In embodiments, the one or more speakers may include a subwoofer.

At step 5010, the multi-dimensional sound signature may be compared to a known multi-dimensional sound signature. At step 5012, the sound emitted by the speaker may be modified such that the similarity between the multi-dimensional sound signature for the location within the space and the known multi-dimensional sound signature may be increased. In embodiments, the modification may create the effect that a listener may be at the location of the known multi-dimensional sound signature. In embodiments, the modification may create the effect that a listener may be at the location of the known multi-dimensional sound signature selected by the listener. The location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that is selected by the user. The location may be a seat in the space, a stage located in the space, and the like. In embodiments, the modification may be performed with a computer processor. In embodiments, the known multi-dimensional sound signature may be for a location in an actual space, a hypothetical space, an audience area of a space, a stage area of a space, and the like.

In embodiments, the known multi-dimensional sound signature composite may be for an actual space, a hypothetical space, and the like. In embodiments, the known multi-dimensional sound signature composite may result from manipulation of one or more other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

The process 5000 may end at step 5014.

Figure 51:
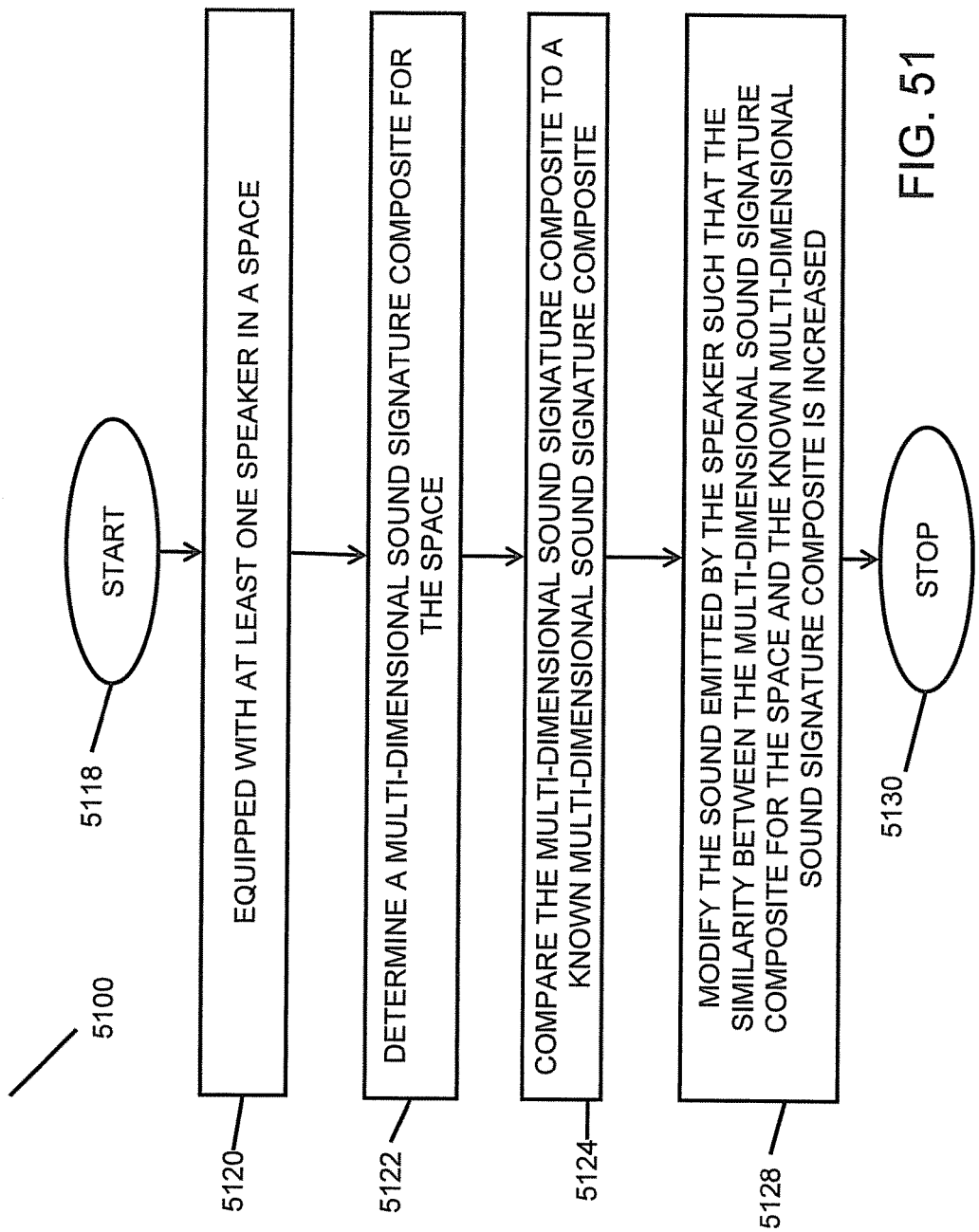
FIG. 51 depicts a flow process diagram in an embodiment of the present invention.

In embodiments, referring to FIG. 51, methods and systems for modifying the sound emitted by a speaker may be provided. As shown in FIG. 51, a process 5100 for modifying the sound emitted by the speaker in accordance with yet another embodiment of the present invention may be provided.

The process 5100 starts at step 5118. At step 5120, one or more speakers may be provided in a space. At step 5122, a multi-dimensional sound signature composite for the space may be determined. In embodiments, the space may be a movie theater, an IMAX theater, a recording studio, a virtual reality environment, simulation environment, computer gaming environment, a sound recording studio, a sound recording studio that may include a sound mixing facility and/or a sound recording facility, a living room, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the one or more speakers may be headphones, a surround sound system, an array of speakers arranged to produce multi-dimensional sound in the space, a monitor, a monitor located on stage, and the like. In embodiments, the one or more speakers may include a subwoofer.

At step 5124, the multi-dimensional sound signature composite may be compared to a known multi-dimensional sound signature composite. At step 5128, the sound emitted by the speaker may be modified such that the similarity between the multi-dimensional sound signature composite for the space and the known multi-dimensional sound signature composite may be increased. In embodiments, the modification may create the effect that a listener is at the location of the known multi-dimensional sound signature. In embodiments, the modification may create the effect that a listener may be at the location of the known multi-dimensional sound signature selected by the listener. The location may be a seat in the space, a stage located in the space, and the like. In embodiments, the modification may be performed with a computer processor.

In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that is selected by the user. The location may be a seat in the space, a stage located in the space, and the like. In embodiments, the modification may be performed with a computer processor. In embodiments, the known multi-dimensional sound signature may be for a location in an actual space, a hypothetical space, an audience area of a space, a stage area of a space, and the like.

In embodiments, the known multi-dimensional sound signature composite may be for an actual space, a hypothetical space, and the like. In embodiments, the known multi-dimensional sound signature composite may result from manipulation of one or more other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

The process 5100 may end at step 5130.

Figure 52:
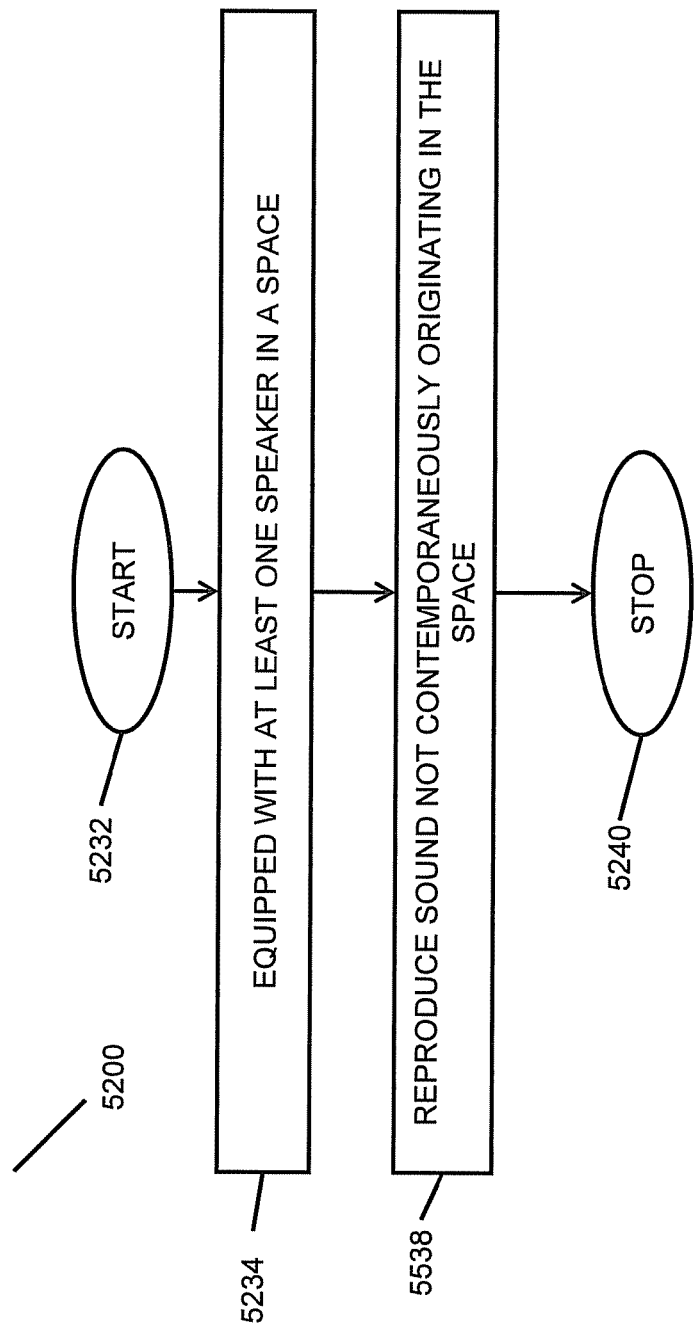
FIG. 52 depicts a flow process diagram in an embodiment of the present invention.

In embodiments, referring to FIG. 52, methods and systems for reproducing sound may be provided. As shown in FIG. 52, a process 5200 for reproducing sound in accordance with an embodiment of the present invention may be provided.

The process 5200 starts at step 5232. At step 5234, one or more speakers may be provided in a space. In embodiments, the space may be a movie theater, an IMAX theater, a living room, a recording studio, a virtual reality environment, simulation environment, computer gaming environment, a sound recording studio, a sound recording studio that may include a sound mixing facility and/or a sound recording facility, a media room, a home media room, a conference room, a museum, a gallery, an arena, a restaurant, a sports venue, a vehicle interior, a substantially anechoic room, an anechoic room, a practice room, a rehearsal location, and the like.

In embodiments, the one or more speakers may be headphones, a surround sound system, an array of speakers arranged to produce multi-dimensional sound in the space, a monitor, a monitor located on stage, and the like. In embodiments, the one or more speakers may include a subwoofer.

At step 5238, sound not contemporaneously originating in the space may be reproduced in accordance with a known multi-sound signature composite. Such reproduction may apply the known multi-dimensional sound signature composite to the reproduced sound. In embodiments, such reproduction may create the effect that a listener is at the location of the known multi-dimensional sound signature and the listener generates, at least in part, the sound contemporaneously originating in the space, such that the reproduced version of the sound generated by the listener may be more similar to sound generated at the location. In embodiments, the known multi-dimensional sound signature may be for a location in an actual space, a hypothetical space, an audience area of a space, a stage area of a space, and the like. In embodiments, applying the known multi-dimensional sound signature may include adjusting at least one of the timing and volume of sound emitted by a speaker at a specified location within the space. Timing of sounds emitted from speakers placed at rear and side locations in the space may be adjusted to increase similarity to timing of rear and side reflections specified in the multi-dimensional sound signature. Timing of sounds emitted from speakers placed at side locations may be adjusted to mimic primary and secondary side reflections specified in the multi-dimensional sound signature. Volume of sounds emitted from speakers placed at rear and side locations in the space is adjusted to increase similarity to amplitude of rear and side reflections specified in the multi-dimensional sound signature.

In embodiments, the known multi-dimensional sound signature composite may be for an actual space, a hypothetical space, and the like. In embodiments, the known multi-dimensional sound signature composite may result from manipulation of one or more other multi-dimensional sound signature composite. In embodiments, the known multi-dimensional sound signature composite may be an idealized multi-dimensional sound signature composite. In embodiments, the known multi-dimensional sound signature composite may be a multi-dimensional sound signature composite for a hypothetical space. In embodiments, the known multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

The process 5200 may end at step 5240.

Figure 53:
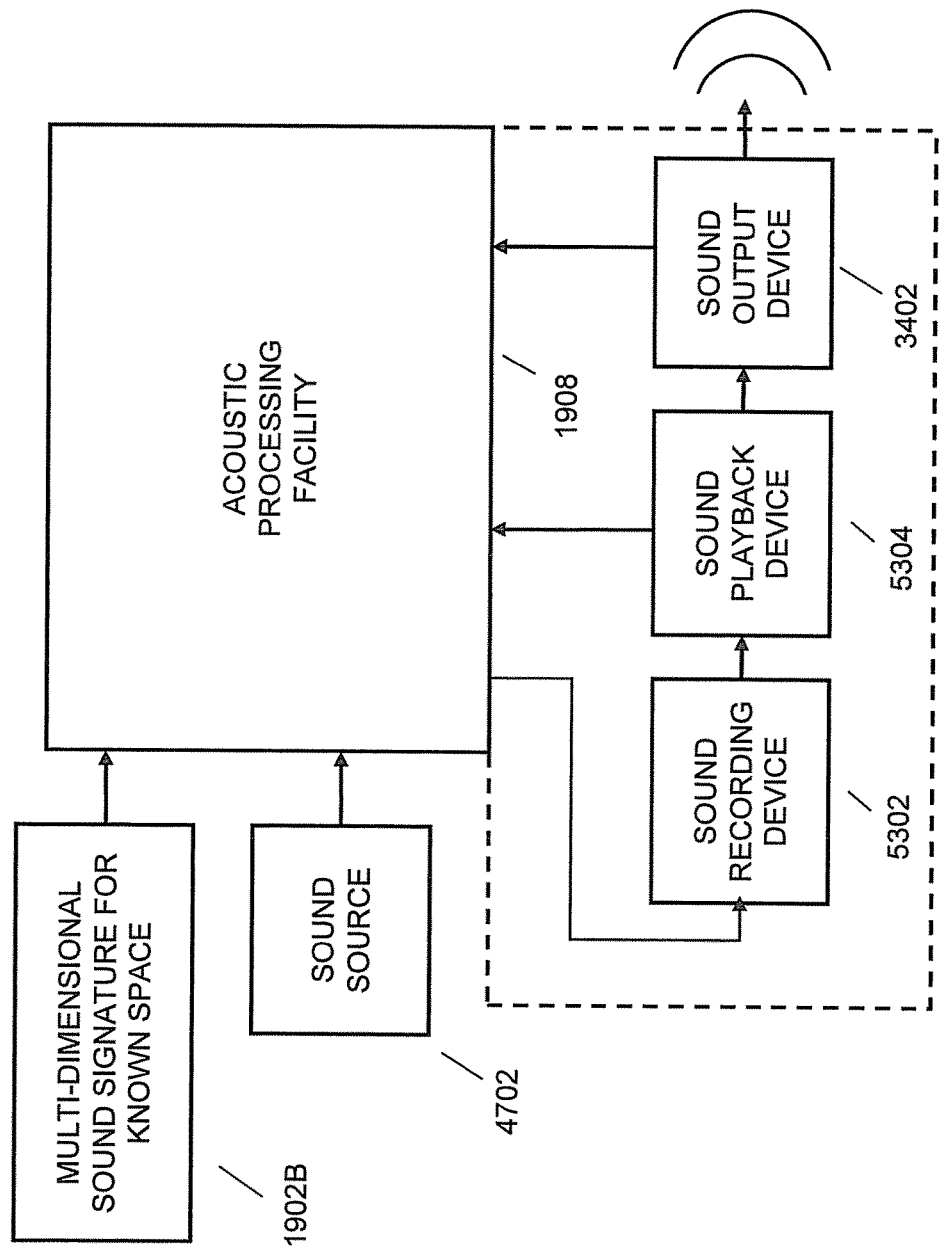
FIG. 53 depicts an embodiment block diagram of the present invention.

In embodiments, the present invention may provide sound simulation using multi-dimensional sound signatures and multi-dimensional sound signature composites determined based on media content, where a known multi-dimensional sound signature or a known multi-dimensional sound signature composite may be recreated in a space using a sound output device (e.g. speakers, headphones) for sound not contemporaneously originating in the space. The space could be any space, including a movie theater, living room, sports venue, conference room and the like. In embodiments, the known multi-dimensional sound signature or a known multi-dimensional sound signature composite may be tied to certain content. For example, the content could be a movie and the known multi-dimensional sound signature or a known multi-dimensional sound signature composite may be that of the location/space being shown in the movie. In embodiments, the present invention may make use of a multi-dimensional sound signature to configure a media track to facilitate approximation of a preferred sound signature environment. Referring to FIG. 53 a multi-dimensional sound signature 1902B for a space may be provided to an acoustic processing facility 1908 along with a sound source 4702, where the sound source may be live, recorded, stored, and the like. The acoustic processing facility 1908 may then modify the sound source input to match the multi-dimensional sound signature 1902B for the space, and output the result to a sound recording device 5302, where the sound recording device may utilize any recording media known to the art. The media recording may then be played back through a sound playback device 5304 and output to the sound output device 3402. In embodiments, the acoustic processing facility 1908 may include any of the acoustical equipment described herein to perform the comparison, manipulation, and the like, between the multi-dimensional sound signature of the known space and the sound source. In addition, and as indicted in FIG. 53, the components and functions of the acoustic processing facility 1908 may be included in the sound recording device, sound playback device, and sound output device.

For example, the movie industry may utilize the present invention to create media recordings that simulate an acoustic environment by measuring the environment's multi-dimensional sound signature. For instance, a director of a movie may shoot a scene on a sound stage but wish to have the sound track play as if it were recorded, and then played back, as if from the true location. In this instance, the director may choose to have the true location's multi-dimensional sound signature measured, and use that multi-dimensional sound signature to create a sound track with the true acoustic characteristics. In embodiments, the present invention may utilize this way of creating recordings to simulate the acoustic character of any space, as described herein. In another example embodiment, the present invention may be implemented through the use of markers or locations on audio and/or video media, such as for TV, audio recordings, movies, and the like, where the markers indicate an acoustic environment that may then be matched with a multi-dimensional sound signature or multi-dimensional sound signature composite. For example, a TV program may come to point where the scene moves into say a cave or an auditorium, where the acoustics are to match the physical environment. In this instance the sound may then be matched to the appropriate multi-dimensional sound signature or multi-dimensional sound signature composite. In embodiments, the marker may located on the media, and the multi-dimensional sound signature or multi-dimensional sound signature composite may be at any of a plurality of locations accessible by the sound system associated with the media playback, such as being directly stored locally, downloaded ahead of time, downloaded as required, accessed from a library, stored on the media, and the like.

Figure 54:
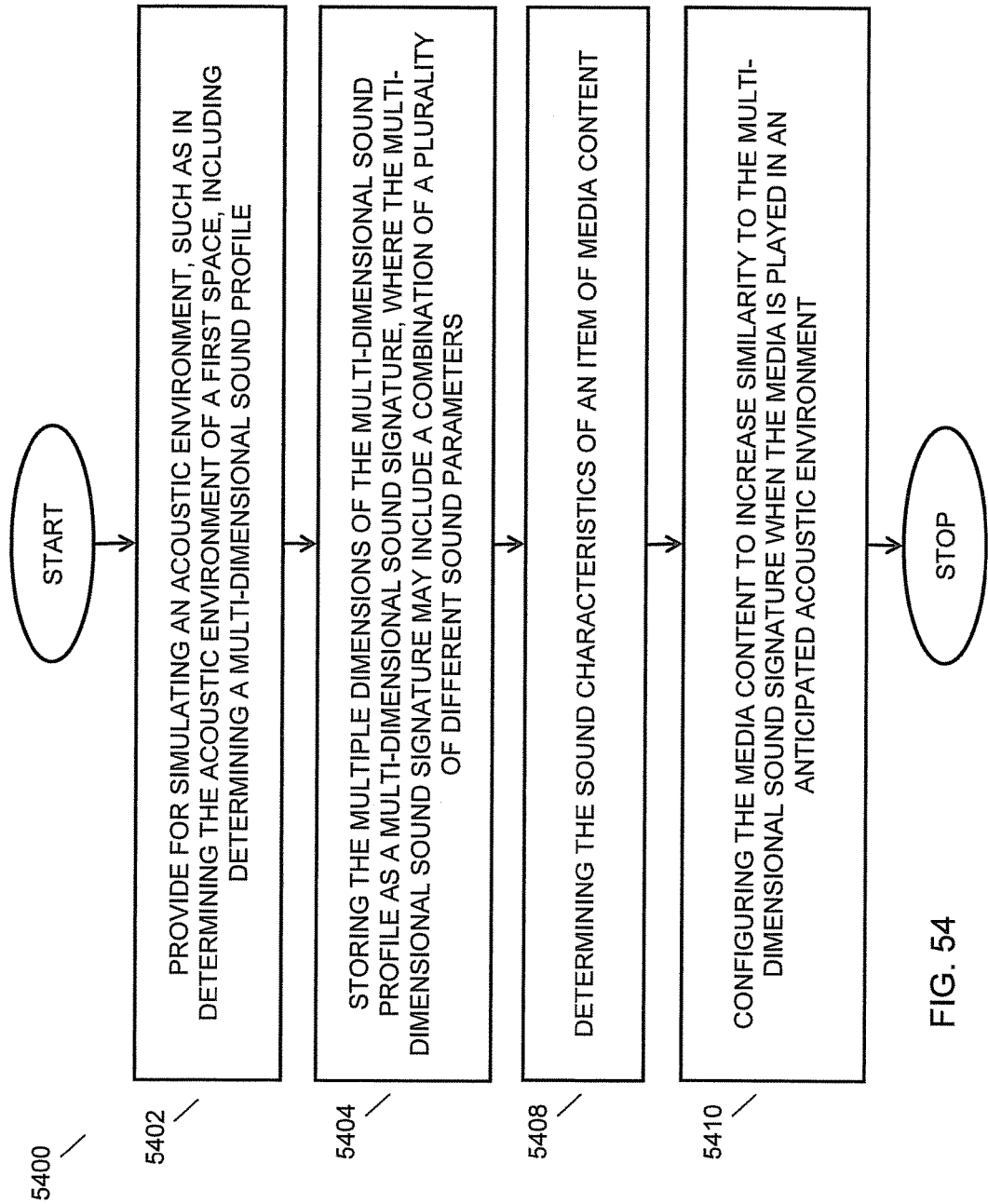
FIG. 54 depicts a flow process diagram in an embodiment of the present invention.

Referring to FIG. 54, in embodiments the present invention may provide for simulating an acoustic environment 5400, such as in determining the acoustic environment of a first space, including determining a multi-dimensional sound profile; storing the multiple dimensions of the multi-dimensional sound profile as a multi-dimensional sound signature, where the multi-dimensional sound signature may include a combination of a plurality of different sound parameters; determining the sound characteristics of an item of media content; and configuring the media content to increase similarity to the multi-dimensional sound signature when the media is played in an anticipated acoustic environment. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 55:
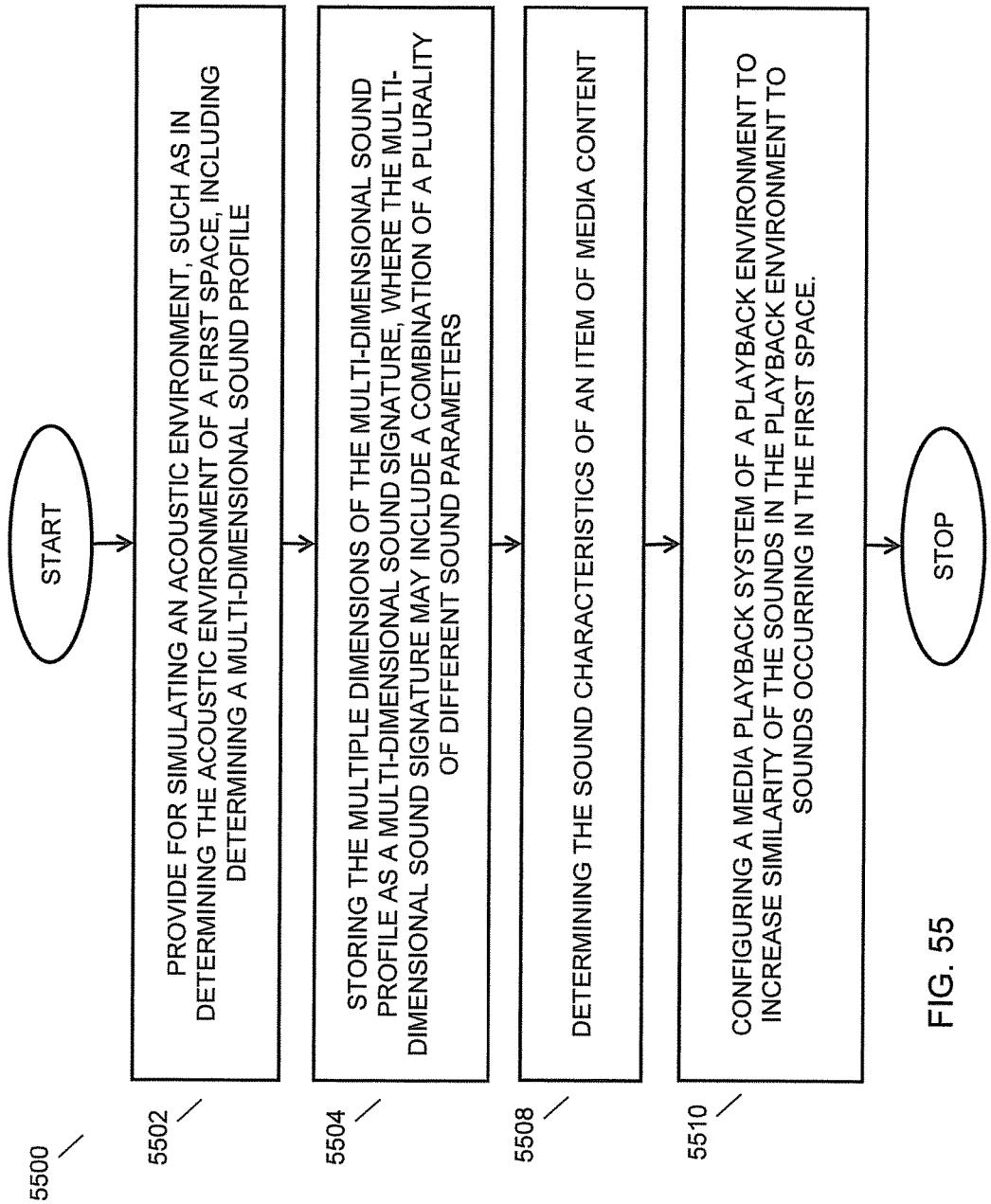
FIG. 55 depicts a flow process diagram in an embodiment of the present invention.

Referring to FIG. 55, in embodiments the present invention may provide for simulating an acoustic environment 5500, such as in determining the acoustic environment of a first space, including determining a multi-dimensional sound profile; storing the multiple dimensions of the multi-dimensional sound profile as a multi-dimensional sound signature, where the multi-dimensional sound signature may include a combination of a plurality of different sound parameters; determining the sound characteristics of an item of media content; and configuring a media playback system of a playback environment to increase similarity of the sounds in the playback environment to sounds occurring in the first space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 56:
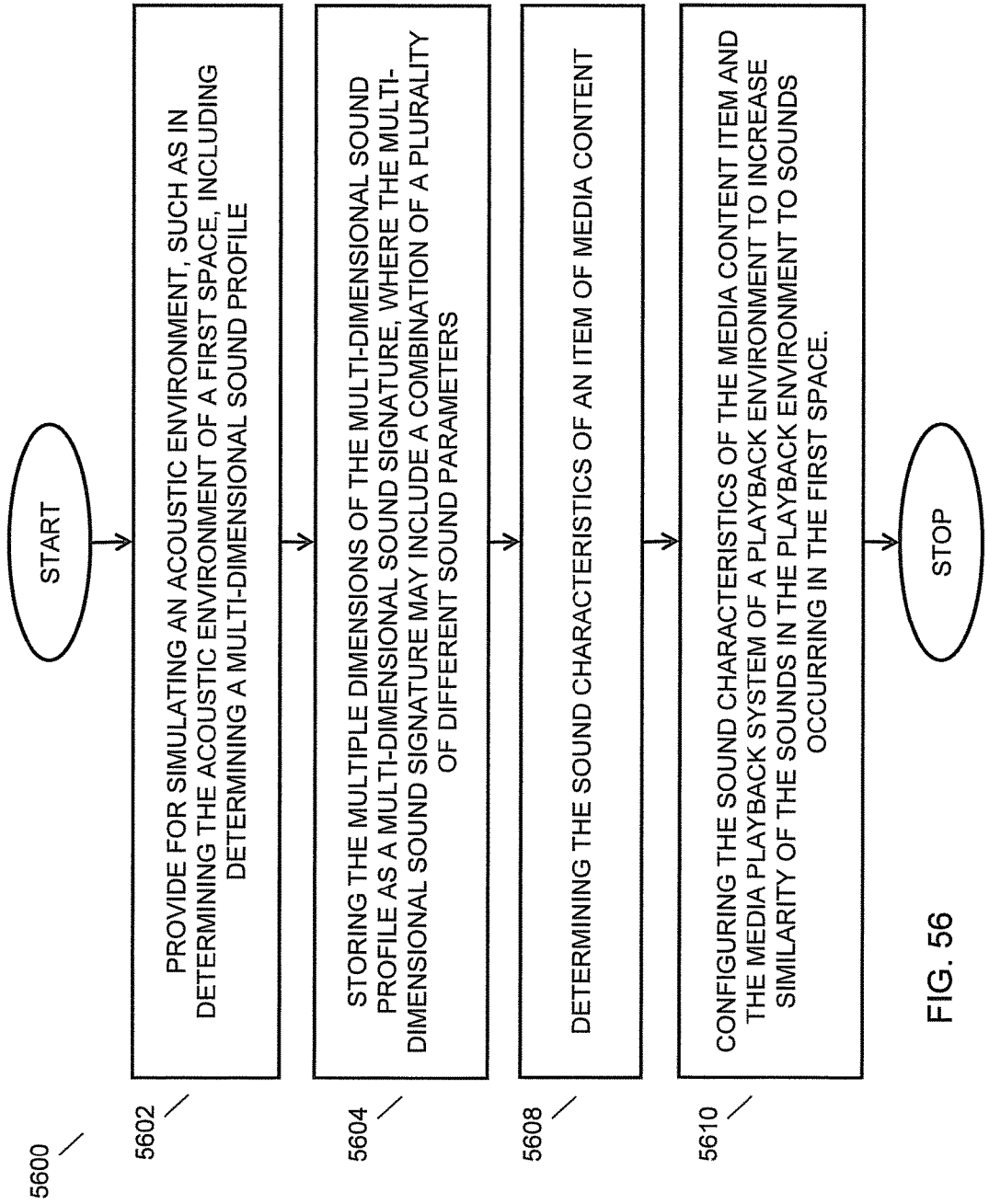
FIG. 56 depicts a flow process diagram in an embodiment of the present invention.

Referring to FIG. 56, in embodiments the present invention may provide for simulating an acoustic environment 5600, such as in determining the acoustic environment of a first space, including determining a multi-dimensional sound profile; storing the multiple dimensions of the multi-dimensional sound profile as a multi-dimensional sound signature, where the multi-dimensional sound signature may include a combination of a plurality of different sound parameters; determining the sound characteristics of an item of media content; and configuring the sound characteristics of the media content item and the media playback system of a playback environment to increase similarity of the sounds in the playback environment to sounds occurring in the first space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 57:
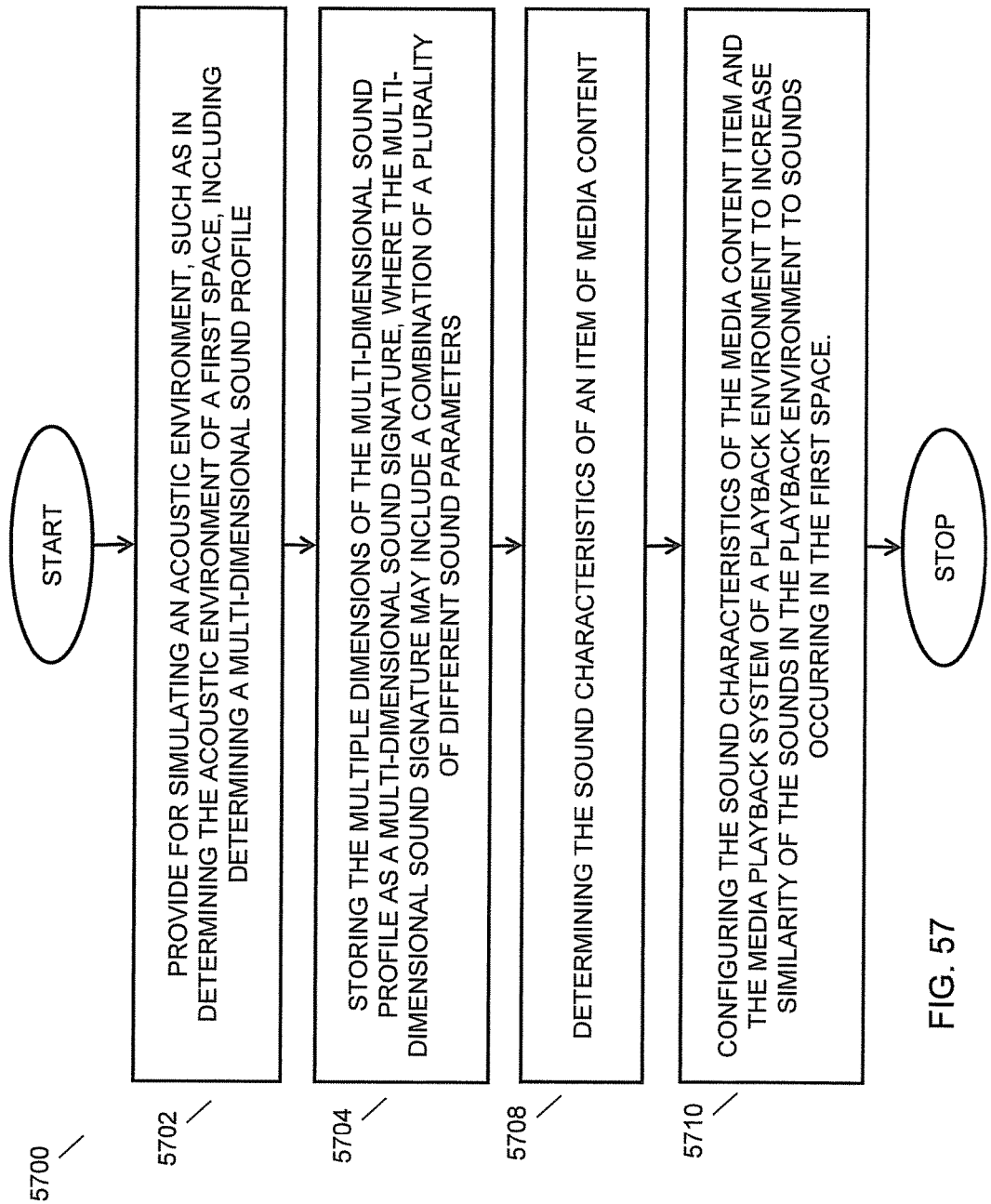
FIG. 57 depicts a flow process diagram in an embodiment of the present invention.

Referring to FIG. 57, in embodiments the present invention may provide for simulating an acoustic environment 5700, such as in determining the acoustic characteristics of a first space, where the determining may result in a multi-dimensional sound profile across a plurality of locations of the known acoustic environment; storing a multi-dimensional sound signature composite, where the multi-dimensional sound signature composite may include a combination of a plurality of different sound dimensions selected from the group consisting of timing, direction, amplitude and frequency of sound reflections of the known acoustic environment; determining the sound characteristics of an item of media content; and configuring the media content to increase similarity to the multi-dimensional sound signature when the media is played in an anticipated acoustic environment. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 58:
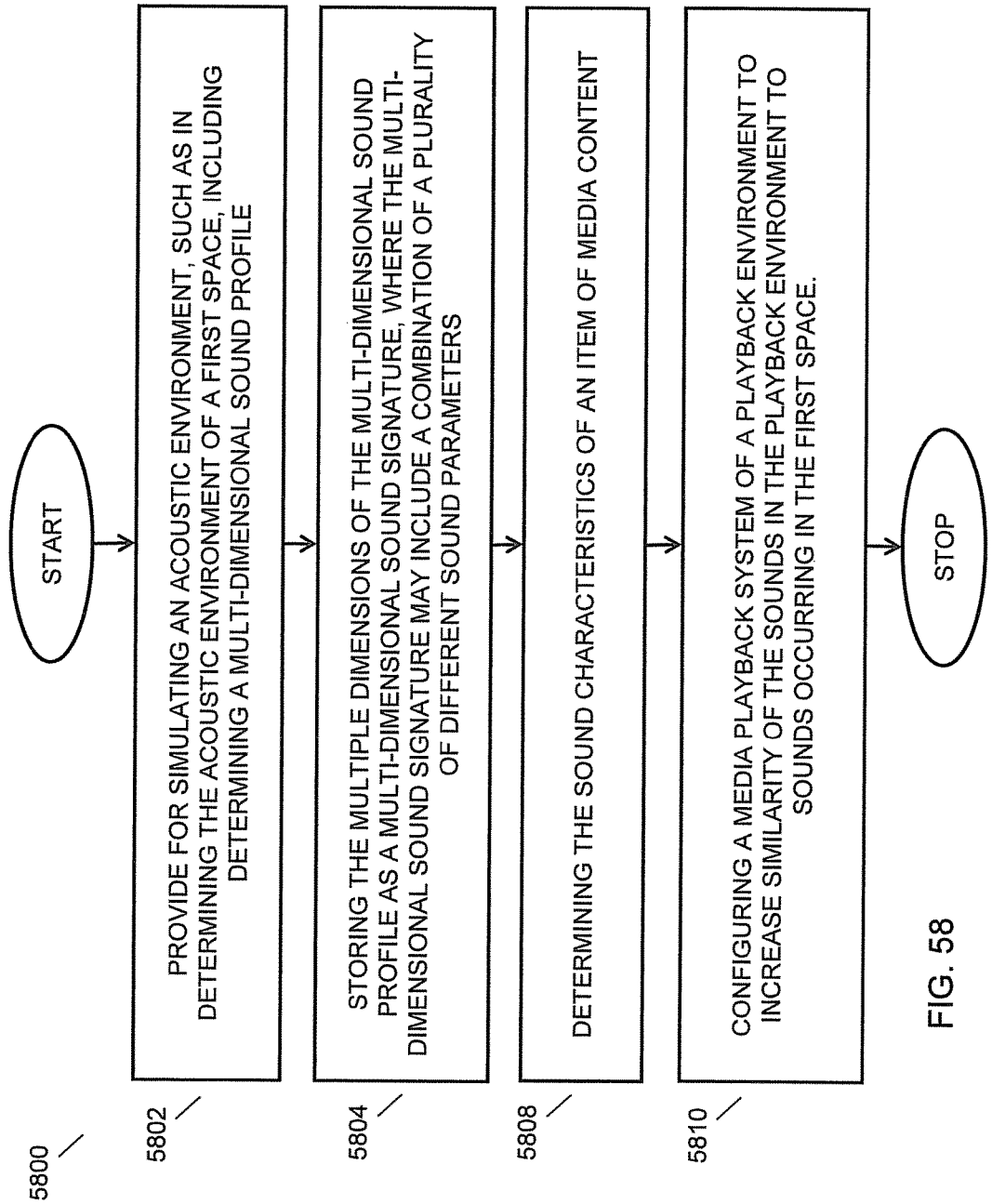
FIG. 58 depicts a flow process diagram in an embodiment of the present invention.

Referring to FIG. 58, in embodiments the present invention may provide for simulating an acoustic environment 5800, such as in determining the acoustic characteristics of a first space, where the determining may result in a multi-dimensional sound profile across a plurality of locations of the known acoustic environment; storing a multi-dimensional sound signature composite, where the multi-dimensional sound signature composite may include a combination of a plurality of different sound dimensions selected from the group consisting of timing, direction, amplitude and frequency of sound reflections of the known acoustic environment; determining the sound characteristics of an item of media content; and configuring a media playback system of a playback environment to increase similarity of the sounds in the playback environment to sounds occurring in the first space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 59:
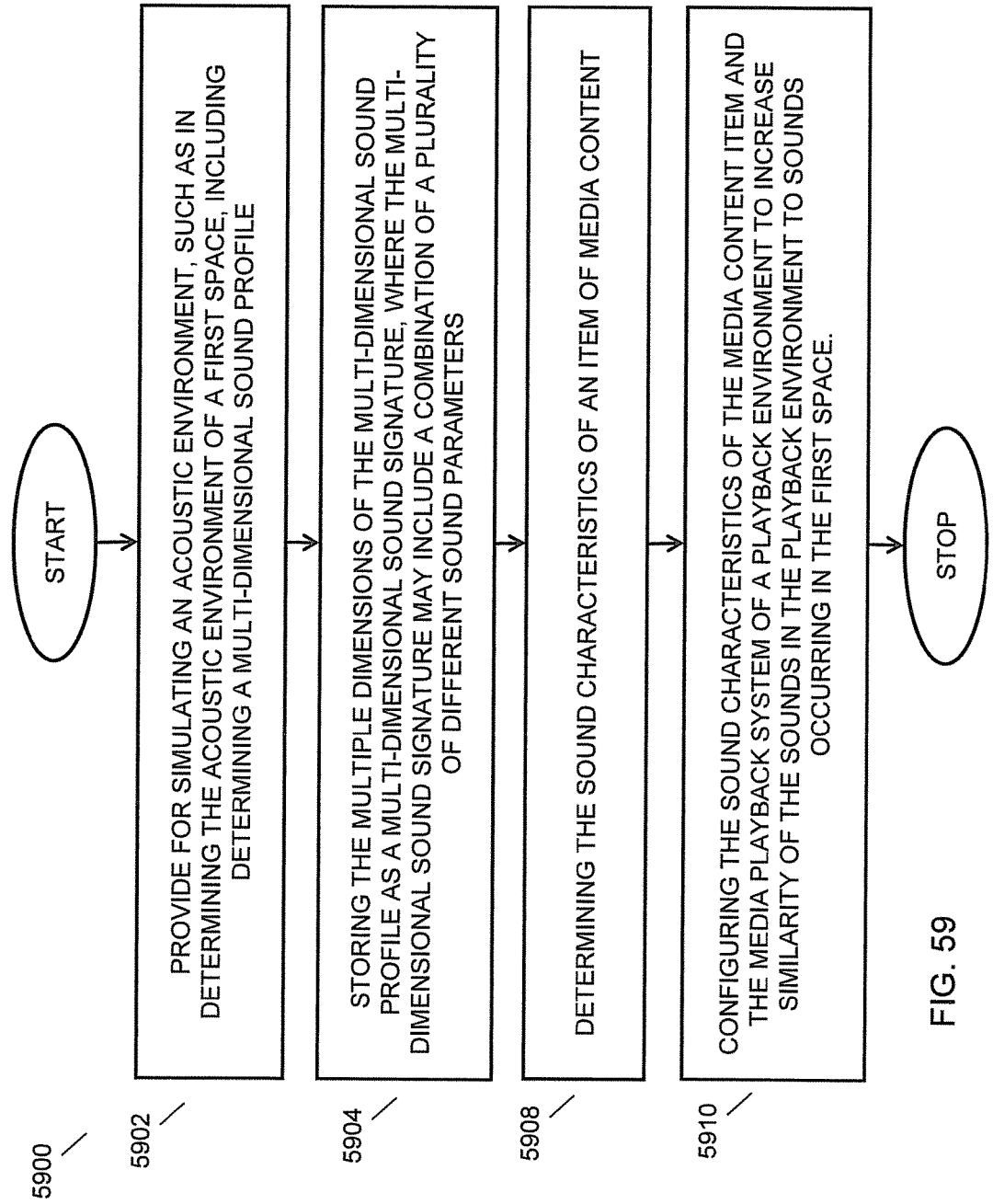
FIG. 59 depicts a flow process diagram in an embodiment of the present invention.

Referring to FIG. 59, in embodiments the present invention may provide for simulating an acoustic environment 5900, such as in determining the acoustic characteristics of a first space, where the determining may result in a multi-dimensional sound profile across a plurality of locations of the known acoustic environment; storing a multi-dimensional sound signature composite, where the multi-dimensional sound signature composite may include a combination of a plurality of different sound dimensions selected from the group consisting of timing, direction, amplitude and frequency of sound reflections of the known acoustic environment; determining the sound characteristics of an item of media content; and configuring the sound characteristics of the media content item and the media playback system of a playback environment to increase similarity of the sounds in the playback environment to sounds occurring in the first space. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 60:
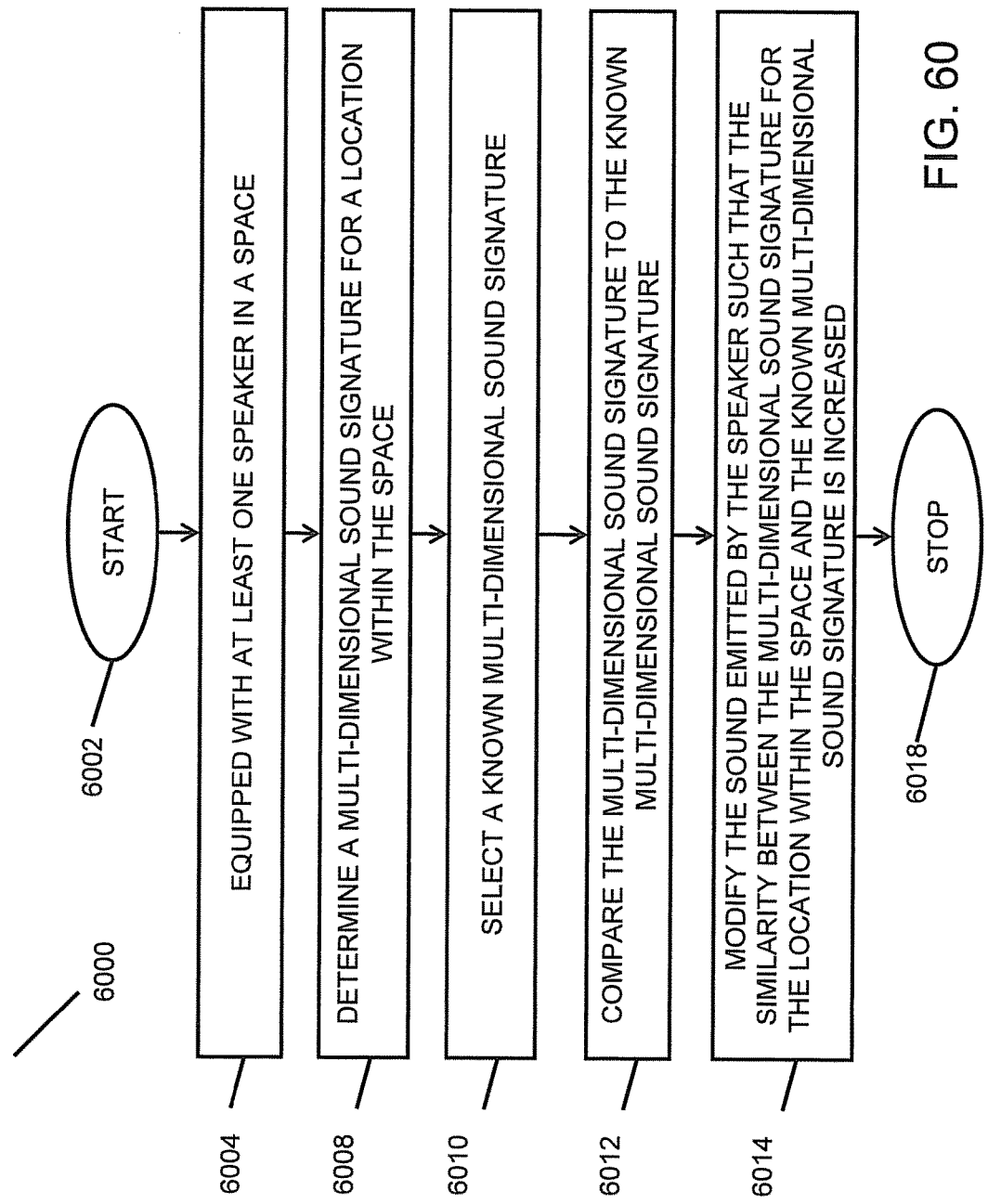
FIG. 60 depicts a flow process diagram in an embodiment of the present invention.

In embodiments, referring to FIG. 60, methods and systems for modifying the sound emitted by a speaker may be provided. As shown in FIG. 60, a process 6000 for modifying the sound emitted by a speaker in accordance with an embodiment of the present invention may be provided.

The process 6000 starts at step 6002. At step 6004, one or more speakers in a space may be provided. The one or more speakers may be configured to emit one or more portions of the sound of an item of content. In embodiments, the one or more speakers may be headphones, a surround sound system, an array of speakers arranged to produce multi-dimensional sound in the space, a monitor, a monitor located on stage, and the like. In embodiments, the one or more speakers may include a subwoofer. In embodiments, the item of content may include sound, audio, audio and video, a movie, a film, a television, music, voice, a video game, and the like. In embodiments, the space may be a movie theater, an IMAX theater, a living room, a media room, a recording studio, a virtual reality environment, simulation environment, computer gaming environment, a sound recording studio, a sound recording studio that may include a sound mixing facility and/or a sound recording facility, a home media room, a conference room, a museum, a gallery, an arena, a restaurant, a sports venue, a vehicle interior, a substantially anechoic room, an anechoic room, a practice room, a rehearsal location, and the like.

At step 6008, a multi-dimensional sound signature for a location within the space may be determined. At step 6010, a known multi-dimensional sound signature may be selected. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content.

At step 6012, the multi-dimensional sound signature may be compared with the known multi-dimensional sound signature. In embodiments, the identity of the known multi-dimensional sound signature may be provided with the content. In embodiments, the identity of the known multi-dimensional sound signature may be provided with the content, but the actual known multi-dimensional sound signature may not be provided with the content.

In embodiments, the content may contain audio and video information. In embodiments, the known multi-dimensional sound signature may be selected based on the video information. In embodiments, the known multi-dimensional sound signature may be selected by a processor based on the video information. In embodiments, the known multi-dimensional sound signature may be selected by a processor based on a determination of the location shown in the video information.

In embodiments, the known multi-dimensional sound signature is for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on the location information provided with the content. In embodiments, the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information. The known multi-dimensional sound signature composite may be selected based on the video information. The content may contain audio and video information, and the known multi-dimensional sound signature composite may be selected by a processor based on the video information. In embodiments, the content may contain audio and video information, and the known multi-dimensional sound signature composite may be selected by a processor based on a determination of the location shown in the video information.

At step 6014, the sound emitted by the speaker may be modified such that the similarity between the multi-dimensional sound signature for the location within the space and the known multi-dimensional sound signature may be increased. In embodiments, the modification may create the effect that a listener may be at the location of the known multi-dimensional sound signature. In embodiments, the modification may create the effect that a listener may be at the location of the known multi-dimensional sound signature selected by the listener. In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite that may be selected by the user. In embodiments, the modification may be performed with a computer processor. In embodiments, the location may be a seat in the space, a stage located in the space, and the like.

The process 6000 may end at step 6018.

Figure 61:
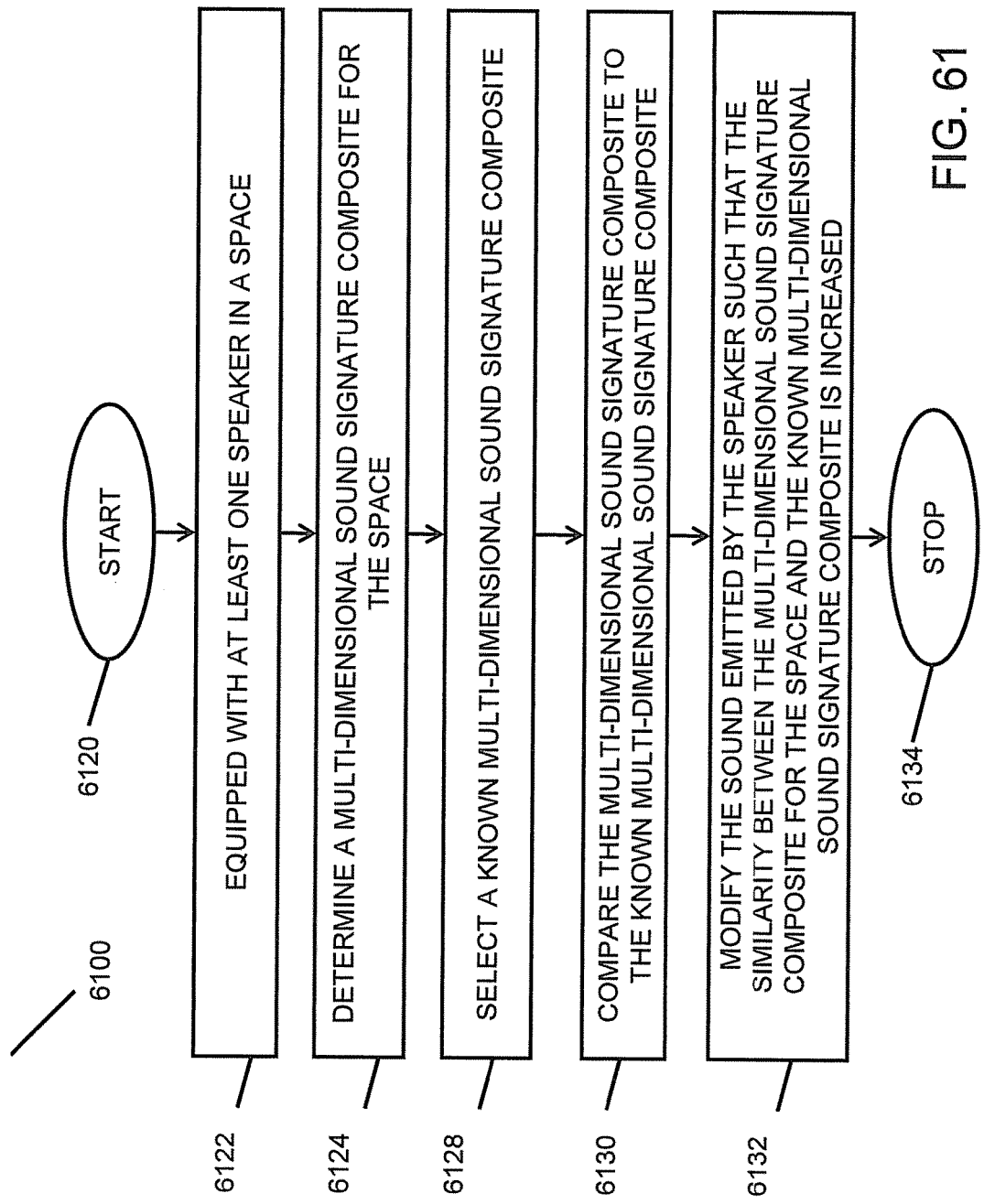
FIG. 61 depicts a flow process diagram in an embodiment of the present invention.

In embodiments, referring to FIG. 61, methods and systems for modifying the sound emitted by a speaker may be provided. As shown in FIG. 61, a process 6100 for modifying the sound emitted by a speaker in accordance with another embodiment of the present invention may be provided.

The process 6100 starts at step 6120. At step 6122, one or more speakers in a space may be provided. The one or more speakers may be configured to emit at least a portion of the sound of an item of content. In embodiments, the one or more speakers may be headphones, a surround sound system, an array of speakers arranged to produce multi-dimensional sound in the space, a monitor, a monitor located on stage, and the like. In embodiments, the one or more speakers may include a subwoofer. In embodiments, the item of content may include sound, audio, audio and video, a movie, a film, a television, music, voice, a video game, and the like. In embodiments, the space may be a movie theater, an IMAX theater, a living room, a media room, a home media room, a conference room, a museum, a gallery, an arena, a restaurant, a sports venue, a vehicle interior, a substantially anechoic room, an anechoic room, a practice room, a rehearsal location, and the like.

At step 6124, a multi-dimensional sound signature composite for the space may be determined. At step 6128, a known multi-dimensional sound signature composite may be selected. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on the location information provided with the content. In embodiments, the known multi-dimensional sound signature may be provided with the content.

At step 6130, the multi-dimensional sound signature composite may be compared with the known multi-dimensional sound signature composite. In embodiments, the identity of the known multi-dimensional sound signature may be provided with the content. In embodiments, the identity of the known multi-dimensional sound signature may be provided with the content, but the actual known multi-dimensional sound signature may not be provided with the content.

In embodiments, the content may contain audio and video information. In embodiments, the known multi-dimensional sound signature may be selected based on the video information. In embodiments, the known multi-dimensional sound signature may be selected by a processor based on the video information. In embodiments, the known multi-dimensional sound signature may be selected by a processor based on a determination of the location shown in the video information. In embodiments, the known multi-dimensional sound signature may be for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information. The known multi-dimensional sound signature composite may be selected based on the video information. The content may contain audio and video information, and the known multi-dimensional sound signature composite may be selected by a processor based on the video information. In embodiments, the content may contain audio and video information, and the known multi-dimensional sound signature composite may be selected by a processor based on a determination of the location shown in the video information.

At step 6132, the sound emitted by the speaker may be modified such that the similarity between the multi-dimensional sound signature composite for the space and the known multi-dimensional sound signature composite may be increased. In embodiments, the modification may create the effect that a listener may be at the location of the known multi-dimensional sound signature. In embodiments, the modification may create the effect that a listener may be at the location of the known multi-dimensional sound signature selected by the listener. In embodiments, the modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite selected by the user. In embodiments, the modification may be performed with a computer processor. In embodiments, the location may be a seat in the space, a stage located in the space, and the like.

The process 6100 may end at step 6134.

Figure 62:
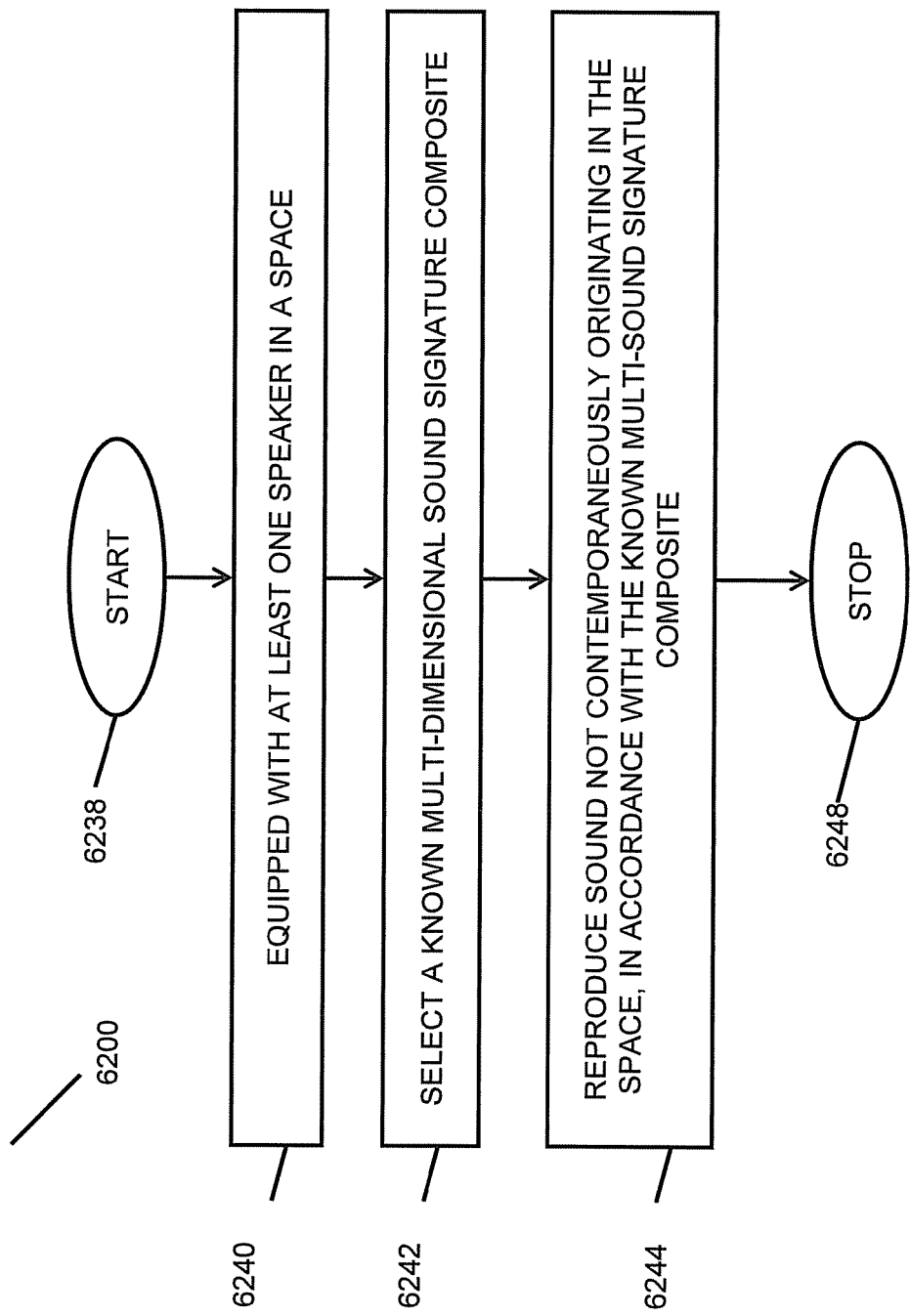
FIG. 62 depicts a flow process diagram in an embodiment of the present invention.

In embodiments, referring to FIG. 62, methods and systems for reproducing the sound may be provided. As shown in FIG. 62, a process 6200 for reproducing the sound in accordance with an embodiment of the present invention may be provided.

The process 6200 starts at step 6238. At step 6240, one or more speakers may be provided in a space. The one or more speakers may be configured to emit at least a portion of the sound of an item of content. In embodiments, the one or more speakers may be headphones, a surround sound system, an array of speakers arranged to produce multi-dimensional sound in the space, a monitor, a monitor located on stage, and the like. In embodiments, the one or more speakers may include a subwoofer. In embodiments, the item of content may include sound, audio, audio and video, a movie, a film, a television, music, voice, a video game, and the like. In embodiments, the space may be a movie theater, an IMAX theater, a living room, a media room, a recording studio, a virtual reality environment, simulation environment, computer gaming environment, a sound recording studio, a sound recording studio that may include a sound mixing facility and/or a sound recording facility, a home media room, a conference room, a museum, a gallery, an arena, a restaurant, a sports venue, a vehicle interior, a substantially anechoic room, an anechoic room, a practice room, a rehearsal location, and the like.

At step 6242, a known multi-dimensional sound signature composite may be selected. In embodiments, the known multi-dimensional sound signature may be selected based on the content. In embodiments, the known multi-dimensional sound signature may be selected automatically based on the content. In embodiments, the known multi-dimensional sound signature may be selected by a processor based on the content. In embodiments, the known multi-dimensional sound signature may be selected based on location information provided with the content. In embodiments, the known multi-dimensional sound signature may be provided with the content.

At step 6244, sound not contemporaneously originating in the space may be reproduced in accordance with the known multi-sound signature composite. Such reproduction may apply the known multi-dimensional sound signature composite to the reproduced sound. In embodiments, such reproduction may create the effect that a listener is at the location of the known multi-dimensional sound signature and the listener generates, at least in part, the sound contemporaneously originating in the space, such that the reproduced version of the sound generated by the listener may be more similar to sound generated at the location. In embodiments, the identity of the known multi-dimensional sound signature may be provided with the content. In embodiments, the identity of the known multi-dimensional sound signature may be provided with the content, but the actual known multi-dimensional sound signature may not be provided with the content. In embodiments, applying the known multi-dimensional sound signature may include adjusting at least one of the timing and volume of sound emitted by a speaker at a specified location within the space. Timing of sounds emitted from speakers placed at rear and side locations in the space may be adjusted to increase similarity to timing of rear and side reflections specified in the multi-dimensional sound signature. Timing of sounds emitted from speakers placed at side locations may be adjusted to mimic primary and secondary side reflections specified in the multi-dimensional sound signature. Volume of sounds emitted from speakers placed at rear and side locations in the space is adjusted to increase similarity to amplitude of rear and side reflections specified in the multi-dimensional sound signature.

In embodiments, the content may contain audio and video information. In embodiments, the known multi-dimensional sound signature may be selected based on the video information. In embodiments, the known multi-dimensional sound signature may be selected by a processor based on the video information. In embodiments, the known multi-dimensional sound signature may be selected by a processor based on a determination of the location shown in the video information. In embodiments, the known multi-dimensional sound signature may be for a location in an actual space, a hypothetical space, an audience area of a space, a stage area of a space, and the like. In embodiments, the known multi-dimensional sound signature may be for a battlefield, a church, a cave, a forest, an office, a house, a hospital, a train station, an airport, a park, an underwater space, and the like.

In embodiments, the known multi-dimensional sound signature may be determined during the creation of the content. In embodiments, the known multi-dimensional sound signature may be created during the creation of the content. In embodiments, the known multi-dimensional sound signature may be similar to that of the space in the content. In embodiments, the known multi-dimensional sound signature may be similar to that of the space in which the content would typically be performed.

In embodiments, the known multi-dimensional sound signature composite may be for an actual space, a hypothetical space, and the like. In embodiments, the known multi-dimensional sound signature composite may result from manipulation of at least one other multi-dimensional sound signature composite. In embodiments, the known multi-dimensional sound signature composite may be an idealized multi-dimensional sound signature composite.

In embodiments, the known multi-dimensional sound signature composite may be a multi-dimensional sound signature composite for a hypothetical space; a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the known multi-dimensional sound signature composite may be for a battlefield, a church, a cave, a forest, an office, a house, a hospital, a train station, an airport, a park, an underwater space, and the like.

In embodiments, the known multi-dimensional sound signature composite may be determined during the creation of the content. In embodiments, the known multi-dimensional sound signature composite may be created during the creation of the content. In embodiments, the known multi-dimensional sound signature composite may be similar to that of the space in the content. In embodiments, the known multi-dimensional sound signature composite may be similar to that of the space in which the content would typically be performed.

In embodiments, the known multi-dimensional sound signature composite may be selected based on the content. In embodiments, the known multi-dimensional sound signature composite may be selected automatically based on the content. In embodiments, the known multi-dimensional sound signature composite may be selected by a processor based on the content. In embodiments, the known multi-dimensional sound signature composite may be selected based on location information provided with the content. In embodiments, the known multi-dimensional sound signature composite may be provided with the content. In embodiments, the identity of the known multi-dimensional sound signature composite may be provided with the content, but the actual known multi-dimensional sound signature composite may not be provided with the content. In embodiments, the content may contain audio and video information. The known multi-dimensional sound signature composite may be selected based on the video information. The content may contain audio and video information, and the known multi-dimensional sound signature composite may be selected by a processor based on the video information. In embodiments, the content may contain audio and video information, and the known multi-dimensional sound signature composite may be selected by a processor based on a determination of the location shown in the video information. In embodiments, the modification may create the effect that a listener may be at the location of the known multi-dimensional sound signature. In embodiments, the modification may create the effect that a listener may be at the location of the known multi-dimensional sound signature selected by the listener. In embodiments, modification may create the effect at each location in the space that a listener may be at a corresponding location of the space of the known multi-dimensional sound signature composite. In embodiments, the modification may create the effect at a location in the space that a listener may be at the corresponding location of the space of the known multi-dimensional sound signature composite. In embodiments, the modification may create the effect at a location in the space that a listener may be at a location of the space of the known multi-dimensional sound signature composite selected by the user. In embodiments, the modification may be performed with a computer processor, a mixing faculty, a sound recording and playback facility, a sound processing facility where the sound processing facility may include a plurality of channels configured to adjust timing of sounds played from specified locations in the space. In embodiments, the location may be a seat in the space, a stage located in the space, and the like.

The process 6200 may end at step 6248.

Figure 63:
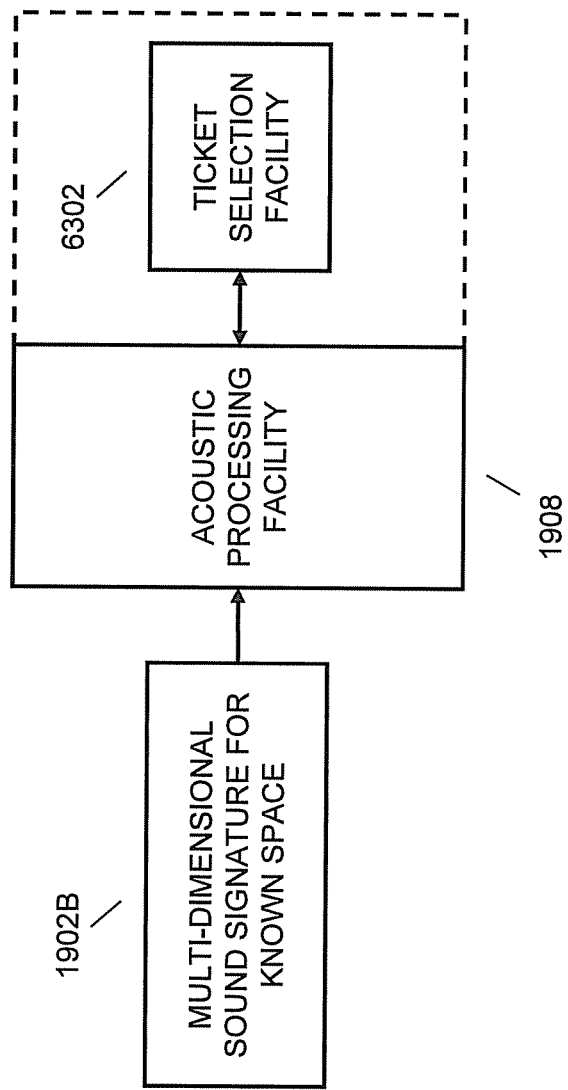
FIG. 63 depicts an embodiment block diagram of the present invention.

In embodiments, the present invention may provide for ticketing based on multi-dimensional sound signatures and multi-dimensional sound signature composites, where the selling of tickets may be tailored to the sound at the seat to the preferences of the ticket buyer, so that the buyer may purchase a ticket for a seat matching the buyer's listening preferences. In embodiments, a software-based system may be provided for selecting seats within venues to result in seating locations within a preferred multi-dimensional sound signature range for a type of performance. Referring to FIG. 63, a multi-dimensional sound signatures 1902B or multi-dimensional sound signature composite 1904B for a venue where tickets are for sale may be input to the acoustic processing facility 1908. This information may then be utilized by a ticket selection facility 6302 where a user may access the facility for ticket selection. In embodiments, the acoustic processing facility 1908 may include any of the acoustical equipment described herein to perform manipulation and the like, of the multi-dimensional sound signature of the known space. In addition, and as indicted in FIG. 63, the components and functions of the acoustic processing facility 1908 may be included in the ticket selection facility.

For example, concert tickets may be up for sale for a performance in the Boston's Symphony Hall, and the user is interested in selecting a seat that matches their preference as related to sound quality. Through use of the present invention, the user may be presented with a seating as a function of sound characteristics as measured in the multi-dimensional sound signatures and multi-dimensional sound signature composite of the Hall. In embodiments, this type of ticketing system may be used for any of a plurality of different spaces, such as music venues, sports venues, entertainment venues, outdoor venues, and the like, or any other space as described herein. In another example, the user may prefer sound of a certain character, such as in the treble range with moderate echo and the like, and the present invention may then be used to locate seats in a venue with those characteristics and present them for sale. In another example, a user may be hard of hearing, and the present invention may than assist the user in selecting seats that have an appropriate volume, such as across certain frequency bands that the user has hearing loss.

Figure 64:
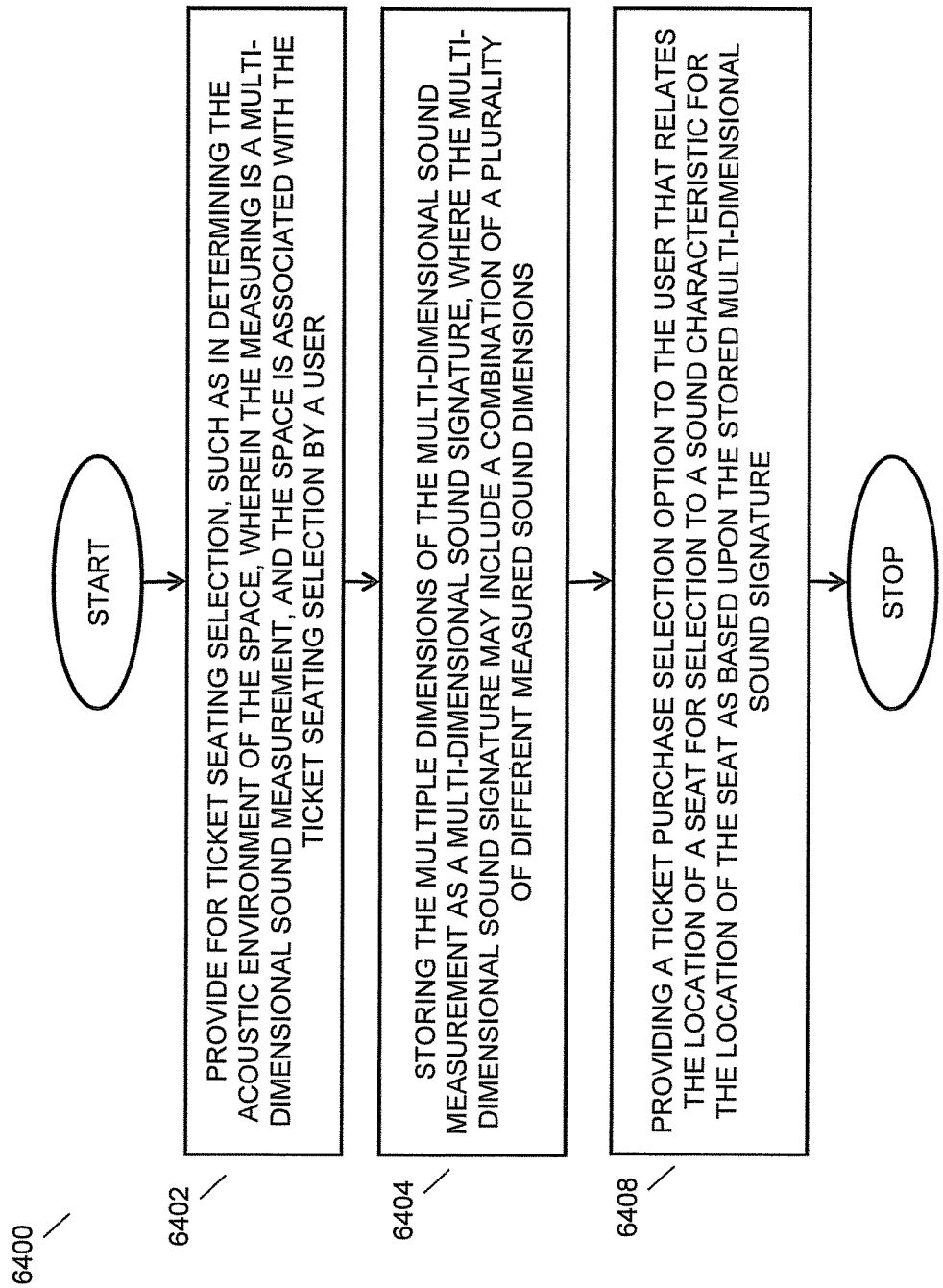
FIG. 64 depicts a flow process diagram in an embodiment of the present invention.

Referring to FIG. 64, in embodiments the present invention may provide for ticket seating selection 6400, such as in determining the acoustic environment of the space, wherein the measuring is a multi-dimensional sound measurement, and the space is associated with the ticket seating selection by a user; storing the multiple dimensions of the multi-dimensional sound measurement as a multi-dimensional sound signature, where the multi-dimensional sound signature may include a combination of a plurality of different measured sound dimensions; and providing a ticket purchase selection option to the user that relates the location of a seat for selection to a sound characteristic for the location of the seat as based upon the stored multi-dimensional sound signature. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 65:
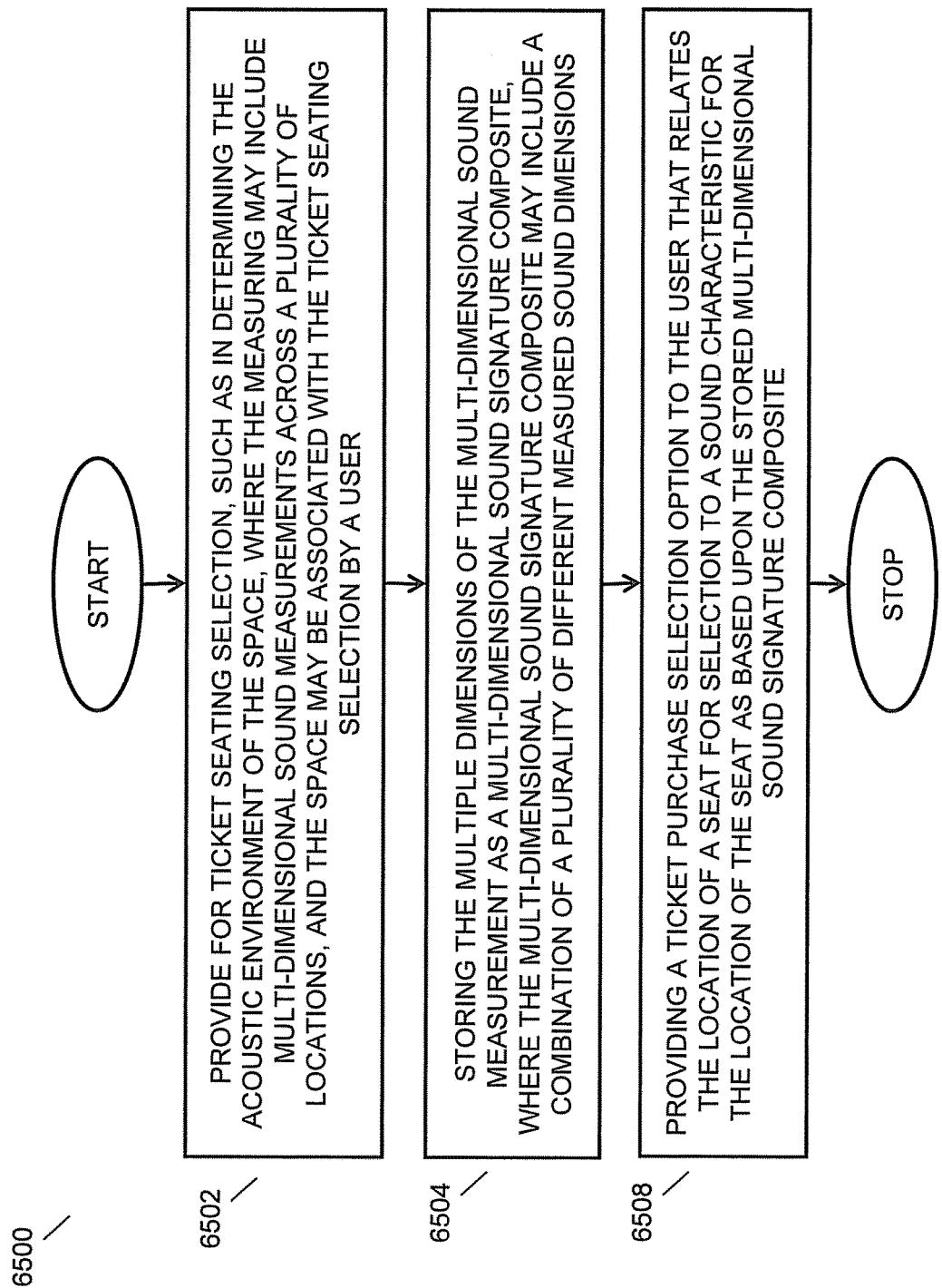
FIG. 65 depicts a flow process diagram in an embodiment of the present invention.

Referring to FIG. 65, in embodiments the present invention may provide for ticket seating selection 6500, such as in determining the acoustic environment of the space, where the measuring may include multi-dimensional sound measurements across a plurality of locations, and the space may be associated with the ticket seating selection by a user; storing the multiple dimensions of the multi-dimensional sound measurement as a multi-dimensional sound signature composite, where the multi-dimensional sound signature composite may include a combination of a plurality of different measured sound dimensions; and providing a ticket purchase selection option to the user that relates the location of a seat for selection to a sound characteristic for the location of the seat as based upon the stored multi-dimensional sound signature composite. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 66:
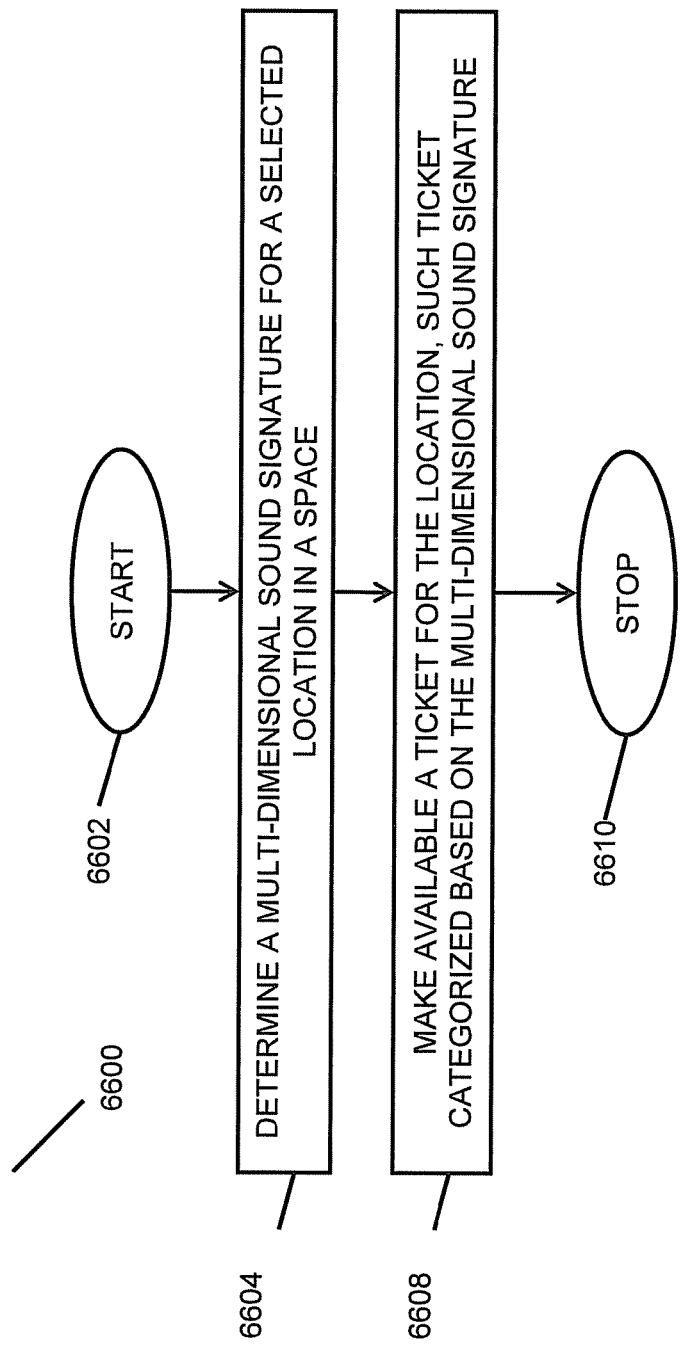
FIG. 66 depicts a flow process diagram in an embodiment of the present invention.

In embodiments, referring to FIG. 66, methods and systems for availability of a ticket for a particular location may be provided. As shown in FIG. 66, a process 6600 for availability of a ticket for a location may be based on the multi-dimensional sound signature in accordance with various embodiments of the present invention may be provided.

The process 6600 starts at step 6602. At step 6604, a multi-dimensional sound signature for a selected location in a space may be determined. In embodiments, the space may be a performance hall, a concert hall, a sports venue, an arena, an entertainment venue, a movie theater, an IMAX theater, a recording studio, a virtual reality environment, simulation environment, computer gaming environment, a sound recording studio, a sound recording studio that may include a sound mixing facility and/or a sound recording facility, a museum, a vehicle interior and the like. At step 6608, tickets may be made available for the location within the space. The tickets may be categorized based on the multi-dimensional sound signature.

In embodiments, the ticket may be categorized for a direct zone, a diamond zone, a middle zone, a deep envelopment zone, a deep envelopment zone and the like. In embodiments, the ticket may be categorized as a location with high-quality sound, a location with medium-quality sound, a location with low-quality sound, a location with sound characterized by bass frequencies, a location with sound characterized by mid-range frequencies, a location with sound characterized by treble frequencies and the like.

In embodiments, the process 6600 may be implemented in a software application executed on a computer. In embodiments, the process 6600 may be implemented using a graphical user interface, a web interface, a processor, a computer and the like. In embodiments, the process 6600 may be implemented by providing a storage media containing a sound as it would be heard at multiple locations. Further, the storage media may be a compact disc, a DVD or some other type of storage media.

The process 6600 may end at step 6610.

Figure 67:
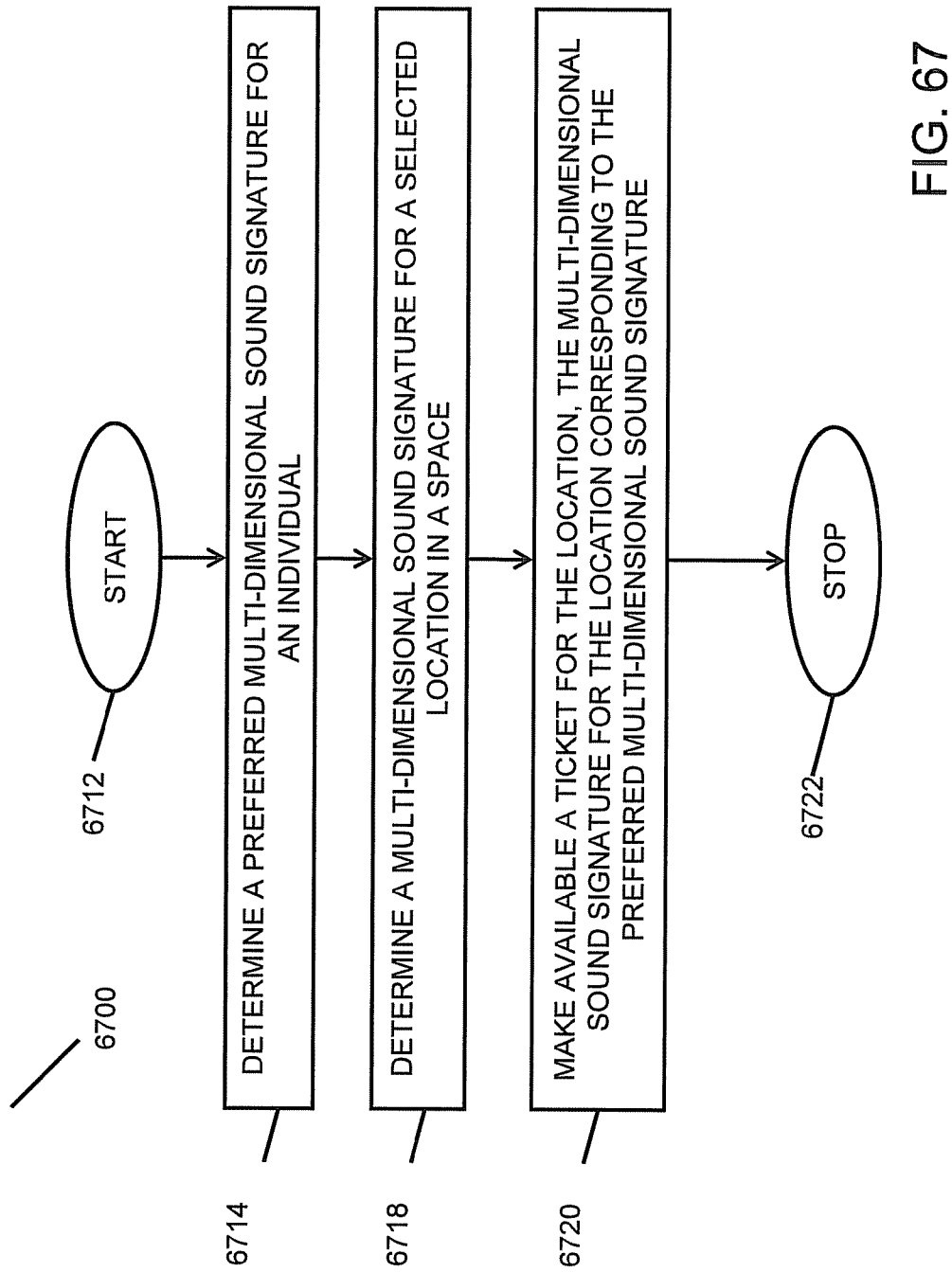
FIG. 67 depicts a flow process diagram in an embodiment of the present invention.

In embodiments, referring to FIG. 67, methods and systems for making available a ticket for the location based on individual preferences may be provided. As shown in FIG. 67, a process 6700 for making available a ticket for a location based on the multi-dimensional sound signature based on individual preference in accordance with various embodiments of the present invention may be provided.

The process 6700 starts at step 6712. At step 6714, a preferred multi-dimensional sound signature based on individual may be determined. At step 6718, a multi-dimensional sound signature for an identified location based on individual preference in a space may be determined. In embodiments, the space may be a performance hall, a concert hall, a sports venue, an arena, an entertainment venue, a movie theater, an IMAX theater, a recording studio, a virtual reality environment, simulation environment, computer gaming environment, a sound recording studio, a sound recording studio that may include a sound mixing facility and/or a sound recording facility, a museum, a vehicle interior and the like.

At step 6720, the process may provide a ticket for the location based on the preferred multi-dimensional sound signature of an individual. In embodiments, the ticket may be categorized for a direct zone, a diamond zone, a middle zone, a deep envelopment zone, a deep envelopment zone and the like. In embodiments, the ticket may be categorized as a location with high-quality sound, a location with medium-quality sound, a location with low-quality sound, a location with sound characterized by bass frequencies, a location with sound characterized by mid-range frequencies, a location with sound characterized by treble frequencies and the like.

In embodiments, the process 6700 may be implemented in a software application executed on a computer. In embodiments, the process 6700 may be implemented using a graphical user interface, a web interface, a processor, a computer and the like. In embodiments, a storage media containing a sound as it would be heard at multiple locations may be provided. Further, the storage media may be a compact disc, a DVD or some other type of storage media.

The process 6700 may end at step 6722.

Figure 68:
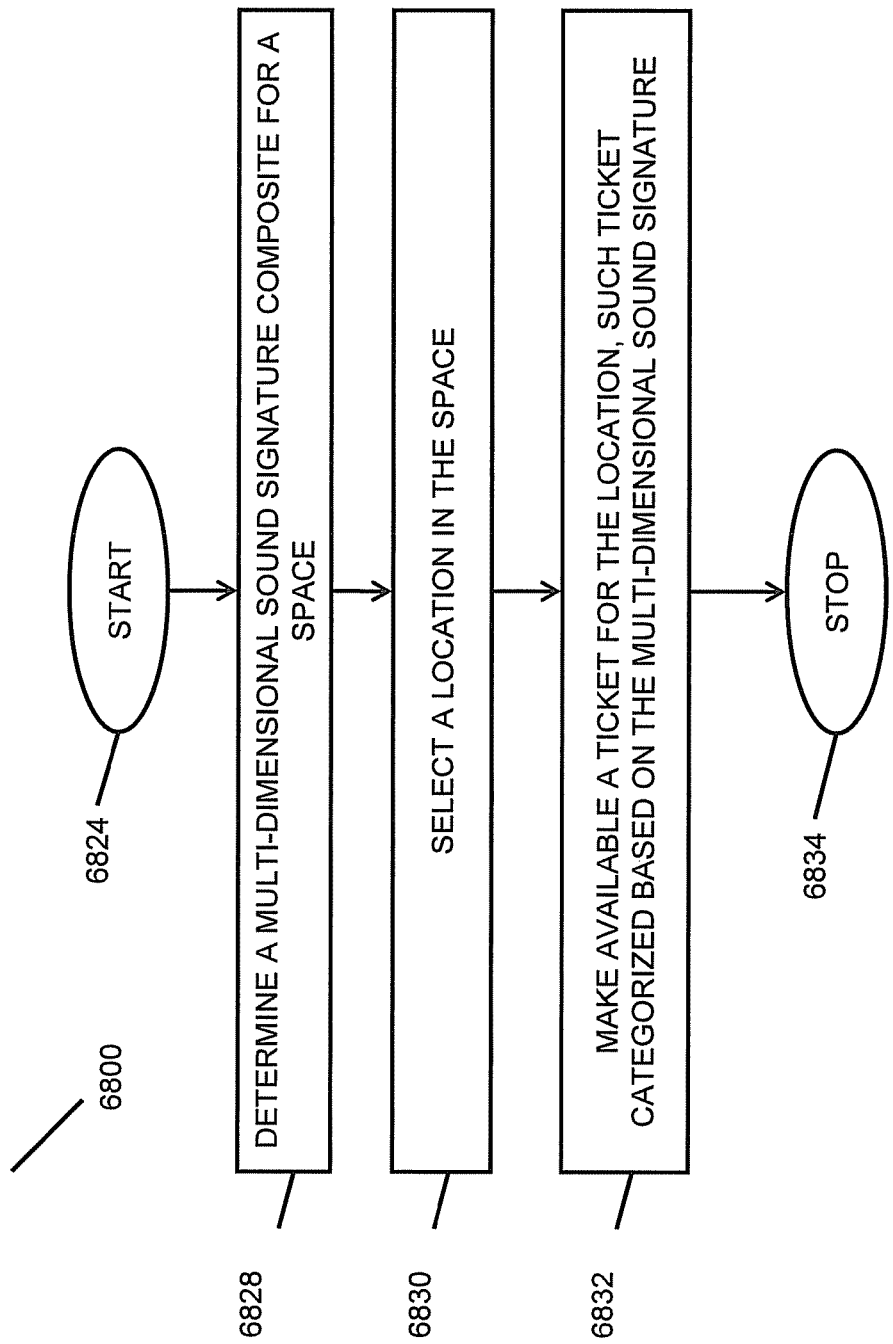
FIG. 68 depicts a flow process diagram in an embodiment of the present invention.

In embodiments, referring to FIG. 68, methods and systems for making available a ticket categorized on the multi-dimensional sound signature may be provided. As shown in FIG. 68, a process 6800 for making available a ticket categorized on the multi-dimensional sound signature in accordance with various embodiments of the present invention may be provided.

The process 6800 starts at step 6824. At step 6828, a multi-dimensional sound signature composite for a space may be determined. In embodiments, the space may be a performance hall, a concert hall, a sports venue, an arena, an entertainment venue, a movie theater, an IMAX theater, a museum, a vehicle interior, a recording studio, a virtual reality environment, simulation environment, computer gaming environment, a sound recording studio, a sound recording studio that may include a sound mixing facility and/or a sound recording facility, and the like. At step 6830, a location may be selected.

At step 6832, a ticket may be made available for the location. The ticket may be categorized based on the multi-dimensional sound signature. In embodiments, the ticket may be categorized for a direct zone, a diamond zone, a middle zone, a deep envelopment zone, a deep envelopment zone and the like. In embodiments, the ticket may be categorized as a location with high-quality sound, a location with medium-quality sound, a location with low-quality sound, a location with sound characterized by bass frequencies, a location with sound characterized by mid-range frequencies, a location with sound characterized by treble frequencies and the like.

In embodiments, the process 6800A may be implemented in a software application executed on a computer. In embodiments, the process 6800A may be implemented using a graphical user interface, a web interface, a processor, a computer and the like. In embodiments, a storage media containing a sound as it would be heard at multiple locations may be provided. Further, the storage media may be a compact disc, a DVD or some other type of storage media.

The process 6800 may end at step 6834.

Figure 69:
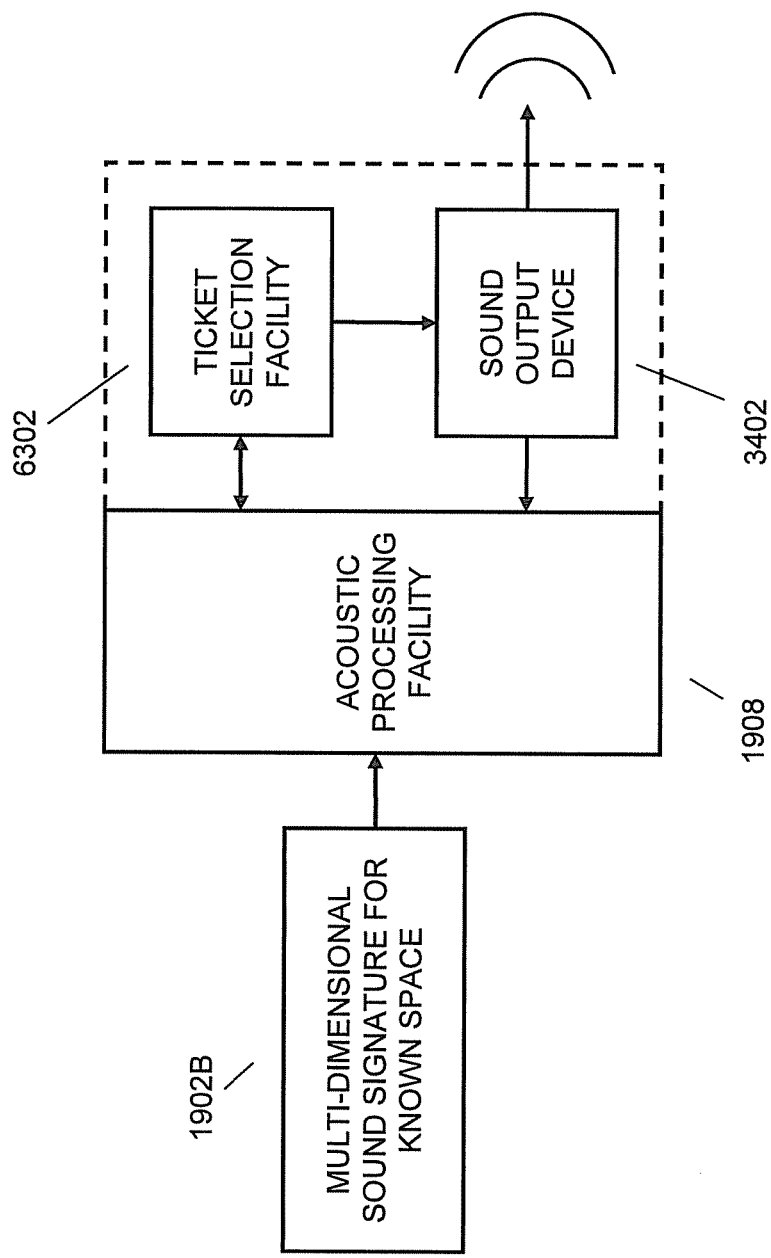
FIG. 69 depicts an embodiment block diagram of the present invention.
Figure 70:
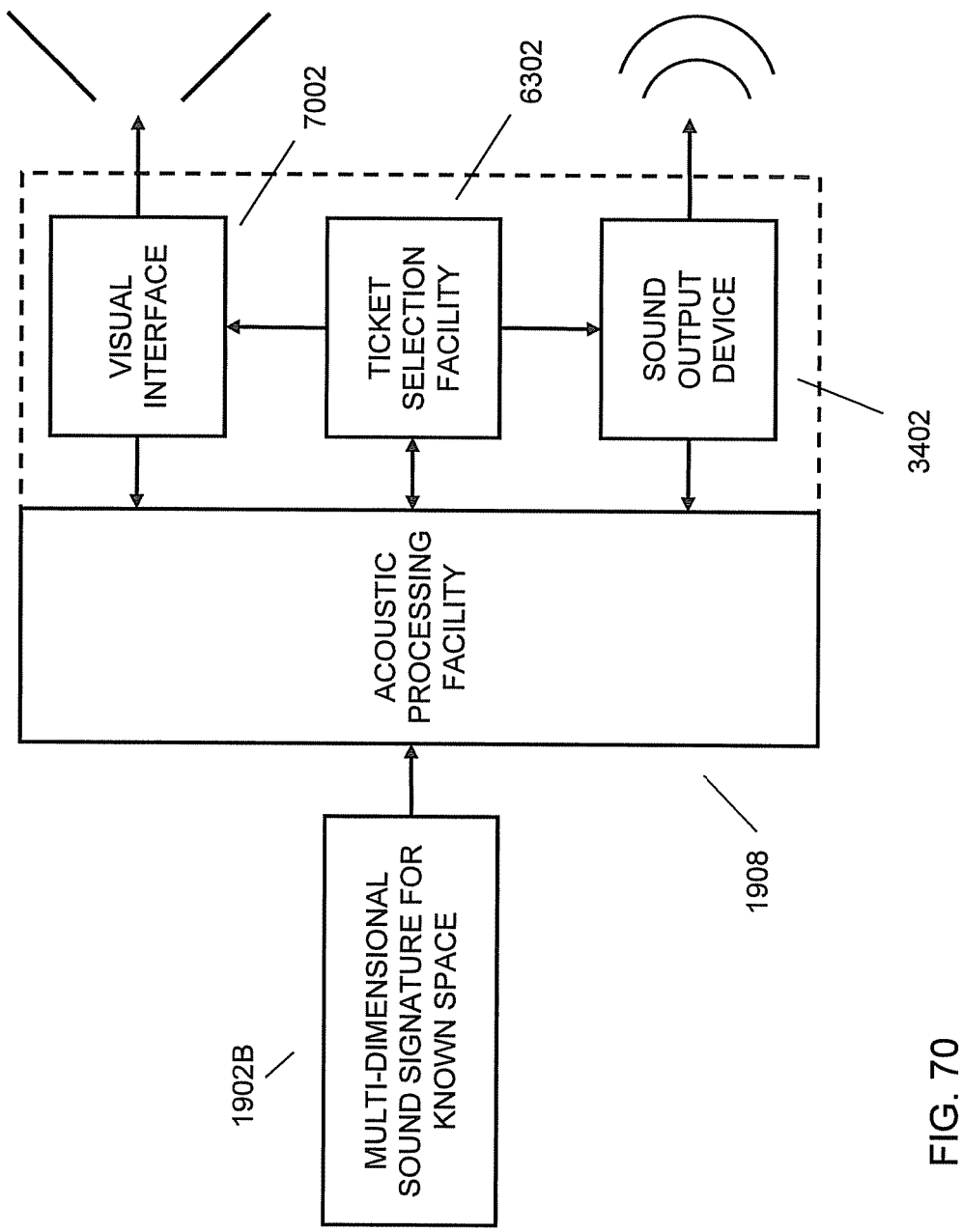
FIG. 70 depicts an embodiment block diagram of the present invention.

In embodiments, the present invention may provide for sound samples based on multi-dimensional sound signatures and/or multi-dimensional sound signature composites, such as in the process of ticket selection. Referring to FIG. 69, a multi-dimensional sound signature 1902 or multi-dimensional sound signature composite 1904 for a venue where tickets are for sale may be input to the acoustic processing facility 1908. This information may then be utilized by a ticket selection facility 6302 where a user may access the facility for ticket selection. In addition, the ticket selection facility may provide access to sound samples that may correspond to the locations within the space, such as for ticketed seats, and play the sound sample to the user through a sound output device 3402. In embodiments, the ticket selection facility may provide a user interface to the user for sample selection, such as a function of seat selection, for a portion of the space, and the like. In embodiments, this sound sample of a given seat may be combined with a visual representation of a view from the seat to provide the ticket buyer with a full sample of the character provided by the seat, prior to the purchase of a ticket. Referring to FIG. 70, a visual interface 7002 is shown interfacing with the ticket selection facility 6302 in addition to the sound output device 3402, which may provide the user with a graphical user interface including both a view of the seat as well as a sample of the sound character that may be expected at the location of the seat. In embodiments, the acoustic processing facility 1908 may include any of the acoustical equipment described herein to perform manipulation and the like, of the multi-dimensional sound signature of the known space. In addition, the components and functions of the acoustic processing facility 1908 may be included in the ticket selection facility, sound output device, and visual interface.

For example, and to continue the previous example of purchasing a ticket for a performance in Boston's Symphony Hall, seats in the Hall may have greatly varied sound characteristics, and so it may become a significant advantage for a user to have access to sound samples as provide by the present invention. And indeed, the user may for the first time realize that a great variety of sound character exists in the Hall, and so come to better appreciate the unique acoustics of the Hall. In addition, the user may be able to view the stage area from the selected seat, and thereby be provided with a facility that provides them with both an auditory and visual sample for seating within the Hall. In embodiments, one can clearly see the applicability of such a facility for the location selection, such as seat selection, of any of a great variety of spaces, including for sporting events, concerts, theater, and the like, or any other space described herein.

Figure 71:
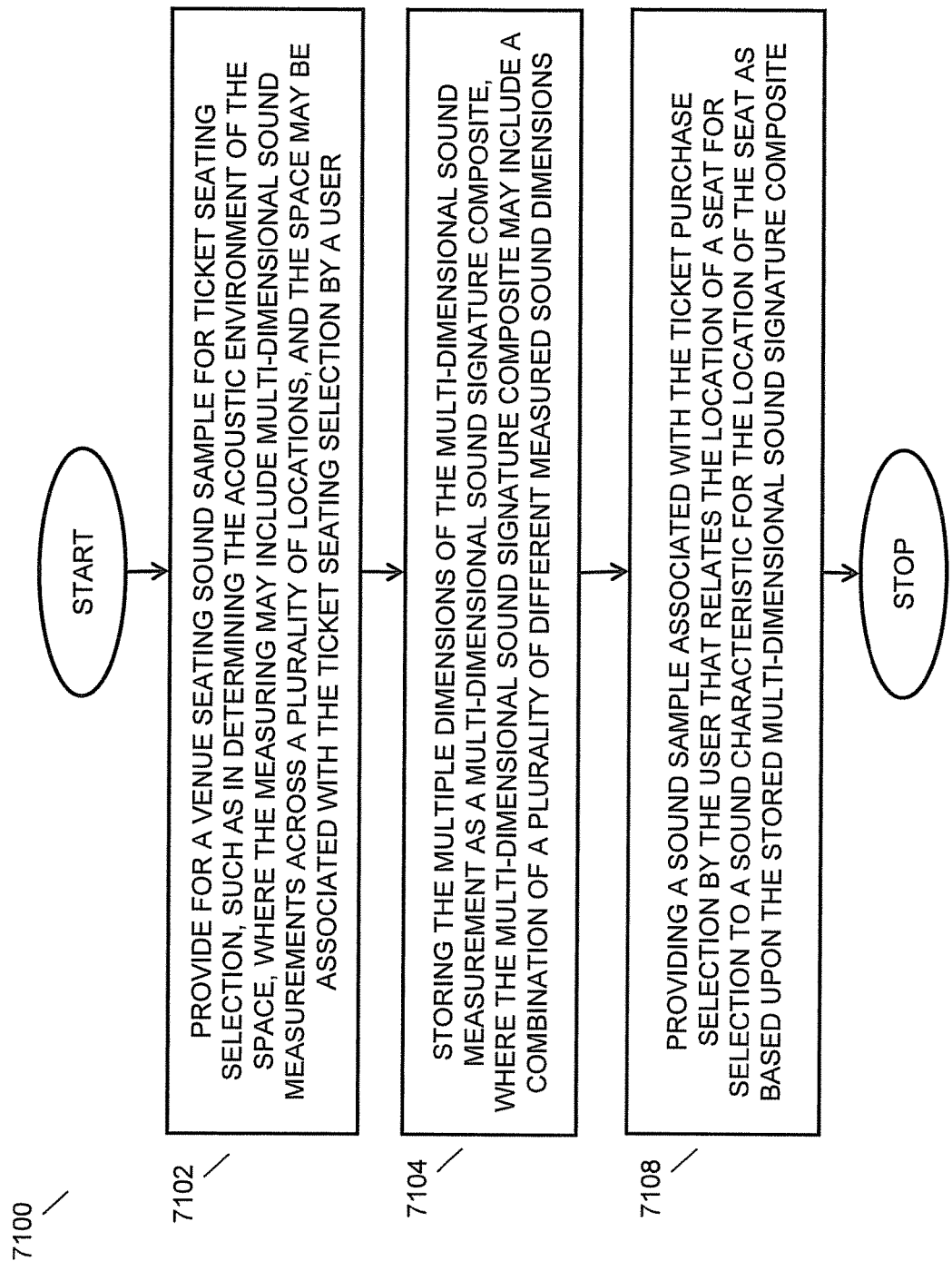
FIG. 71 depicts a flow process diagram in an embodiment of the present invention.

Referring to FIG. 71, in embodiments the present invention may provide for providing a venue seating sound sample for ticket seating selection, such as in determining the acoustic environment of the space, wherein the measuring is a multi-dimensional sound measurement, and the space is associated with the ticket seating selection by a user; storing the multiple dimensions of the multi-dimensional sound measurement as a multi-dimensional sound signature, wherein the multi-dimensional sound signature includes a combination of a plurality of different measured sound dimensions; and providing a sound sample associated with the ticket purchase selection by the user that relates the location of a seat for selection of sound characteristic for the location of the seat as based upon the stored multi-dimensional sound signature. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

In embodiments, the present invention may provide for a venue seating sound sample for ticket seating selection, such as in determining the acoustic environment of the space, where the measuring may include multi-dimensional sound measurements across a plurality of locations, and the space may be associated with the ticket seating selection by a user; storing the multiple dimensions of the multi-dimensional sound measurement as a multi-dimensional sound signature composite, where the multi-dimensional sound signature composite may include a combination of a plurality of different measured sound dimensions; and providing a sound sample associated with the ticket purchase selection by the user that relates the location of a seat for selection to a sound characteristic for the location of the seat as based upon the stored multi-dimensional sound signature composite. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 72:
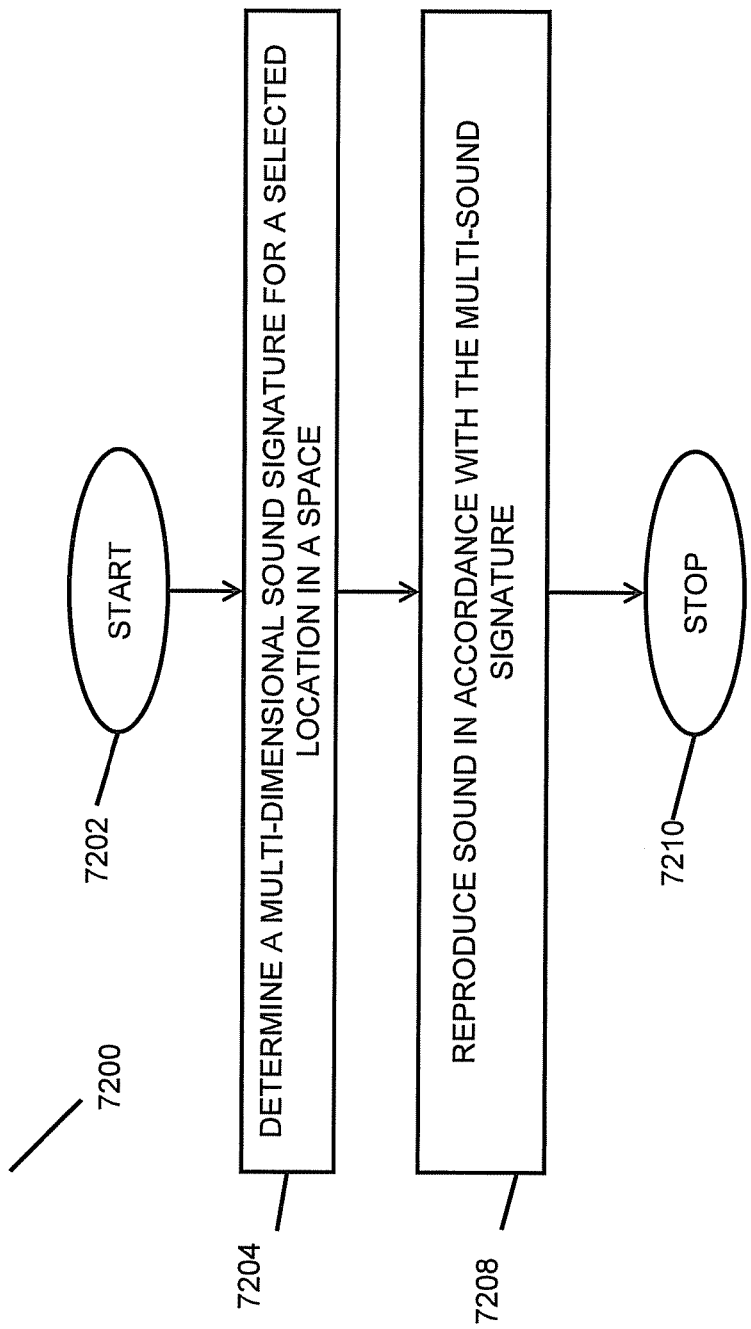
FIG. 72 depicts a flow process diagram in an embodiment of the present invention.

In embodiments, referring to FIG. 72, methods and systems for reproducing sound in accordance with the multi-sound signature may be provided. As shown in FIG. 72, a process 7200 for reproducing sound with respect to the multi-sound signature in accordance with various embodiments of the present invention may be provided.

The process 7200 starts at step 7202. At step 7204, a multi-dimensional sound signature may be determined for a selected location in a space. In embodiments, the space may be a performance hall, a concert hall, a sports venue, an arena, an entertainment venue, a movie theater, an IMAX theater, a museum, a vehicle interior, a recording studio, a virtual reality environment, simulation environment, computer gaming environment, a sound recording studio, a sound recording studio that may include a sound mixing facility and/or a sound recording facility, and the like.

At step 7208, sound may be reproduced in accordance with the multi-sound signature. Such reproduction may apply the multi-dimensional sound signature to the reproduced sound so that the sound may be heard as it would be heard at the location in the space. In embodiments, such reproduction may create the effect that a listener is at the location of the known multi-dimensional sound signature and the listener generates, at least in part, the sound contemporaneously originating in the space, such that the reproduced version of the sound generated by the listener may be more similar to sound generated at the location. In embodiments, the sound may be a sample of a performance of a type typically performed in the space. In embodiments, the sound may be created by an artist who may be performing at the venue. In embodiments, the sound may be a sample of an upcoming performance to be held at the venue. In embodiments, the location may be a seat, an area of seating, a zone of the space, and the like. In embodiments, the reproduced sound may be provided in connection with a representation of the view from the location in the space. In embodiments, the reproduced sound may be provided in connection with an interactive representation of the view from the location in the space. In embodiments, the reproduced sound may be provided in connection with an image of the view from the location in the space. In embodiments, the reproduced sound may be provided in connection with an interactive image of the view from the location in the space. In embodiments, applying the known multi-dimensional sound signature may include adjusting at least one of the timing and volume of sound emitted by a speaker at a specified location within the space. Timing of sounds emitted from speakers placed at rear and side locations in the space may be adjusted to increase similarity to timing of rear and side reflections specified in the multi-dimensional sound signature. Timing of sounds emitted from speakers placed at side locations may be adjusted to mimic primary and secondary side reflections specified in the multi-dimensional sound signature. Volume of sounds emitted from speakers placed at rear and side locations in the space is adjusted to increase similarity to amplitude of rear and side reflections specified in the multi-dimensional sound signature.

In embodiments, the space may be a performance space, and the reproduced sound may be provided in connection with an interactive representation of the view from the location in the space. In embodiments, the space may be a performance space, and the reproduced sound may be provided in connection with an interactive representation of the view from the location in the space showing a stage in the performance space. In embodiments, the location may be selected using a graphical user interface that may associate with the sound an interactive representation of the view from the location in the space. In embodiments, a listener may be allowed to purchase tickets for the location.

The process 7200 may end at step 7210.

Figure 73:
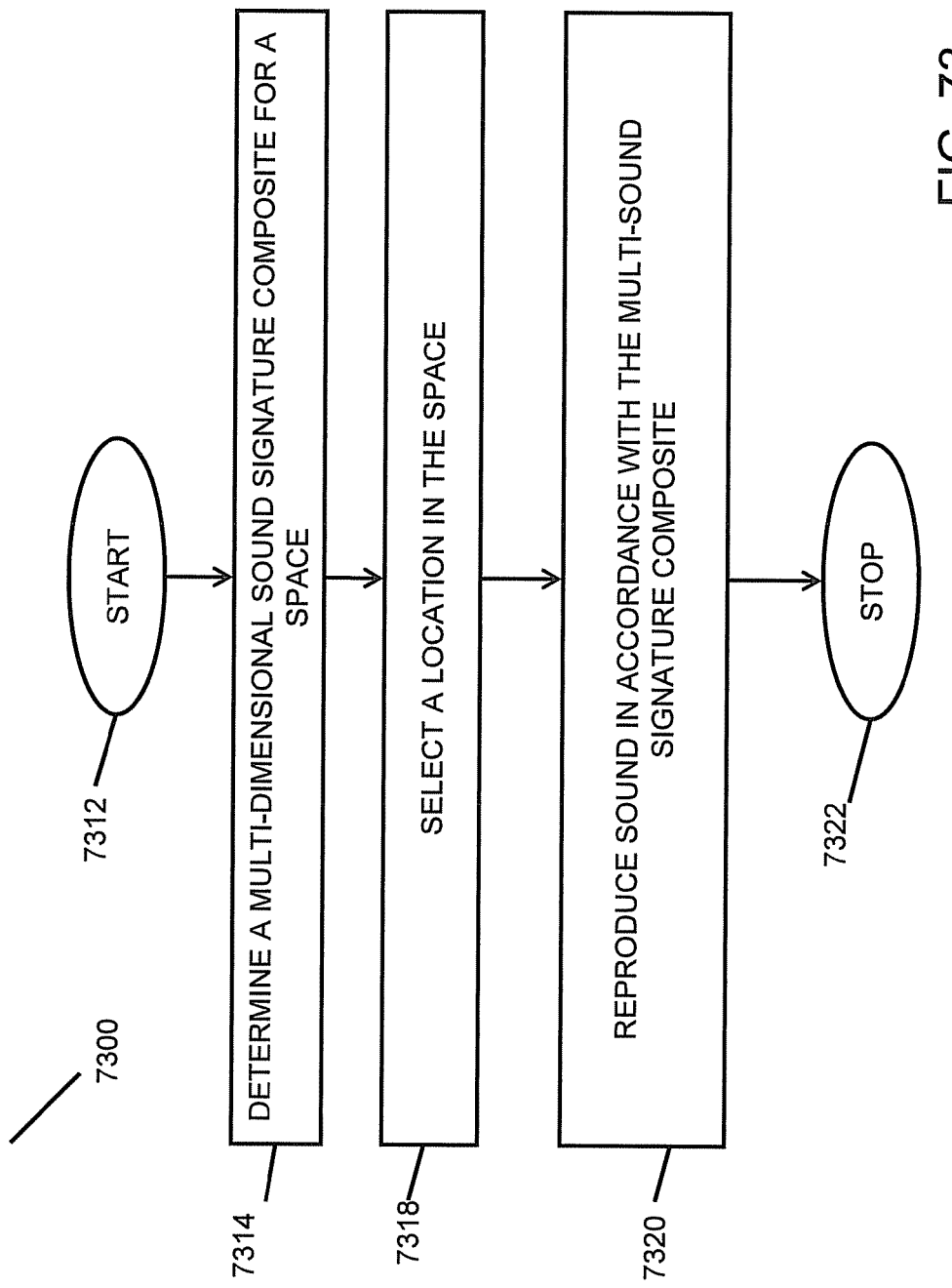
FIG. 73 depicts a flow process diagram in an embodiment of the present invention.

In embodiments, referring to FIG. 73, methods and systems for reproducing sound with respect to the multi-sound signature composite in accordance with the multi-sound signature may be provided. As shown in FIG. 73, a process 7300 for reproducing sound with respect to the multi-sound signature composite in accordance with various embodiments of the present invention may be provided.

The process 7300 starts at step 7312. At step 7314, a multi-dimensional sound signature composite for a space may be determined. In embodiments, the space may be a performance hall, a concert hall, a sports venue, an arena, an entertainment venue, a movie theater, an IMAX theater, a museum, a recording studio, a virtual reality environment, simulation environment, computer gaming environment, a sound recording studio, a sound recording studio that may include a sound mixing facility and/or a sound recording facility, a vehicle interior, and the like.

At step 7318, a location in the space may be selected. At step 7320, sound may be reproduced in accordance with the multi-sound signature composite. Such reproduction may apply the multi-dimensional sound signature composite to the reproduced sound so that the sound may be heard as it would be heard at the location in the space. In embodiments, the sound may be a sample of a performance of a type typically performed in the space. In embodiments, the sound may be created by an artist who may be performing at the venue. In embodiments, the sound may be a sample of an upcoming performance to be held at the venue. In embodiments, applying the known multi-dimensional sound signature may include adjusting at least one of the timing and volume of sound emitted by a speaker at a specified location within the space. Timing of sounds emitted from speakers placed at rear and side locations in the space may be adjusted to increase similarity to timing of rear and side reflections specified in the multi-dimensional sound signature. Timing of sounds emitted from speakers placed at side locations may be adjusted to mimic primary and secondary side reflections specified in the multi-dimensional sound signature. Volume of sounds emitted from speakers placed at rear and side locations in the space is adjusted to increase similarity to amplitude of rear and side reflections specified in the multi-dimensional sound signature.

In embodiments, the location may be a seat, an area of seating, a zone of the space, and the like. In embodiments, the reproduced sound may be provided in connection with a representation of the view from the location in the space. In embodiments, the reproduced sound may be provided in connection with an interactive representation of the view from the location in the space. In embodiments, the reproduced sound may be provided in connection with an image of the view from the location in the space. In embodiments, the reproduced sound may be provided in connection with an interactive image of the view from the location in the space.

In embodiments, the space may be a performance space, and the reproduced sound may be provided in connection with an interactive representation of the view from the location in the space. In embodiments, such reproduction may create the effect that a listener is at the location of the known multi-dimensional sound signature and the listener generates, at least in part, the sound contemporaneously originating in the space, such that the reproduced version of the sound generated by the listener may be more similar to sound generated at the location. In embodiments, the space may be a performance space, and the reproduced sound may be provided in connection with an interactive representation of the view from the location in the space showing a stage in the performance space. In embodiments, the location may be selected using a graphical user interface that may associate with the sound an interactive representation of the view from the location in the space. In embodiments, a listener may be allowed to purchase tickets for the location.

At step 7320, the process 7300 may end at step 7322.

In embodiments, the processes 7200 and 7300 may be implemented in a software application executed on a computer. In embodiments, the processes 7200 and 7300A may be implemented using a graphical user interface, a web interface, and the like. In embodiments, the processes 7200 and 7300 may be implemented using a processor, a computer, a storage media containing a sound as sound would be heard at multiple locations, and the like. The storage media may be a compact disc, a DVD, and the like.

Figure 74:
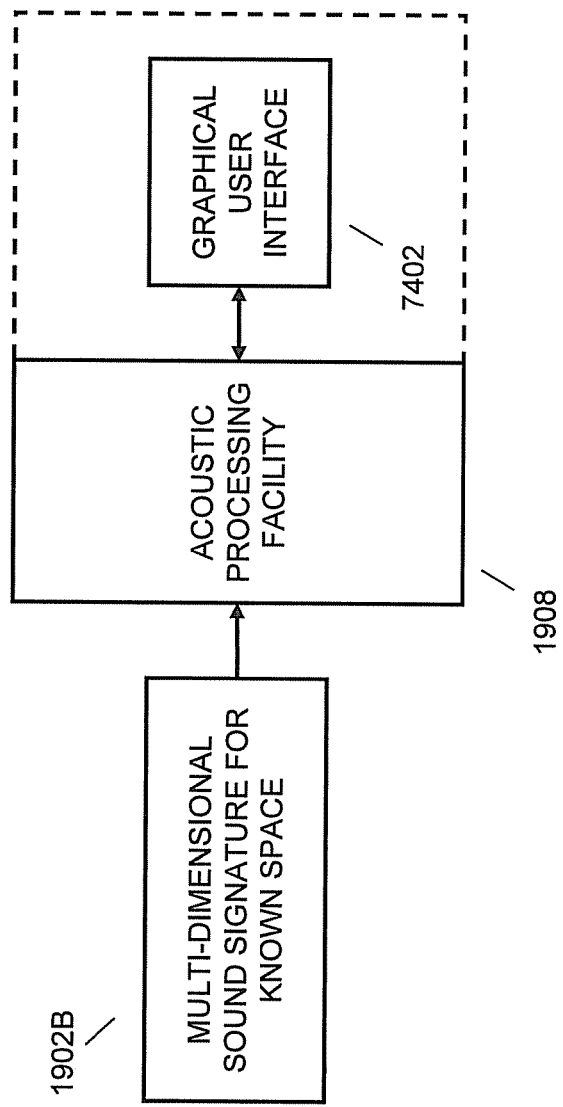
FIG. 74 depicts an embodiment block diagram of the present invention.
Figure 75:
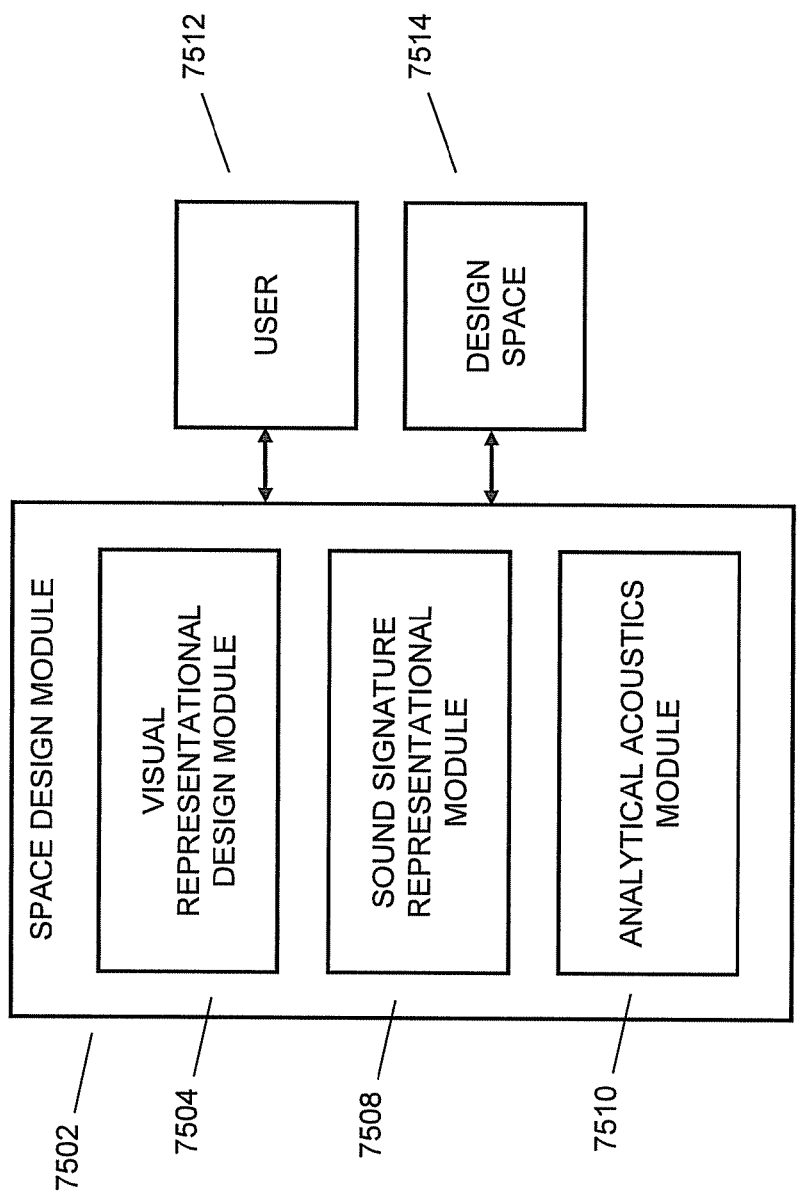
FIG. 75 depicts an embodiment block diagram of the present invention.

In embodiments, the present invention may provide for a software interfaces for multi-dimensional sound signatures and multi-dimensional sound signature composites, such as a graphical user interface for manipulating multi-dimensional sound signatures and multi-dimensional sound signature composites, software interfaces for visually representing and manipulating, as well as designing and optimizing spaces in consideration of, multi-dimensional sound signatures and multi-dimensional sound signature composites, a software interface for facilitating design of rooms to facilitate sound reflections occurring within preferred ranges of multi-dimensional sound signature, a software interface with visual representation of sound vectors to facilitate design of rooms with preferred sound signature characteristics, and the like. Referring to FIG. 74, a multi-dimensional sound signatures 1902B or multi-dimensional sound signature composite 1904B for a known space may be input to an acoustic processing facility 1908, and where a graphical user interface 7402 is provided for use of the data. In embodiments, the acoustic processing facility 1908 may include any of the acoustical equipment described herein to perform manipulation and the like, of the multi-dimensional sound signature of the known space. In addition, as shown in FIG. 74, the components and functions of the acoustic processing facility 1908 may be included in the graphical user interface. Referring to FIG. 75, in embodiments, the present invention may provide for a computer-implemented program for designing a space 7514, including a design module 7502 capable of visually representing parameters of a planned space as specified by a user 7512 of the design module 7502, a sound signature representation module 7504 capable of visually representing a multi-dimensional sound signature 1902 in the space, and an analytical acoustics module 7510 capable of determining the predicted impact of changes to parameters in the design module 7502 on a multi-dimensional sound signature 1902 or multi-dimensional sound signature composite 1904 in the planned space, where upon modification of parameters of the space in the design module 7502 a modified multi-dimensional sound signature may be presented to the user 7512. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

For example, a designer of a new concert hall may be utilizing the multi-dimensional sound signatures or multi-dimensional sound signature composite for a known concert hall where the sound characteristics are known to be pleasing. The designer may wish to work with this data, such as in conjunction with the acoustic processing facility 1908, to help improve the sound characteristic of their new concert hall. In embodiments, the designer may have a plurality of visual and auditory interfaces available through the graphical user interface to aid in the designer's access, manipulation, and use of the data to help them in their design. In embodiments, software may be used to model sound signatures/composites, and to determine hypothetical ones. In addition, the software may be used to simulate effects of the adjustment of characteristics of a space or aspects of a sound signatures/composite.

Figure 76:
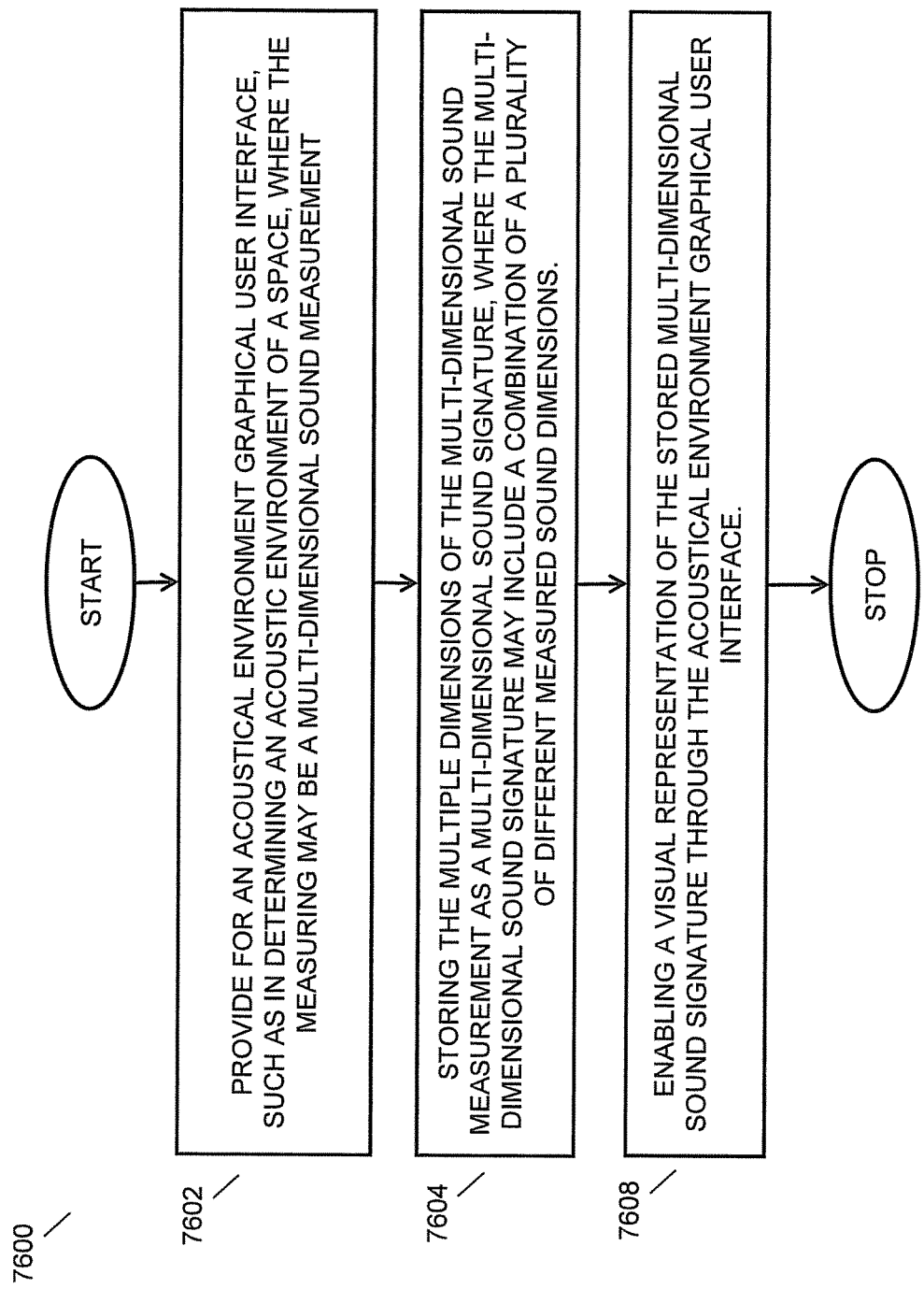
FIG. 76 depicts a flow process diagram in an embodiment of the present invention.

Referring to FIG. 76, in embodiments the present invention may provide for an acoustical environment graphical user interface 7600, such as in determining an acoustic environment of a space, where the measuring may be a multi-dimensional sound measurement; storing the multiple dimensions of the multi-dimensional sound measurement as a multi-dimensional sound signature, where the multi-dimensional sound signature may include a combination of a plurality of different measured sound dimensions; and enabling a visual representation of the stored multi-dimensional sound signature through the acoustical environment graphical user interface. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 77:
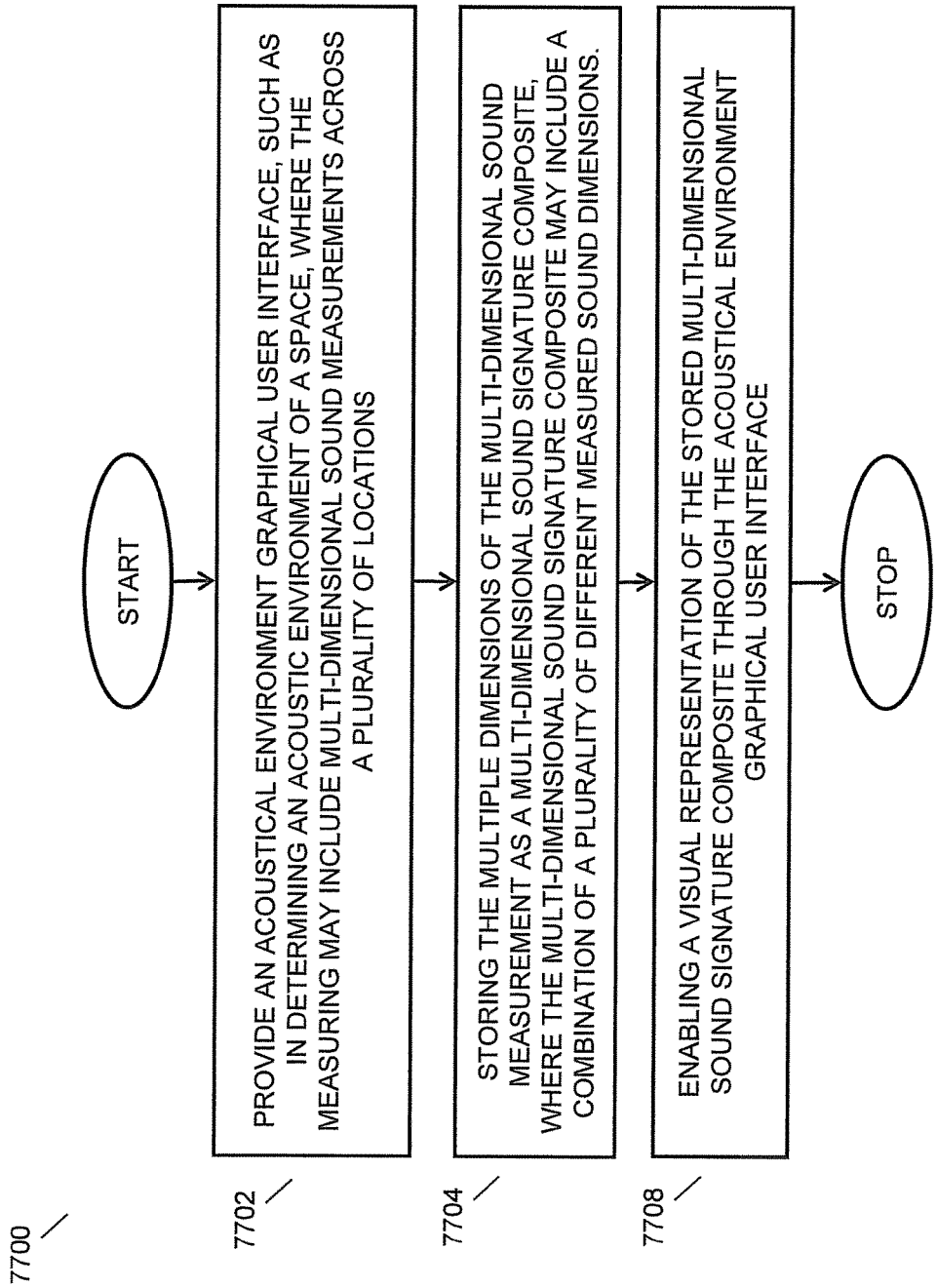
FIG. 77 depicts a flow process diagram in an embodiment of the present invention.

Referring to FIG. 77, in embodiments the present invention may provide an acoustical environment graphical user interface 7700, such as in determining an acoustic environment of a space, where the measuring may include multi-dimensional sound measurements across a plurality of locations; storing the multiple dimensions of the multi-dimensional sound measurement as a multi-dimensional sound signature composite, where the multi-dimensional sound signature composite may include a combination of a plurality of different measured sound dimensions; and enabling a visual representation of the stored multi-dimensional sound signature composite through the acoustical environment graphical user interface. In embodiments, determining the acoustic environment may include making a multi-dimensional sound measurement, specifying a multi-dimensional sound signature, and the like. In embodiments, the determining of the acoustic environment of the space may include the creation of a multi-dimensional sound signature for the space. The comparing may include the comparison of the multi-dimensional sound signature of the space with the multi-dimensional sound signature of the known space. The sound characteristics may include modifying a reflective characteristic of the space, modifying an absorption characteristic of the space, adjusting a sound system of the space, modifying at least one reflection to mimic at least one of a secondary and a tertiary reflection in the space, and the like. Adjusting a sound system of the space where adjusting a sound system includes adjusting at least one of timing, location, direction and volume of at least one speaker in the space, adjusting a parameter of a sound mixing system, where the parameter may include adjusting at least one of the timing, frequency, and volume of sound that will be played by at least one speaker. In embodiments, the sound dimensions of the sound signature composite may be selected from the group consisting of timing, direction, amplitude and frequency of reflections of sound associated with the known acoustic environment. Reflections include primary and secondary reflections from similar directions; primary, secondary and tertiary reflections from similar directions; and the like. The determining of the acoustic environment of the space may include the creation of a multi-dimensional sound signature for the space. The comparing may include the comparison of the multi-dimensional sound signature of the space with the multi-dimensional sound signature of the known space. The plurality of locations may be a plurality of sound initiation locations, a plurality of sound measurement locations, a plurality of sound initiation locations and a plurality of sound measurement locations, and the like.

Figure 78:
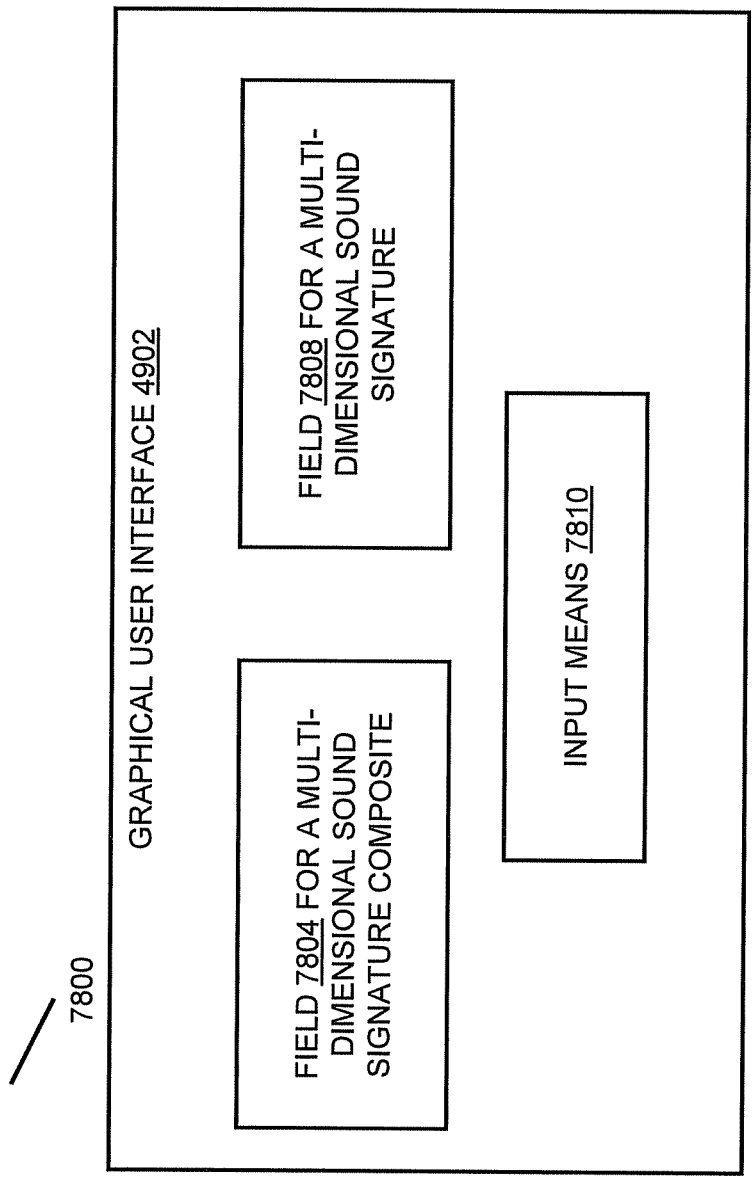
FIG. 78 depicts an embodiment block diagram of the present invention.

In embodiments, referring to FIG. 78, a block diagram 7800 showing the graphical user interface 7802 may be provided. The graphical user interface 7802 may have a field 7804 for representing, a field for visually representing, a field for manipulating, and the like, one or more multi-dimensional sound signature composites. In addition, the graphical user interface 7802 may have a field 7808 for representing a multi-dimensional sound signature. It may be noted that the graphical user interface 7802 may have multiple fields for representing multi-dimensional sound signature composite and multi-dimensional sound signature. The graphical user interface 7802 may have an input means 7810 for manipulating the one or more of a multi-dimensional sound signature and a multi-dimensional sound signature composite. In embodiments, the multi-dimensional sound signature composite may be for an actual space, a hypothetical space, and the like. In embodiments, the multi-dimensional sound signature composite may result from manipulation of one or more other multi-dimensional sound signature composites. In embodiments, the multi-dimensional sound signature composite may be an idealized multi-dimensional sound signature composite. In embodiments, the multi-dimensional sound signature composite may be a multi-dimensional sound signature composite for a hypothetical space. In embodiments, the multi-dimensional sound signature composite may be for a single source multi-dimensional sound signature composite. In embodiments, the multi-dimensional sound signature composite may be a multiple source multi-dimensional sound signature composite; a multiple source, multiple locations, multi-dimensional sound signature composite; a hypothetical multi-dimensional sound signature composite; an ambient multi-dimensional sound signature composite; and the like.

Figure 79:
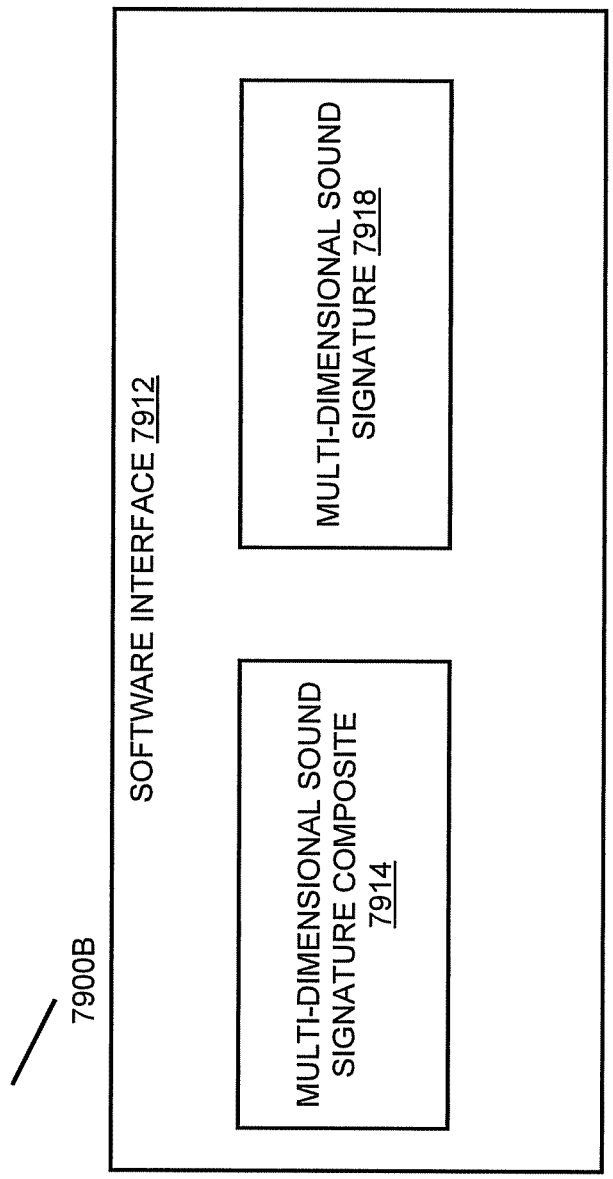
FIG. 79 depicts an embodiment block diagram of the present invention.

In embodiments, referring to FIG. 79, a block diagram showing the software interface 7912 may be provided. The software interface 7912 may be capable of visually representing at least one of a multi-dimensional sound signature 7918 and a multi-dimensional sound signature composite 7914. It may be noted that the software interface 7912 may be capable of visually representing one or more multi-dimensional sound signatures and multi-dimensional sound signature composites. In embodiments, the multi-dimensional sound signature composite 7914 may be for an actual space, a hypothetical space, and the like. In embodiments, the multi-dimensional sound signature composite 7914 may result from manipulation of one or more other multi-dimensional sound signature composites. In embodiments, the multi-dimensional sound signature composite 7914 may be an idealized multi-dimensional sound signature composite. In embodiments, the multi-dimensional sound signature composite 7914 may be a multi-dimensional sound signature composite for a hypothetical space. In embodiments, the multi-dimensional sound signature composite 7914 may be for a single source multi-dimensional sound signature composite. In embodiments, the multi-dimensional sound signature composite 7914 may be a multiple source, multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the software interface 7912 may be capable of manipulating at least one of a multi-dimensional sound signature 7918 and a multi-dimensional sound signature composite 7914. It may be noted that the software interface 7912 may be capable of manipulating one or more multi-dimensional sound signatures and multi-dimensional sound signature composites. In embodiments, the manipulation may be combination, decomposition, and the like. In embodiments, the multi-dimensional sound signature composite 7914 may be for an actual space, a hypothetical space, and the like. In embodiments, the multi-dimensional sound signature composite 7914 may result from manipulation of one or more other multi-dimensional sound signature composite. In embodiments, the multi-dimensional sound signature composite 7914 may be an idealized multi-dimensional sound signature composite. In embodiments, the multi-dimensional sound signature composite 7914 may be a multi-dimensional sound signature composite for a hypothetical space. In embodiments, the multi-dimensional sound signature composite 7914 may be for a single source multi-dimensional sound signature composite. In embodiments, the multi-dimensional sound signature composite 7914 may be a multiple source, multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the software interface 7912 may be capable of designing a space in consideration of at least a multi-dimensional sound signature 7918 and a multi-dimensional sound signature composite 7914. In embodiments, the space may be a hypothetical space. In embodiments, the multi-dimensional sound signature composite 7914 may be for an actual space, a hypothetical space, and the like. In embodiments, the multi-dimensional sound signature composite 7914 may result from manipulation of one or more other multi-dimensional sound signature composites. In embodiments, the multi-dimensional sound signature composite 7914 may be an idealized multi-dimensional sound signature composite. In embodiments, the multi-dimensional sound signature composite 7914 may be a multi-dimensional sound signature composite for a hypothetical space. In embodiments, the multi-dimensional sound signature composite 7914 may be for a single source multi-dimensional sound signature composite. In embodiments, the multi-dimensional sound signature composite 7914 may be a multiple source, multi-dimensional sound signature composite; a multiple source, multiple locations, multi-dimensional sound signature composite; a hypothetical multi-dimensional sound signature composite; an ambient multi-dimensional sound signature composite; and the like.

In embodiments, the software interface 7912 may be capable of optimizing a space in consideration of at least one of a multi-dimensional sound signature 7918 and a multi-dimensional sound signature composite 7914. In embodiments, the space may be a hypothetical space.

In embodiments, the multi-dimensional sound signature composite 7914 may be for an actual space, a hypothetical space, and the like. In embodiments, the multi-dimensional sound signature composite 7914 may result from manipulation of one or more other multi-dimensional sound signature composites. In embodiments, the multi-dimensional sound signature composite 7914 may be an idealized multi-dimensional sound signature composite. In embodiments, the multi-dimensional sound signature composite 7914 may be a multi-dimensional sound signature composite for a hypothetical space. In embodiments, the multi-dimensional sound signature composite 7914 may be for a single source multi-dimensional sound signature composite. In embodiments, the multi-dimensional sound signature composite 7914 may be a multiple source, multi-dimensional sound signature composite; a multiple source, multiple locations, multi-dimensional sound signature composite; a hypothetical multi-dimensional sound signature composite; an ambient multi-dimensional sound signature composite; and the like.

Figure 80:
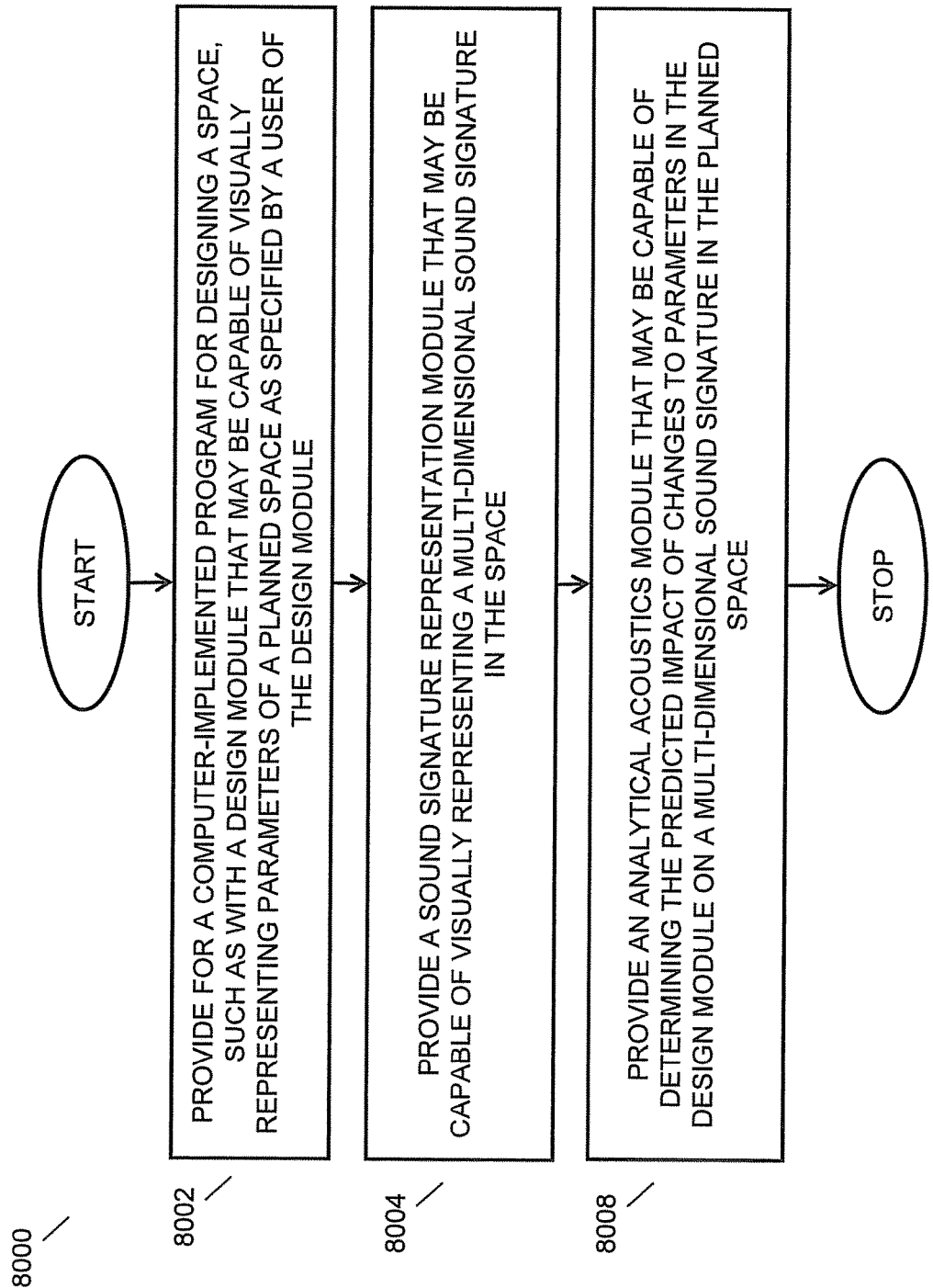
FIG. 80 depicts a flow process diagram in an embodiment of the present invention.

Referring to FIG. 80, in embodiments the present invention may provide for a computer-implemented program for designing a space 8000, such as with a design module that may be capable of visually representing parameters of a planned space as specified by a user of the design module; a sound signature representation module that may be capable of visually representing a multi-dimensional sound signature in the space; and an analytical acoustics module that may be capable of determining the predicted impact of changes to parameters in the design module on a multi-dimensional sound signature in the planned space. In embodiments, upon modification of parameters of the space in the design module a modified multi-dimensional sound signature may be presented to the user. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature composite; be a hypothetical multi-dimensional sound signature composite, an ambient multi-dimensional sound signature composite, and the like.

Figure 81:
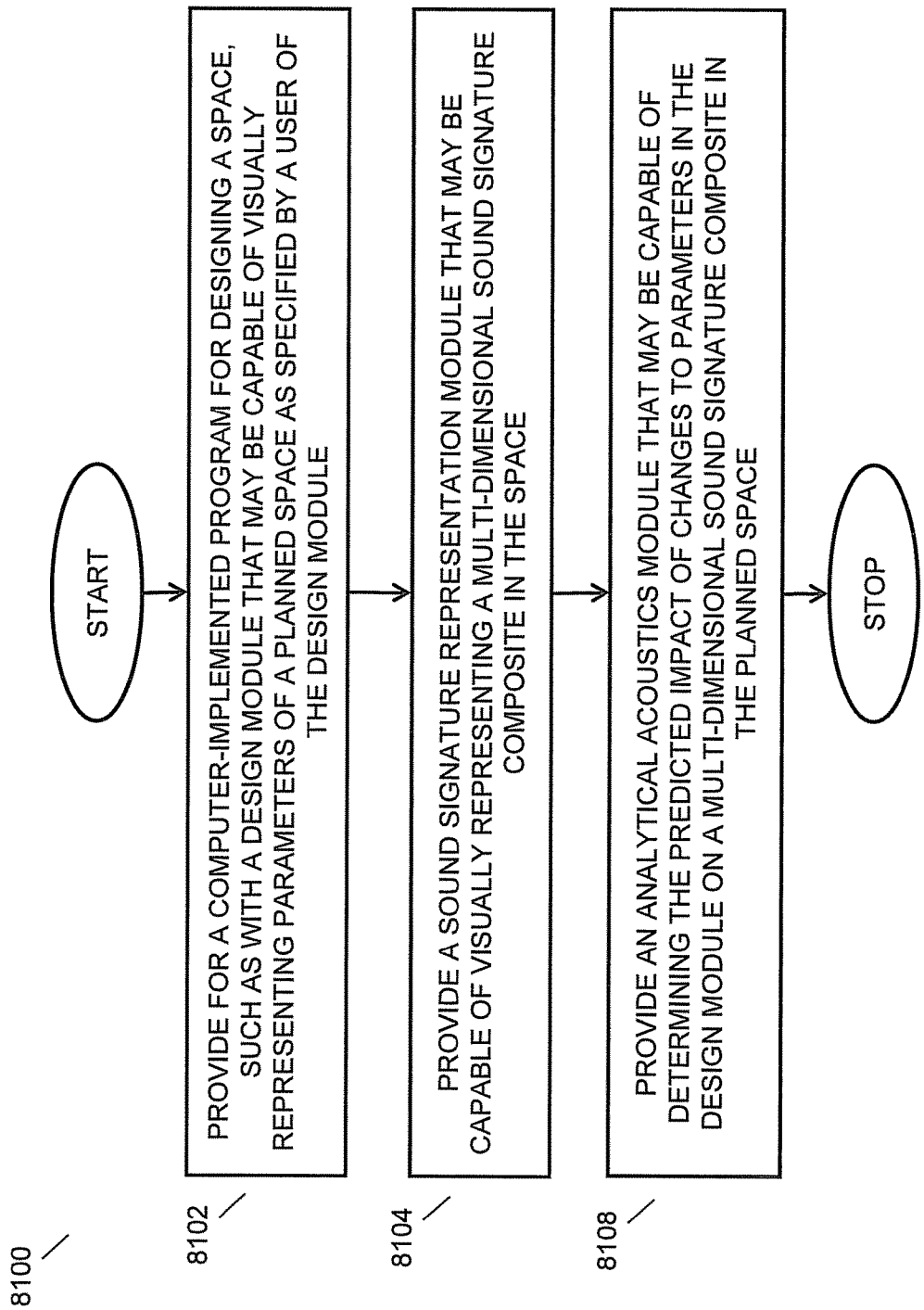
FIG. 81 depicts a flow process diagram in an embodiment of the present invention.

Referring to FIG. 81, in embodiments the present invention may provide for a computer-implemented program for designing a space 8100, such as with a design module that may be capable of visually representing parameters of a planned space as specified by a user of the design module; a sound signature representation module that may be capable of visually representing a multi-dimensional sound signature composite in the space; and an analytical acoustics module that may be capable of determining the predicted impact of changes to parameters in the design module on a multi-dimensional sound signature composite in the planned space. In embodiments, upon modification of parameters of the space in the design module a modified multi-dimensional sound signature may be presented to the user. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature composite; be a hypothetical multi-dimensional sound signature composite, an ambient multi-dimensional sound signature composite, and the like.

Figure 82:
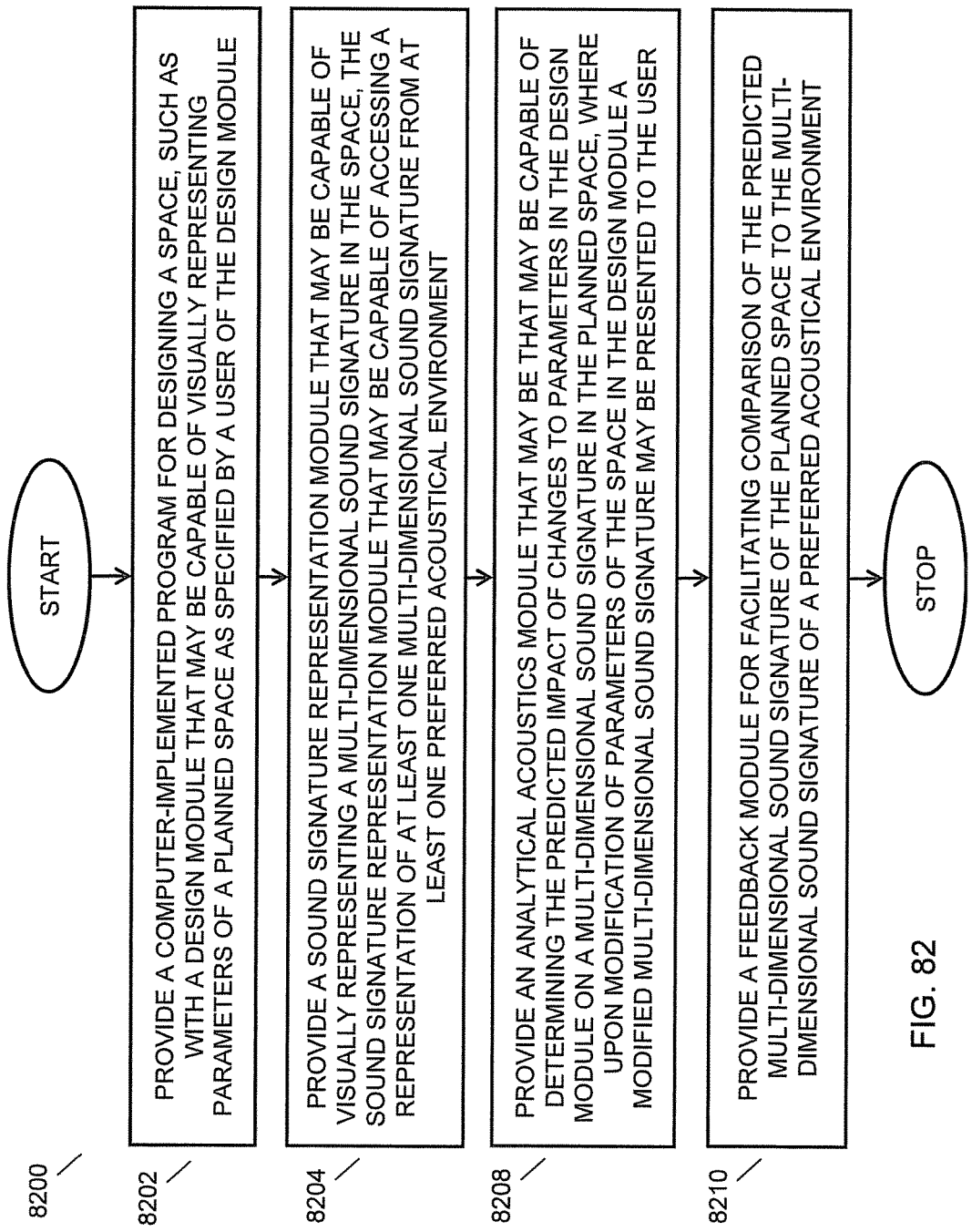
FIG. 82 depicts a flow process diagram in an embodiment of the present invention.

Referring to FIG. 82, in embodiments the present invention may provide a computer-implemented program for designing a space 8200, such as with a design module that may be capable of visually representing parameters of a planned space as specified by a user of the design module; a sound signature representation module that may be capable of visually representing a multi-dimensional sound signature in the space, the sound signature representation module that may be capable of accessing a representation of at least one multi-dimensional sound signature from at least one preferred acoustical environment; an analytical acoustics module that may be that may be capable of determining the predicted impact of changes to parameters in the design module on a multi-dimensional sound signature in the planned space, where upon modification of parameters of the space in the design module a modified multi-dimensional sound signature may be presented to the user; and a feedback module for facilitating comparison of the predicted multi-dimensional sound signature of the planned space to the multi-dimensional sound signature of a preferred acoustical environment. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature composite; be a hypothetical multi-dimensional sound signature composite, an ambient multi-dimensional sound signature composite, and the like.

Figure 83:
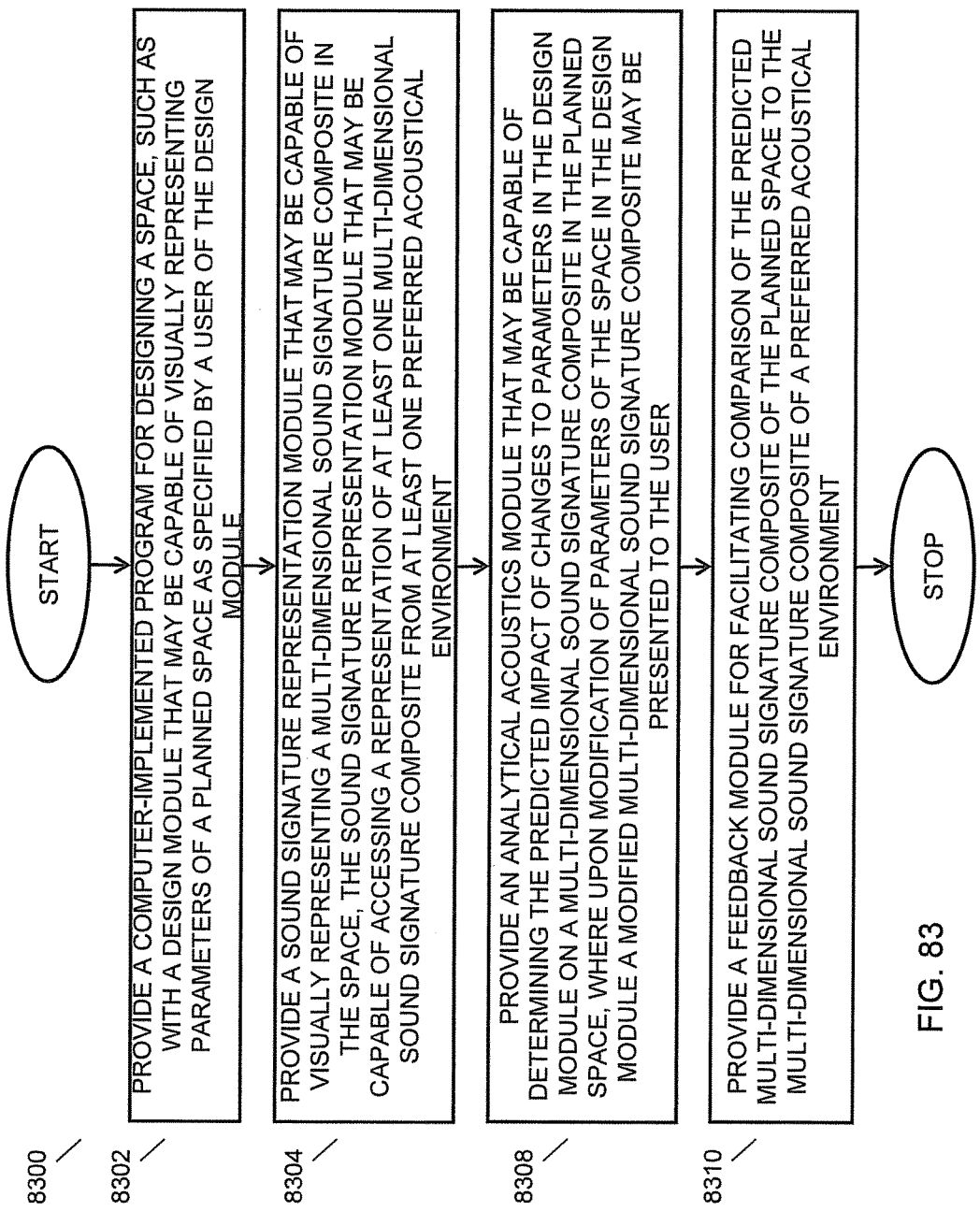
FIG. 83 depicts a flow process diagram in an embodiment of the present invention.

Referring to FIG. 83, in embodiments the present invention may provide a computer-implemented program for designing a space 8300, such as with a design module that may be capable of visually representing parameters of a planned space as specified by a user of the design module; a sound signature representation module that may be capable of visually representing a multi-dimensional sound signature composite in the space, the sound signature representation module that may be capable of accessing a representation of at least one multi-dimensional sound signature composite from at least one preferred acoustical environment; an analytical acoustics module that may be capable of determining the predicted impact of changes to parameters in the design module on a multi-dimensional sound signature composite in the planned space, where upon modification of parameters of the space in the design module a modified multi-dimensional sound signature composite may be presented to the user; and a feedback module for facilitating comparison of the predicted multi-dimensional sound signature composite of the planned space to the multi-dimensional sound signature composite of a preferred acoustical environment. In embodiments, the feedback module may facilitate visual comparison, comparison of reflections from various directions, and the like. The comparison may include a comparison of at least one of timing, amplitude, frequency and direction of reflections between the planned space and the preferred acoustical environment; comparison of primary and secondary reflections from similar directions; and the like. The feedback module may visually present preferred ranges of parameters of the multi-dimensional sound signature. The feedback module may indicate whether a specified parameter may be within a preferred range. The feedback module may suggest modifications that would reduce differences between the planned space and the preferred acoustical space. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature composite; be a hypothetical multi-dimensional sound signature composite, an ambient multi-dimensional sound signature composite, and the like.

Figure 84:
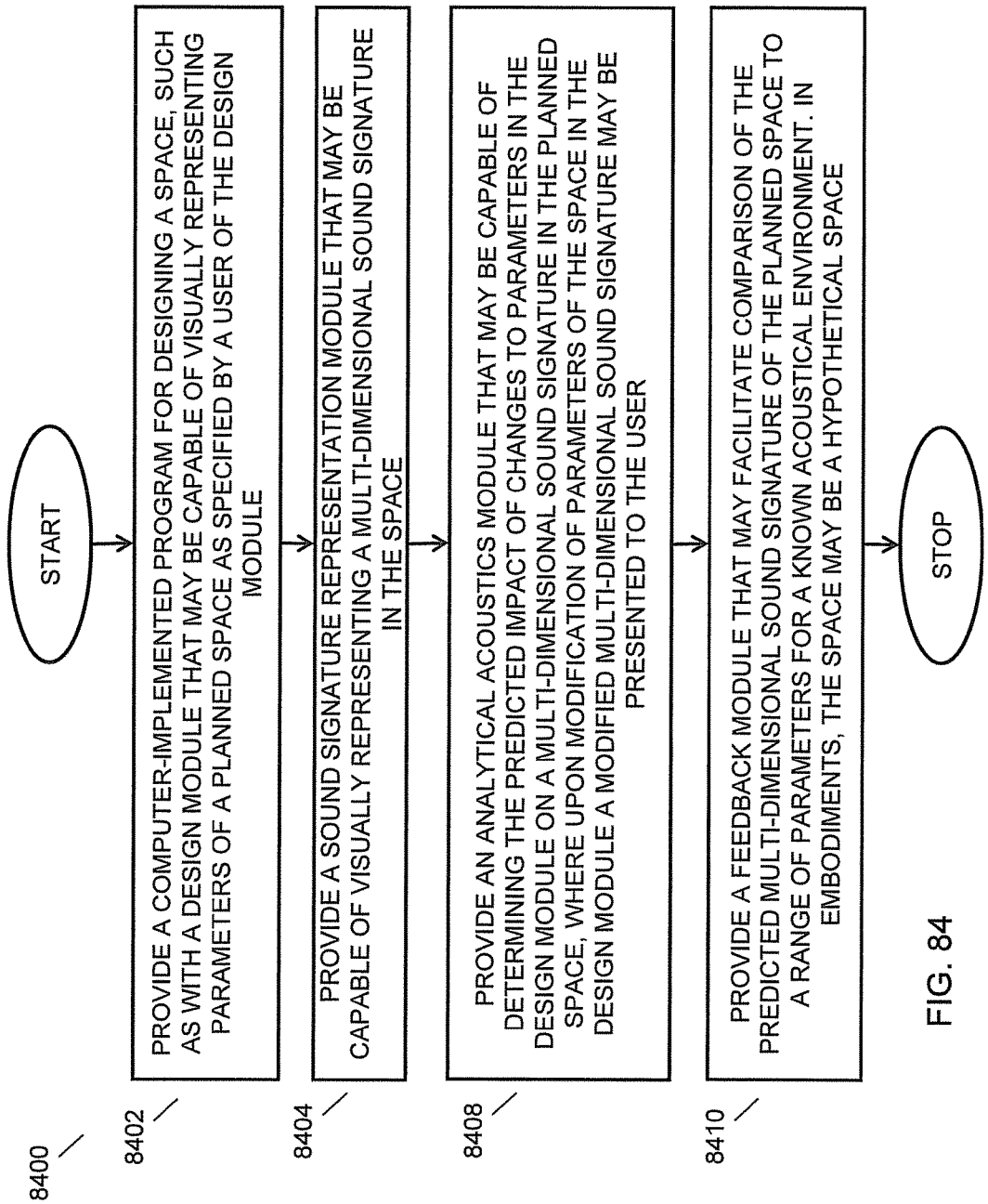
FIG. 84 depicts a flow process diagram in an embodiment of the present invention.

Referring to FIG. 84, in embodiments the present invention may provide a computer-implemented program for designing a space 8400, such as with a design module that may be capable of visually representing parameters of a planned space as specified by a user of the design module; a sound signature representation module that may be capable of visually representing a multi-dimensional sound signature in the space; an analytical acoustics module that may be capable of determining the predicted impact of changes to parameters in the design module on a multi-dimensional sound signature in the planned space, where upon modification of parameters of the space in the design module a modified multi-dimensional sound signature may be presented to the user; and a feedback module that may facilitate comparison of the predicted multi-dimensional sound signature of the planned space to a range of parameters for a known acoustical environment. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature composite; be a hypothetical multi-dimensional sound signature composite, an ambient multi-dimensional sound signature composite, and the like.

Figure 85:
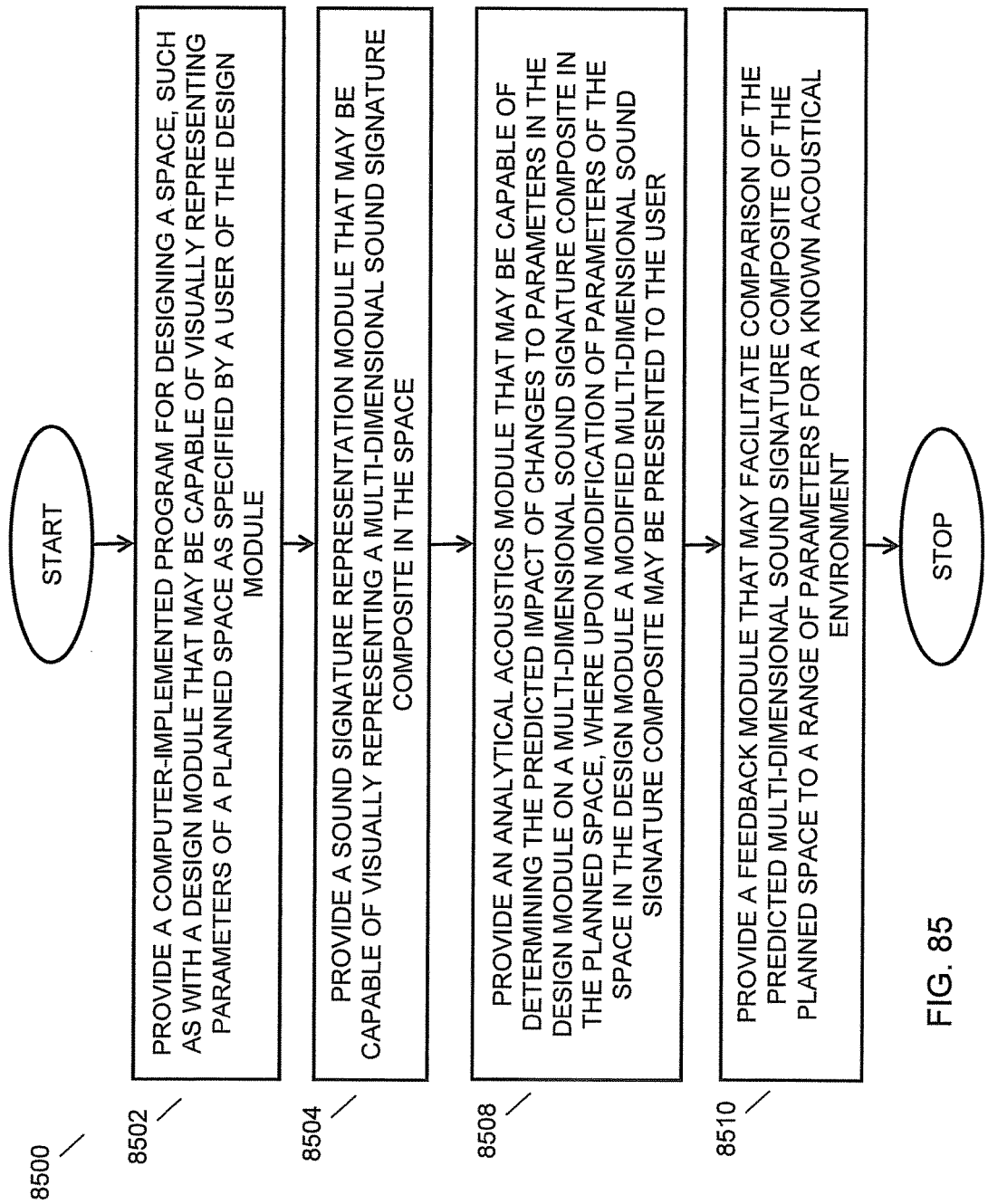
FIG. 85 depicts a flow process diagram in an embodiment of the present invention.

Referring to FIG. 85, in embodiments the present invention may provide a computer-implemented program for designing a space 8500, such as with a design module that may be capable of visually representing parameters of a planned space as specified by a user of the design module; a sound signature representation module that may be capable of visually representing a multi-dimensional sound signature composite in the space; an analytical acoustics module that may be capable of determining the predicted impact of changes to parameters in the design module on a multi-dimensional sound signature composite in the planned space, where upon modification of parameters of the space in the design module a modified multi-dimensional sound signature composite may be presented to the user; and a feedback module that may facilitate comparison of the predicted multi-dimensional sound signature composite of the planned space to a range of parameters for a known acoustical environment. In embodiments, the feedback module may facilitate visual comparison. The feedback module may facilitate comparison of reflections from various directions. The comparison may include comparison of at least one of timing, amplitude, frequency and direction of reflections between the planned space and a preferred set of ranges for such parameters. The preferred set of ranges may be based on a ranges measured in at least one preferred acoustical environment. The comparison may include a comparison of primary and secondary reflections from similar directions. The feedback module may visually present preferred ranges of parameters of the multi-dimensional sound signature. The feedback module may indicate whether a specified parameter is within a preferred range. The feedback module may suggest modifications that may reduce differences between the planned space and a preferred acoustical space. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature composite; be a hypothetical multi-dimensional sound signature composite, an ambient multi-dimensional sound signature composite, and the like.

Figure 86:
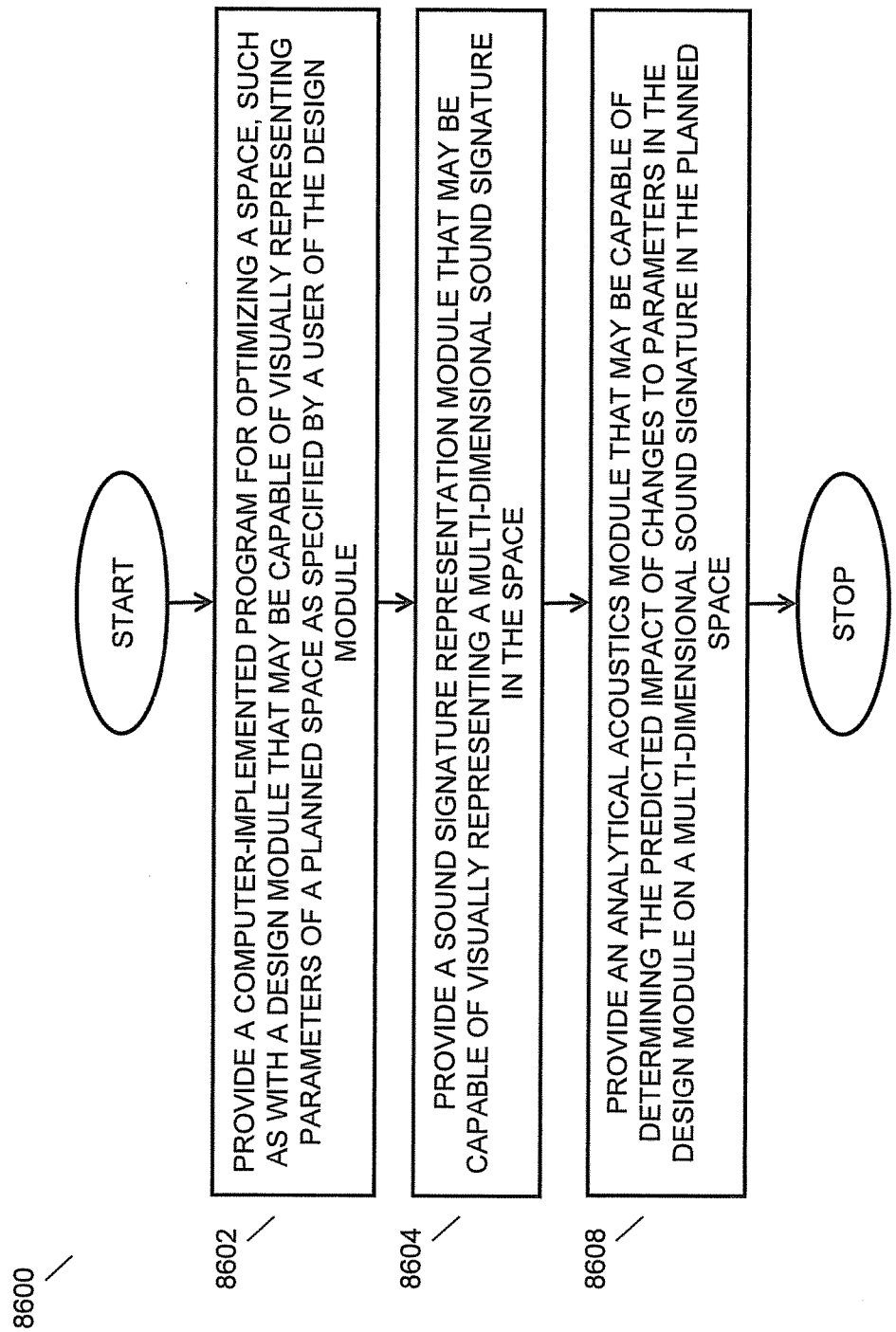
FIG. 86 depicts a flow process diagram in an embodiment of the present invention.

Referring to FIG. 86, in embodiments the present invention may provide a computer-implemented program for optimizing a space 8600, such as with a design module that may be capable of visually representing parameters of a planned space as specified by a user of the design module; a sound signature representation module that may be capable of visually representing a multi-dimensional sound signature in the space; and an analytical acoustics module that may be capable of determining the predicted impact of changes to parameters in the design module on a multi-dimensional sound signature in the planned space. In embodiments, where upon optimizations of parameters of the space in the design module a modified multi-dimensional sound signature may be presented to the user. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature compos-ite; be a hypothetical multi-dimensional sound signature composite, an ambient multi-dimensional sound signature composite, and the like.

Figure 87:
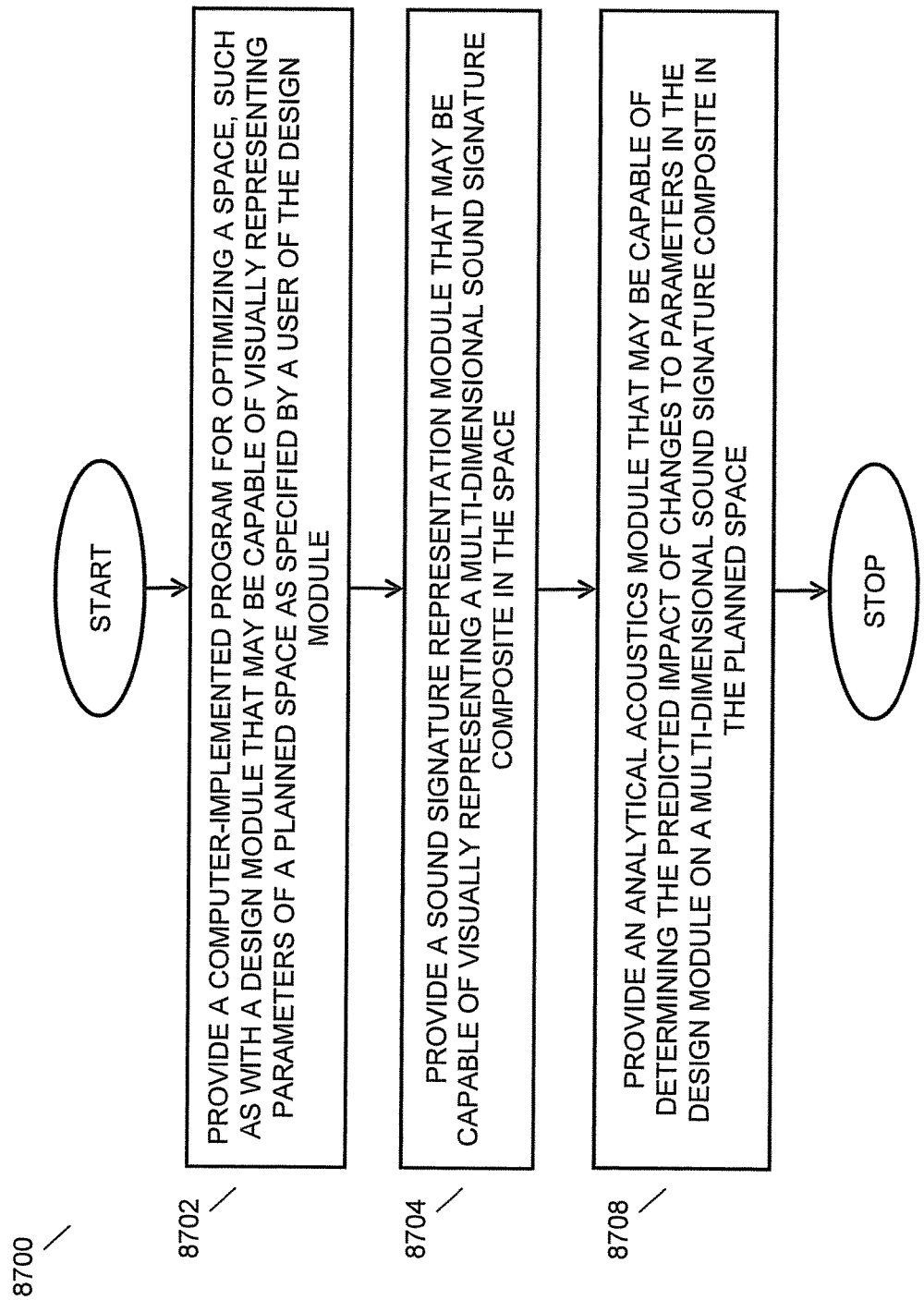
FIG. 87 depicts a flow process diagram in an embodiment of the present invention.

Referring to FIG. 87, in embodiments the present invention may provide a computer-implemented program for optimizing a space 8700, such as with a design module that may be capable of visually representing parameters of a planned space as specified by a user of the design module; a sound signature representation module that may be capable of visually representing a multi-dimensional sound signature composite in the space; and an analytical acoustics module that may be capable of determining the predicted impact of changes to parameters in the design module on a multi-dimensional sound signature composite in the planned space. In embodiments, wherein upon optimizations of parameters of the space in the design module a modified multi-dimensional sound signature may be presented to the user. In embodiments, the space may be a hypothetical space. The manipulation may be combination, decomposition, and the like. The multi-dimensional sound signature composite may be for an actual space, hypothetical space, and the like. The multi-dimensional sound signature composite may result from manipulation of at least one other multi-dimensional sound signature composite. The multi-dimensional sound signature composite may be an idealized multi-dimensional sound signature composite; multi-dimensional sound signature composite for a hypothetical space; a single source multi-dimensional sound signature composite; a multiple source multi-dimensional sound signature composite; a multiple source, multiple location, multi-dimensional sound signature composite; be a hypothetical multi-dimensional sound signature composite, an ambient multi-dimensional sound signature composite, and the like.

In embodiments, the present invention may be utilized to improve the acoustics of a building for performing and cinematic arts that may have a plurality of performance spaces. For instance, the performance spaces may include an opera house to seat several hundred people. In embodiments, the present invention may determine that acoustics of the performance space may be improved if the performance space did not have a full fly tower, but may be equipped with a stage-level scenery tracking staging system. The staging system is intended to change scenes with horizontally moving side flats or shutters and vertically moving borders and rolled backdrops. The stage-level scenery tracking system may allow for more pleasing acoustics due to the absence of fly towers and wide stage wings, both of which may contain sound absorbent materials. These flats may have painted scenery may use perspective effects to create an illusion of three dimensionality whilst enabling rapid and spectacular in-view scene changes. The present invention may provide for software to create multiple flats recreating a 3-D environment from a single 2-D image, where existing systems may require a high personal skill to create the flats. Further, the present invention may provide the ability to create box sets and other modern stage "looks", while making available the speed and range of control inherent in the invention. In embodiments, the present invention may employ motor drive and control technology to provide precise and flexible control, a wide range of speeds, greater reliability, and less noise than a manually operated system.

In embodiments, the present invention may provide for a stage-level scenery flat tracking system as a part of the staging system. In embodiments, an important element of the staging system may be the 'chariot' used to move the canvas flats on and off stage. For example, there may be a number of groups or ranks of chariots, such as six groups of four chariots, and tracks on each side of the stage. This would enable four completely different scenes to be pre-loaded and rapidly changed in view. If more scenes or partial scenes are required for a particular show, then some of the timber flats may be swapped during intervals between acts by stage hands. Storage space for additional flats may be provided close by to minimize manual handling.

In embodiments, the design for the chariot system of the present invention may determine precisely how close together the side flats may be packed without compromising clean and reliable operation. In embodiments, the chariot system of the present invention may dictate that a the packing of the tracking system be tight enough such that a new more rigid flat construction may be required so that the flats do not touch one another when different flats on different tracks are moved past one another. In embodiments, the present invention may provide a flat construction that enables closer packing of the chariot tracking.

Figure 88:
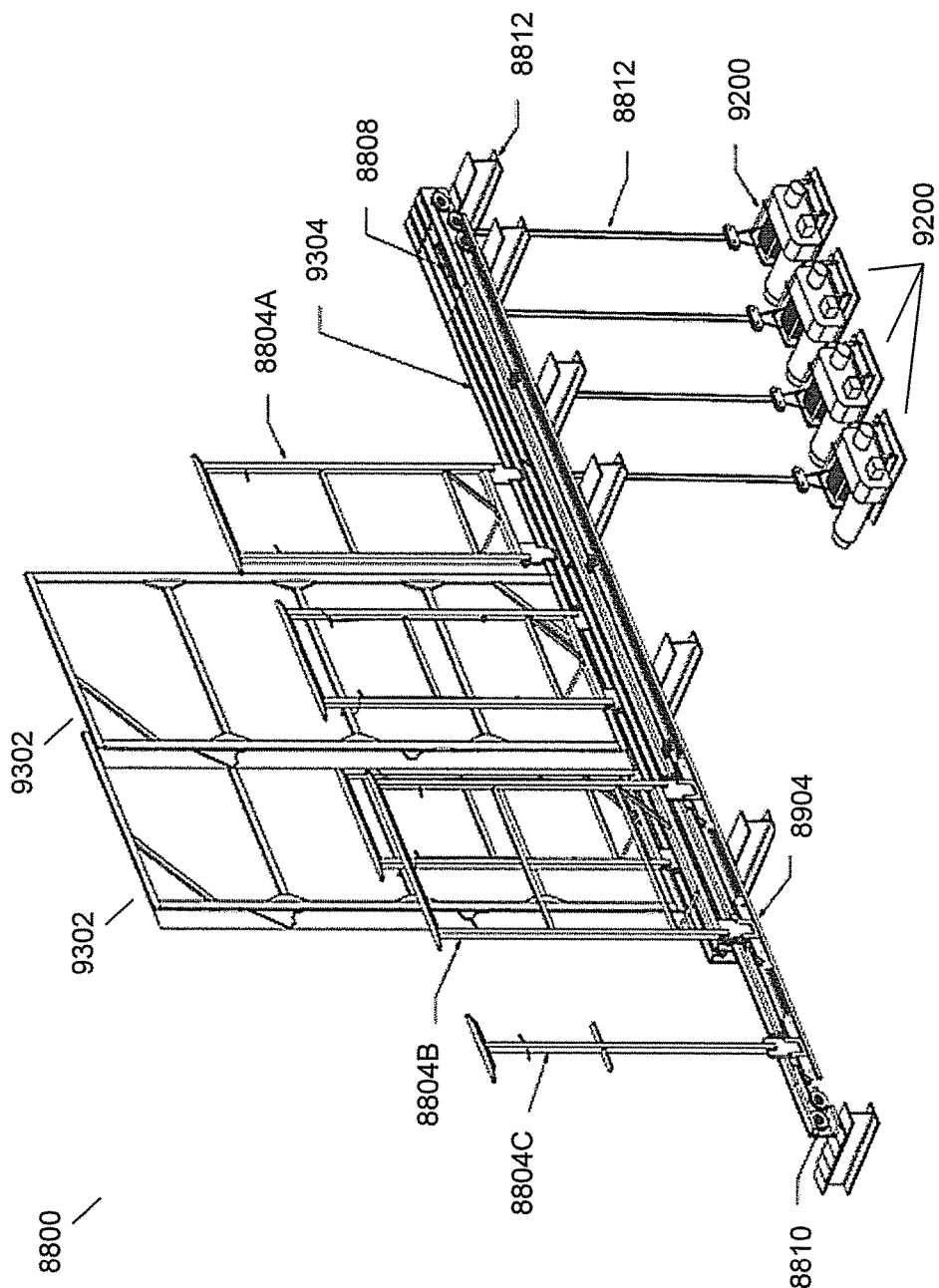
FIG. 88 depicts an embodiment illustration of multiple scenery flats and multiple motor drive facilities in a stage-level scenery track system.

Referring to FIG. 88, an embodiment example of a stage-level scenery flat tracking system, including four individual tracks 9304, four motor drives 9200 (also referred to as winches), two scenery flats 9302 mounted on support frames 8804 (where support frames may come in a plurality of sizes, such as a standard support frame 8804A, a wide support frame 8804B, a narrow support frame 8804C, and the like), hauling rope 8812 connecting a motor drive 9200 with a carriage 8904 (where the carriage may be accessed through open slots 8808 in the tracks 9304, return pulleys to carry the hauling ropes around the end of the tracks 9304, and the like. In embodiment, a typical group of four tracks and associated staging equipment may indicate how these may fit into a full scheme of perhaps 48 tracks. In embodiments, with such a large number of tracks, the present invention may provide for new ways to dampen noise associated with the movement of the flats mounted in the tracks. For instance, if there were only a small number of tracks, being run by a small number of motor drives, the noise may not be an issue to the quality of the performance. However, in embodiments of the present invention, the larger number of tracks, and associated motor drives, may dictate that the present invention provide a substantially quieter tracking system.

Figure 89:
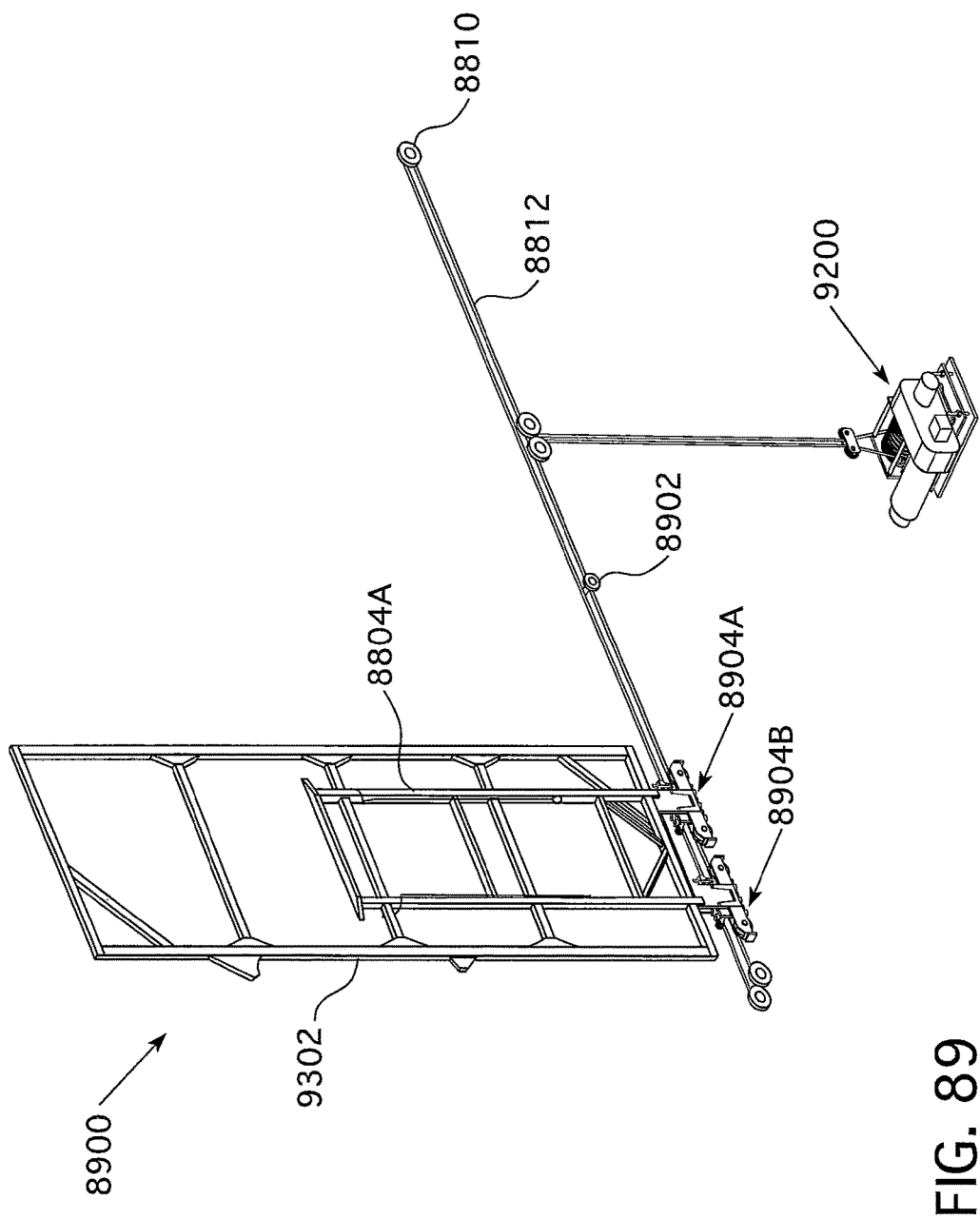
FIG. 89 depicts an embodiment illustration of a single scenery flat and motor drive facility in a stage-level scenery track system.

In embodiments, a single chariot track system may be a stand-alone unit that enables one wing flat to be independently motor driven in and out of view from the side of the stage. FIG. 89 illustrates an embodiment single chariot track system (shown without the track 9304 itself), where in addition to the components introduced in FIG. 88, there are both carriages 8904A clamped to hauling rope and carriages 8904B that are free running. Also, an idler pulley is shown in a mid portion of the track run. The wing flat may be supported from behind by a support frame that engages in a pair of carriages through a narrow slot in the stage floor. The carriages may run on and be held vertical by a very substantial track supported on structural steel beams below the floor. The carriages may be moved by a hauling rope connected to a motorized winch located in the area below the stage. Each track may also provide support for the slotted timber stage floor.

In embodiments, multiple chariot tracks may be mounted as close together as possible to form a group, and a number of groups may be provided on both sides of the stage to form ranks. Most of the tracks may only extend part of the way from the wings onto the edge of the stage area. However, one track in each group may extend all the way to the stage centre line. This track may be provided with an additional carriage that may carry wider flats or shutters used to close off the back of the scene or for other effects.

In embodiments, the number of chariots and tracks in use may vary from show to show and therefore the support frames may be made easily removable so that the slots in the floor may be filled in. One further type of track may be required that runs across the full width of the stage. This might be provided with multiple, such as two or three, independently controllable carriages used to carry scenic elements, such as ships, from one side of the stage to the other. This may not be pursued further at this stage.

In embodiments, the floor track system of the present invention may have advantages over other configurations. For instance, an overhead track system may not be appropriate because the flats often have profiled tops that must be visible in front of the borders. This profiled top edge may be an essential dividing line between free standing scenic elements such as houses or trees and ceiling or sky borders behind Overhead tracks cannot therefore be hidden behind the borders in the conventional contemporary manner. Horizontal support from the side walls of the stage may not be appropriate because it could hamper the movement and storage of flats in the side stage areas. The design intent is that the perspective scenery may move in a smooth, theatrical manner. This must be possible at any time during the performance, including moments of pianissimo music or theatrical silence.

In embodiments, to achieve the required experience, it may be essential that noise from the movement of the scenery does not distract the audience, as this may break the bond of illusion between the listener and the stage. The chariot may be controlled for noise to meet these needs.

In embodiments, a number of support frames for the flats may be required in standard, narrow, and wide formats. The standard and wide format may have a number of legs and may be used to support normal wing flats. The narrow format may have one leg and may be used to support thinner items of scenery like trees and also to provide additional support to extra wide items such as shutters that overhang the other support frames.

In embodiments, the present invention may provide a computer program/system that allows CAD design of the scenery flats that may permit the creation of trompe l'oeil effects such as street scenes and multiple vanishing point effects that were not possible in historical renditions of the scenery (which typically showed single vanishing-point perspective only).

Support frames may be fabricated from thin walled steel hollow sections, extruded aluminum tube with welded joints, or any other similar material. The choice of materials may ensure that sufficient support is provided to the flat, but at minimum weight to ease handling. Appropriate bracing to stiffen the frames may be included.

Figure 90:
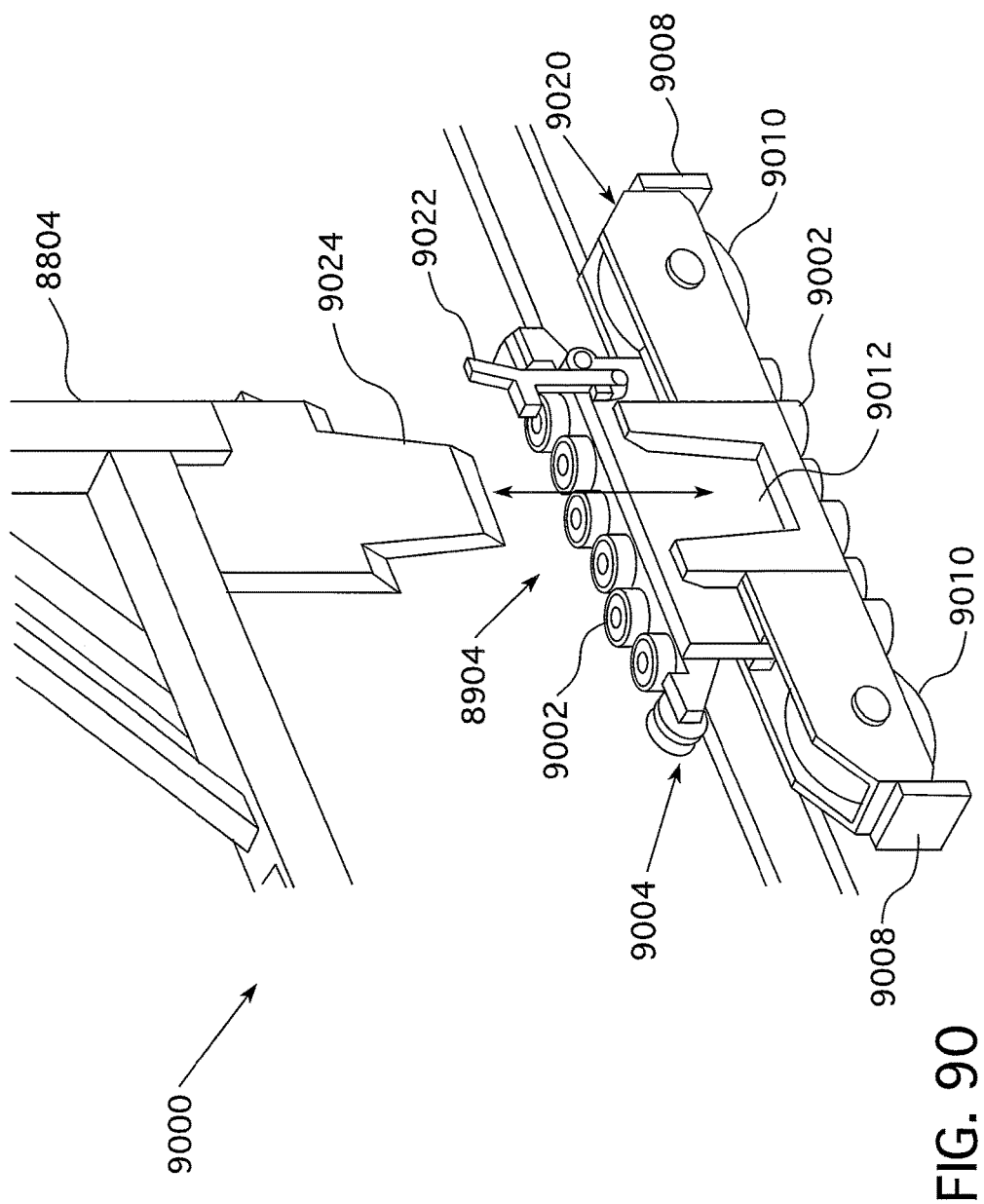
FIG. 90 depicts an embodiment illustration of a carriage with spade removed in a stage-level scenery track system.
Figure 91:
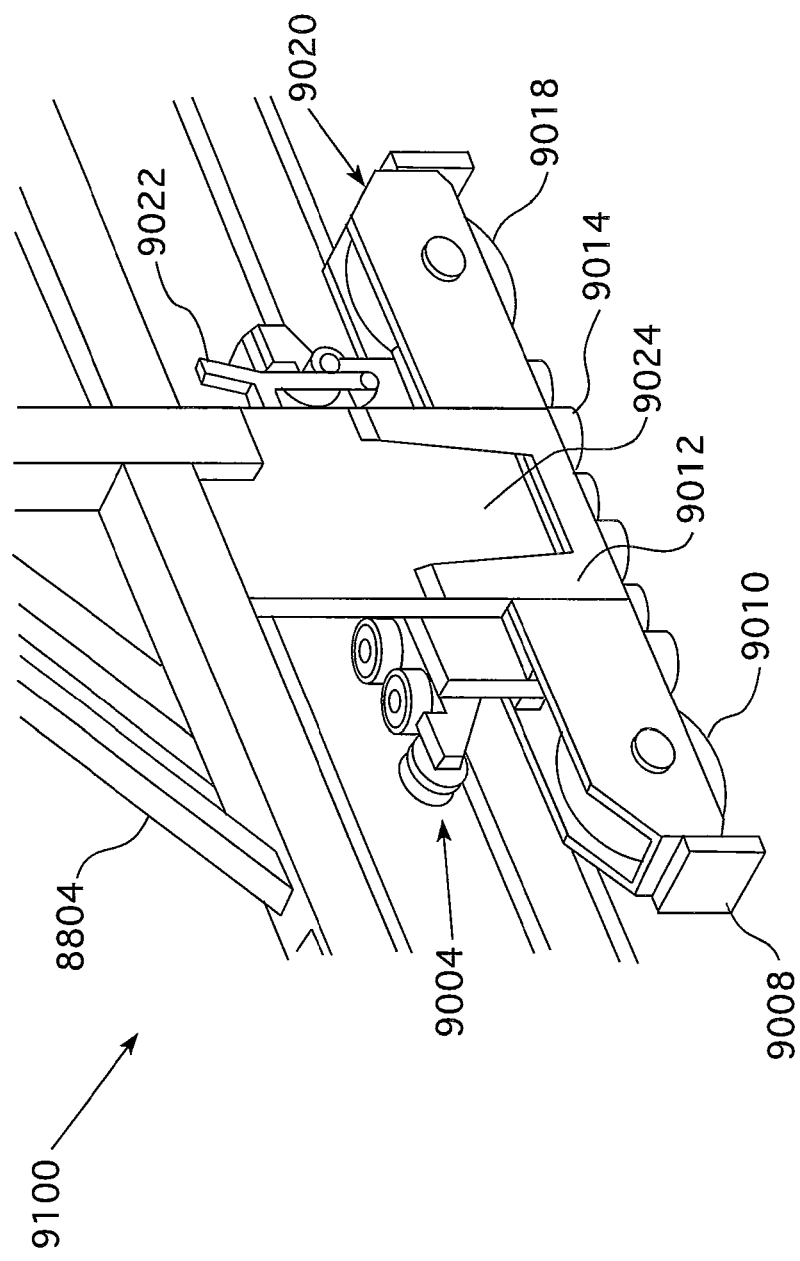
FIG. 91 depicts an embodiment illustration of a carriage with spade inserted in a stage-level scenery track system.

In embodiments, the bottom of each frame may be provided with machined tapered steel spades which locate securely into matching sockets in the carriages. FIG. 90 shows one embodiment of the tapered steel spade 9024 as attached to the bottom of a scenery flat mounted on a removable support frame 8804, and a tapered socket 9012 for accepting the spade 9024 in the track carriage. Also shown are a plurality of components associated with the carriage 8904, including horizontal guide wheels 9002, vertical guide wheels 9004, track cleaning wipers 9008, vertical load wheels 9010, carriage frame 9020, latch mechanism 9022, and the like. FIG. 91 shows the flat mounted on the carriage 8904, where the tapered spade 9024 is mounted in the tapered spade socket 9012. In embodiments, all the spades 9024 and sockets 9012 may be entirely interchangeable. To minimize the width of the floor slots the spades 9024 may be no thicker than absolutely necessary, but they must be stiff enough to prevent excessive sway in the support frames 8804. The spades 9024 may fit precisely into the sockets 9012 so that there is no perceptible movement. In embodiments, a tapered dovetail arrangement may be chosen to connect the support frame spade securely to the carriage 8904 to allow easy removal. In an example, a steel plate ¾ inch thick and at least 6 inch wide may suffice and may allow 1 inch wide floor slots.

In embodiments, the top rear of the frames there may be a smooth profiled nylon bumper bar which may be intended to guide adjacent flats past one another without clashing or jamming in case of some sway. Two toe hooks may support the bottom rail of the flats and prevent the flats from sliding off. The toe hooks may be set as close as possible to the stage floor, without scraping, so that the gap below the flats is minimized. Suitable pegs and clam cleats may be provided to enable the upper part of the flats to be held securely against the frame with two throw lines, operated from stage level.

In embodiments, carriages may be used singly, in pairs, or a group to carry the different sizes of support frame described herein, and may be swapped around between tracks. The carriage frames may be fabricated from heavy machined steel plates and contain tapered sockets to receive the support frame spades. An additional foot operated spring loaded latch mechanism or other fixing may be provided to prevent the support frames from lifting under strong acceleration or braking. The carriage frames may be sized to transmit the load from the support frames into the guide wheels with minimum deflection. Each carriage may be provided with a sufficient number of polyurethane tired guide wheels to allow smooth movement along the guide tracks whilst preventing any discernable lateral movement or wobble between the carriage and the track. The wheels and axles may be of the largest diameter that can fit in the available space and be arranged to resist both vertical loads and twisting moments in all axes. The wheels may be fitted with sealed for life, grease filled bearings or any other similar material that requires no maintenance. Damaged wheels may be easy to replace. The carriages may be protected against the ingress of dust and dirt by shields. Brushes, wipers, or any other similar device may be fitted to ensure the path of the wheels is kept clean. The carriages may effectively be silent in operation.

In embodiments, each carriage may be fitted with a clamp device or any other attachment device to attach to the hauling rope. Carriages may either be driven directly by the hauling rope, or be free floating and be linked through the support frame. In embodiments, the rope clamping device may be simple to operate so that carriages may be connected and disconnected from the hauling rope by the users as required.

In embodiments, guide tracks may be fabricated from heavy steel sections and may be designed to provide as much lateral support as possible to the carriages and support frames within the limited space available. Note that horizontal bracing may not need to be applied to the top of the tracks because of the close spacing. The tracks may minimize any tendency for the carriages to twist or rotate, but allow smooth, quiet horizontal motion. Care may be taken to avoid over constraint and any possibility of the carriage binding or locking.

In embodiments, the guide tracks may have a corrosion resistant finish that does not require lubrication. Running surfaces may be straight, smooth, and free from irregularities. Consideration may be given to shaping the tracks to make them self cleaning or at least to prevent debris from accumulating and getting picked up by the wheels. Apertures may be provided for dirt to fall through.

In embodiments, each track may be fabricated complete with stiffeners and base plates and may be bolted securely to the structural support beams with sufficient fasteners to eliminate deflection. To accommodate the raked stage floor, the height of each adjacent track may be slightly staggered. It may be possible to remove individual tracks for maintenance. The ends of the tracks may be cut back to enable access to the carriages and hauling system from trap doors in the flooring. It may be possible to add or remove carriages from one end of the track. In embodiments, a timber batten may be screwed or bolted to the top of each track for floor fixing. The top face may be chamfered to match the rake of the stage.

In embodiments, acoustic damping or absorbent material may be used to eliminate ringing or other noise radiation from the track. Suitable products may include vibration damping compound. Alternatively, voids may be packed with compressed mineral wool (e g minimum uncompressed density 3 lbs/ft$^3$ (48 kgm-3), protected with a perforated metal panel (e.g. >20% perforation, maximum hole diameter ⅛ in (3.2 mm).)

In embodiments, a low stretch synthetic plaited rope such as Polyester or Dyneema may be used to haul the carriages back and forth. Alternative methods and materials may be considered; bearing in mind that very quiet operation may be paramount. The hauling rope may be wound in a single layer on a spiral grooved winch drum. Both ends of the rope may be fixed to the winch drum to ensure no creep can occur. From the winch the continuous rope may run up around diverter pulleys, along the track, around return pulleys and back down to the winch. Idler pulleys may be needed along the track to support the rope and prevent sagging and slapping. The hauling rope and pulleys may be generously sized for the application in excess of the manufacturers' recommendations. Care may be taken to calculate the probable stretch in the rope under all operating conditions. Pulleys may be fitted with sealed ball or roller bearings and be maintenance free, but replaceable if required. Pulleys may be protected with guards or shields to prevent the ingress of dirt or debris that might cause damage.

In embodiments, appropriate tensioning devices may provide both sufficient pre-tension and automatic dynamic tensioning without any need for further attention. In particular, in either direction of operation and during changes of direction, tension may be maintained in the rope on both sides of the drum to ensure that it winds on and off the winch cleanly. Nonetheless, keepers or rollers may also be fitted to the winch and pulleys to ensure that a slack rope cannot become dislodged.

Figure 92:
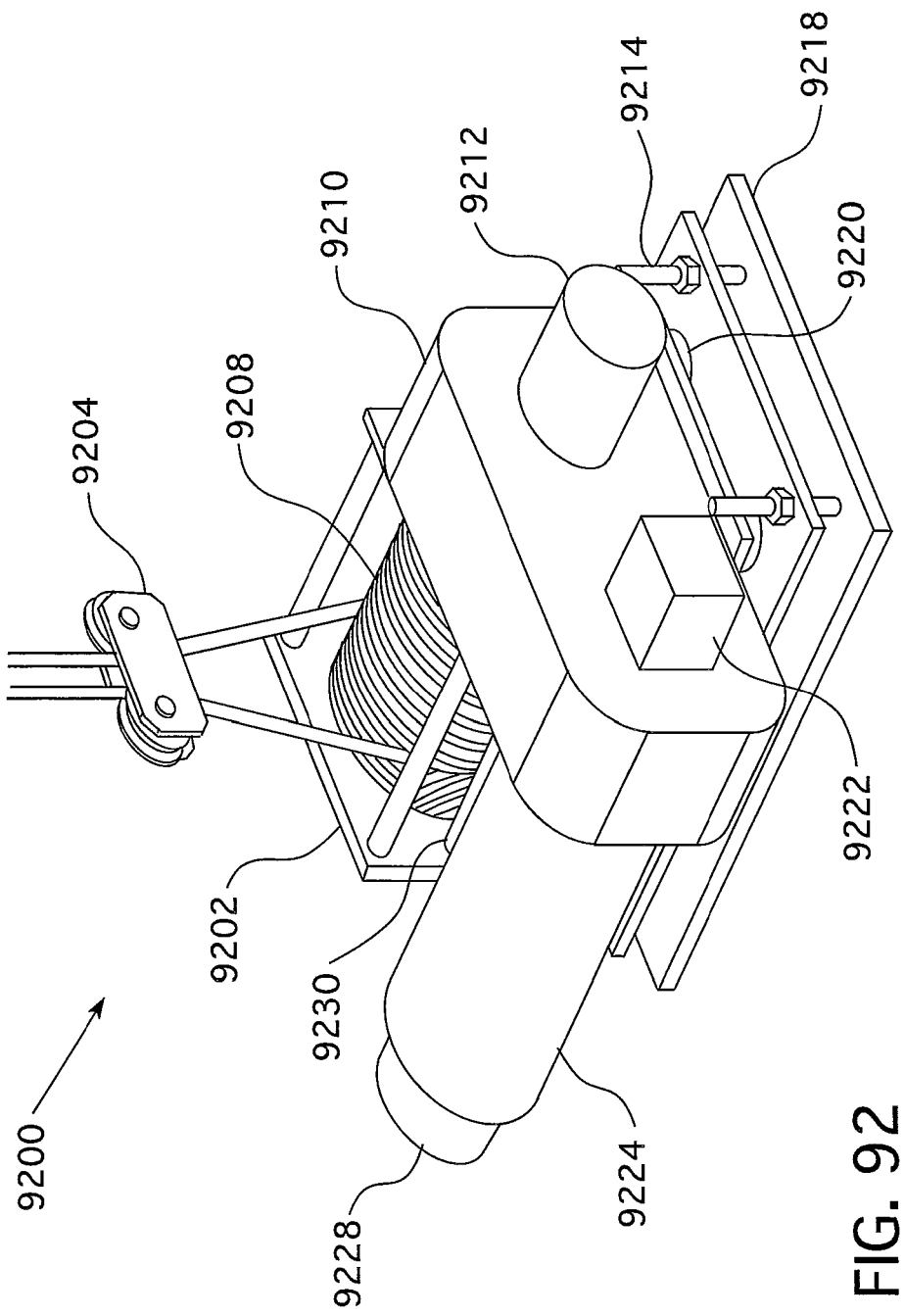
FIG. 92 depicts an embodiment illustration of a motor drive facility in a stage-level scenery track system.

In embodiments, the hauling system may essentially be smooth and silent in operation without any significant backlash and may be maintenance free. Referring to FIG. 92, a flux-vector or servo type motor and variable speed drive unit may be selected that may be controlled with a high degree of precision. Speed, acceleration, direction, and position may be continually and accurately monitored and controlled through closed loop feedback. Acceleration and deceleration may be smoothly ramped and the rate or profile may be adjustable by the control system. An absolute encoder may provide positional information without any need for re-indexing on start-up. It may be possible to synchronize two or more carriages running in adjacent tracks, so that they are able to carry a single heavy shared load.

In embodiments, a holding brake or the like may be provided to ensure the carriage is held in a fixed position when the system is powered down. Emergency braking under e-stop may be ramped to avoid damage to the scenery. Brakes may be specifically designed for theatrical use and shall operate silently. Independent normal and over travel limit switches may provide protection against mechanical damage regardless of other control system faults or errors. An overload clutch or other device may be fitted to prevent damage to the system if an obstruction blocks or jams the movement of a carriage in either direction. The overload device may be adjustable so that it can be set by the users to match the loads being carried and the speed of operation required for a particular production.

In embodiments, In the case of power failure, drive or control system malfunction, it may be possible to move the carriage by hand by simply pushing the support frame at stage level. A simple brake release mechanism may be provided. If movement is restrained by a motor or transmission that does not easily backwind, then a simple clutch release mechanism may be required.

As shown in FIG. 92, and in embodiments, a motor drive 9200 is shown, including a winch frame 9202, floating tensioner 9204, grooved winding drum 9208, low noise gear box 9210, encoder 9212, rope tensioning adjustors 9214, mounting plate 9218, resilient vibration isolators 9220, limit-switch box 9222, servo motor 9224, brake 9228, roller keeper 9230, and the like. In embodiments the motor drive 9200 unit may be made to be as quiet as possible, so as to accommodate the needed theatrical environment given the relatively large number of control motors, or winches, of the present invention. All the components may be selected with low noise as a primary consideration. The unit may be mounted on a substantial base frame with resilient mountings and couplings, and flexible power and control cable connections to minimize noise and vibration transmission. For example, the vibration isolators may be selected by a specialist to give ≥95% isolation efficiency at the lowest operating speed of the motor, considering the span and construction of the supporting floor structure. Mounting on an inertia pad may also be considered necessary. The motor and gearbox unit may be enclosed in a sound reducing enclosure. For example, this may be a perforated metal inner lining, 2 in (50 mm) sound absorbing material and a sheet steel outer enclosure, with acoustic seals to opening panels. The unit may also be convection cooled, with no fans. Consideration may be given to how the enclosure is sealed at the point where the hauling ropes enter and leave. This may mean that fleet angle compensation may be included in the winch mechanism to make sure that the ropes leave the enclosure at a fixed position. In embodiments, the system may include winches mounted below the stage. The position of the winches and the distance from the tracks may also be variable so that adjustments may be made.

In embodiments, the motor and transmission system may essentially be maintenance free. If lubricants need to be checked or changed then proper access may be provided and if there is any possibility of oil leakage then built in drip trays may be included. In embodiments, stand alone local control may be included. This may include the ability to move between user selectable stopping positions at a range of speeds or times and with variable rates of acceleration.

In embodiments, a computerized theatrical 'power flying' type motion control system may be used to provide sophisticated programmable control of each track and other scenic elements. In embodiments, this computer controlled tracking system may control the movements of scenic elements, such as provided on scenery flats and mounted on stage tracking, that allow for their motion as individual items, or in combinations of items, as programmed through the system.

In embodiments, the mechanized computer controlled tracking system of the present invention may have greater synchronization of scenery flat movement, at higher reliability, and at higher speeds than previous systems. In embodiments, the control system may move and synchronize all, one, or any combination of flats to precise locations, at precise points in a show, and at precise speeds. In embodiments, the control system may provide for greater repeatability of multiple flat movements, such as to allow repeat performances with minimal crews.

In embodiments, the system may be supported on a steel structural framework provided as part of the building structure. A steel base frame may be required to support a group of chariot system tracks and winches as a standalone unit, complete with a section of flooring. Ideally the frame may be broad enough to avoid the necessity for any fixings to the floor. Rubber foot pads and level adjustable feet may be provided.

In embodiments, to better ensure minimum noise, vertical fascia panels closing off the sides of the mechanism and sealing to the floor may be needed. These fascia panels may have a surface mass greater than or equal to the surface mass of the stage floor and may be sealed to the floor surface with a compressed neoprene strip or similar.

Figure 93:
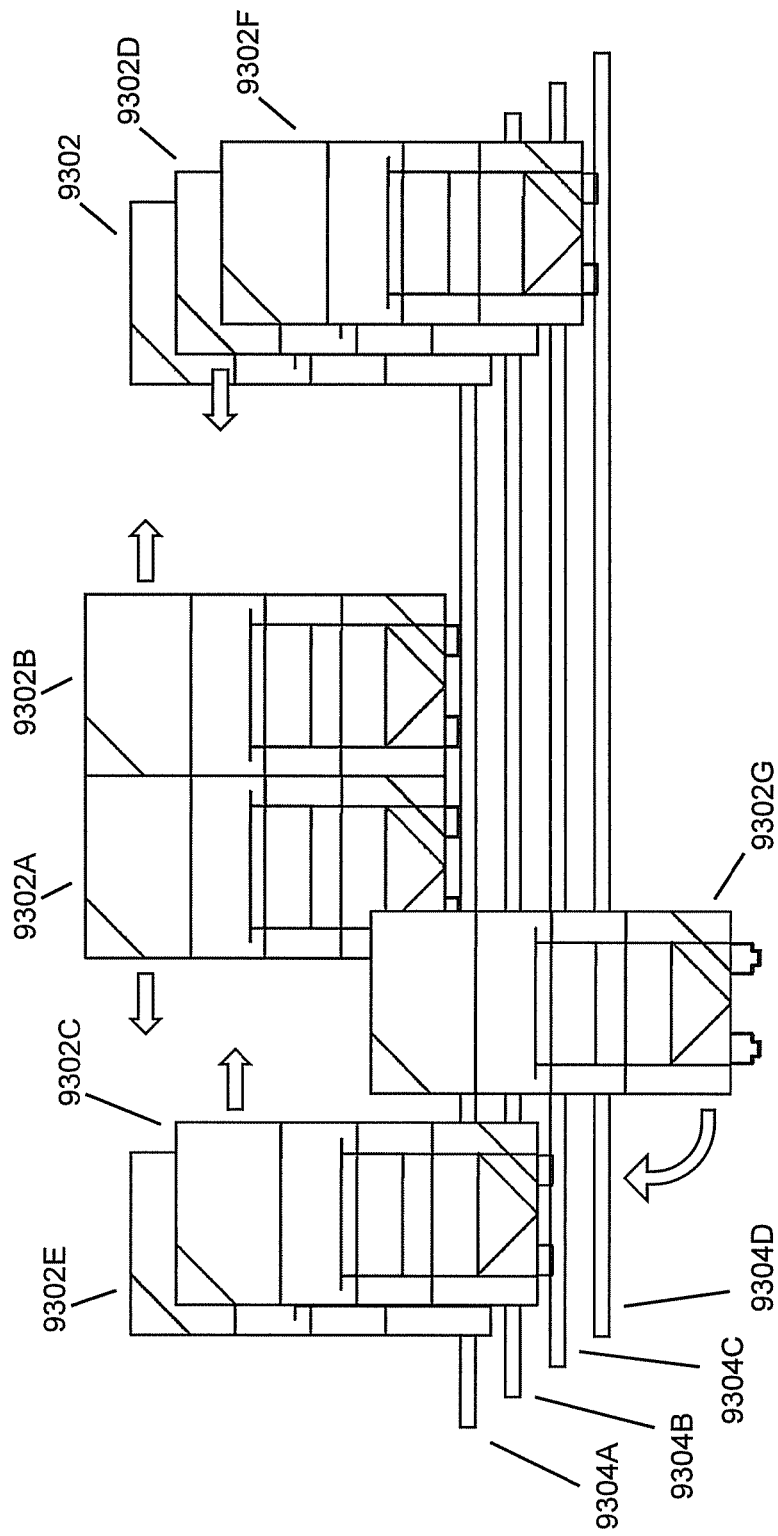
FIG. 93 depicts an embodiment illustration of rapid scenery changing in a stage-level scenery track system.

In embodiments, the present invention's scenery flat construction and configuration as described herein may provide for rapid scene changes, such as in or out of view. Referring to FIG. 93, an embodiment example of a plurality of scene flats 9302A-F are mounted on a plurality of tracks 9304A-D, and where a single flat 9302G is shown in a position ready for mounting in a track 9304D. In embodiments, this configuration may represent a rapid scene changing configuration, where, for instance, flats 9302A and 9302B represent flats for a current scene, and flats 9302C and 9302D represent flats for a next scene. In this instance, flats 9302A and 9302B may be rapidly moved to the left and right respectively when the scene is to change from the current scene to the next scene. At the same time, flats 9302C and 9302D may be rapidly moved to the right and left respectively. This movement may be enabled by the motorized and computer controlled track system as described herein. In embodiments, flats 9302 may be moved together, such as in pairs, groups, in combination, and the like, or singly along the tracks 9304. In embodiments, the movement profiles of a flat 9302 may be programmed for control through the computer controlled track system.

Continuing to refer to FIG. 93, rapid scene changes may also be enabled through the spade and socket system as described herein. For instance, scenery flat 9302G may be rapidly and securely inserted in track 9304D, scenery flat 9302F may be rapidly removed from track 9304D, and the like. In embodiments, the configuration shown in FIG. 93 may show only a relatively small number of tracks 9304 and flats 9302, and the present invention, through its high density track system, may support a plurality of tracks 9304 and flats 9302 in support of a performance or multiple performances in a space. In embodiments, the present invention may provide for a rapid scenery changing system that accommodates a significant number of tracks 9304 and flats 9302, where the track system is both quiet and easy to change despite the significant numbers of associated equipment.

Figure 94:
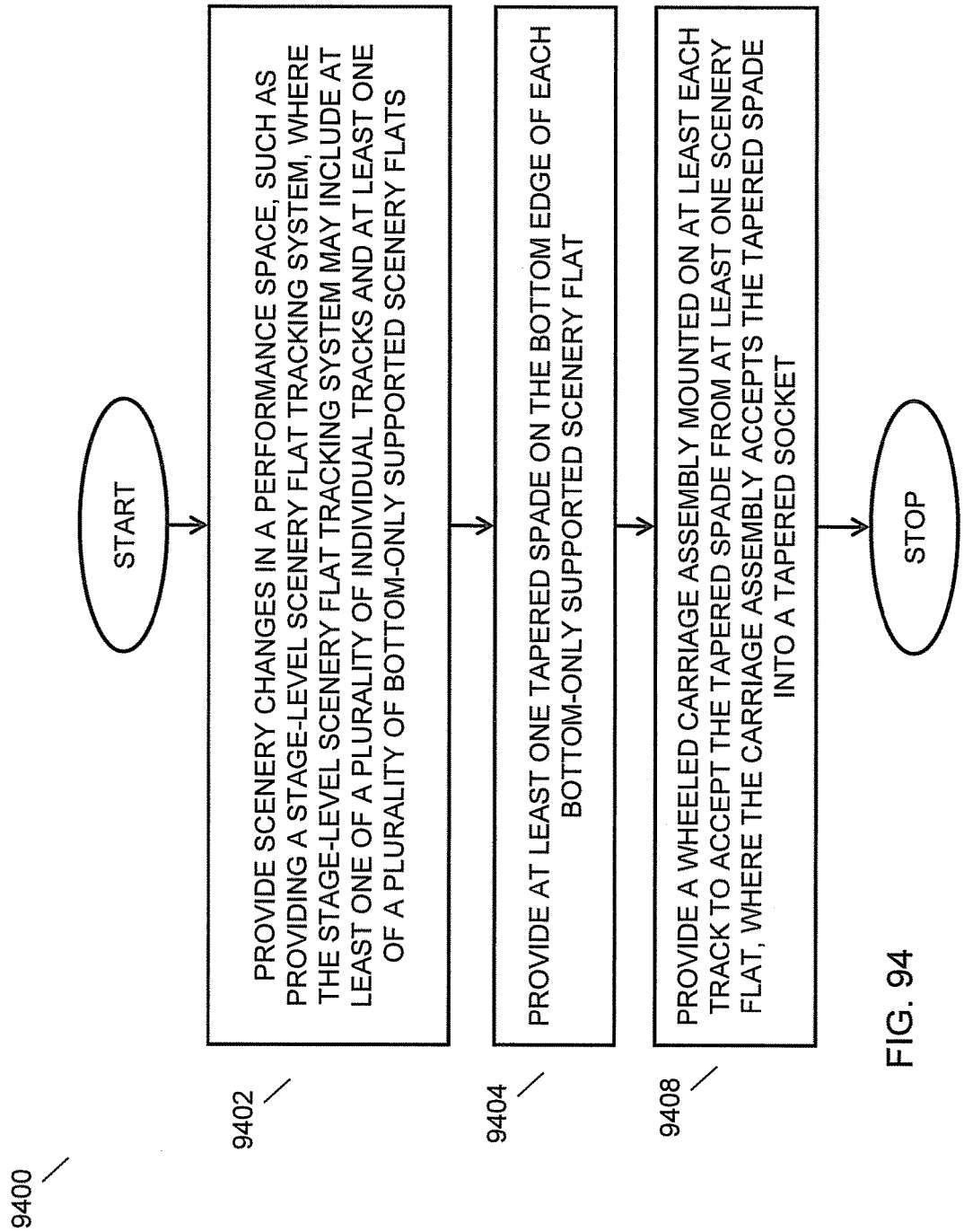
FIG. 94 depicts a flow process diagram in an embodiment of the present invention.

Referring to FIG. 94, in embodiments, the present invention may provide mounting of a flat to the tracking system by way of a tapered spade/socket system. The present invention may provide scenery changes in a performance space 9400, such as providing a stage-level scenery flat tracking system, where the stage-level scenery flat tracking system may include at least one of a plurality of individual tracks and at least one of a plurality of bottom-only supported scenery flats, provide at least one tapered spade on the bottom edge of each bottom-only supported scenery flat, provide a wheeled carriage assembly mounted on at least each track to accept the tapered spade from at least one scenery flat, where the carriage assembly accepts the tapered spade into a tapered socket, and the like. In embodiments, the carriage assembly may include a latch mechanism to secure the tapered spade in the tapered socket. The plurality of individual tracks may be closely spaced. The carriage of the stage-level scenery flat tracking system may be driven by a motor drive system. The motor drive system may be a computer controlled motor drive system. The motor drive system may be a sound damped motor drive system. The drive system may include a plurality of sound dampened motor drives, where each of the plurality of sound dampened motor drives may control a single carriage, a plurality of carriages, a combination of carriages, and the like. The bottom-only supported scenery flats may be provided a rigid construction, where the rigid construction may enable scenery flat motion of the bottom-only supported scenery flats on adjacent tracks of the stage-level scenery flat tracking system without physical contact between bottom-only supported scenery flats on adjacent tracks while in motion. The tapered spade may be mounted into the tapered socket to enable rapid scenery changes, where the rapid scenery change may be in view of the audience.

Figure 95:
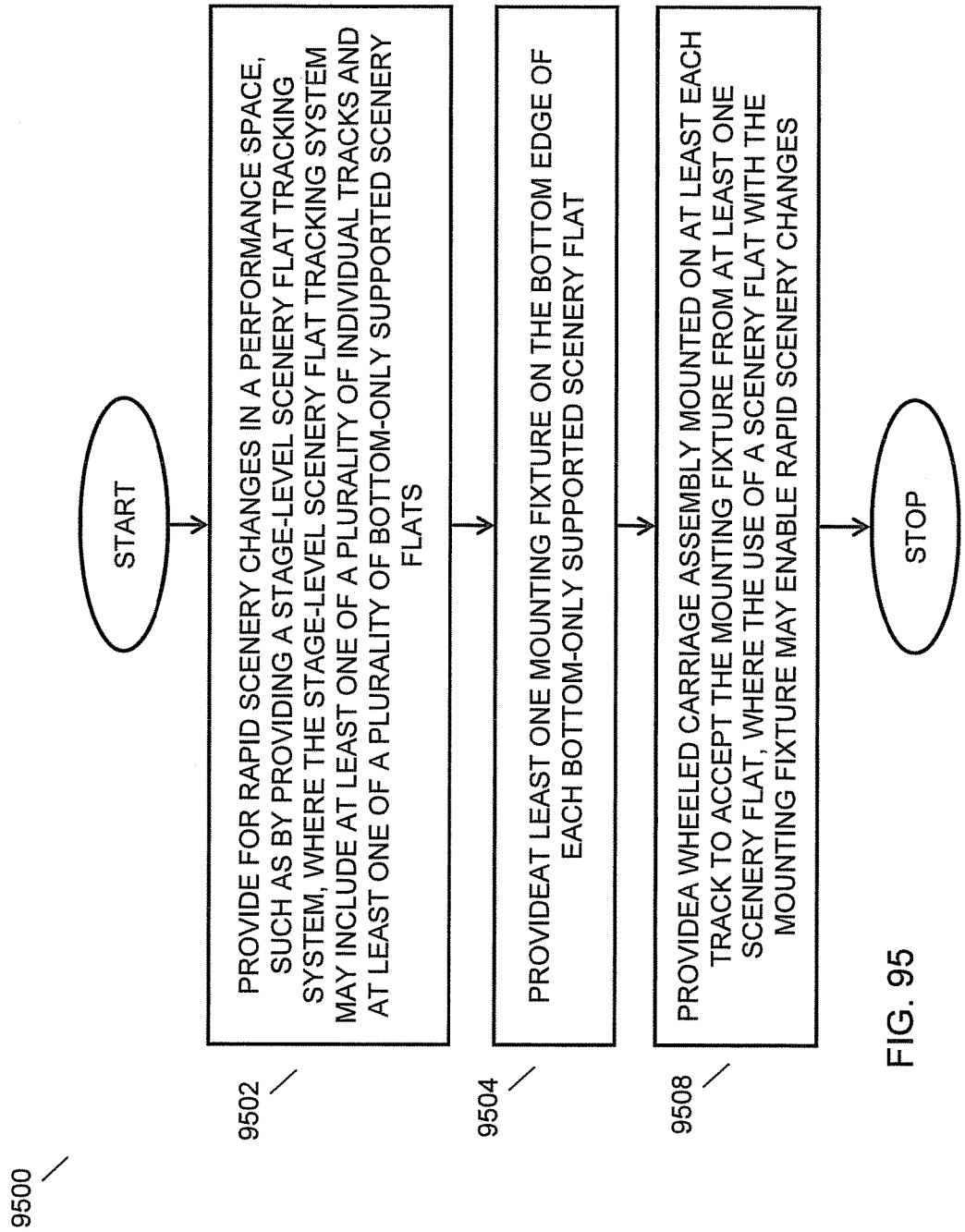
FIG. 95 depicts a flow process diagram in an embodiment of the present invention.

Referring to FIG. 95, in embodiments the present invention may provide for rapid scene changes through a stage-level scenery flat tracking system. The present invention may provide for rapid scenery changes in a performance space 9500, such as by providing a stage-level scenery flat tracking system, where the stage-level scenery flat tracking system may include at least one of a plurality of individual tracks and at least one of a plurality of bottom-only supported scenery flats; providing at least one mounting fixture on the bottom edge of each bottom-only supported scenery flat; providing a wheeled carriage assembly mounted on at least each track to accept the mounting fixture from at least one scenery flat, where the use of a scenery flat with the mounting fixture may enable rapid scenery changes, and the like. In embodiments, the carriage assembly may include a latch mechanism to secure the mounting fixture. The rapid scenery change may be in view of the audience. The plurality of individual tracks may be closely spaced. The carriage of the stage-level scenery flat tracking system may be driven by a motor drive system. The motor drive system may be a computer controlled motor drive system, where the motor drive system may be a sound damped motor drive system, a plurality of sound dampened motor drives, each of the plurality of sound dampened motor drives may control a single carriage, each of the plurality of sound dampened motor drives may control a plurality of carriages, and the like. The bottom-only supported scenery flats may be provided a rigid construction, where the rigid construction may enable scenery flat motion of the bottom-only supported scenery flats on adjacent tracks of the stage-level scenery flat tracking system without physical contact between bottom-only supported scenery flats on adjacent tracks while in motion. In embodiments, the rapid scenery changes may include box sets, or other modern stage scenery.

Figure 96:
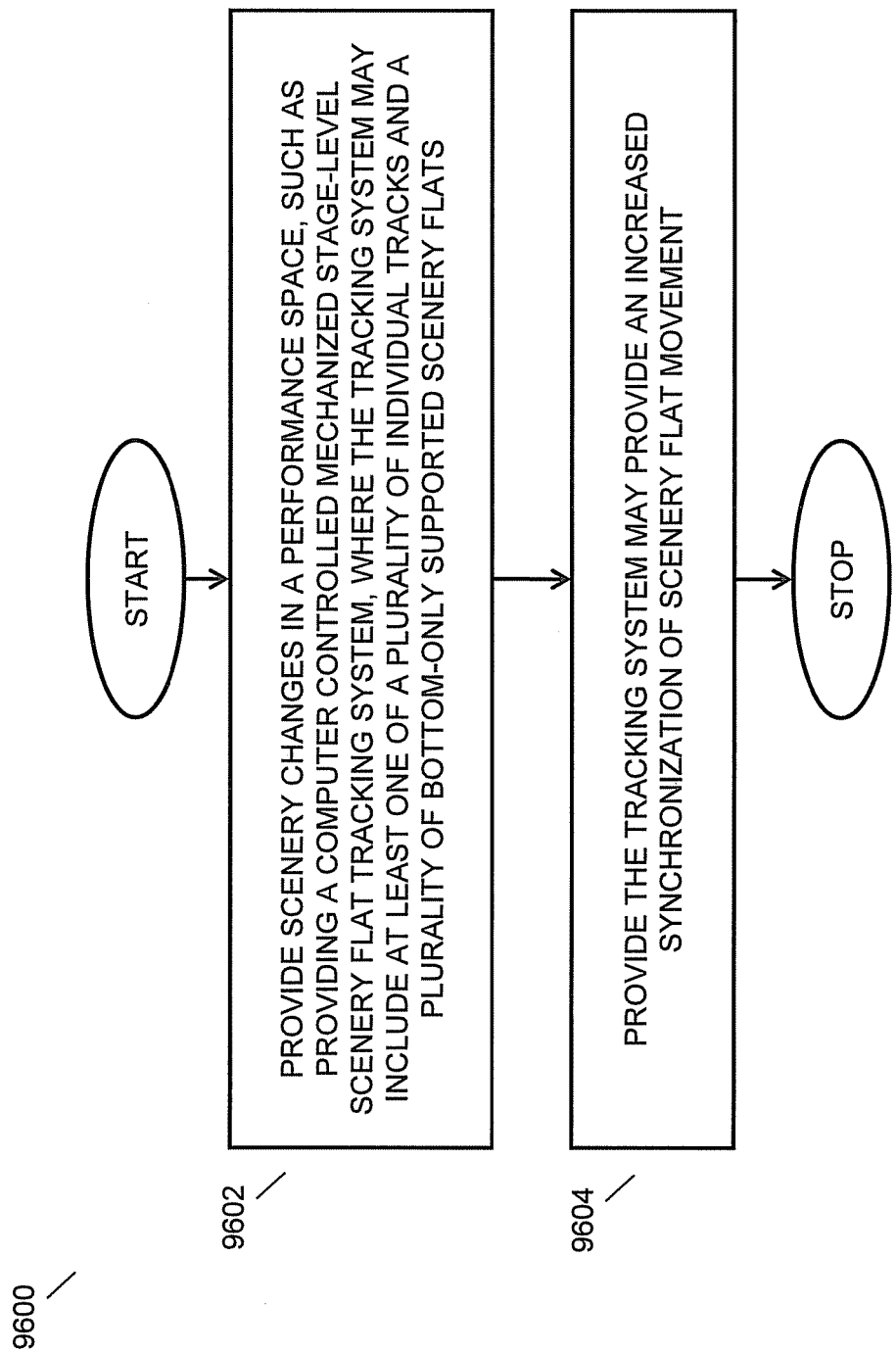
FIG. 96 depicts a flow process diagram in an embodiment of the present invention.

Referring to FIG. 96, in embodiments the present invention may provide for a mechanized tracking system for improved synchronization of movement. The present invention may provide scenery changes in a performance space 9600, such as providing a computer controlled mechanized stage-level scenery flat tracking system, where the tracking system may include at least one of a plurality of individual tracks and a plurality of bottom-only supported scenery flats, and where the tracking system may provide an increased synchronization of scenery flat movement. In embodiments, the synchronization may be for all of the bottom-only supported scenery flats, for one bottom-only supported scenery flat, for a combination of bottom-only supported scenery flats, and the like.

Figure 97:
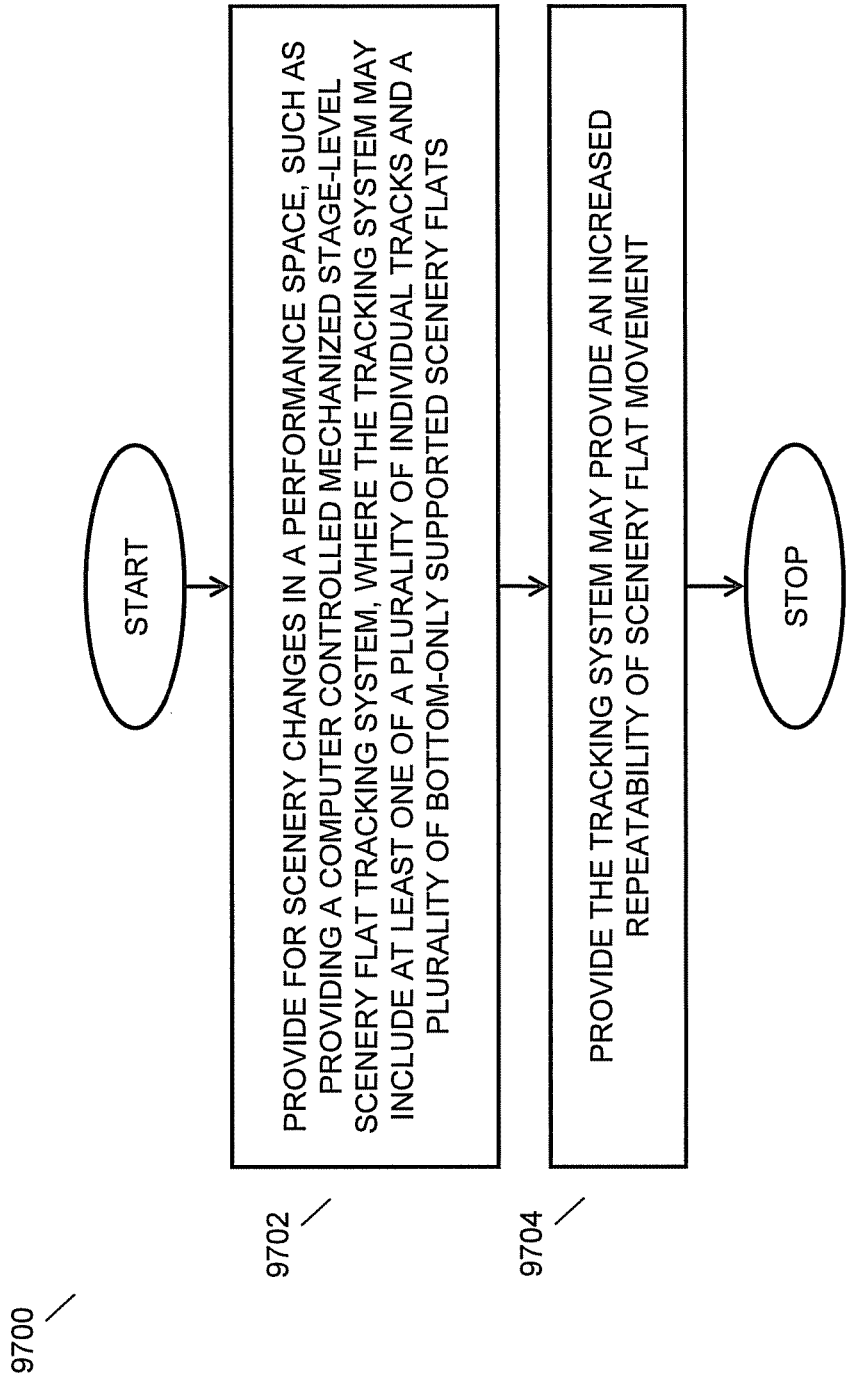
FIG. 97 depicts a flow process diagram in an embodiment of the present invention.

Referring to FIG. 97, in embodiments the present invention may provide for a mechanized tracking system for improved reliability of movement. The present invention may provide for scenery changes in a performance space 9700, such as providing a computer controlled mechanized stage-level scenery flat tracking system, where the tracking system may include at least one of a plurality of individual tracks and a plurality of bottom-only supported scenery flats, and where the tracking system may provide an increased repeatability of scenery flat movement.

Figure 98:
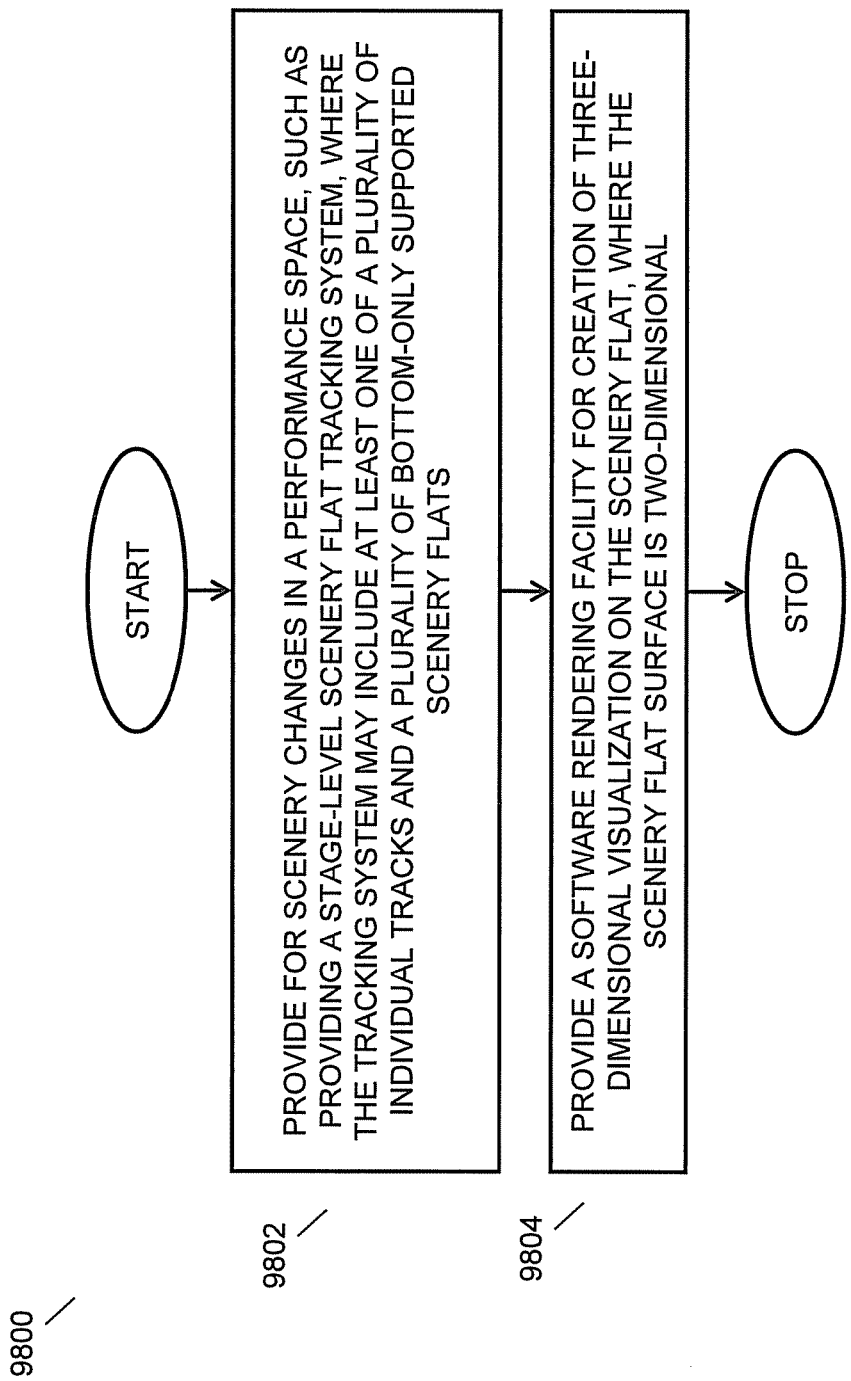
FIG. 98 depicts a flow process diagram in an embodiment of the present invention.

Referring to FIG. 98, in embodiments the present invention may provide for three dimensional renditions on scenery flats. The present invention may provide for scenery changes in a performance space 9800, such as providing a stage-level scenery flat tracking system, where the tracking system may include at least one of a plurality of individual tracks and a plurality of bottom-only supported scenery flats, and a software rendering facility for creation of three-dimensional visualization on the scenery flat, where the scenery flat surface is two-dimensional.

Figure 99:
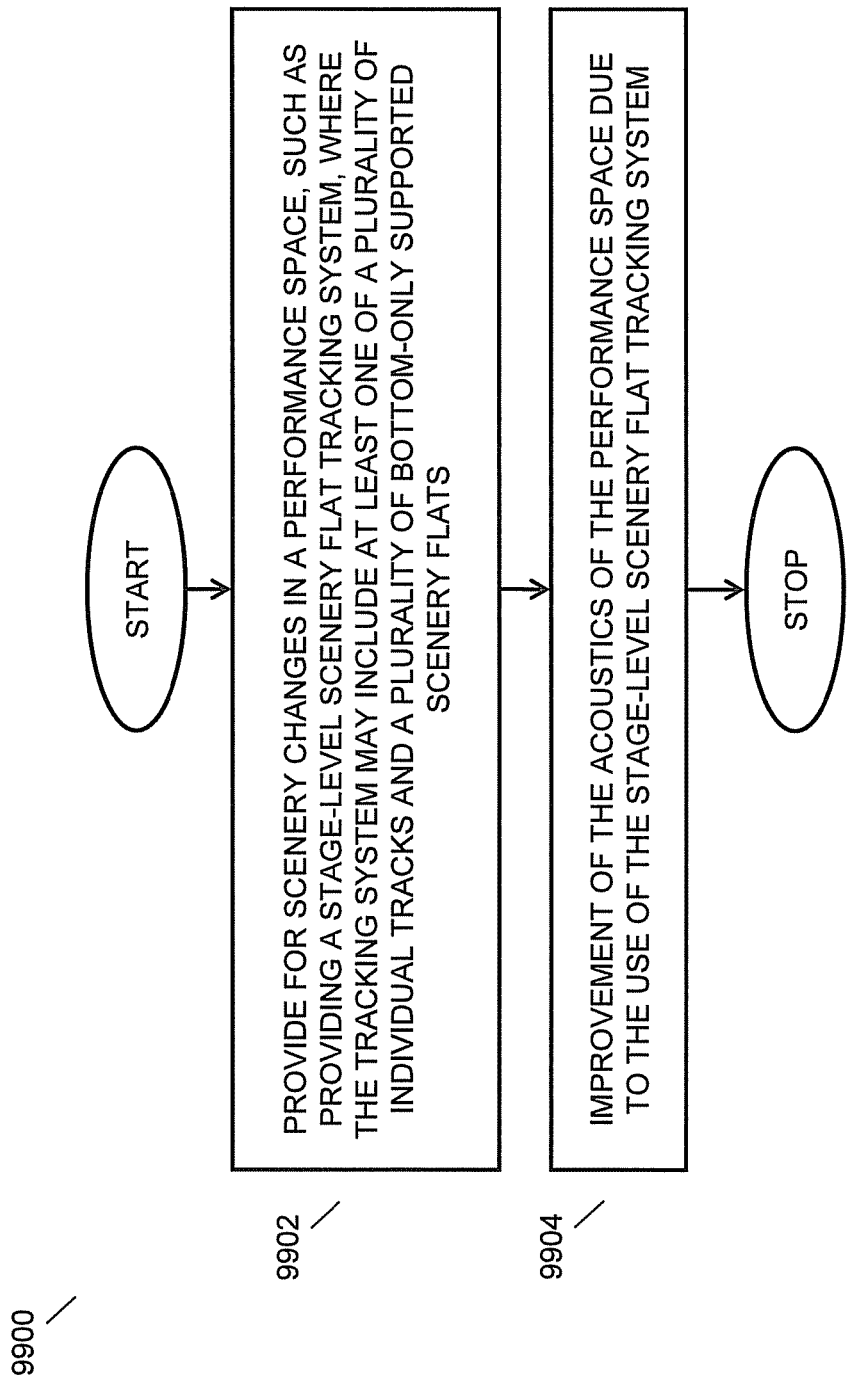
FIG. 99 depicts a flow process diagram in an embodiment of the present invention.

Referring to FIG. 99, in embodiments the present invention may provide for more pleasing acoustics due to the absence of a fly tower. The present invention may provide for scenery changes in a performance space 9900, such as providing a stage-level scenery flat tracking system, where the tracking system may include at least one of a plurality of individual tracks and a plurality of bottom-only supported scenery flats, and where the acoustics of the performance space may be improved due to the use of the stage-level scenery flat tracking system, where the stage-level scenery flat tracking system may have no fly tower.

Figure 100:
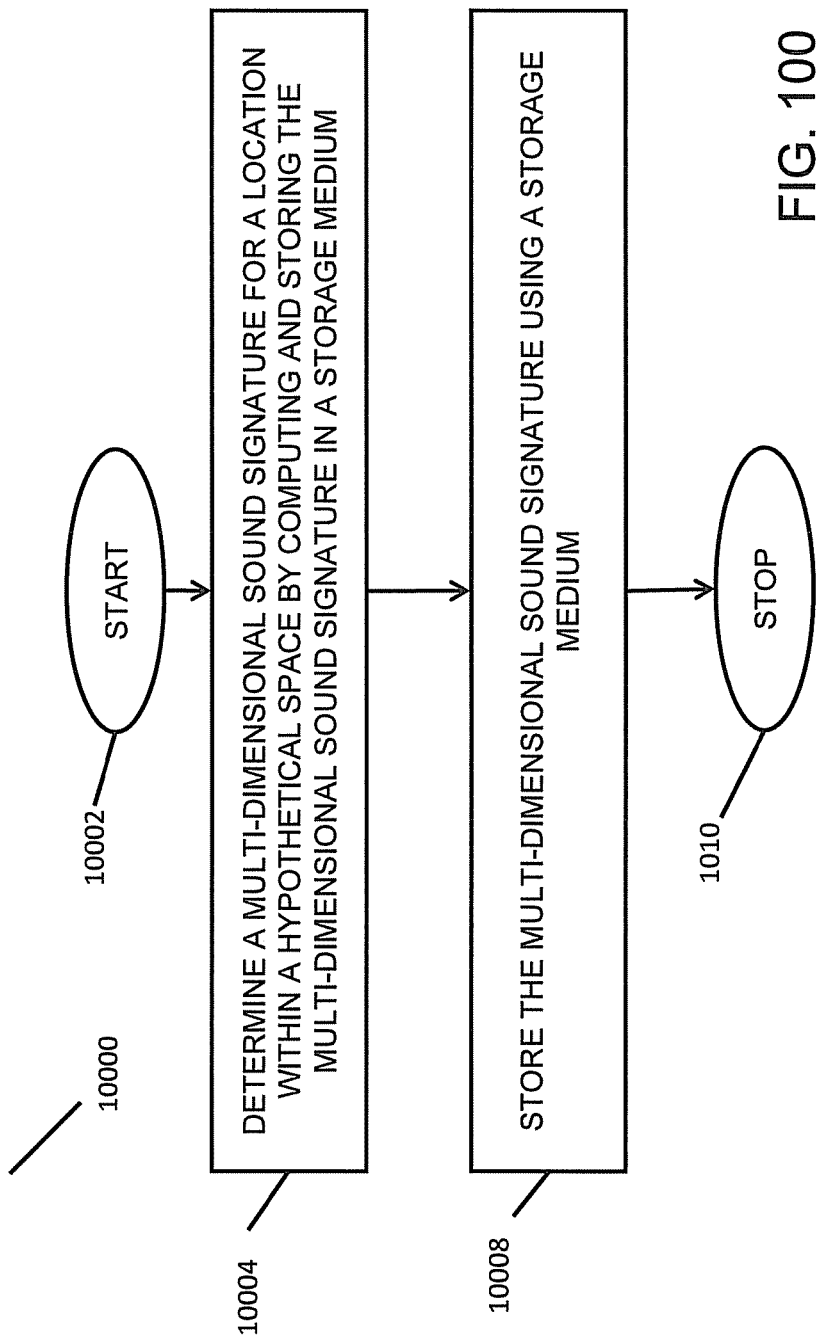
FIG. 100 depicts a flow process diagram in an embodiment of the present invention.

In embodiments, referring to FIG. 100, methods and systems for determining multi-dimensional sound signature for a location within a hypothetical space may be provided. As shown in FIG. 100, a process 10000 for determining a multi-dimensional sound signature for a location within a hypothetical space in accordance with various embodiments of the present invention may be provided.

The process 10000 starts at step 10002. At step 10004, a multi-dimensional sound signature for a location within a hypothetical space may be computed using an electronic device, a processor, a computer or some other type of computing medium. This computation may be stored in a storage medium such a memory, a buffer, flash disk, hard disk, CD device or some other type of storage medium. In embodiments, the computation for determining a multi-dimensional sound signature for a location within a hypothetical space may include simulating the initiation of a sound at a first location. The simulation may be performed using a computer processor or some other type of computing device. The initialized sound at the first location may be measured for one or more dimensions of the resulting sound at a second location in the hypothetical space. The measurement associated with one or more dimensions may be utilized to form a multi-dimensional sound signature at the second location.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as a time series of distinct sound waves representing the initial arrival of reflected sound from different directions. In embodiments, a preferred multi-dimensional sound signature may be determined by defining acceptable timing and amplitude ranges for a series of sound waves arriving at a location.

At step 10008, the simulation result and other computations may be stored in a storage medium. In embodiments, the multi-dimensional sound signature composite may be stored in a database.

The process 10000 may end at step 10010.

Figure 101:
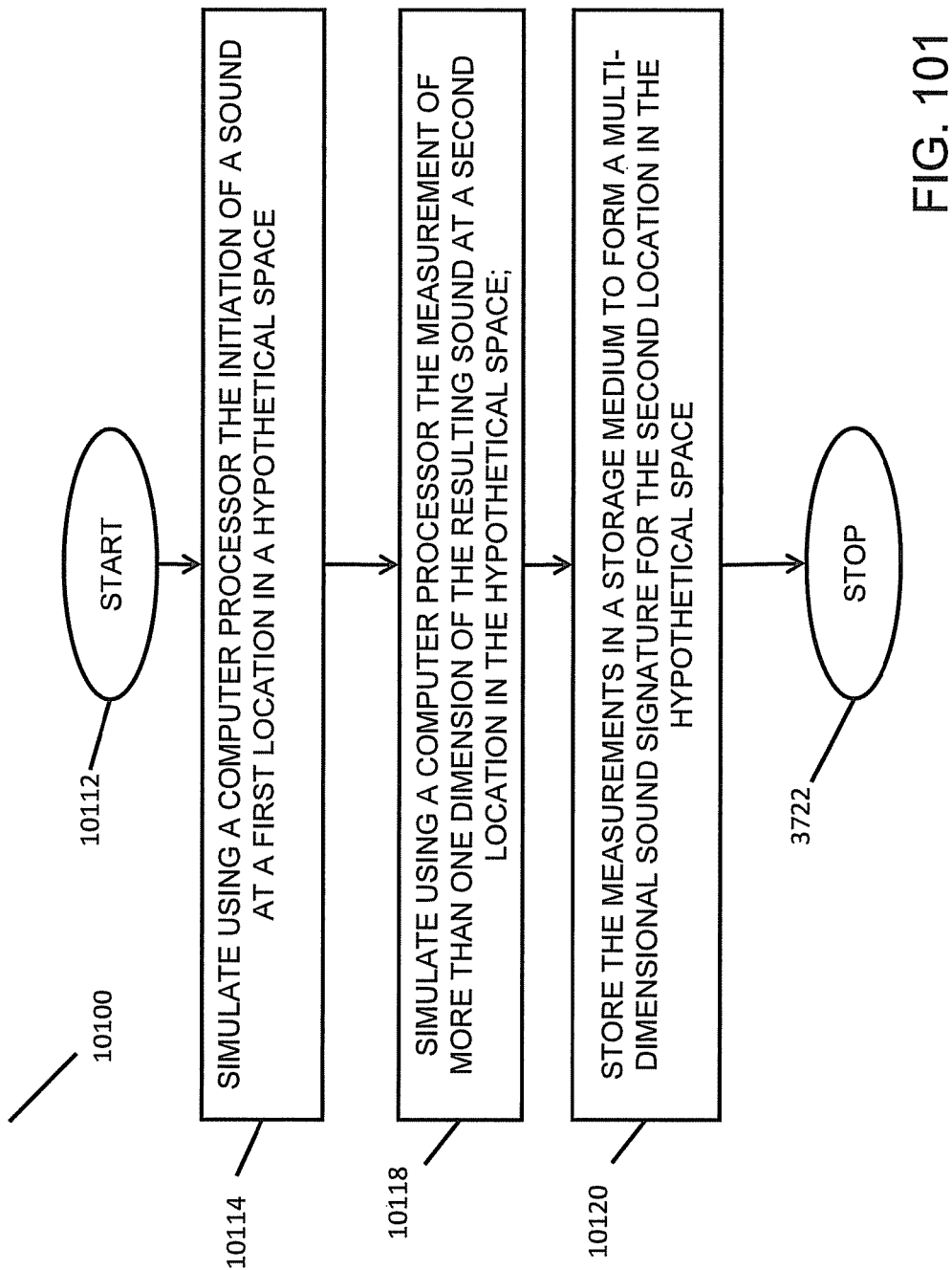
FIG. 101 depicts a flow process diagram in an embodiment of the present invention.

In embodiments, referring to FIG. 101, methods and systems for simulating and storing a multi-dimensional sound signature for a second location within a hypothetical space may be provided. As shown in FIG. 101, a process 10100 for simulating a multi-dimensional sound signature for a second location within a hypothetical space in accordance with various embodiments of the present invention may be provided.

The process 10100 starts at step 10112. At step 10114, a computer processor may be utilized for simulating the initiation of sound at the first location of the hypothetical space.

At step 10118, the initiated sound at the first location may be received at the second location in the hypothetical space. The resulting sound at the second space may be measured for more than one dimension. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, the more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

At step 10120, the measurements of the resulting sound may be stored in the storage medium. The measurement may be utilized to form a multi-dimensional sound signature for the second location in the hypothetical space. In embodiments, the multi-dimensional sound signature composite may be stored in a database.

The process 10100 may end at step 10122.

Figure 102:
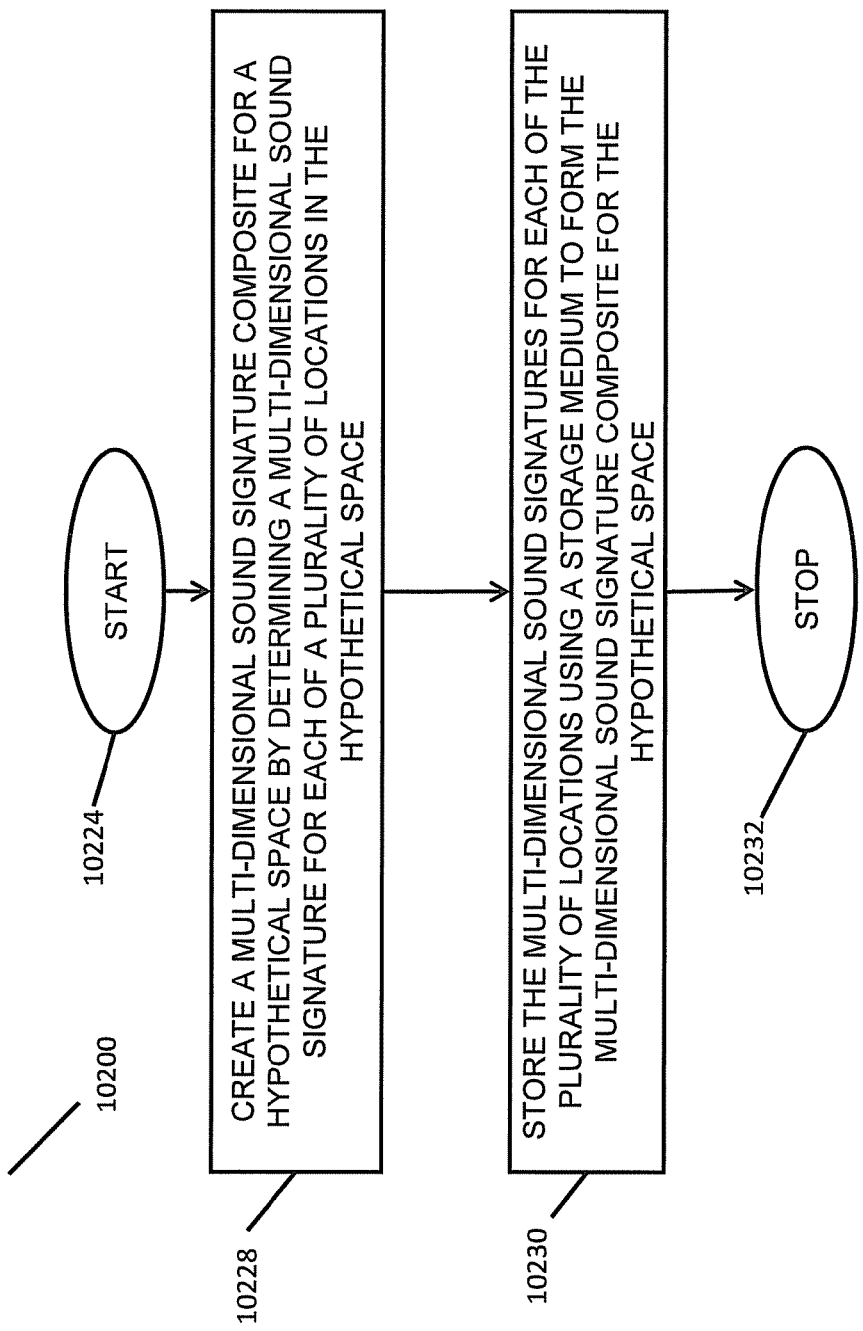
FIG. 102 depicts a flow process diagram in an embodiment of the present invention.

In embodiments, referring to FIG. 102, methods and systems for storing a multi-dimensional sound signature composite for a hypothetical space may be provided. As shown in FIG. 102, a process 10200 for creating a multi-dimensional sound signature for a hypothetical space in accordance with various embodiments of the present invention may be provided.

The process 10200 starts at step 10224. At step 10228, a multi-dimensional sound signature composite for a hypothetical space may be created. The multi-dimensional sound signature composite may be created by determining a multi-dimensional sound signature for one or more of a plurality of locations in the hypothetical space. Each of the multi-dimensional sound signatures may be determined by simulation using a computer processor. The simulation may be performed by initiating a sound at a constant location in the space and the measurement of more than one dimension of the resulting sound at each of the multiple locations in the hypothetical space.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

At step 10230, the multi-dimensional sound signatures for each of the plurality of locations using a storage medium may be stored. The stored parameter may be used to form the multi-dimensional sound signature composite for the hypothetical space. In embodiments, the multi-dimensional sound signature composite may be stored in a database.

The process 10200 may end at step 10232.

Figure 103:
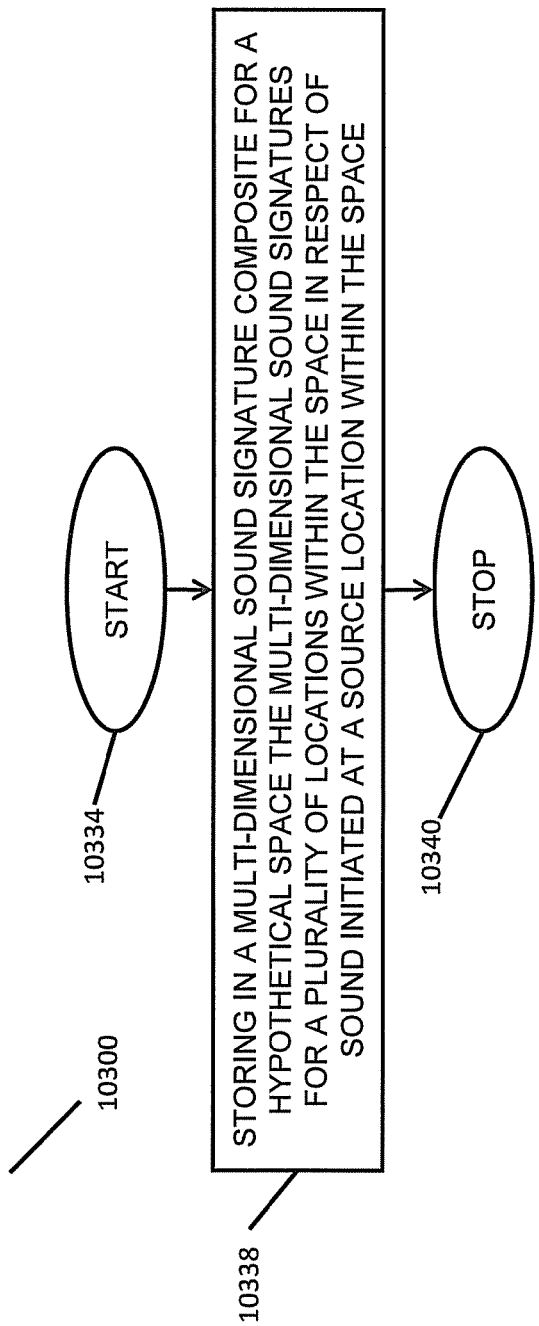
FIG. 103 depicts a flow process diagram in an embodiment of the present invention.

In embodiments, referring to FIG. 103, methods and systems for storing a multi-dimensional sound signature composite within a hypothetical space may be provided. As shown in FIG. 103, a process 10300 for storing a multi-dimensional sound signature composite within a hypothetical space in accordance with various embodiments of the present invention may be provided.

The process 10300 starts at step 10334. At step 10338, the process 10300 may store one or more multi-dimensional sound signatures for multiple locations in a multi-dimensional sound signature composite. The calculation of parameter thus stored may be determined by initiating a sound at the source location within the hypothetical space and generating the corresponding multi-dimensional sound signatures using a computer processor.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the multi-dimensional sound signature composite may be stored in a database.

The process 10300 may end at step 10340.

Figure 104:
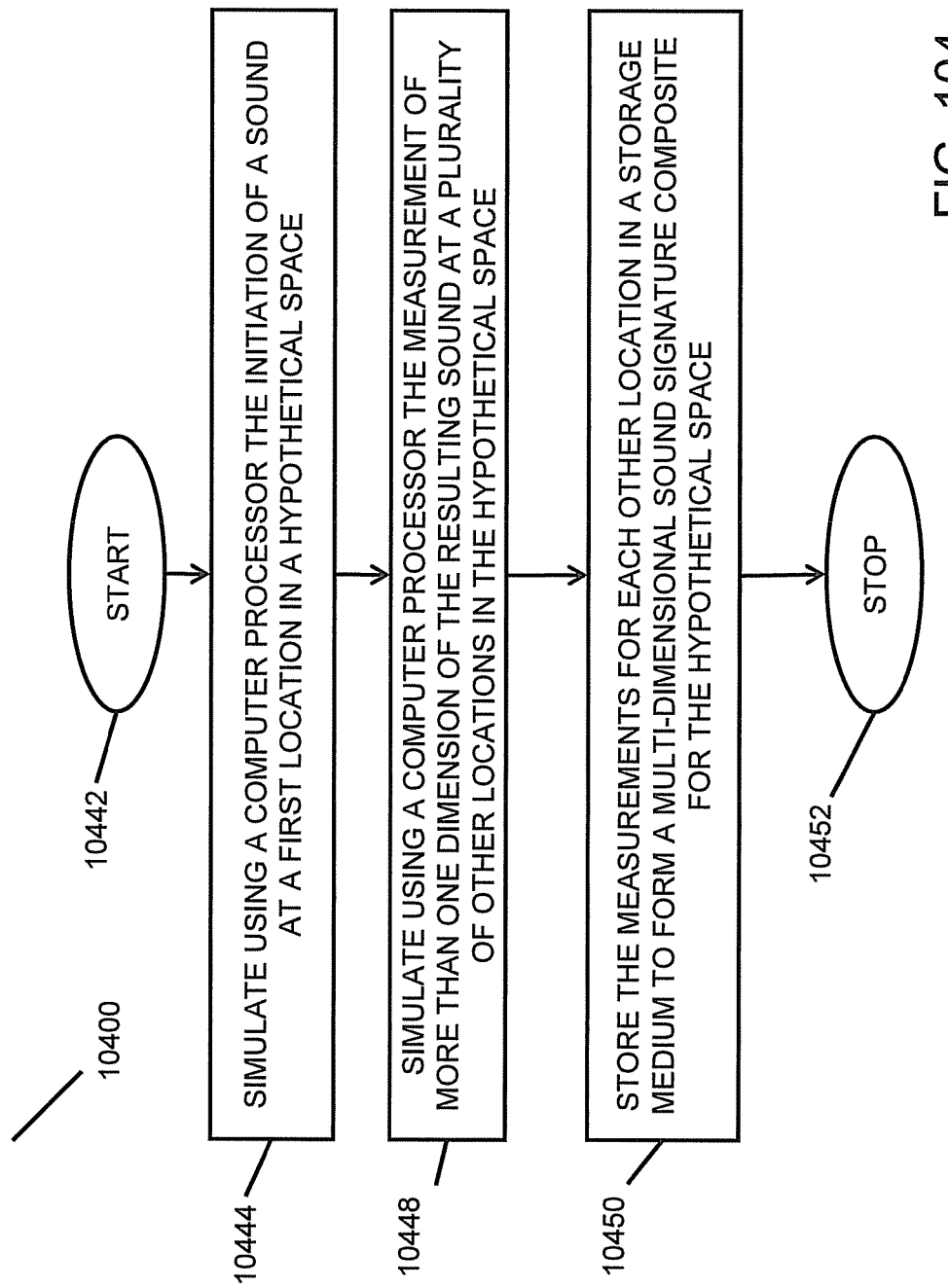
FIG. 104 depicts a flow process diagram in an embodiment of the present invention.

In embodiments, referring to FIG. 104, methods and systems for simulating and storing a multi-dimensional sound signature for a second location within a hypothetical space may be provided. As shown in FIG. 104, a process 10400 for simulating and storing a multi-dimensional sound signature within a hypothetical space in accordance with various embodiments of the present invention may be provided.

The process 10400 starts at step 10442. At step 10444, a computer processor may be utilized for simulating the initiation of sound at the first location in the hypothetical space.

At step 10448, measurement of more than one dimension of the resulting sound created by simulation at one or more locations in the hypothetical space may be performed within the simulated environment.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, the more than one dimension may include a direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

At step 10450, the measurements of the resulting sound may be stored in the storage medium. The measurement may be utilized to form a multi-dimensional sound signature for the second location in the hypothetical space. In embodiments, the multi-dimensional sound signature composite may be stored in a database.

The process 10400 may end at step 10452.

Figure 105:
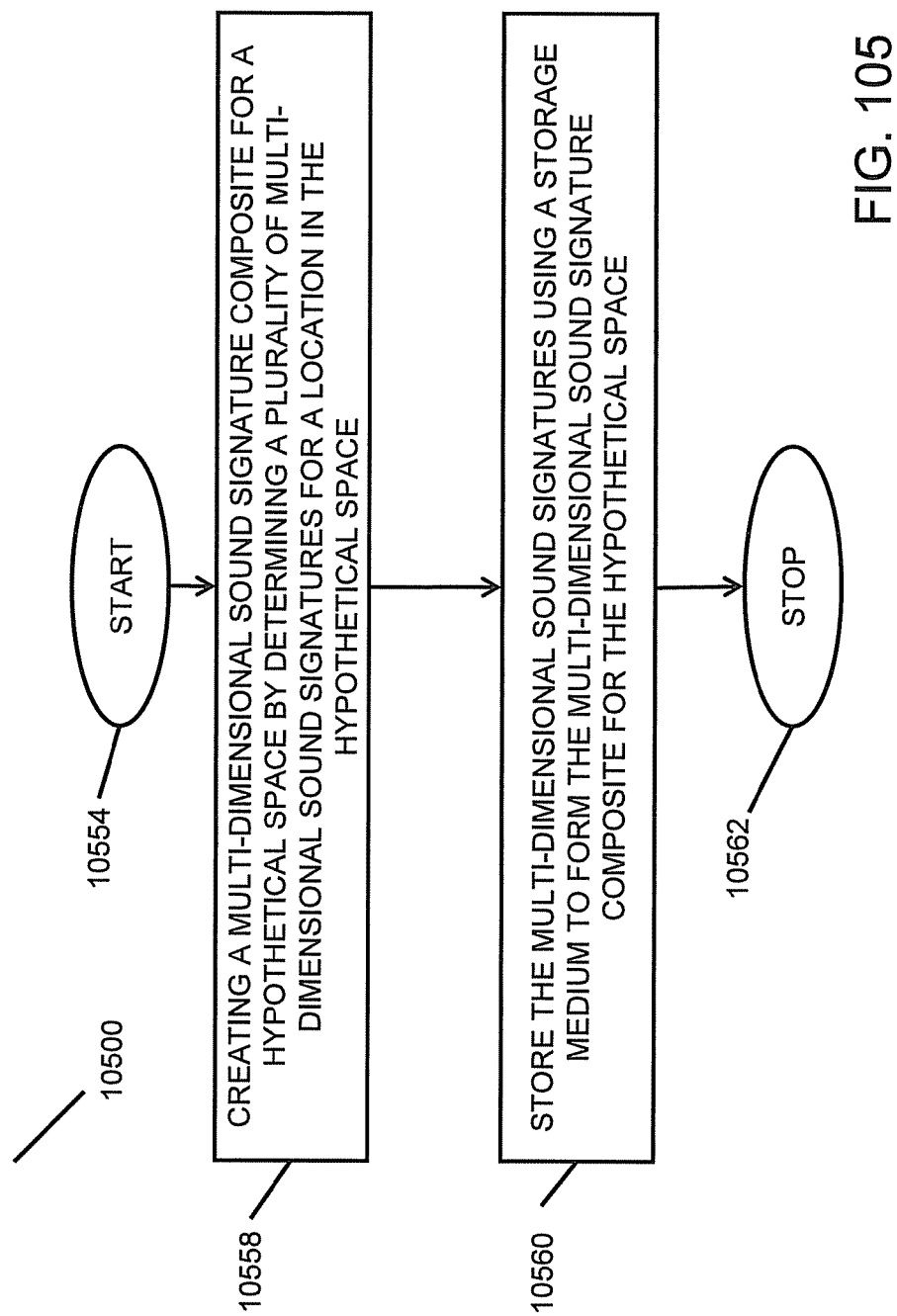
FIG. 105 depicts a flow process diagram in an embodiment of the present invention.

In embodiments, referring to FIG. 105, methods and systems for creating a multi-dimensional sound signature composite within a hypothetical space may be provided. As shown in FIG. 105, a process 10500 for simulating a multi-dimensional sound signature within a hypothetical space in accordance with various embodiments of the present invention may be provided.

The process 10500 starts at step 10554. At step 10558, a computer processor may be utilized for simulating the .multi-dimensional sound signature composite for a hypothetical space. In embodiments, the computer processor may determine a plurality of multi-dimensional sound signatures for a location in the hypothetical space within the simulated environment. In embodiments, each multi-dimensional sound signature may be determined by simulating using a computer processor. In embodiments, the initiation of a sound may be at one or more locations in the hypothetical space. In embodiments, measurement of more than one dimension of the resulting sound at the location in the hypothetical space may be determined.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, the more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

At step 10560, the measurements of the resulting sound may be stored in the storage medium. In embodiments, the measurement may be utilized to form a multi-dimensional sound signature for the second location in the hypothetical space. In embodiments, the multi-dimensional sound signature composite may be stored in a database.

The process 10500 may end at step 10562.

Figure 106:
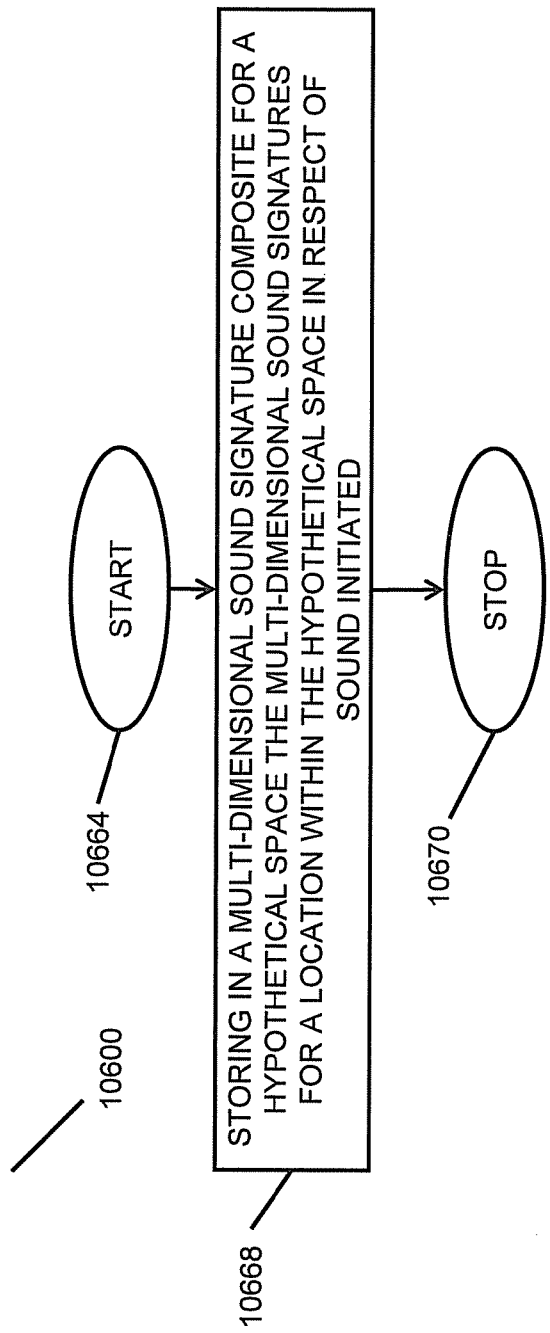
FIG. 106 depicts a flow process diagram in an embodiment of the present invention.

In embodiments, referring to FIG. 106, methods and systems for storing a multi-dimensional sound signature composite within a hypothetical space may be provided. As shown in FIG. 106, a process 10600 for storing a multi-dimensional sound signature composite within a hypothetical space in accordance with various embodiments of the present invention may be provided.

The process 10600 starts at step 10664. At step 10668, a computer processor may be utilized for generating multi-dimensional sound signatures within a hypothetical space. In embodiments, the multi-dimensional sound signatures may be determined for a particular location initiated from one or more source locations. The multi-dimensional sound signatures thus determined may be stored in a multi-dimensional sound signature composite. The multi-dimensional sound signature composite may be stored in a database.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

The process 10600 may end at step 10670.

Figure 107:
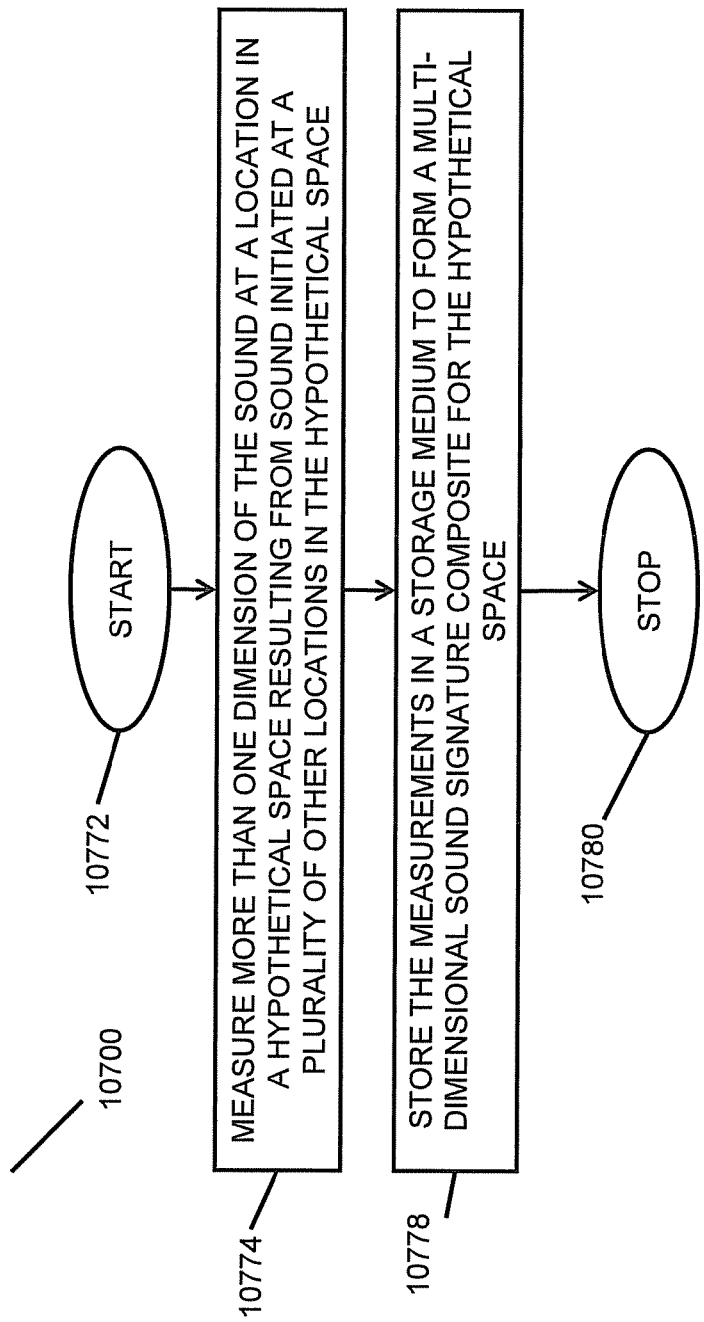
FIG. 107 depicts a flow process diagram in an embodiment of the present invention.

In embodiments, referring to FIG. 107, methods and systems for simulating and storing a multi-dimensional sound signature for a second location within a hypothetical space may be provided. As shown in FIG. 107, a process 10700 for simulating a multi-dimensional sound signature within a hypothetical space in accordance with various embodiments of the present invention may be provided.

The process 10700 starts at step 10772. At step 10774, a computer processor may be utilized for simulating a sound at one or more location. The resulting measurements for more than one dimension may be calculated at a particular location within the hypothetical space.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but is a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

At step 10778, the resulting measurement determined for a particular location may be stored in a storage medium. In embodiments, the measurement may be utilized to form a multi-dimensional sound signature for the second location in the hypothetical space. In embodiments, the multi-dimensional sound signature composite may be stored in a database.

The process 10700 may end at step 10780.

Figure 108:
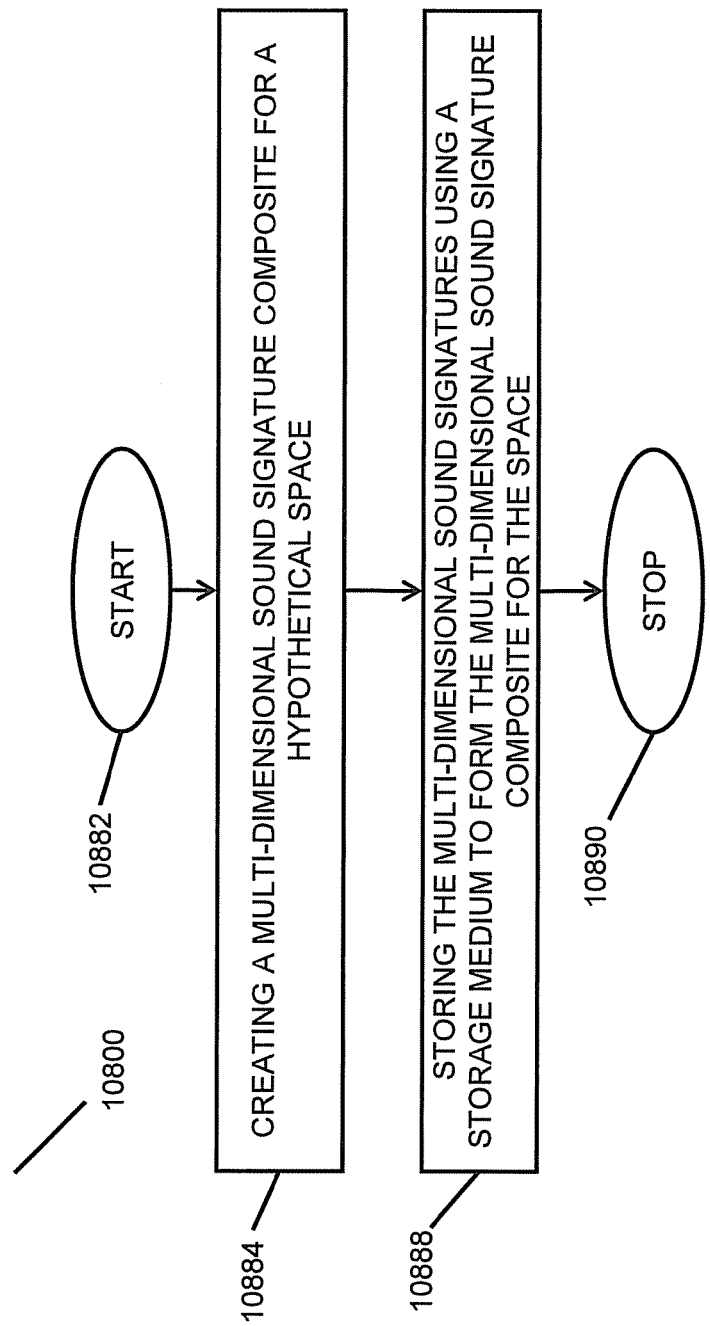
FIG. 108 depicts a flow process diagram in an embodiment of the present invention.

In embodiments, referring to FIG. 108, methods and systems for simulating and storing a multi-dimensional sound signature for a hypothetical space may be provided. As shown in FIG. 108, a process 10800B for creating and storing a multi-dimensional sound signature for a hypothetical space in accordance with various embodiments of the present invention may be provided.

The process 10800B starts at step 10882. At step 10884, a multi-dimensional sound signature composite may be created for a hypothetical space. The multi-dimensional sound signature composite may be created for a hypothetical space by determining multiple multi-dimensional sound signatures for a location in the hypothetical space. Each multi-dimensional sound signature may be determined by initiating a sound at one of multiple other locations in the hypothetical space and measuring more than one dimension of the resulting sound at the location in the hypothetical space. Such measurement and initiation may be simulated through the use of a computer processor. Following this, a multi-dimensional sound signature for each of multiple locations in the hypothetical space may be determined. Each multi-dimensional sound signature may be determined by initiating a sound at a constant location in the hypothetical space and measuring more than one dimension of the resulting sound at each of the multiple locations in the hypothetical space. Such measurement and initiation may be simulated through the use of a computer processor.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

At step 10888, the multi-dimensional sound signatures may be stored using a storage medium to form the multi-dimensional sound signature composite for the space. In embodiments, the multi-dimensional sound signature composite may be stored in a database.

The process 10800 may end at step 10890.

Figure 109:
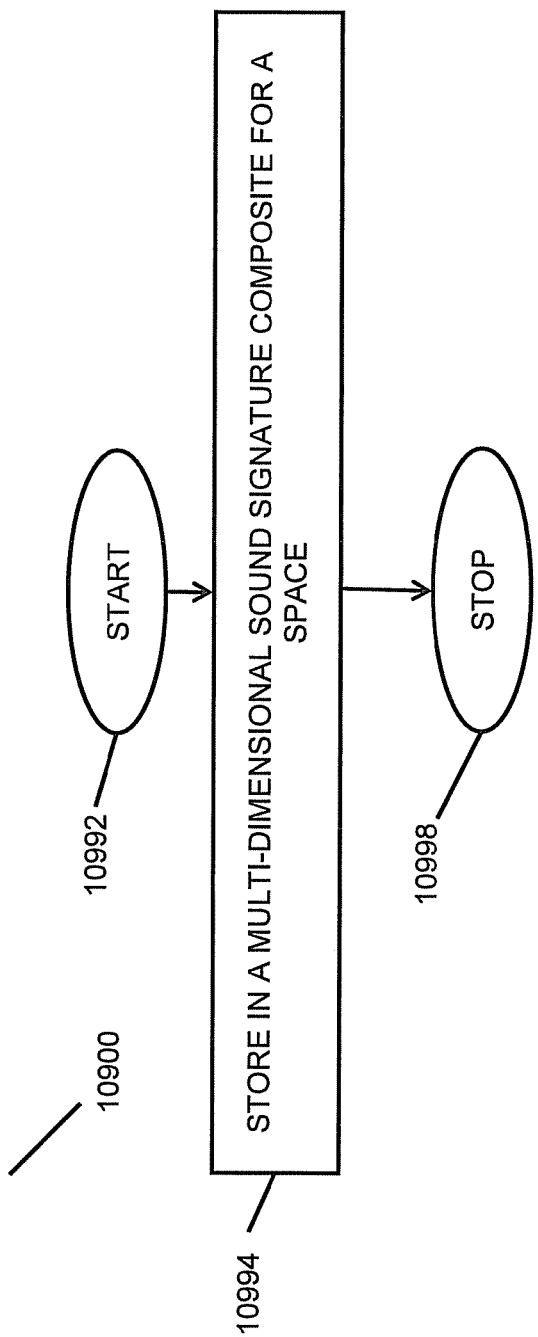
FIG. 109 depicts a flow process diagram in an embodiment of the present invention.

In embodiments, referring to FIG. 109, methods and systems for storing a multi-dimensional sound signature composite space may be provided. As shown in FIG. 109, a process 10900 for storing a multi-dimensional sound signature composite within a space in accordance with various embodiments of the present invention may be provided.

The process 10900 starts at step 10992. At step 10994, the process 10900 may store a multi-dimensional sound signature composite space. In embodiments, the process 10900 may initiate a sound at one or more locations within a hypothetical space and determine the multi-dimensional sound signatures for the same. The multi-dimensional sound signatures for a multiple locations within the hypothetical space may be determined for a sound initiated at a source location within the hypothetical space.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the multi-dimensional sound signature composite may be stored in a database.

The process 10900 may end at step 10998.

Figure 110:
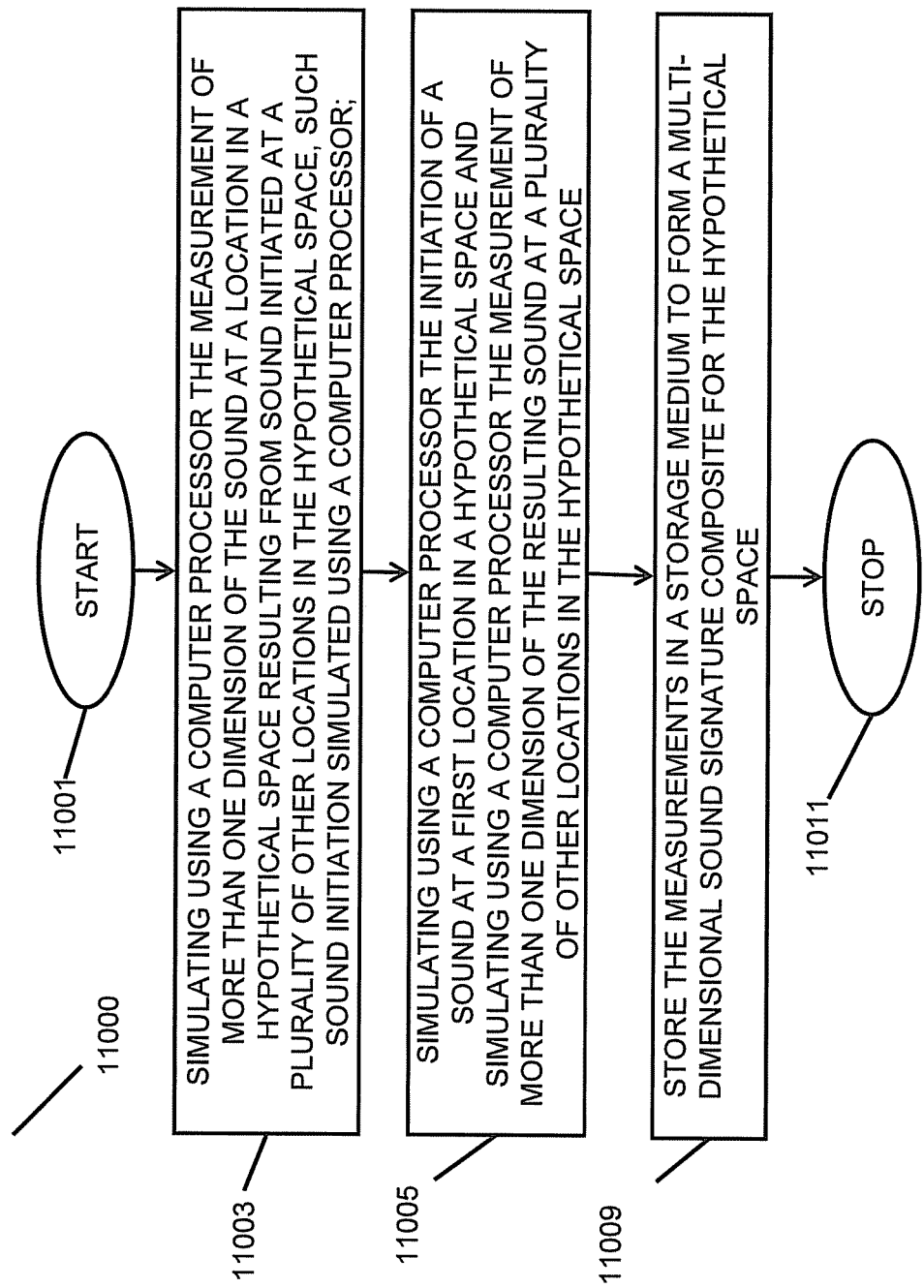
FIG. 110 depicts a flow process diagram in an embodiment of the present invention.

In embodiments, referring to FIG. 110, methods and systems for simulating and storing a multi-dimensional sound signature for a second location within a hypothetical space may be provided. As shown in FIG. 110, a process 11000 for simulating a multi-dimensional sound signature for a second location within a hypothetical space in accordance with various embodiments of the present invention may be provided.

The process 11000 starts at step 11001. At step 11003, a computer processor may be utilized for simulating the sound from one or more location within the hypothetical space. Subsequently, measurements of more than one dimension may be performed at a particular location in the hypothetical space using the computer processor.

At step 11005 of the process 11000B, the computer processor may initiate that sound at the first location, and the measurement of more than one parameter may be performed at one or more locations.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, the more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the multi-dimensional sound signature composite may be a data record, a table, and the like. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from multiple incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from multiple incidence directions. In embodiments, the multi-dimensional sound signature composite may include information about the tonal distribution of sound reaching multiple locations from multiple incidence directions. In embodiments, the multi-dimensional sound signature composite may include information about the tonal distribution of sound reaching multiple locations from multiple incidence directions. In embodiments, the tonal distribution may include a high-frequency drop-off that may be greater than the masking effect of air.

In embodiments, the sound may be audible, inaudible, a multi-frequency sound, characterized by a single frequency and the like.

In embodiments, the parameters of the initiated sound may be varied over time. In embodiments, the sound may be initiated using a speaker, a subwoofer, a speaker and a subwoofer, a tetrahedron speaker, a tetrahedron speaker and a subwoofer, a speaker system with at least as many sides as a tetrahedron, a speaker system with at least as many sides as a tetrahedron as well as a subwoofer, a dodecahedral speaker, a dodecahedral speaker and a subwoofer, a microphone, a directional microphone, and the like.

In embodiments, the sound may not be initiated but may be a sound source inherent to the space. In embodiments, the sound may not be initiated but may be generated by one or more sound sources inherent to the space. In embodiments, the sound may be initiated by one or more sound sources inherent to the space.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

At step 11009, the measurements of the resulting sound may be stored in the storage medium. The measurement may be utilized to form a multi-dimensional sound signature for the second location in the hypothetical space. In embodiments, the multi-dimensional sound signature composite may be stored in a database.

The process 11000 may end at step 11011.

Figure 111:
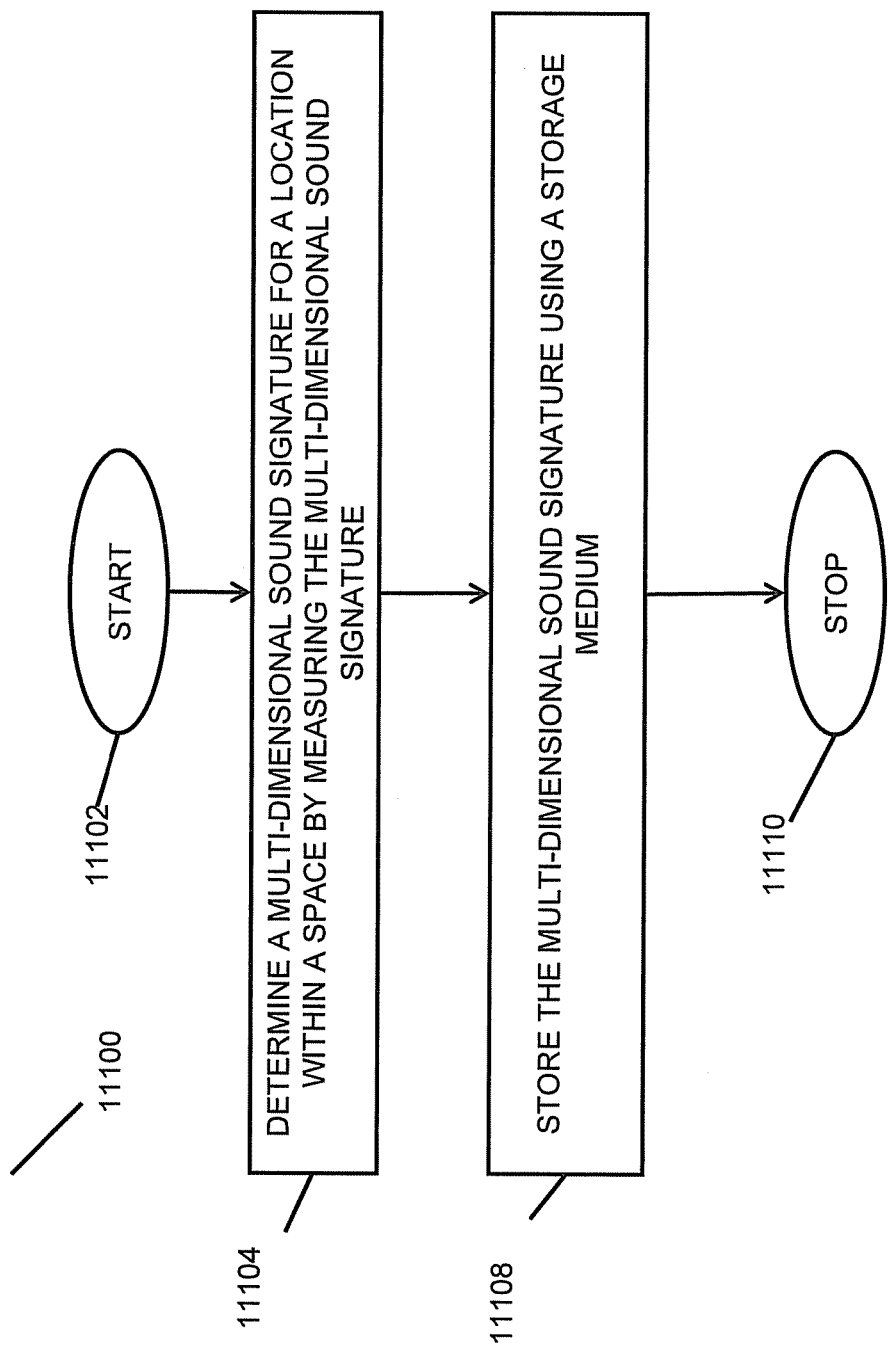
FIG. 111 depicts a flow process diagram in an embodiment of the present invention.

In embodiments, referring to FIG. 111, methods and systems for storing the multi-dimensional sound signature may be provided. As shown in FIG. 111, a process 11100 for storing the multi-dimensional sound signature may be provided in accordance with an embodiment of the present invention.

The process 11100 starts at step 11102. At step 11104, a multi-dimensional sound signature for a location within a space may be determined by measuring the multi-dimensional sound signature. The measuring may include measuring more than one dimension of the sound at a location in the space resulting from the inherent ambient sound of the space to form the multi-dimensional sound signature for such location.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, and occupied by material approximating an audience and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

At step 11108, the multi-dimensional sound signature using a storage medium may be stored.

The process 11100 may end at step 11110.

Figure 112:
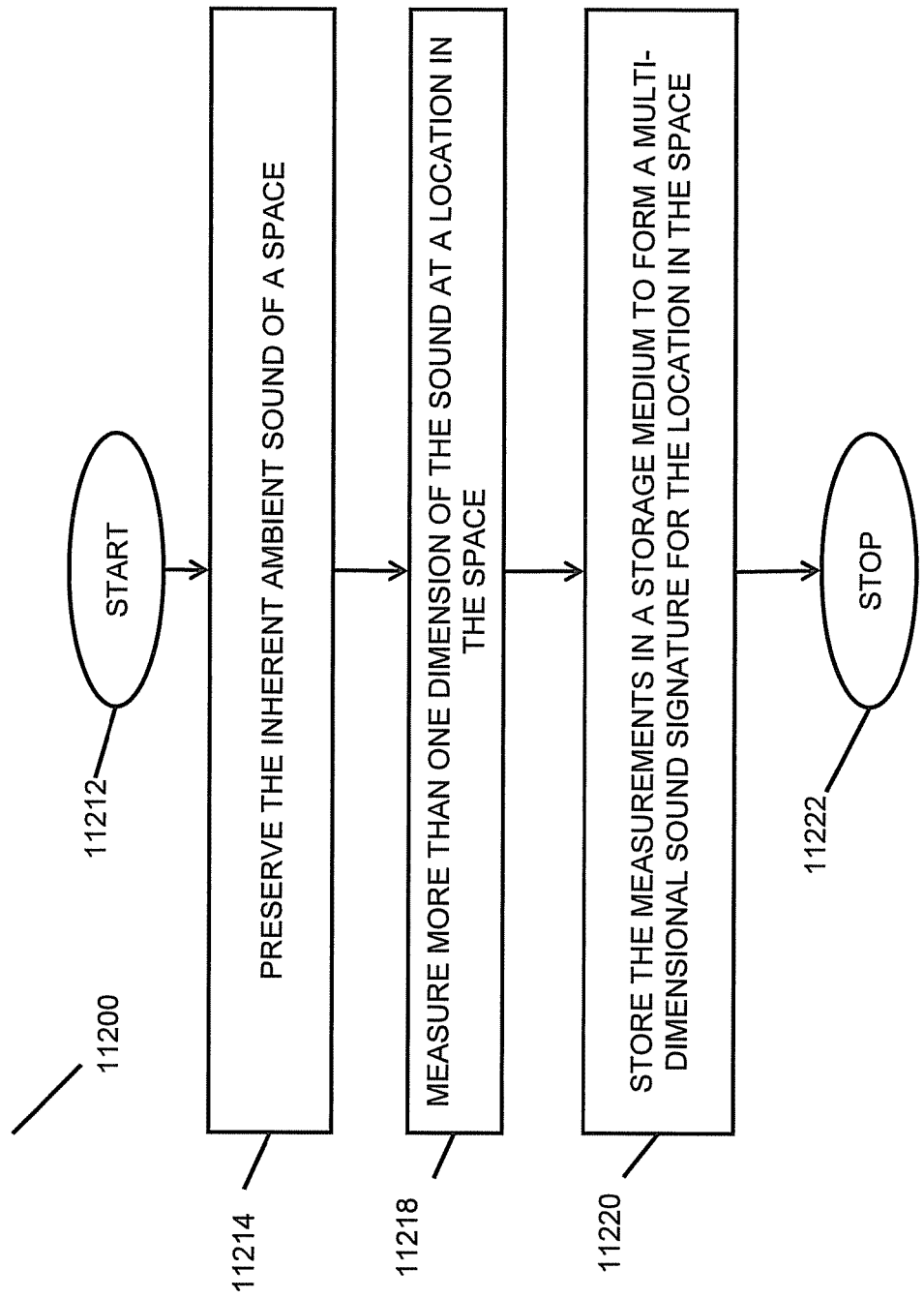
FIG. 112 depicts a flow process diagram in an embodiment of the present invention.

In embodiments, referring to FIG. 112, methods and systems for storing the multi-dimensional sound signature may be provided. As shown in FIG. 112, a process 11200 for storing the multi-dimensional sound signature in accordance with another embodiment of the present invention may be provided.

The process 11200 starts at step 11212. At step 11214, the inherent ambient sound of a space may be preserved. At step 11218, more than one dimension of the sound at a location in the space may be measured. At step 11220, the measurements may be stored in a storage medium to form a multi-dimensional sound signature for the location in the space. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and each the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

The process 11200 may end at step 11222.

Figure 113:
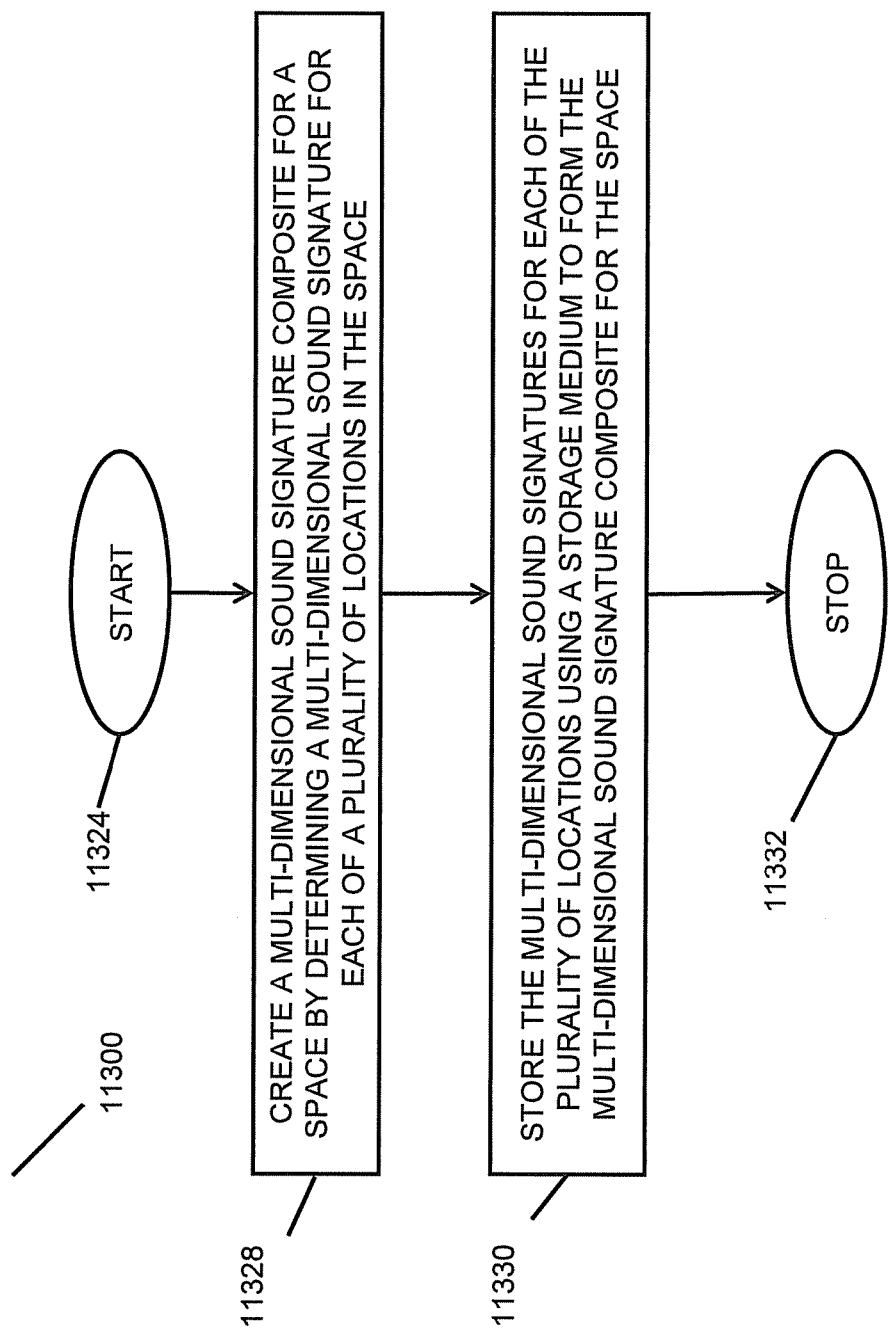
FIG. 113 depicts a flow process diagram in an embodiment of the present invention.

In embodiments, referring to FIG. 113, methods and systems for storing the multi-dimensional sound signature may be provided. As shown in FIG. 113, a process 11300 for storing the multi-dimensional sound signature in accordance with yet another embodiment of the present invention may be provided.

The process 11300 starts at step 11324. At step 11328, a multi-dimensional sound signature composite may be created for a space by determining a multi-dimensional sound signature for each of multiple locations in the space. Each multi-dimensional sound signature may be determined by measuring more than one dimension of the sound at each of the multiple locations in the space resulting from the inherent ambient sound of the space.

In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location. In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

At step 11330, the multi-dimensional sound signatures may be stored for each of the multiple locations using a storage medium to form the multi-dimensional sound signature composite for the space.

The process 11300 may end at step 11332.

Figure 114:
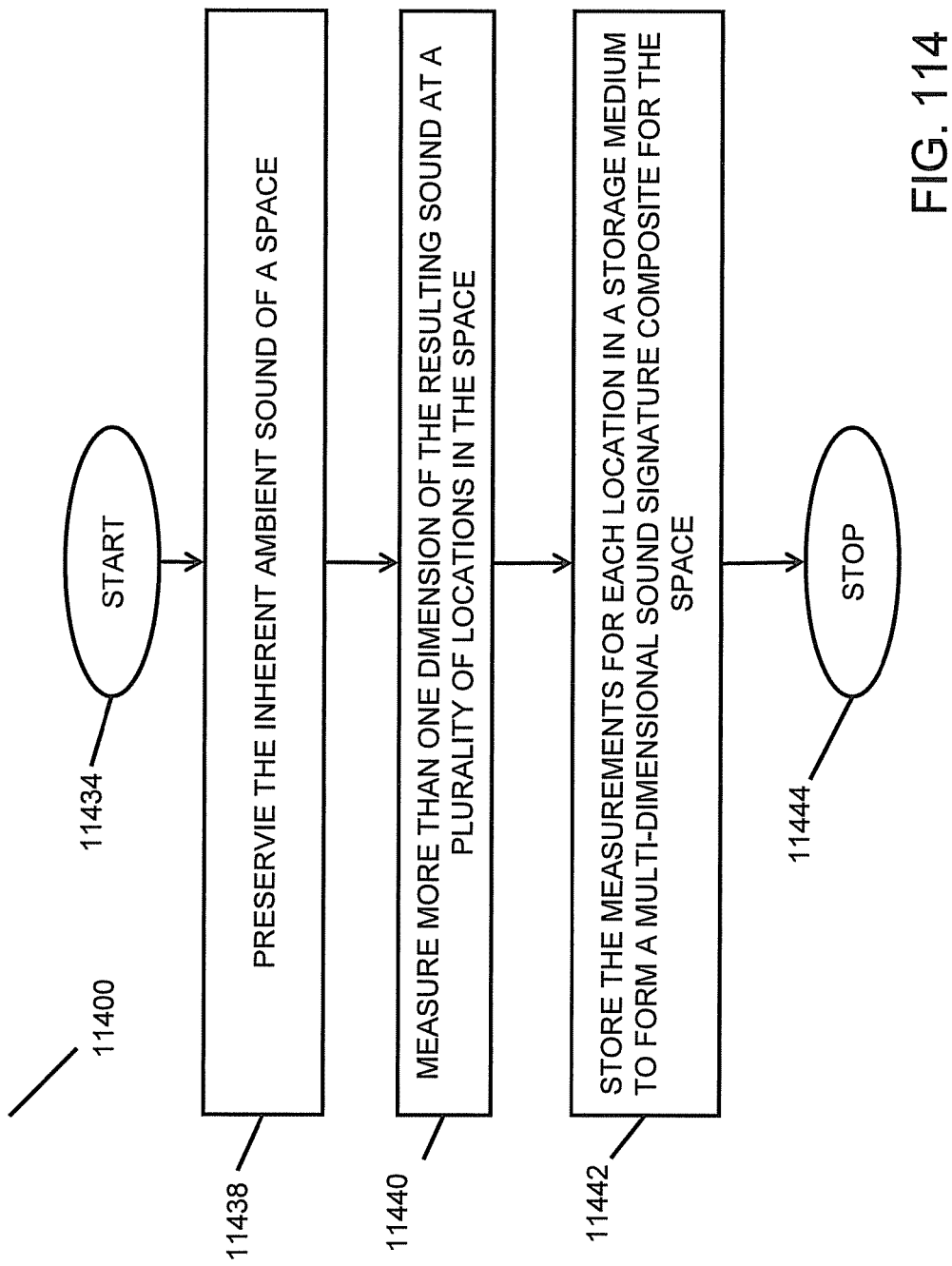
FIG. 114 depicts a flow process diagram in an embodiment of the present invention.

In embodiments, referring to FIG. 114, methods and systems for storing the measurements for each location may be provided. As shown in FIG. 114, a process 11400 for storing the measurements for each location in accordance with an embodiment of the present invention may be provided.

The process 11400 starts at step 11434. At step 11438, the inherent ambient sound of a space may be preserved. At step 11440, more than one dimension of the resulting sound may be measured at multiple locations in the space. At step 11442, the measurements for each location may be stored in a storage medium to form a multi-dimensional sound signature composite for the space. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio.

In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location.

In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

The process 11400 may end at step 11444.

Figure 115:
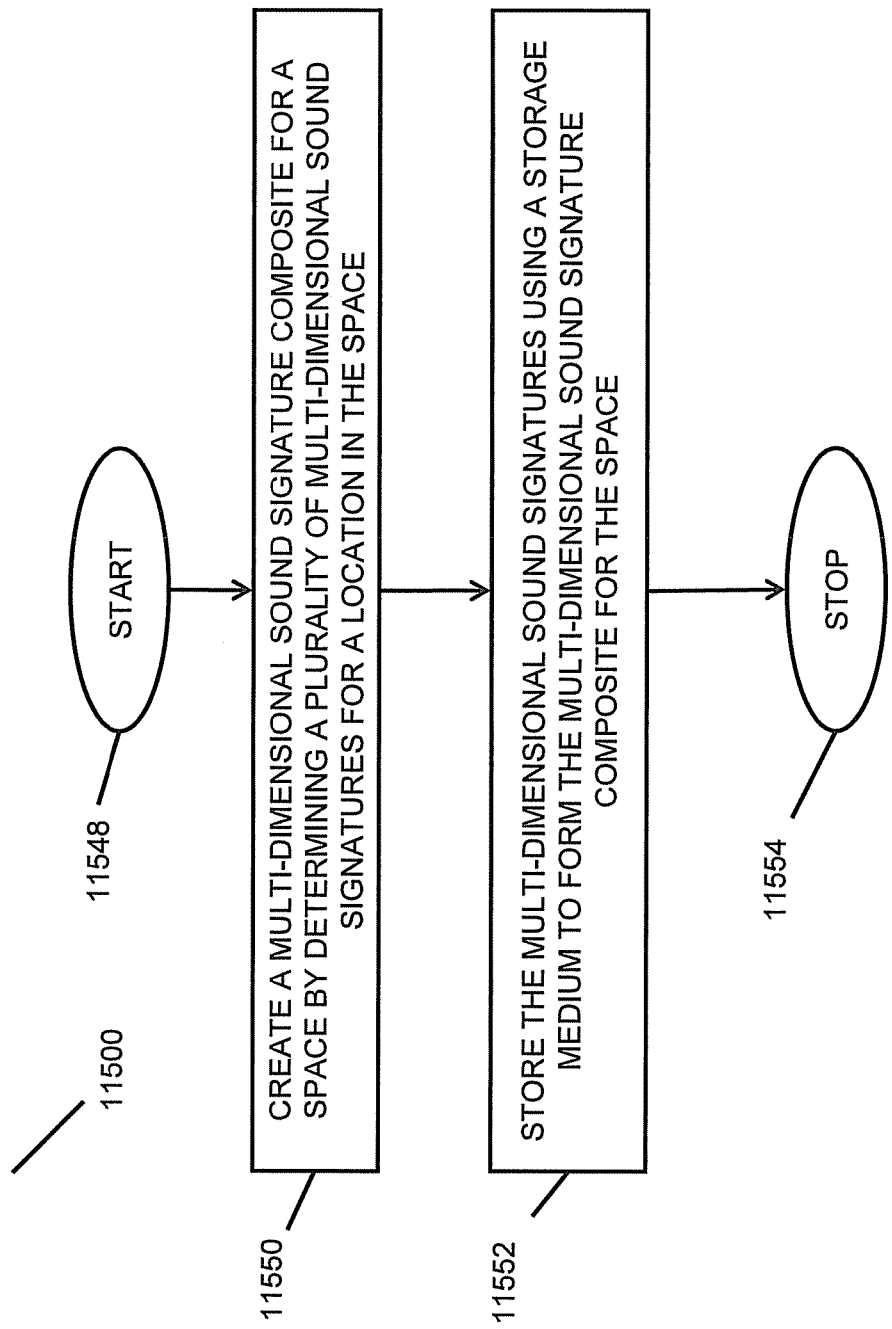
FIG. 115 depicts a flow process diagram in an embodiment of the present invention.

In embodiments, referring to FIG. 115, methods and systems for storing the multi-dimensional sound signature may be provided. As shown in FIG. 115, a process 11500 for storing the multi-dimensional sound signature in accordance with yet another embodiment of the present invention may be provided.

The process 11500 starts at step 11548. At step 11550, a multi-dimensional sound signature composite may be created for a space by determining multiple multi-dimensional sound signatures for a location in the space. Each multi-dimensional sound signature may be determined by measuring more than one dimension of the sound at the location in the space resulting from the inherent ambient sound of the space. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location. In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

At step 11552, the multi-dimensional sound signatures may be stored using a storage medium to form the multi-dimensional sound signature composite for the space.

The process 11500 may end at step 11554.

Figure 116:
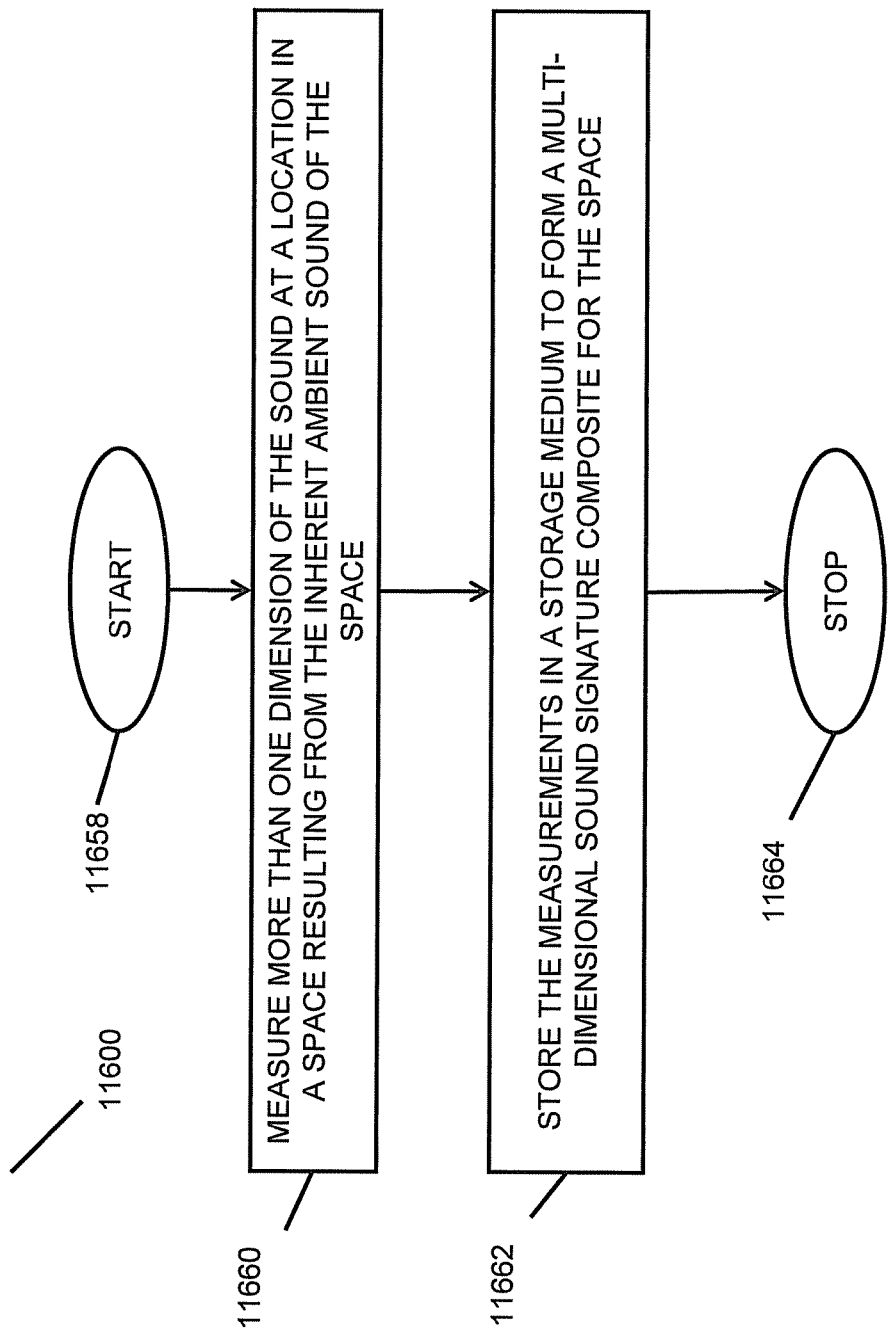
FIG. 116 depicts a flow process diagram in an embodiment of the present invention.

In embodiments, referring to FIG. 116, methods and systems for storing the measurements to form a multi-dimensional sound signature composite for the space may be provided. As shown in FIG. 116, a process 11600 for storing the measurements to form a multi-dimensional sound signature composite for the space, in accordance with another embodiment of the present invention, may be provided.

The process 11600 starts at step 11658. At step 11660, more than one dimension of the sound may be measured at a location in a space resulting from the inherent ambient sound of the space. At step 11662, the measurements may be stored in a storage medium to form a multi-dimensional sound signature composite for the space. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location. In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

The process 11600 may end at step 11664.

Figure 117:
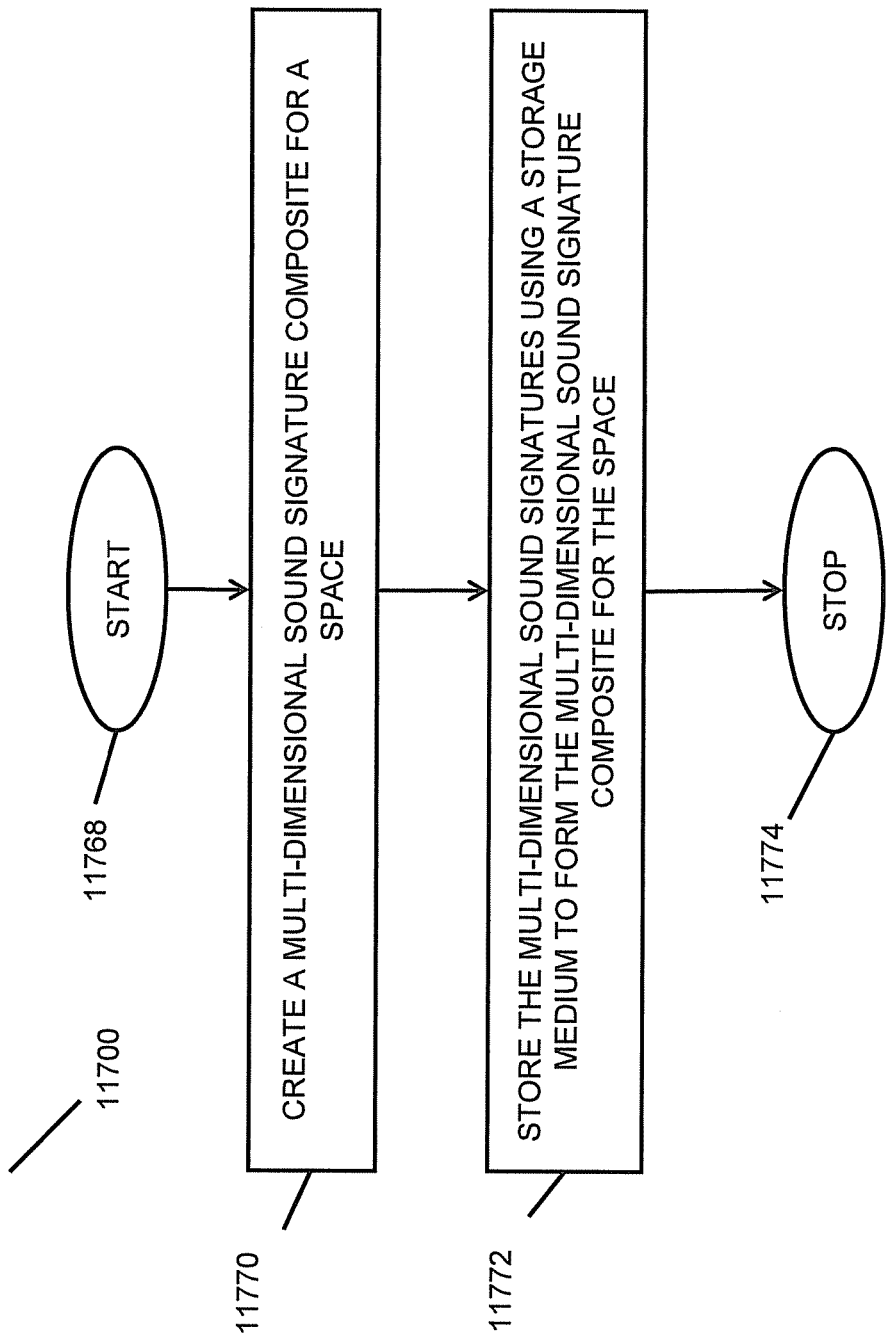
FIG. 117 depicts a flow process diagram in an embodiment of the present invention.

In embodiments, referring to FIG. 117, methods and systems for storing the multi-dimensional sound signatures may be provided. As shown in FIG. 117, a process 11700 for storing the multi-dimensional sound signatures, in accordance with another embodiment of the present invention, may be provided.

The process 11700 starts at step 11768. At step 11770, a multi-dimensional sound signature composite for a space may be created. In embodiments, the multi-dimensional sound signature composite for a space may be created by determining multiple multi-dimensional sound signatures for a location in the space. Each multi-dimensional sound signature may be determined by measuring more than one dimension of the sound at the location in the space resulting from the inherent ambient sound of the space. Following this, a multi-dimensional sound signature for each of multiple locations in the space may be determined. Each multi-dimensional sound signature may be determined by measuring more than one dimension of the sound at each of the multiple locations in the space resulting from the inherent ambient sound of the space. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, an integrated energy, an early decay time (EDT), an early-to-late sound index, an early lateral energy fraction (LF), a total relative sound level (G), a sound pressure, an early decay time, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location. In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

At step 11772, the multi-dimensional sound signatures may be stored using a storage medium to form the multi-dimensional sound signature composite for the space.

The process 11700 may end at step 11774.

Figure 118:
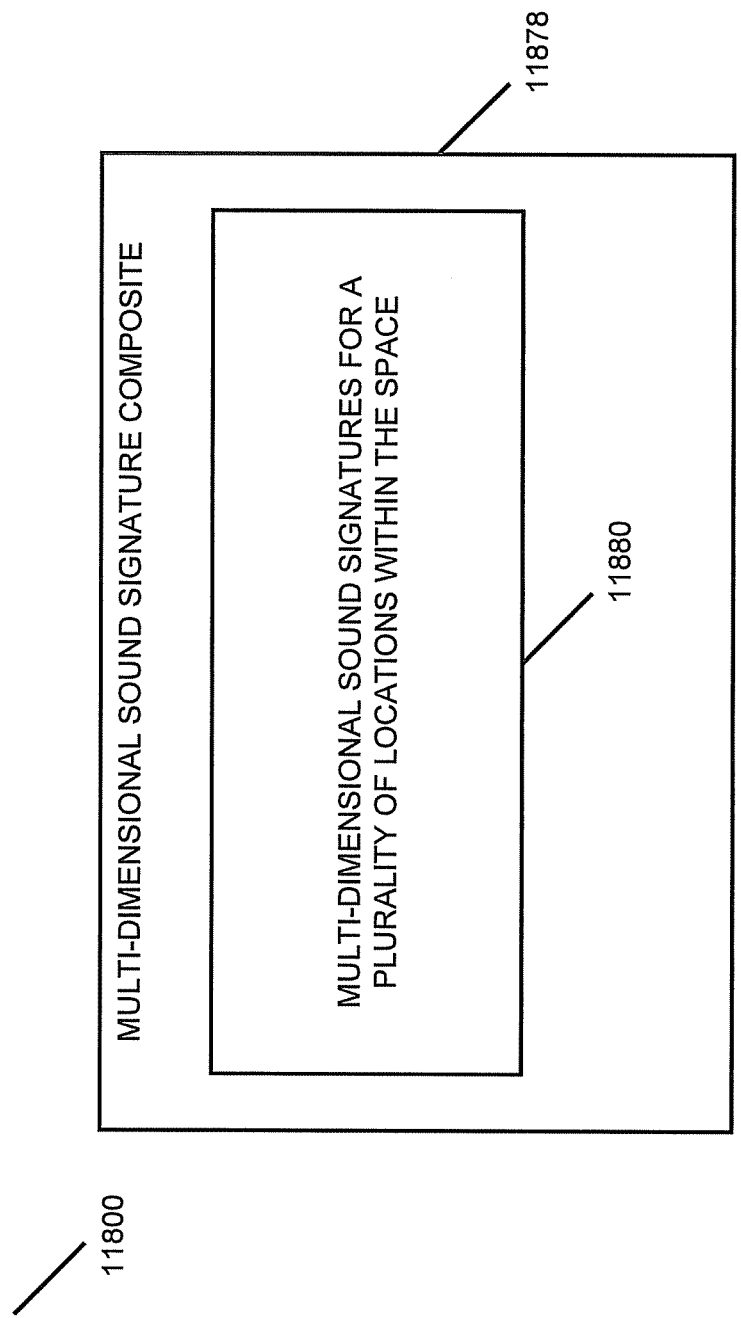
FIG. 118 depicts a flow process diagram in an embodiment of the present invention.

In embodiments, as shown in FIG. 118, block diagram 11800 depicts the multi-dimensional sound signatures being stored for a plurality of locations within the space. As shown in the block 11878, the multi-dimensional sound signature composite may store the multi-dimensional sound signatures for multiple locations within the space in respect of in respect of the inherent ambient sound of the space.

In embodiments, the multi-dimensional sound signature composite for a space may be created by determining multiple multi-dimensional sound signatures for a location in the space. Each multi-dimensional sound signature may be determined by measuring more than one dimension of the sound at the location in the space resulting from the inherent ambient sound of the space. Following this, a multi-dimensional sound signature for each of multiple locations in the space may be determined. Each multi-dimensional sound signature may be determined by measuring more than one dimension of the sound at each of the multiple locations in the space resulting from the inherent ambient sound of the space. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an early decay time (EDT), an early-to-late sound index, an early lateral energy fraction (LF), a total relative sound level (G), an integrated energy, a sound pressure, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location. In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

Figure 119:
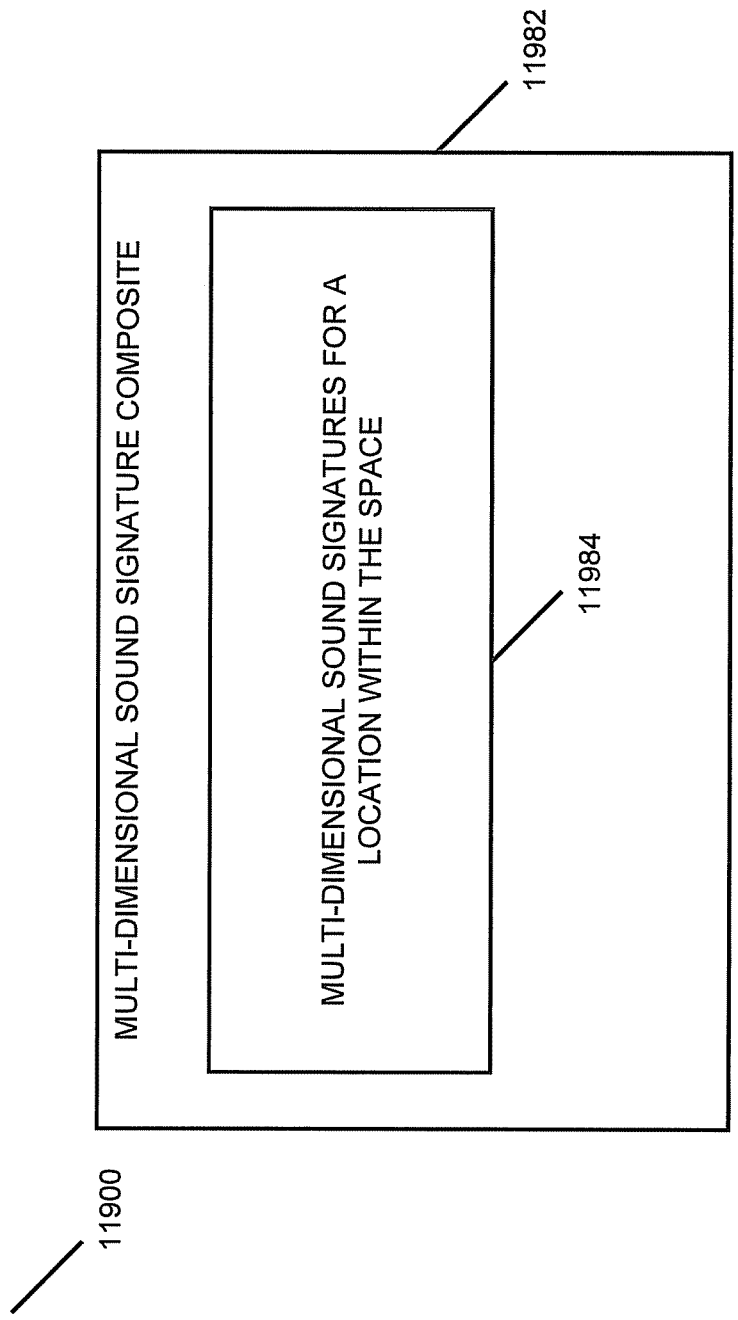

In embodiments, as shown in FIG. 119, block diagram 11900 depicts the multi-dimensional sound signatures being stored for a location within the space. As shown in the block 11982, the multi-dimensional sound signature composite may store the multi-dimensional sound signatures for a location within the space in respect of in respect of the inherent ambient sound of the space. In embodiments, the multi-dimensional sound signature composite for a space may be created by determining multiple multi-dimensional sound signatures for a location in the space. Each multi-dimensional sound signature may be determined by measuring more than one dimension of the sound at the location in the space resulting from the inherent ambient sound of the space. Following this, a multi-dimensional sound signature for each of multiple locations in the space may be determined. Each multi-dimensional sound signature may be determined by measuring more than one dimension of the sound at each of the multiple locations in the space resulting from the inherent ambient sound of the space. In embodiments, the multi-dimensional sound signature may consist of a plurality of sound vectors, each representing the incidence of sound at the second location from a direction defined by three spatial dimensions and including the time lag and loudness at a frequency from the direction. In embodiments, the multi-dimensional sound signature may consist of a plurality of sound vectors, each representing the incidence of sound at the second location from a direction defined by three spatial dimensions and including the time lag and loudness from the direction. Further, more than one dimension may include direction defined by three spatial dimensions, time lag and amplitude. In embodiments, more than one dimension may include loudness amplitude and time lag defined by three spatial dimensions.

In embodiments, the dimension may be the difference in the timing of arrival of sound at the second location from different directions, the timing of arrival of reflected sound versus sound traveling directly from the first location to the second location, the difference in the amplitude of the sound arriving at the second location from different directions, the difference between the amplitude of reflected sound versus sound traveling directly from the first location to the second location and the like.

In embodiments, the dimension may be a direction; the direction may be defined by three spatial dimensions, an intensity, an amplitude, an attenuation, a frequency, a frequency distribution, a pitch, a time, a time lag, a delay, a loudness at a frequency, a clarity, a definition, a timbre, an arrival time, an azimuth, an elevation, a path length, a reverberation time, an integrated energy, a sound pressure, an early decay time, an early to late arriving sound energy ratio, and the like.

In embodiments, the multi-dimensional sound signature may be associated with a timing range for each incidence direction following reflection relative to sound reaching each location without reflection or relative to a time in which the sound was created.

In embodiments, the multi-dimensional sound signature may define a preferential timing or a preferential order for reception of sound from a plurality of incidence directions.

In embodiments, the sound may be audible, inaudible, a multi-frequency sound, characterized by a single frequency and the like.

In embodiments, the space may be unoccupied, occupied, occupied by an audience, occupied by material approximating an audience, and the like.

In embodiments, the space may include a stage and an auditorium, a performance location and a performance observation location, a stage and the first and second locations on the stage, only a stage, only a performance location, and the like. In embodiments, the space may be less than all the volume of the structure housing the space and/or a subset of the structure housing the space and the like.

In embodiments, the space may be a great hall. In embodiments, the dimensions of the great hall may be 43 feet wide, 92 feet long, and 60 feet high. In embodiments, the space may be a jewel box. In embodiments, the dimensions of the jewel box may be 52 feet wide, 36 feet long, and 26 feet high. In embodiments, the space may be a music salon. In embodiments, the dimensions of the music salon may be 26 feet wide, 36 feet long, and 16 feet high. In embodiments, the space may be a ballroom. In embodiments, the dimensions of the ballroom may be 26 feet wide, 62 feet long, and 16 feet high. In embodiments, the space may be an oratorio. In embodiments, the dimensions of the oratorio may be 26 feet wide, 62 feet long, and 40 feet high.

In embodiments, the space may be an ante room, a choir box, a ball court, an organ church, a Bach organ church, a basilica, a baroque opera house, an opera house, a cathedral, an amphitheater, a conference room, an office, a gymnasium, a movie theater, a vehicle interior, an automobile interior, an aircraft interior, a train interior, a marine interior, a public space, an airport, a train station, a subway station, a hospital and the like.

In embodiments, the measured values may be represented by a vector diagram. In embodiments, the length of the vector in the vector diagram may represent loudness. In embodiments, the direction of the vector in the vector diagram may represent the incident angle of the incoming sound. In embodiments, the color of the vector in the vector diagram may represent time lag.

In embodiments, the sound signature may be represented as time series of distinct sound waves representing initial arrival of reflected sound from different directions. In embodiments, a preferred multi-dimensional sound signature may be determined by defining acceptable timing and amplitude ranges for a series of sound waves arriving at a location. In embodiments, the multi-dimensional sound signature composite may be a data record, a table, and the like. In embodiments, the multi-dimensional sound signature composite may be stored in a database. In embodiments, the multi-dimensional sound signatures in the multi-dimensional sound signature composite may associate a timing range for each incidence direction following reflection relative to sound reaching each location without reflection. In embodiments, the multi-dimensional sound signatures in the multi-dimensional sound signature composite may associate a timing range for each incidence direction following reflection relative to a time in which the sound was created. In embodiments, the multi-dimensional sound signatures in the multi-dimensional sound signature composite may define a preferential timing for reception of sound from a plurality of incidence directions. In embodiments, the multi-dimensional sound signatures in the multi-dimensional sound signature composite may define an amplitude range for each incidence direction. In embodiments, the multi-dimensional sound signatures in the multi-dimensional sound signature composite may define a preferential order for reception of sound from a plurality of incidence directions. In embodiments, the multi-dimensional sound signature composite may include information about the tonal distribution of sound reaching the multiple locations from multiple incidence directions. In embodiments, the multi-dimensional sound signature composite may include information about the tonal distribution of sound reaching the multiple locations from a multiple incidence directions. The tonal distribution may include a high-frequency drop-off that may be greater than the masking effect of air.

Figure 120:
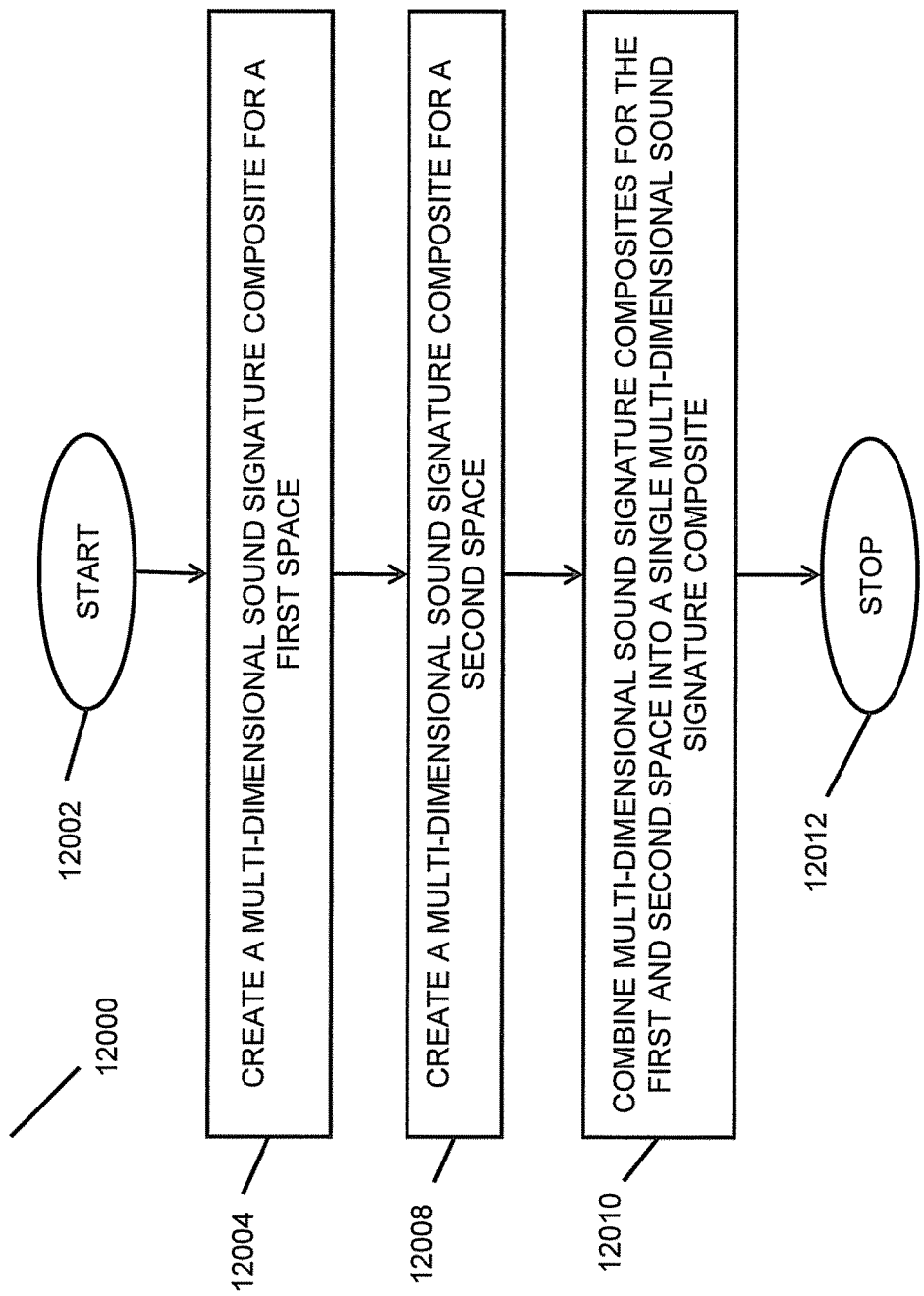
Figure 121:
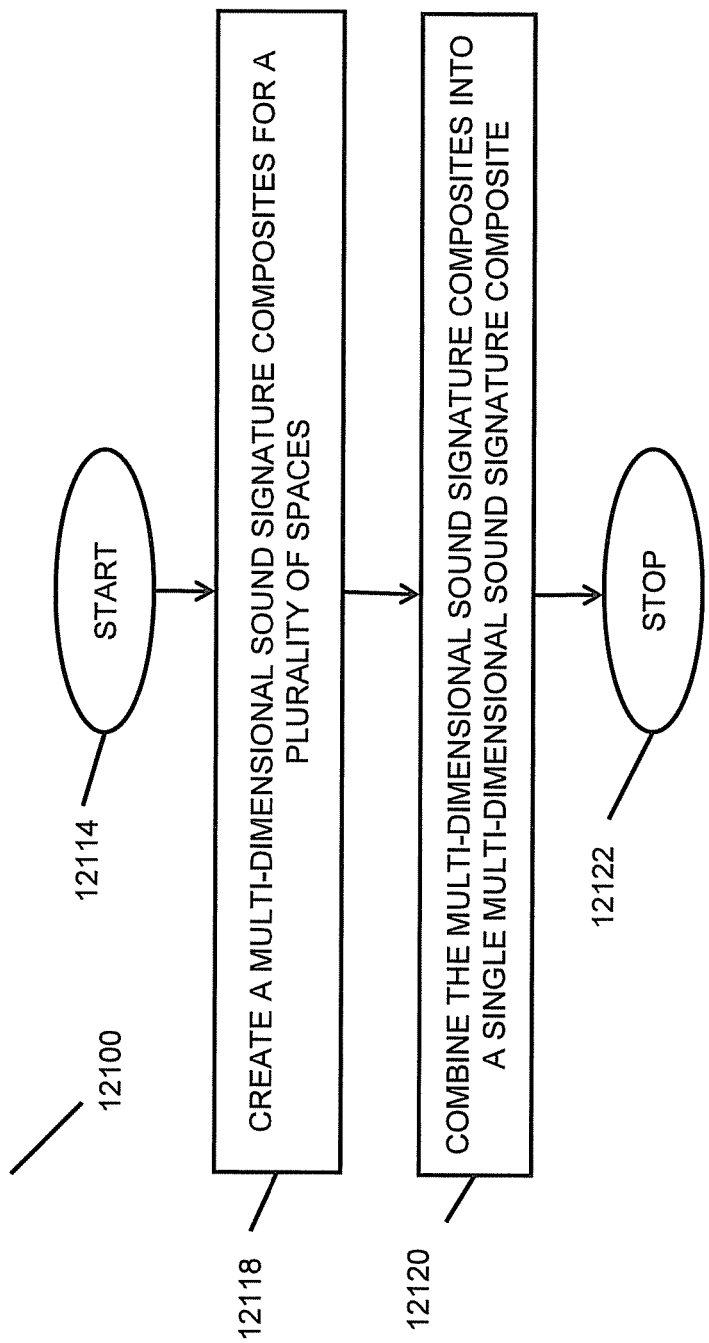

In embodiments, referring to FIGS. 120 and 121, methods and systems for data manipulation action of combining two or more multi-dimensional sound signature composites may be provided. As shown in FIG. 120, a process 12000 for data manipulation action of combining two or more multi-dimensional sound signature composites, in accordance with various embodiments of the present invention, may be provided.

The process 12000 starts at step 12002. At step 12004, the multi-dimensional sound signature for a first space may be created. In embodiments, the first space multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like.

At step 12008, a multi-dimensional sound signature for a second space may be created. In embodiments, the second space multi-dimensional sound signature composite may be a single source multi-dimensional sound signature composite; a multiple source multi-dimensional sound signature composite; a multiple source, multiple locations, multi-dimensional sound signature composite; a hypothetical multi-dimensional sound signature composite; an ambient multi-dimensional sound signature composite; and the like. In embodiments, the first and second spaces may share similar acoustic properties and may be used for the performance of the same genre of music. In embodiments, the sounds initiated in the first and second spaces may be similar.

At step 12010, the multi-dimensional sound signature composites for the first and second spaces may be combined into a single multi-dimensional sound signature composite. In embodiments, the range of values for each dimension may include the values for each of the first and second space. In embodiments, the acoustic properties represented by the single combined multi-dimensional sound signature composite may be superior to those of any of the individual spaces. In embodiments, for a given purpose, the acoustic properties represented by the single combined multi-dimensional sound signature composite may be superior to those of any of the individual spaces. In embodiments, the first and second spaces may share similar geometric properties. In embodiments, the room dimensions of the first and second spaces, Great Hall or Basic Room, may be 43 feet wide, 92 feet long, and 60 feet high. In embodiments, there may be an extension of the room dimensions of first and second spaces from the Basic Room on the entire long sides, 11 feet up from the floor extending 40 feet up, and extending 8 feet outward from the basic room. In embodiments, the room dimensions of the first and second spaces may be 52 by 36 by 26 in height for the Jewel Box. In embodiments, the room dimensions of the first and second spaces may be 26 by 36 by 16 in height for the Music Salon. In embodiments, the room dimensions of the first and second spaces may be 26 by 62 by 40 in height, for the Oratorio. In embodiments, the room dimensions of the first and second spaces may be 26 by 62 by 16 in height for the Ballroom.

The process 12000 may end at step 12012.

In embodiments, referring to FIG. 121, methods and systems for combining two or more multi-dimensional sound signature composites may be provided. As shown in FIG. 121B, a process 12100 for combining two or more multi-dimensional sound signature composites, in accordance with various embodiments of the present invention, may be provided.

The process 12100 starts at step 12114. At step 12118, multi-dimensional sound signature composites may be created for a number of spaces. At step 12120, the multi-dimensional sound signature composites may be combined into a single multi-dimensional sound signature composite. In embodiments, the single multi-dimensional sound signature composite may represent the range of values for each dimension that may be included in the multi-dimensional sound signature composites for the plurality of spaces.

In embodiments, the acoustic properties that may be represented by the single combined sound signatures may be superior to those of any of the individual spaces. In embodiments, for a given purpose, the acoustic properties that may be represented by the single combined sound signatures may be superior to those of any of the individual spaces. In embodiments, the first and second spaces may share similar geometric properties. In embodiments, the room dimensions of the first and second spaces, Great Hall or Basic Room, may be 43 feet wide, 92 feet long, and 60 feet high. In embodiments, there may be an extension of the room dimensions of first and second spaces from the Basic Room on the entire long sides, 11 feet up from the floor extending 40 feet up, and extending 8 feet outward from the basic room. In embodiments, the room dimensions of the first and second spaces may be 52 by 36 by 26 in height, plus for the Jewel Box. In embodiments, the room dimensions of the first and second spaces may be 26 by 36 by 16 in height for the Music Salon. In embodiments, the room dimensions of the first and second spaces may be 26 by 62 by 40 in height for the Oratorio. In embodiments, the room dimensions of the first and second spaces may be 26 by 62 by 16 in height for the Ballroom.

The process 12100 may end at step 12122.

Figure 122:
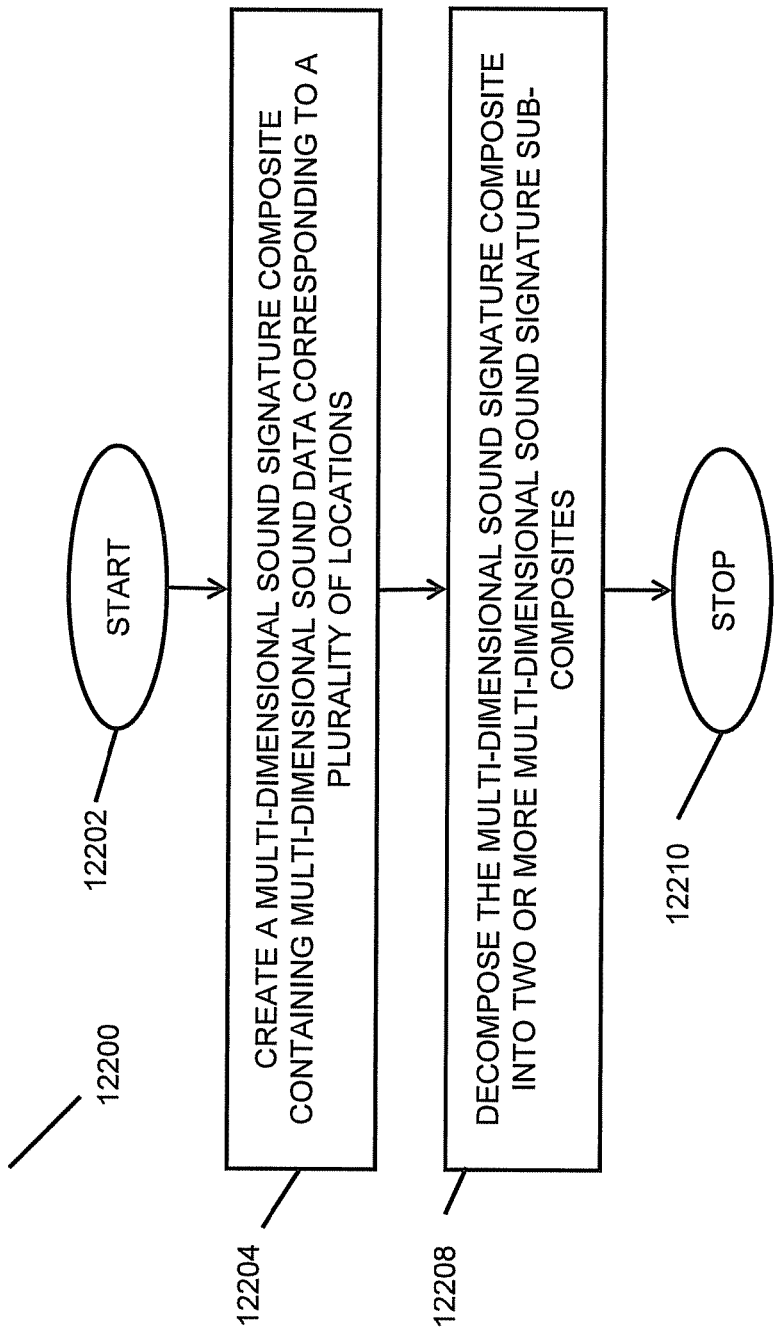

In embodiments, referring to FIG. 122, methods and systems for data manipulation action of decomposing a multi-dimensional sound signature composite into two or more multi-dimensional sound signature composites may be provided. As shown in FIG. 122, a process 12200 for data manipulation action of decomposing a multi-dimensional sound signature composite into two or more multi-dimensional sound signature composites, in accordance with various embodiments of the present invention, may be provided.

The process 12200 starts at step 12202. At step 12204, a multi-dimensional sound signature composite that may include multi-dimensional sound data corresponding to a number of locations may be created by combining two or more multi-dimensional sound signature composites, and the like. In embodiments, the multi-dimensional sound signature composite may be a space; a hypothetical space; a single source multi-dimensional sound signature composite;

a multiple source multi-dimensional sound signature composite; a multiple source, multiple locations, multi-dimensional sound signature composite; a hypothetical multi-dimensional sound signature composite; an ambient multi-dimensional sound signature composite; and the like.

At step 12208, the multi-dimensional sound signature composite may decompose into two or more multi-dimensional sound signature sub-composites. In embodiments, each sub-composite may correspond to at least one selected location in the number of locations. In embodiments, the at least one selected location may correspond to a space, a physical space, a zone of a space, a region of a space, a range of seats in a space, a stage contained in a space, an auditorium contained in a space, and the like. In embodiments, the room dimensions of the first and second spaces, Great Hall or Basic Room, may be 43 feet wide, 92 feet long, and 60 feet high. In embodiments, there may be an extension of the room dimensions of first and second spaces from the Basic Room on the entire long sides, 11 feet up from the floor extending 40 feet up, and extending 8 feet outward from the basic room. In embodiments, the room dimensions of the first and second spaces may be 52 by 36 by 26 in height, plus for the Jewel Box. In embodiments, the room dimensions of the first and second spaces may be 26 by 36 by 16 in height for the Music Salon. In embodiments, the room dimensions of the first and second spaces may be 26 by 62 by 40 in height for the Oratorio. In embodiments, the room dimensions of the first and second spaces may be 26 by 62 by 16 in height for the Ballroom. In embodiments, the zone may be a direct sound zone, a diamond zone, a middle zone, a deep development zone, and the like.

Figure 123:
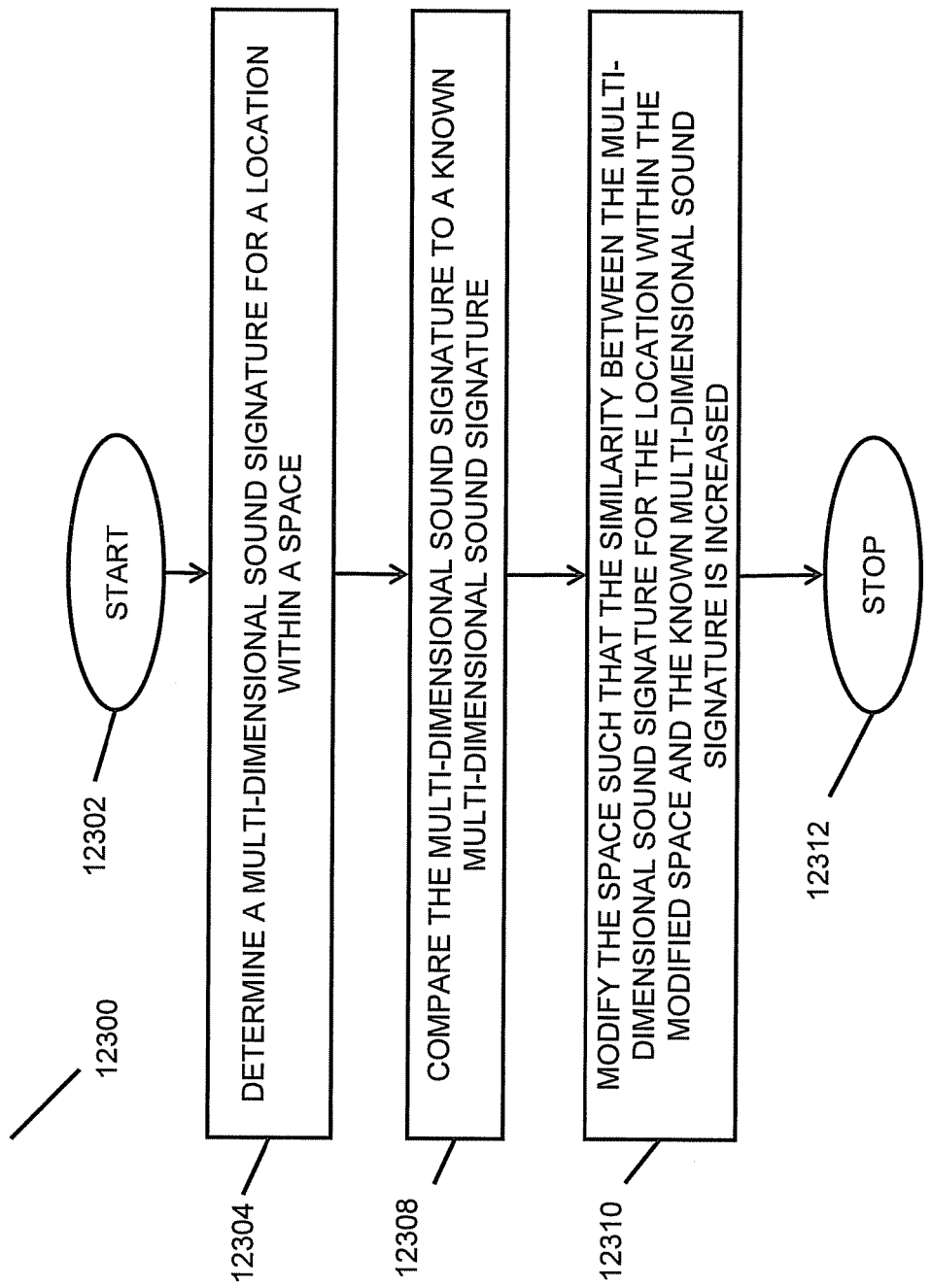

In embodiments, referring to FIG. 123, methods and systems for modifying an existing space in respect of a multi-dimensional sound signature may be provided. As shown in FIG. 123, a process 12300 for modifying an existing space in light of a multi-dimensional sound signature in accordance with various embodiments of the present invention may be provided.

The process 12300 starts at step 12302. At step 12304, the multi-dimensional sound signature may be determined for a location within a space. At step 12308, the multi-dimensional sound signature may be compared with a known multi-dimensional sound signature. In embodiments, the known multi-dimensional sound signature may be an actual multi-dimensional sound signature for a location in another space, an idealized multi-dimensional sound signature, a multi-dimensional sound signature for a location in a hypothetical space, and the like. In embodiments, the known multi-dimensional sound signature may result from manipulation of one or more other multi-dimensional sound signatures.

At step 12310, the space may be modified such that the similarity between the multi-dimensional sound signature for the location within the modified space and the known multi-dimensional sound signature may be increased. In embodiments, the similarity may be increased for one dimension of the multi-dimensional sound signature. In embodiments, the similarity may be increased for one or more dimensions of the multi-dimensional sound signature.

In embodiments, the modification of the space may refer to altering the design of the existing space. In embodiments, the existing space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material. In embodiments, the space may also be modified by the construction of fixtures designed to create reflections of sound within a defined range of time, amplitude and direction. In embodiments, the space may be modified by adding, removing and/or moving fixtures designed to create reflections of sound within a defined range of time, amplitude and direction. The range for all the above stated embodiments may be defined based on a preferred, multi-dimensional sound signature.

The process 12300 may end at step 12312.

In embodiments, referring to FIG. 124, methods and systems for modifying a hypothetical space in respect of a multi-dimensional sound signature may be provided. As shown in FIG. 124, a process 12400 for modifying a hypothetical space in light of a multi-dimensional sound signature in accordance with various embodiments of the present invention may be provided.

The process 12400 starts at step 12402. At step 12404, a multi-dimensional sound signature for a location may be determined within a hypothetical space. At step 12408, the multi-dimensional sound signature may be compared with a known multi-dimensional sound signature. In embodiments, the known multi-dimensional sound signature may be an actual multi-dimensional sound signature for a location in another space, an idealized multi-dimensional sound signature, a multi-dimensional sound signature for a location in a hypothetical space, and the like. In embodiments, the known multi-dimensional sound signature may result from manipulation of one or more other multi-dimensional sound signatures.

At step 12410, the hypothetical space may be modified such that the similarity between the multi-dimensional sound signature for the location within the modified hypothetical space and the known multi-dimensional sound signature may be increased. In embodiments, the similarity may be increased for one dimension of the multi-dimensional sound signature. In embodiments, the similarity may be increased for one or more dimensions of the multi-dimensional sound signature.

In embodiments, the modification of the hypothetical space may refer to altering the design of the hypothetical space. In embodiments, the hypothetical space may be modified by adding fabric, removing fabric, moving fabric, adding concrete, removing concrete, moving concrete, adding wood, removing wood, moving wood, adding scenery located on a stage, removing scenery located on a stage, moving scenery located on a stage, or adding, removing and/or moving some other material. In embodiments, the hypothetical space may be modified by the construction of fixtures designed to create reflections of sound within a defined range of time, amplitude and direction. In embodiments, the hypothetical space may be modified by adding, removing, and moving fixtures designed to create reflections of sound within a defined range of time, amplitude and direction. The range for all the above stated embodiments may be defined based on a preferred, multi-dimensional sound signature.

The process 12400 may end at step 12412.

The methods and systems described herein may be deployed in part or in whole through a machine that executes computer software, program codes, and/or instructions on a processor. The present invention may be implemented as a method on the machine, as a system or apparatus as part of or in relation to the machine, or as a computer program product embodied in a computer readable medium executing on one or more of the machines. The processor may be part of a server, client, network infrastructure, mobile computing platform, stationary computing platform, or other computing platform. A processor may be any kind of computational or processing device capable of executing program instructions, codes, binary instructions and the like. The processor may be or include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the invention. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the invention. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipments, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A computer-based method for reproducing a performance sound quality in a rehearsal space, the method comprising:
   accessing a computer stored multi-dimensional sound signature for an audience location in a performance space;

receiving sound data from a sound input device in the rehearsal space;

modifying the sound data received in the rehearsal space to match a sound characteristic of the multi-dimensional sound signature of the audience location of the performance space; and simultaneously transmitting the modified sound data matching the sound characteristic of the performance space through a sound output device in the rehearsal space.

2. The method of claim 1, wherein the multi-dimensional sound signature comprises a measured sound quality.

3. The method of claim 1, wherein the multi-dimensional sound signature comprises a time-based sound reflection sequence within the performance space for at least two sound parameters.

4. The method of claim 1, wherein the multi-dimensional sound signature comprises a combination of a plurality of different sound dimensions selected from the group consisting of timing, direction, amplitude, and frequency of sound reflections.

5. The method of claim 1, wherein modifying the sound data reduces a difference between an acoustic environment of the rehearsal space and the multi-dimensional sound signature of the audience location in the performance space when the modified sound data is transmitted in the rehearsal space.

6. The method of claim 1, wherein the sound input device is a microphone.

7. The method of claim 1, wherein the sound output device is a speaker.

8. The method of claim 1, wherein the sound output device is a headphone.

9. The method of claim 1, wherein the audience location is an area of audience seats in the performance space.

10. The method of claim 1, wherein the audience location is a specific seat in the performance space.

11. A system comprising:

an acoustic processing facility accessing a computer stored multi-dimensional sound signature for an audience location in a performance space;

a sound input device receiving sound data, wherein the acoustic processing facility modifies the sound data received in a rehearsal space to match a sound characteristic of the multi-dimensional sound signature of the audience location of the performance space; and a sound output device to simultaneously transmit the modified sound data matching the sound characteristic of the performance space in the rehearsal space.

12. The system of claim 11, wherein the multi-dimensional sound signature comprises a measured sound quality.

13. The system of claim 11, wherein the multi-dimensional sound signature comprises a time-based sound reflection sequence within the performance space for at least two sound parameters.

14. The system of claim 11, wherein the multi-dimensional sound signature comprises a combination of a plurality of different sound dimensions selected from the group consisting of timing, direction, amplitude and frequency of sound reflections.

15. The system of claim 11, wherein modifying the sound data reduces a difference between an acoustic environment of the rehearsal space and the multi-dimensional sound signature of the audience location in the performance space when the modified sound data is transmitted.

16. The system of claim 11, wherein the sound input device is a microphone.

17. The system of claim 11, wherein the sound output device is a speaker.

18. The system of claim 11, wherein the sound output device is a headphone.

19. The system of claim 11, wherein the audience location is an area of audience seats in the performance space.

20. The system of claim 11, wherein the audience location is a specific seat in the performance space.

* * * * *

UNITED STATES PATENT AND TRADEMARK OFFICE
CERTIFICATE OF CORRECTION

PATENT NO. : 10,275,726 B2
APPLICATION NO. : 15/713740
DATED : April 30, 2019
INVENTOR(S) : Glenn KnicKrehm et al.

It is certified that error appears in the above-identified patent and that said Letters Patent is hereby corrected as shown below:

In the Drawings

On Sheet 20 of 124, in Fig. 20, reference numeral 2013, Line 3, delete "IDSTRIBUTION" and insert -- DISTRIBUTION --, therefor.

On Sheet 33 of 124, in Fig. 33, reference numeral 3334, Line 5, delete "MUITI- MULTI-DIMENSIONAL" and insert -- MULTI-DIMENSIONAL --, therefor.

On Sheet 95 of 124, in Fig. 95, reference numeral 9504, Line 1, delete "PROVIDEAT" and insert -- PROVIDE AT --, therefor.

On Sheet 95 of 124, in Fig. 95, reference numeral 9508, Line 1, delete "PROVIDEA" and insert -- PROVIDE A --, therefor.

On Sheet 114 of 124, in Fig. 114, reference numeral 11438, Line 1, delete "PRESERVIE" and insert -- PRESERVE --, therefor.

In the Specification

In Column 1, Line 8, delete "patent" and insert -- patent application --, therefor.

In Column 1, Line 10, delete "patent" and insert -- patent application --, therefor.

In Column 5, Lines 23-34, delete "In embodiments, the measured values may be represented by a vector diagram. The length of the vector in the vector diagram may represent loudness. The direction of the vector in the vector diagram may represent the incident angle of the incoming sound. The color of the vector in the vector diagram may represent time lag. In embodiments, the sound signature may be represented as time series of distinct sound waves representing initial arrival of reflected sound from different directions. In embodiments, a preferred multi-dimensional sound signature may be Signed and Sealed this
Thirtieth Day of July, 2019

Andrei Iancu
*Director of the United States Patent and Trademark Office*

CERTIFICATE OF CORRECTION (continued)
U.S. Pat. No. 10,275,726 B2 determined by defining acceptable timing and amplitude ranges for a series of sound waves arriving at a location." and insert the same on, in Column 5, Line 24, as a new paragraph.

In Column 78, Line 20, delete "a the" and insert -- the --, therefor.

In Column 80, Line 20, delete "like" and insert -- like. --, therefor.

In Column 107, Line 32, delete "subwoofer" and insert -- subwoofer. --, therefor.

In Column 158, Line 4, delete "Markgrafliches Operhaus" and insert -- Markgräfliches Opernhaus --, therefor.

In Column 160, Line 4, delete "dosi meters," and insert -- dosimeters, --, therefor.

In Column 160, Line 62, delete "SMI" and insert -- SML --, therefor.

In Column 160, Line 63, delete "eh" and insert -- the --, therefor.

In Column 164, Line 62, delete "effect" and insert -- effect. --, therefor.

In Column 178, Line 43, delete "hZ." and insert -- Hz. --, therefor.

In Column 196, Line 63, delete "like" and insert -- like. --, therefor.

In Column 243, Line 13, delete "a the" and insert -- the --, therefor.

In Column 244, Line 19, delete "behind" and insert -- behind. --, therefor.

In Column 245, Line 36, delete "discernable" and insert -- discernible --, therefor.

In Column 246, Line 24, delete "(e g" and insert -- (e.g. --, therefor.

In Column 247, Line 17, delete "In" and insert -- in --, therefor.

In Column 262, Line 48, delete ".multi-dimensional" and insert -- multi-dimensional --, therefor.

In Column 296, Line 14, delete "FIG. 121B," and insert -- FIG. 121, --, therefor.